United States Patent
Steinberg et al.

(10) Patent No.: US 11,782,137 B2
(45) Date of Patent: Oct. 10, 2023

(54) AGGREGATING DATA OVER TIME TO IMPROVE IMAGE QUALITY

(71) Applicant: Innoviz Technologies Ltd., Rosh HaAyin (IL)

(72) Inventors: Amit Steinberg, Adanim (IL); Guy Zohar, Even Yehuda (IL)

(73) Assignee: Innoviz Technologies Ltd., Rosh HaAyin (IL)

( * ) Notice: Subject to any disclaimer, the term of this patent is extended or adjusted under 35 U.S.C. 154(b) by 0 days.

(21) Appl. No.: 18/060,795

(22) Filed: Dec. 1, 2022

(65) Prior Publication Data

US 2023/0121373 A1    Apr. 20, 2023

Related U.S. Application Data

(63) Continuation of application No. 16/829,156, filed on Mar. 25, 2020, now Pat. No. 11,604,262, which is a
(Continued)

(51) Int. Cl.
*G01S 7/481* (2006.01)
*G01S 17/931* (2020.01)
(Continued)

(52) U.S. Cl.
CPC .............. *G01S 7/4817* (2013.01); *B60S 1/02* (2013.01); *B81B 3/0018* (2013.01); *G01H 1/00* (2013.01);
(Continued)

(58) Field of Classification Search
CPC .... G01S 7/4808; G01S 7/4817; G01S 7/4863; G01S 7/4914; G01S 17/10; G01S 17/18;
(Continued)

(56) References Cited

U.S. PATENT DOCUMENTS

| 10,398,006 B2 | 8/2019 | Nakamura |
| 2005/0163278 A1* | 7/2005 | Metz ..................... A61B 6/032 378/4 |

(Continued)

FOREIGN PATENT DOCUMENTS

| EP | 2189815 A1 | 5/2010 |
| WO | 0244682 A2 | 6/2002 |

(Continued)

OTHER PUBLICATIONS

Search Report and Written Opinion dated Mar. 5, 2019 for International Application No. PCT/IB2018/001156, 23 pages.
(Continued)

*Primary Examiner* — Michael A Lyons
(74) *Attorney, Agent, or Firm* — Finnegan, Henderson, Farabow, Garrett & Dunner LLP

(57) ABSTRACT

A LIDAR system or a vehicle may include at least one processor configured to perform a method to detect objects in a field of view. The method may include controlling at least one LIDAR light source in a manner enabling light flux of the at least one LIDAR light source to vary over a plurality of scans of a field of view; receiving, from a group of detectors, a plurality of input signals indicative of reflections of light projected from the field of view; detecting a possible existence of an object in the background area based on first input signals associated with a first scanning cycle; detecting a possible existence of the object based on second input signals associated with a second scanning cycle; and aggregating the first and second input signals to detect an existence of the object at an object-existence-certainty level higher than a threshold.

25 Claims, 74 Drawing Sheets

Related U.S. Application Data continuation of application No. PCT/IB2018/001156, filed on Sep. 26, 2018.

(60) Provisional application No. 62/632,789, filed on Feb. 20, 2018, provisional application No. 62/589,686, filed on Nov. 22, 2017, provisional application No. 62/567,692, filed on Oct. 3, 2017, provisional application No. 62/563,367, filed on Sep. 26, 2017.

(51) Int. Cl.

| | |
|---|---|
| *G01H 1/00* | (2006.01) |
| *G01S 17/10* | (2020.01) |
| *G01S 7/4863* | (2020.01) |
| *G01S 7/4914* | (2020.01) |
| *G01S 17/32* | (2020.01) |
| *G01S 17/58* | (2006.01) |
| *G01S 7/48* | (2006.01) |
| *G01S 7/484* | (2006.01) |
| *G01S 7/4911* | (2020.01) |
| *G01S 17/42* | (2006.01) |
| *B81B 3/00* | (2006.01) |
| *B60S 1/02* | (2006.01) |
| *G01S 7/497* | (2006.01) |
| *G01S 17/06* | (2006.01) |
| *G01S 17/89* | (2020.01) |
| *G02B 26/12* | (2006.01) |

(52) U.S. Cl.
CPC ............ *G01S 7/4802* (2013.01); *G01S 7/484* (2013.01); *G01S 7/4808* (2013.01); *G01S 7/4814* (2013.01); *G01S 7/4815* (2013.01); *G01S 7/4816* (2013.01); *G01S 7/4863* (2013.01); *G01S 7/497* (2013.01); *G01S 7/4911* (2013.01); *G01S 7/4914* (2013.01); *G01S 17/06* (2013.01); *G01S 17/10* (2013.01); *G01S 17/32* (2013.01); *G01S 17/42* (2013.01); *G01S 17/58* (2013.01); *G01S 17/89* (2013.01); *G01S 17/931* (2020.01); *B81B 2201/04* (2013.01); *G01S 2007/4975* (2013.01); *G02B 26/122* (2013.01)

(58) Field of Classification Search
CPC .......... G01S 17/32; G01S 17/58; G01S 17/93; G01S 17/931; G01S 17/933
See application file for complete search history.

(56) References Cited

U.S. PATENT DOCUMENTS

| | | | |
|---|---|---|---|
| 2007/0252075 A1* | 11/2007 | Heinemann | G01S 17/931 250/215 |
| 2009/0135405 A1 | 5/2009 | Fischer et al. | |
| 2014/0324266 A1* | 10/2014 | Zhu | G01S 13/865 382/104 |
| 2017/0180707 A1 | 6/2017 | Hsu et al. | |
| 2018/0081037 A1 | 3/2018 | Medina et al. | |
| 2018/0081038 A1 | 3/2018 | Medina et al. | |
| 2018/0100928 A1 | 4/2018 | Keilaf et al. | |
| 2018/0113200 A1 | 4/2018 | Steinberg et al. | |
| 2018/0113216 A1 | 4/2018 | Kremer et al. | |
| 2019/0056498 A1 | 2/2019 | Sonn et al. | |
| 2019/0079367 A1 | 3/2019 | Park et al. | |
| 2019/0212414 A1 | 7/2019 | Esfahany et al. | |
| 2019/0317217 A1* | 10/2019 | Day | G01S 17/04 |
| 2020/0271761 A1 | 8/2020 | O'Keeffe | |
| 2020/0385014 A1* | 12/2020 | Hanniel | B60W 40/072 |

FOREIGN PATENT DOCUMENTS

| | | |
|---|---|---|
| WO | 2007105107 A2 | 9/2007 |
| WO | 2015136100 A2 | 9/2015 |

OTHER PUBLICATIONS

Extended Search Report for European Application No. 23156412.1-1218, dated Jul. 3, 2023 (8 pages).

Wang et al., "Laser-based detection and tracking of dynamic objects," PhD Thesis, Oct. 1, 2014 (Oct. 1, 2014), pp. 1-183, XP055666290, Retrieved from the Internet: URL: http://www.robots.ox.ac.uk/~mobile/Theses/WangThesis.pdf.

\* cited by examiner

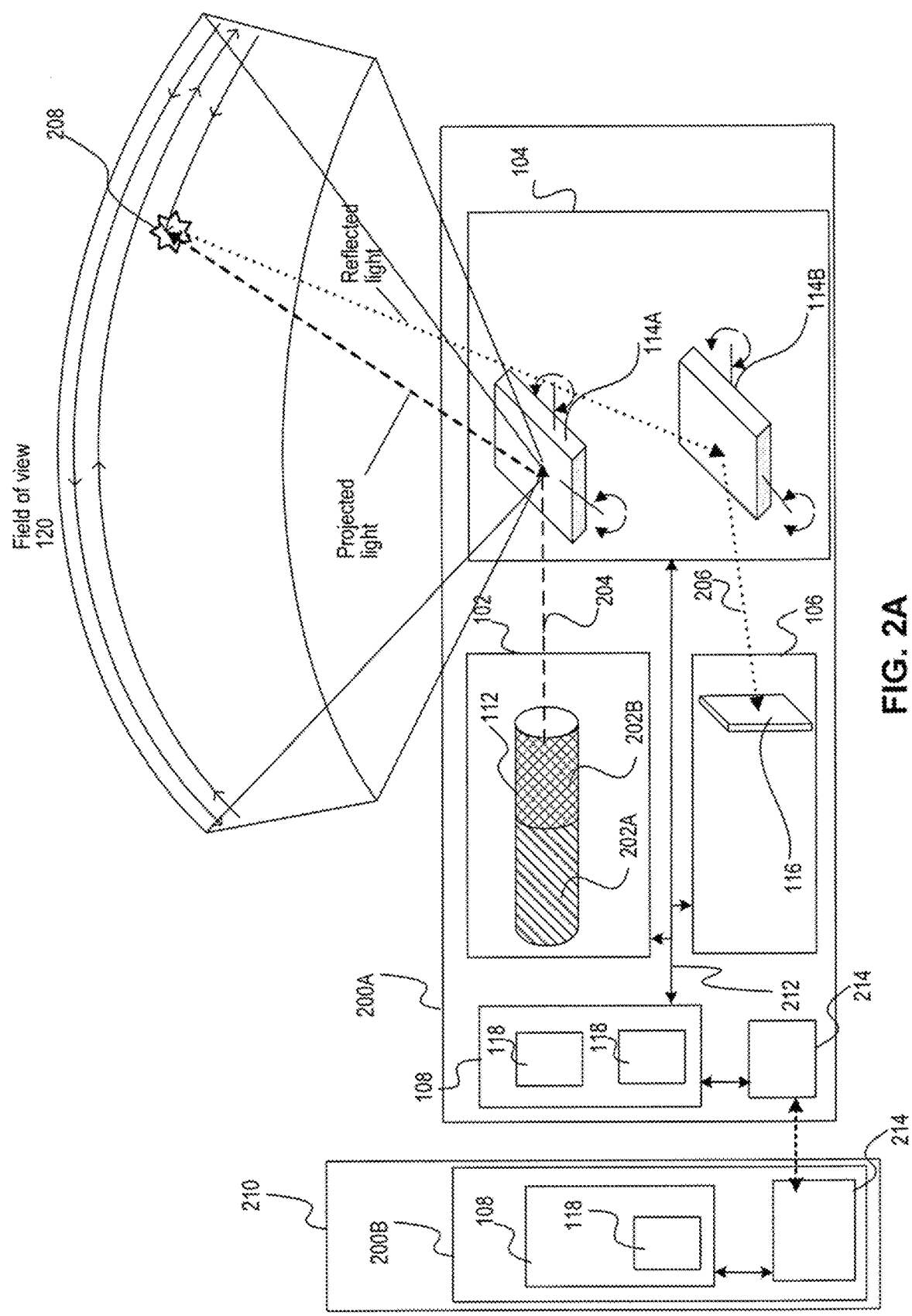

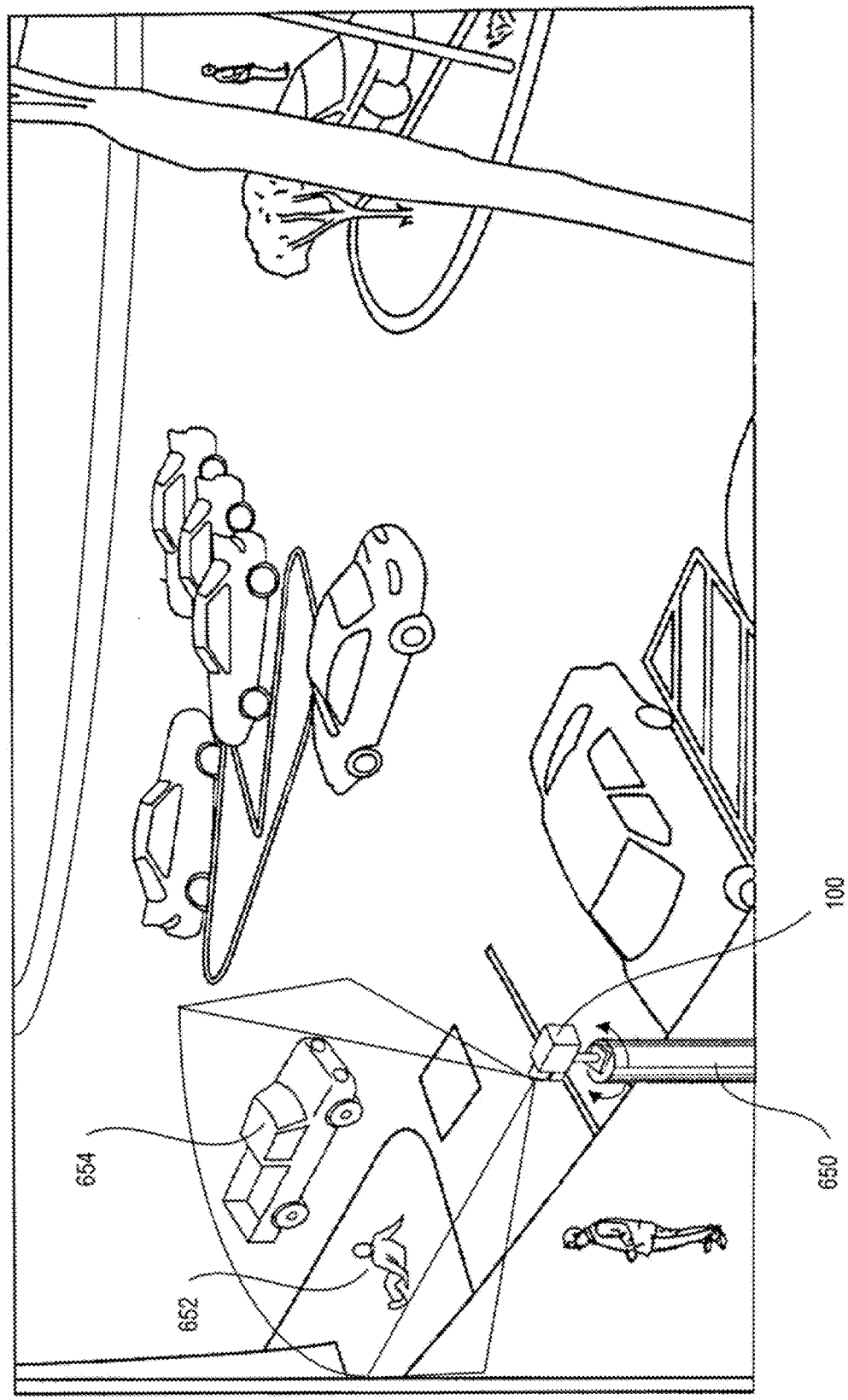

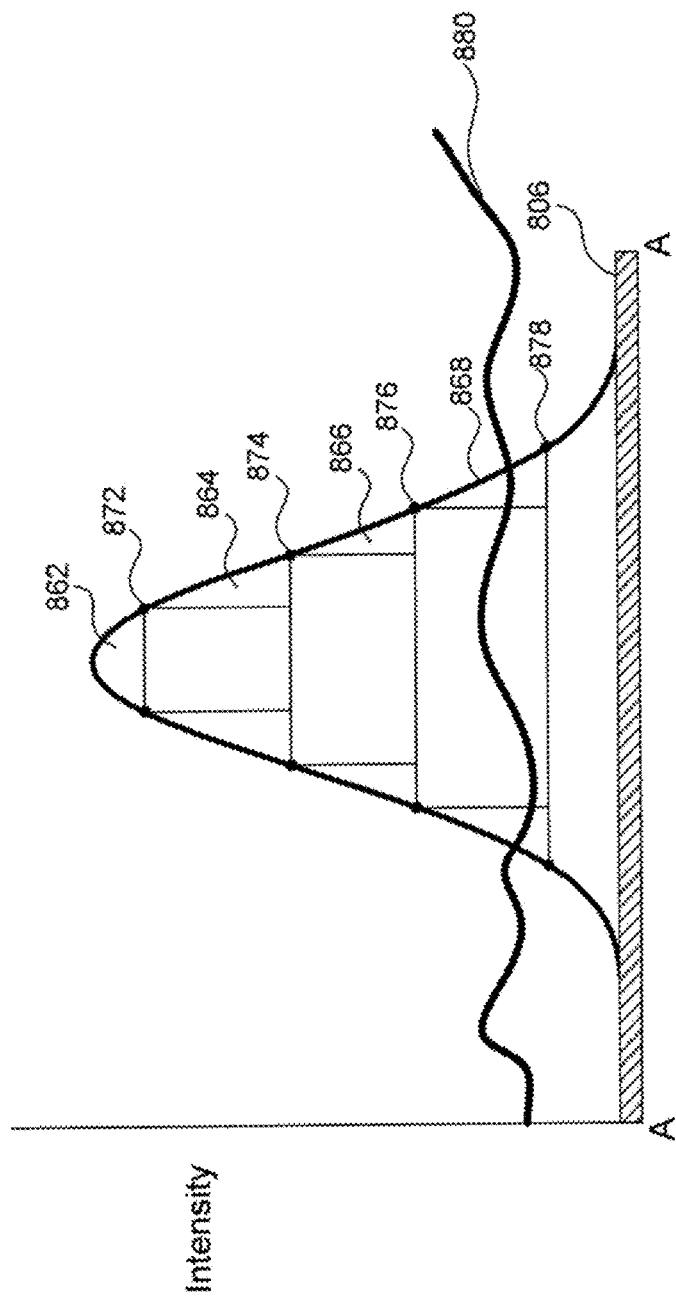

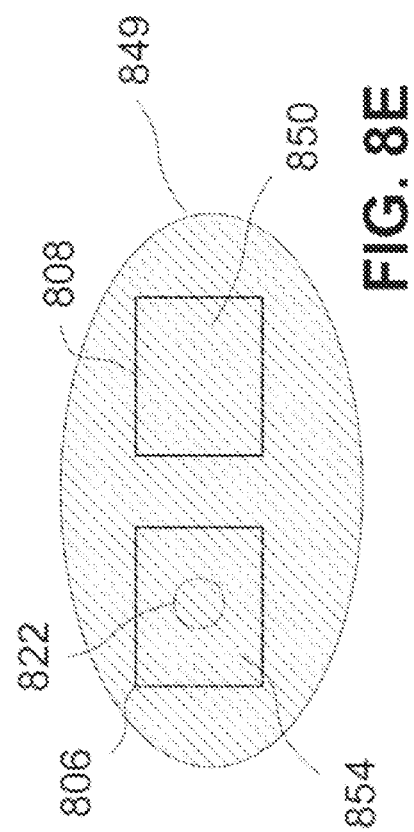

AGGREGATING DATA OVER TIME TO IMPROVE IMAGE QUALITY

CROSS REFERENCES TO RELATED APPLICATIONS

This application is a continuation of U.S. patent Ser. No. 16/829,156, filed Mar. 25, 2020, which is a continuation of PCT International Application No. PCT/IB2018/001156, filed Sep. 26, 2018, which claims the benefit of priority of U.S. Provisional Patent Application No. 62/563,367, filed Sep. 26, 2017; U.S. Provisional Patent Application No. 62/567,692, filed Oct. 3, 2017; U.S. Provisional Patent Application No. 62/589,686, filed Nov. 22, 2017; and U.S. Provisional Patent Application No. 62/632,789, filed Feb. 20, 2018. All of the foregoing applications are incorporated herein by reference in their entirety.

BACKGROUND

I. Technical Field

The present disclosure relates generally to surveying technology for scanning a surrounding environment, and, more specifically, to systems and methods that use LIDAR technology to detect objects in the surrounding environment.

II. Background Information

With the advent of driver assist systems and autonomous vehicles, automobiles need to be equipped with systems capable of reliably sensing and interpreting their surroundings, including identifying obstacles, hazards, objects, and other physical parameters that might impact navigation of the vehicle. To this end, a number of differing technologies have been suggested including radar, LIDAR, camera-based systems, operating alone or in a redundant manner.

One consideration with driver assistance systems and autonomous vehicles is an ability of the system to determine surroundings across different conditions including, rain, fog, darkness, bright light, and snow. A light detection and ranging system, (LIDAR a/k/a LADAR) is an example of technology that can work well in differing conditions, by measuring distances to objects by illuminating objects with light and measuring the reflected pulses with a sensor. A laser is one example of a light source that can be used in a LIDAR system. As with any sensing system, in order for a LIDAR-based sensing system to be fully adopted by the automotive industry, the system should provide reliable data enabling detection of far-away objects. Currently, however, the maximum illumination power of LIDAR systems is limited by the need to make the LIDAR systems eye-safe (i.e., so that they will not damage the human eye which can occur when a projected light emission is absorbed in the eye's cornea and lens, causing thermal damage to the retina.)

The systems and methods of the present disclosure are directed towards improving performance of LIDAR systems while complying with eye safety regulations.

SUMMARY

In some embodiments, a LIDAR system may include at least one processor configured to control at least one light source for projecting light toward a field of view and receive from at least one first sensor first signals associated with light projected by the at least one light source and reflected from an object in the field of view, wherein the light impinging on the at least one first sensor is in a form of a light spot having an outer boundary. The processor may further be configured to receive from at least one second sensor second signals associated with light noise, wherein the at least one second sensor is located outside the outer boundary; determine, based on the second signals received from the at least one second sensor, an indicator of a magnitude of the light noise; and determine, based on the indicator the first signals received from the at least one first sensor and, a distance to the object.

Some embodiments may also include a method for using LIDAR to detect objects. The method may include controlling at least one light source for projecting light toward a field of view; receiving from at least one first sensor signals associated with light projected by the at least one light source and reflected from an object in the field of view, wherein light impinging on the at least one first sensor is in a form of a light spot having an outer boundary; receiving from at least one second sensor, signals associated with light noise, wherein the at least one second sensor is located outside the outer boundary; determining, based on the signals received from the at least one second sensor, an indicator of a magnitude of the light noise; and determining, based on the signals received from the at least one first sensor and the indicator, a distance to the object.

Additionally, some embodiments may include a non-transitory computer-readable storage medium including instructions that, when executed by at least one processor, cause the at least one processor to perform a method for compensating for light noise in a LIDAR system. The method may include receiving from at least one first sensor signals associated with light projected by at least one light source and reflected from an object, wherein light impinging on the at least one first sensor is in a form of a light spot having an outer boundary; receiving from at least one second sensor, signals associated with light noise, wherein the at least one second sensor is located outside the outer boundary; determining, based on the signals received from the at least one second sensor, an indicator of a magnitude of the light noise; and correcting the signals received from the at least one first sensor using the indicator to compensate for the light noise, thereby enabling a determination of a distance to the object.

In an exemplary embodiment, a LIDAR system for projecting light through a protective window associated with the LIDAR system may include at least one processor. The at least one processor may be configured to: control at least one LIDAR light source; receive LIDAR reflections signals from at least one sensor, wherein the LIDAR reflections signals include indications of light reflected from the protective window and light reflected from objects in the field of view and passing through the protective window prior to reaching the at least one sensor; detect, based on the LIDAR reflections signals, a particular obstruction pattern at least partially obstructing light passage through the protective window; access stored information characterizing reference obstruction patterns for at least one of salt, mud, road grime, snow, rain, dust, bug debris, pollen, and bird droppings; compare the detected obstruction pattern with the reference obstruction patterns in order to determine a likely obstruction-pattern match; and based on the likely match, output information indicative of the match.

In another exemplary embodiment, a LIDAR system for projecting light through a protective window associated with the LIDAR system may include at least one processor. The at least one processor may be configured to: control at least one LIDAR light source; receive LIDAR reflections signals from at least one sensor, wherein the LIDAR reflections signals include indications of light reflected from objects in the field of view and passing through the protective window prior to reaching the at least one sensor; detect, based on the LIDAR reflections signals, a particular obstruction area at least partially obstructing light passage through the protective window at a first time; and initiate at least one remedial action, based on the detected obstruction area, to increase the amount of light passaging through the protective at a second time.

In another exemplary embodiment, a vehicle may include a body; a LIDAR light source arranged to projecting light through a protective window; and at least one processor. The at least one processor may be configured to control the at least one LIDAR light source; receive LIDAR reflections signals from at least one sensor, wherein the LIDAR reflections signals are indicative of light reflected from objects in a field of view and passing through the protective window prior to reaching the at least one sensor; detect, based on the LIDAR reflections, a particular obstruction pattern at least partially obstructing light passage through the protective window; access stored information characterizing reference obstruction patterns for at least one of salt, mud, road grime, snow, rain, dust, bug debris, pollen, and bird droppings; compare the detected obstruction pattern with the reference obstruction patterns in order to determine a likely match; and based on the likely match, output information indicative of the match.

In another exemplary embodiment, a method for determining obstructions on a protective window associated with a LIDAR may include: controlling at least one LIDAR light source; receiving LIDAR reflections signals from at least one sensor, wherein the LIDAR reflections signals are indicative of light reflected from objects in a field of view and passing through the protective window prior to reaching the at least one sensor; detecting, based on the LIDAR reflections, a particular obstruction pattern at least partially obstructing light passage through the protective window; accessing stored information characterizing reference obstruction patterns for at least one of salt, mud, road grime, snow, rain, dust, bug debris, pollen, and bird droppings; comparing the detected obstruction pattern with the reference obstruction patterns in order to determine a likely match; and based on the likely match, output information indicative of the match.

In another exemplary embodiment, a LIDAR system for projecting light through a protective window associated with the LIDAR system may include at least one processor. The at least one processor may be configured to: control at least one LIDAR light source; receive LIDAR reflections signals from at least one sensor, wherein the LIDAR reflections signals include indications of light reflected from the protective window inside the LIDAR system; determine internal reflection parameters from the LIDAR reflections signals; access memory storing signal baseline parameters associated with the LIDAR system; use the internal reflection parameters and the signal baseline parameters to identify at least one obstructed portion of the field of view; and alter a light source parameter such that more light is projected toward other portions of the field of view than light projected toward the at least one obstructed portion of the field of view.

In one embodiment, a LIDAR system may comprise at least one processor. The at least one processor may be configured to control at least one LIDAR light source in a manner enabling light flux to vary over a plurality of scans of a field of view. The field of view may include a foreground area and a background area. The at least one processor may be further configured to receive from at least one detector a plurality of input signals indicative of light reflected from the field of view. A representation of a portion of the field of view associated with a plurality of pixels may be constructible from the plurality of input signals, and the plurality of input signals may be associated with a first pixel that covers a portion of the foreground area, a second pixel that covers a portion of the foreground area and a portion of the background area, and a third pixel that covers a portion of the background area. The at least one processor may be further configured to use input signals associated with the first pixel to determine a distance to a first object located in the foreground area and use input signals associated with the second pixel and input signals associated with the third pixel to determine a distance to a second object located in the background area.

In one embodiment, a vehicle may comprise a body and at least one processor within the body. The at least one processor may be configured to control at least one LIDAR light source in a manner enabling light projected from the at least one LIDAR light source to vary over a plurality of scans of a field of view. The field of view may include a foreground area and a background area. The at least one processor may be further configured to receive, from a group of detectors, a plurality of input signals indicative of reflections of the projected light from the field of view. A representation of a portion of the field of view associated with a plurality of pixels may be constructible from the plurality of input signals, and the plurality of input signals may be associated with a first pixel that covers a portion of the foreground area, a second pixel that covers a portion of the foreground area and a portion of the background area, and a third pixel that covers a portion of the background area. The at least one processor may be further configured to use input signals associated with the first pixel to determine a distance to a first object located in the foreground area and use input signals associated with the second pixel and input signals associated with the third pixel to determine a distance to a second object located in the background area.

In one embodiment, a method for using LIDAR to determine distances to objects in a field of view may comprise controlling at least one LIDAR light source in a manner enabling light projected from the at least one light source to vary over a plurality of scans of a field of view. The field of view may include a foreground area and a background area. The method may further comprise receiving from a group of detectors a plurality of input signals indicative of reflections of the projected light from the field of view. A representation of a portion of the field of view associated with a plurality of pixels may be constructible from the plurality of input signals. The method may further comprise identifying a first pixel that covers a portion of the foreground area, a second pixel that covers a portion of the foreground area and a portion of the background area, and a third pixel that covers a portion of the background area; using input signals associated with the first pixel to determine a distance to a first object located in the foreground area; and using input signals associated with the second pixel and input signals associated with the third pixel to determine a distance to a second object located in the background area.

In one embodiment, a LIDAR system may comprise at least one processor. The at least one processor may be configured to control at least one LIDAR light source in a manner enabling light projected from the at least one light source to vary over a plurality of scans of a field of view. The field of view may include a foreground area and a background area. The at least one processor may be further configured to receive from a group of detectors a plurality of input signals indicative of reflections of the projected light from the field of view. A representation of a portion of the field of view associated with a plurality of pixels is constructible from the plurality of input signals. The at least one processor may be further configured to detect a possible existence of an object in the background area based on first input signals associated with a first scanning cycle. An object-existence-certainty level in the first scanning cycle may be below a threshold. The at least one processor may be further configured to detect a possible existence of the object based on second input signals associated with a second scanning cycle. An object-existence-certainty level in the second scanning cycle may be below the threshold. The at least one processor may be further configured to aggregate the first input signals associated with the first scanning cycle and the second input signals associated with the second scanning cycle to detect an existence of the object at an object-existence-certainty level higher than the threshold.

In one embodiment, a vehicle may comprise a body and at least one processor. The at least one processor may be configured to control at least one LIDAR light source in a manner enabling light projected from of the at least one LIDAR light source to vary over a plurality of scans of a field of view. The field of view may include a foreground area and a background area. The at least one processor may be further configured to receive from a group of detectors a plurality of input signals indicative of reflections of the projected light from the field of view. A representation of a portion of the field of view associated with a plurality of pixels may be constructible from the plurality of input signals. The at least one processor may be further configured to detect a possible existence of an object in the background area based on first input signals associated with a first scanning cycle. An object-existence-certainty level in the first scanning cycle may be below a threshold. The at least one processor may be further configured to detect a possible existence of the object based on second input signals associated with a second scanning cycle. An object-existence-certainty level in the second scanning cycle may be below the threshold. The at least one processor may be further configured to use the first input signals associated with the first scanning cycle and the second input signals associated with the second scanning cycle to detect an existence of the object at an object-existence-certainty level higher than the threshold.

In one embodiment, a method for using LIDAR system to detecting objects in a field of view may comprise controlling at least one LIDAR light source in a manner enabling light flux of the at least one LIDAR light source to vary over a plurality of scans of a field of view. The field of view may include a foreground area and a background area. The method may further comprise receiving from a group of detectors a plurality of input signals indicative of reflections of light projected from the field of view. A representation of a portion of the field of view associated with a plurality of pixels may be constructible from the plurality of input signals. The method may further comprise detecting a possible existence of an object in the background area based on first input signals associated with a first scanning cycle. An object-existence-certainty level in the first scanning cycle may be below a threshold. The method may further comprise detecting a possible existence of the object based on second input signals associated with a second scanning cycle. An object-existence-certainty level in the second scanning cycle may be below the threshold. The method may further comprise aggregating the first input signals associated with the first scanning cycle and the second input signals associated with the second scanning cycle to detect an existence of the object at an object-existence-certainty level higher than the threshold.

One aspect of the present disclosure is directed to a LIDAR system, the LIDAR system comprises at least one processor configured to control at least one LIDAR light source for illuminating a field of view, receive from a group of light detectors a plurality of input signals indicative of reflections of light from objects in the field of view, process a first subset of the input signals associated with a first region of the field of view to detect a first object in the first region, wherein processing the first subset is performed individually on each input signal of the first subset of the input signals, process a second subset of the input signals associated with a second region of the field of view to detect at least one second object in the second region, wherein the at least one second object is located at a greater distance from the at least one light source than the first object and wherein processing of the second subset includes processing together input signals of the second subset, and output information indicative of a distance to the first object and information indicative of a distance to the at least one second object.

Another aspect of the present disclosure is directed to vehicle. The vehicle comprises a body and at least one processor within the body and the processor is configured to control at least one light source for illuminating a field of view, receive from a group of detectors a plurality of input signals indicative of reflections of light from objects in the field of view, process a first subset of the input signals associated with a first region of the field of view to detect a first object in the first region, wherein processing the first subset is performed individually on each of the first subset of the input signals, process a second subset of the input signals associated with a second region of the field of view to detect at least one second object in the second region, wherein the at least one second object is located at a greater distance from the at least one light source than the first object and wherein processing of the second subset includes combining input signals of the second subset, and output information associated with a distance to the first object and information associated with a distance to the at least one second object.

Yet another aspect of the present disclosure is directed to a method for using a LIDAR system to determine distances to objects in a field of view, the method comprises controlling at least one light source for illuminating the field of view, receiving from a group of detectors a plurality of input signals indicative of reflections of light from objects in the field of view, processing a first subset of the input signals associated with a first region of the field of view to detect a first object in the first region, wherein processing the first subset is performed individually on each of the first subset of the input signals, processing a second subset of the input signals associated with a second region of the field of view to detect at least one second object in the second region, wherein the at least one second object is located at a greater distance from the light source than the first object and wherein processing of the second subset includes combining input signals of the second subset, and outputting information associated with a distance to the first object and information associated with a distance to the at least one second object.

One aspect of the present disclosure is directed to a LIDAR system for use in a vehicle, the LIDAR system comprises a first housing containing at least one processor configured to control at least one light source in a manner enabling light flux of the at least one light source to vary over a single scan of a field of view, at least one second housing configured for location in the vehicle remote from the first housing, the at least one second housing containing a controllable light deflector configured to deflect light from the at least one light source, and at least one actuator configured to move the light deflector such that during a single scanning cycle the light deflector moves through a plurality of different instantaneous positions in order to scan the field of view, and at least one data conduit configured to interconnect the first housing and the at least one second housing, the data conduit is associated with a forward path from the first housing to the at least one second housing and a return path from the at least one second housing to the first housing, wherein the data conduit is configured to cooperate with the at least one processor and the at least one actuator such that the forward path is enabled to convey control signals for controlling the at least one actuator and the return path is enabled to convey to the at least one processor reflections signals indicative of light reflected from objects in the field of view.

Another aspect of the present disclosure is directed to vehicle. The vehicle comprises a body, a first housing containing at least one processor configured to control at least one light source in a manner enabling light flux of the at least one light source to vary over scans of a field of view, a plurality of second housings configured for location in the vehicle remote from the first housing, the each second housing containing at least one light deflector configured to deflect light from the at least one light source, and at least one actuator configured to move the at least one light deflector such that during a single scanning cycle the light deflector moves through a plurality of different instantaneous positions in order to scan the field of view, and a plurality of data conduits configured to interconnect the first housing with the plurality of second housings, each data conduit being configured to cooperate with the at least one processor and the at least one actuator to enable a forward path from the first housing to each second housing and a return path from each second housing to the first housing, such that the forward path is enabled to convey control signals for controlling the at least one actuator and the return path is enabled to convey to the at least one processor reflections signals indicative of light reflected from objects in the field of view.

In one aspect, a MEMS scanning device may include: a movable MEMS mirror configured to pivot about at least one axis; a plurality of actuators configured to cause pivoting of the movable MEMS mirror about the at least one axis in at least one first direction; a plurality of restraining springs configured to facilitate pivoting of the movable MEMS mirror about the at least one axis in at least one second direction different from the at least one first direction. At least two of the movable MEMS mirror, the number of actuators, and the number of restraining springs may be constructed of at least two differing wafers with mechanical properties that differ from each other. The at least two differing wafers may be directly bonded together to form a unified structure.

In another aspect, a MEMS scanning device may include: a movable MEMS mirror configured to pivot about at least one axis, the movable MEMS mirror being constructed of at least one first wafer; a plurality of actuators configured to cause pivoting of the movable MEMS mirror about the at least one axis in at least one first direction, the plurality of actuators being constructed of at least one second wafer different from the at least one first wafer; a plurality of restraining springs configured to facilitate pivoting of the movable MEMS mirror about the at least one axis in at least one second direction different from the at least one first direction. The plurality of restraining springs may be constructed of at least one third wafer, different from the at least one first wafer and the at least one second wafer. The at least one first wafer, the at least one second wafer, and the at least one third wafer may each have differing mechanical properties and may be bonded together to form a composite structure.

In another aspect, a LIDAR system may include: at least one housing mountable on a vehicle; a light source within the at least one housing configured to project light for illuminating an object in an environment of the vehicle; a scanning unit configured to deflect light from the light source in order to scan at least part of the environment of the vehicle; at least one sensor within the at least one housing configured to detect reflections of the projected light; and at least one processor configured to determine a distance between the vehicle and the object. The scanning unit may include: a movable MEMS mirror configured to pivot about at least one axis; a plurality of actuators configured to cause pivoting of the movable MEMS mirror about the at least one axis in at least one first direction; a plurality of restraining springs configured to facilitate pivoting of the movable MEMS mirror about the at least one axis in a second direction different from the first direction. At least two of: the movable MEMS mirror, the plurality of actuators, and the plurality of restraining springs, may be constructed of at least two differing wafers with mechanical properties that differ from each other. At least two differing wafers may be directly bonded together to form a unified structure.

A MEMS scanning device may include a movable MEMS mirror configured to pivot about at least one axis; at least one actuator operable to rotate the MEMS mirror about the at least one axis, each actuator out of the at least one actuator operable to bend upon actuation to move the MEMS mirror; and at least one flexible interconnect element coupled between the at least one actuator and the MEMS mirror for transferring the pulling force of the bending of the at least one actuator to the MEMS mirror. Each flexible interconnect element out of the at least one interconnect element may include an elongated structure comprising at least two turns at opposing directions, each turn greater than 120°.

A polygon scanner assembly may include an at least-partly transparent tank; an at least-partly transparent fluid, confined within the tank; and a reflective polygon, at least partly immersed in the fluid, the reflective polygon operable to reflect an incidence beam of light arriving from outside the tank to provide a deflected beam of light exiting from the tank outward; wherein a shape of an exterior wall of the tank is not parallel to a shape of an interior wall of the wall in at least a transference part of the wall of the tank through which at least one of the incidence beam and the deflected beam propagates.

Other embodiments may include non-transitory computer-readable media storing instructions that, when executed by at least one processor, cause the at least one processor to execute one or more methods disclosed herein.

BRIEF DESCRIPTION OF THE DRAWINGS

The accompanying drawings, which are incorporated in and constitute a part of this disclosure, illustrate various disclosed embodiments. In the drawings:

FIGS. 2A-2G are diagrams illustrating different configurations of projecting units in accordance with some embodiments of the present disclosure.

FIG. 6D is a diagram illustrating a second example implementation consistent with some embodiments of the present disclosure.

FIG. 8D includes a diagrammatic representation of light intensity of the spot shown in FIG. 8C taken across the line A-A of FIG. 8C.

FIG. 8E diagrammatically illustrates light components incident upon sensors 806 and 808.

DETAILED DESCRIPTION

Figure 1A:
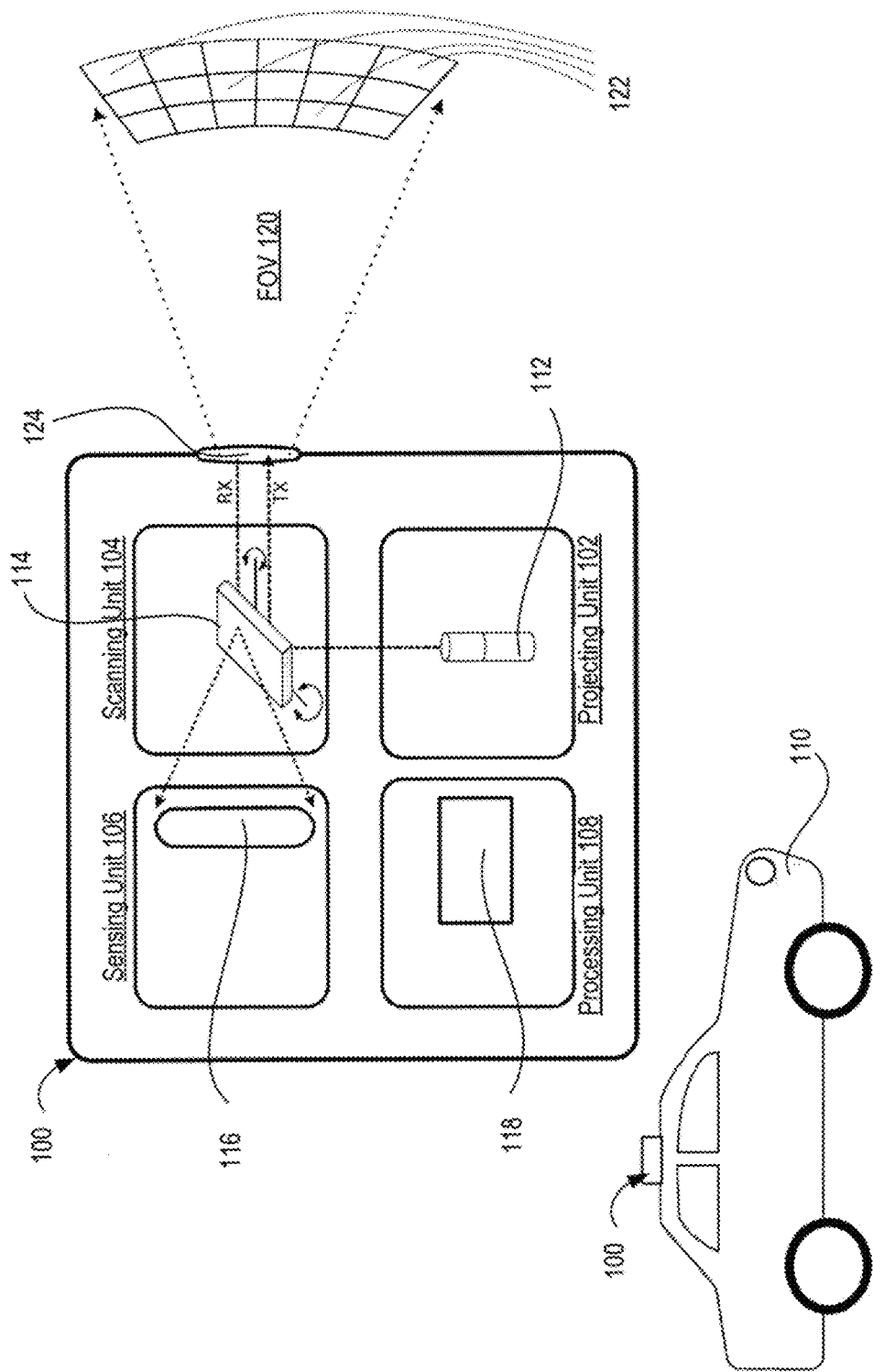
FIG. 1A is a diagram illustrating an exemplary LIDAR system consistent with disclosed embodiments.

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions or modifications may be made to the components illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope is defined by the appended claims.

Terms Definitions

Disclosed embodiments may involve an optical system. As used herein, the term "optical system" broadly includes any system that is used for the generation, detection and/or manipulation of light. By way of example only, an optical system may include one or more optical components for generating, detecting and/or manipulating light. For example, light sources, lenses, mirrors, prisms, beam splitters, collimators, polarizing optics, optical modulators, optical switches, optical amplifiers, optical detectors, optical sensors, fiber optics, semiconductor optic components, while each not necessarily required, may each be part of an optical system. In addition to the one or more optical components, an optical system may also include other non-optical components such as electrical components, mechanical components, chemical reaction components, and semiconductor components. The non-optical components may cooperate with optical components of the optical system. For example, the optical system may include at least one processor for analyzing detected light.

Consistent with the present disclosure, the optical system may be a LIDAR system. As used herein, the term "LIDAR system" broadly includes any system which can determine values of parameters indicative of a distance between a pair of tangible objects based on reflected light. In one embodiment, the LIDAR system may determine a distance between a pair of tangible objects based on reflections of light emitted by the LIDAR system. As used herein, the term "determine distances" broadly includes generating outputs which are indicative of distances between pairs of tangible objects. The determined distance may represent the physical dimension between a pair of tangible objects. By way of example only, the determined distance may include a line of flight distance between the LIDAR system and another tangible object in a field of view of the LIDAR system. In another embodiment, the LIDAR system may determine the relative velocity between a pair of tangible objects based on reflections of light emitted by the LIDAR system. Examples of outputs indicative of the distance between a pair of tangible objects include: a number of standard length units between the tangible objects (e.g. number of meters, number of inches, number of kilometers, number of millimeters), a number of arbitrary length units (e.g. number of LIDAR system lengths), a ratio between the distance to another length (e.g. a ratio to a length of an object detected in a field of view of the LIDAR system), an amount of time (e.g. given as standard unit, arbitrary units or ratio, for example, the time it takes light to travel between the tangible objects), one or more locations (e.g. specified using an agreed coordinate system, specified in relation to a known location), and more.

The LIDAR system may determine the distance between a pair of tangible objects based on reflected light. In one embodiment, the LIDAR system may process detection results of a sensor which creates temporal information indicative of a period of time between the emission of a light signal and the time of its detection by the sensor. The period of time is occasionally referred to as "time of flight" of the light signal. In one example, the light signal may be a short pulse, whose rise and/or fall time may be detected in reception. Using known information about the speed of light in the relevant medium (usually air), the information regarding the time of flight of the light signal can be processed to provide the distance the light signal traveled between emission and detection. In another embodiment, the LIDAR system may determine the distance based on frequency phase-shift (or multiple frequency phase-shift). Specifically, the LIDAR system may process information indicative of one or more modulation phase shifts (e.g. by solving some simultaneous equations to give a final measure) of the light signal. For example, the emitted optical signal may be modulated with one or more constant frequencies. The at least one phase shift of the modulation between the emitted signal and the detected reflection may be indicative of the distance the light traveled between emission and detection. The modulation may be applied to a continuous wave light signal, to a quasi-continuous wave light signal, or to another type of emitted light signal. It is noted that additional information may be used by the LIDAR system for determining the distance, e.g. location information (e.g. relative positions) between the projection location, the detection location of the signal (especially if distanced from one another), and more.

In some embodiments, the LIDAR system may be used for detecting a plurality of objects in an environment of the LIDAR system. The term "detecting an object in an environment of the LIDAR system" broadly includes generating information which is indicative of an object that reflected light toward a detector associated with the LIDAR system. If more than one object is detected by the LIDAR system, the generated information pertaining to different objects may be interconnected, for example a car is driving on a road, a bird is sitting on the tree, a man touches a bicycle, a van moves towards a building. The dimensions of the environment in which the LIDAR system detects objects may vary with respect to implementation. For example, the LIDAR system may be used for detecting a plurality of objects in an environment of a vehicle on which the LIDAR system is installed, up to a horizontal distance of 100 m (or 200 m, 300 m, etc.), and up to a vertical distance of 10 m (or 25 m, 50 m, etc.). In another example, the LIDAR system may be used for detecting a plurality of objects in an environment of a vehicle or within a predefined horizontal range (e.g., 25°, 50°, 100°, 180°, etc.), and up to a predefined vertical elevation (e.g., ±10°, ±20°, ±40°-20°, ±90° or 0°-90°).

As used herein, the term "detecting an object" may broadly refer to determining an existence of the object (e.g., an object may exist in a certain direction with respect to the LIDAR system and/or to another reference location, or an object may exist in a certain spatial volume). Additionally or alternatively, the term "detecting an object" may refer to determining a distance between the object and another location (e.g. a location of the LIDAR system, a location on earth, or a location of another object). Additionally or alternatively, the term "detecting an object" may refer to identifying the object (e.g. classifying a type of object such as car, plant, tree, road; recognizing a specific object (e.g., the Washington Monument); determining a license plate number; determining a composition of an object (e.g., solid, liquid, transparent, semitransparent); determining a kinematic parameter of an object (e.g., whether it is moving, its velocity, its movement direction, expansion of the object). Additionally or alternatively, the term "detecting an object" may refer to generating a point cloud map in which every point of one or more points of the point cloud map correspond to a location in the object or a location on a face thereof. In one embodiment, the data resolution associated with the point cloud map representation of the field of view may be associated with 0.1°×0.1° or 0.3°×0.3° of the field of view.

Consistent with the present disclosure, the term "object" broadly includes a finite composition of matter that may reflect light from at least a portion thereof. For example, an object may be at least partially solid (e.g. cars, trees); at least partially liquid (e.g. puddles on the road, rain); at least partly gaseous (e.g. fumes, clouds); made from a multitude of distinct particles (e.g. sand storm, fog, spray); and may be of one or more scales of magnitude, such as ~1 millimeter (mm), ~5 mm, ~10 mm, ~50 mm, ~100 mm, ~500 mm, ~1 meter (m), ~5 m, ~10 m, ~50 m, ~100 m, and so on. Smaller or larger objects, as well as any size in between those examples, may also be detected. It is noted that for various reasons, the LIDAR system may detect only part of the object. For example, in some cases, light may be reflected from only some sides of the object (e.g., only the side opposing the LIDAR system will be detected); in other cases, light may be projected on only part of the object (e.g. laser beam projected onto a road or a building); in other cases, the object may be partly blocked by another object between the LIDAR system and the detected object; in other cases, the LIDAR's sensor may only detects light reflected from a portion of the object, e.g., because ambient light or other interferences interfere with detection of some portions of the object.

Consistent with the present disclosure, a LIDAR system may be configured to detect objects by scanning the environment of LIDAR system. The term "scanning the environment of LIDAR system" broadly includes illuminating the field of view or a portion of the field of view of the LIDAR system. In one example, scanning the environment of LIDAR system may be achieved by moving or pivoting a light deflector to deflect light in differing directions toward different parts of the field of view. In another example, scanning the environment of LIDAR system may be achieved by changing a positioning (i.e. location and/or orientation) of a sensor with respect to the field of view. In another example, scanning the environment of LIDAR system may be achieved by changing a positioning (i.e. location and/or orientation) of a light source with respect to the field of view. In yet another example, scanning the environment of LIDAR system may be achieved by changing the positions of at least one light source and of at least one sensor to move rigidly respect to the field of view (i.e. the relative distance and orientation of the at least one sensor and of the at least one light source remains).

As used herein the term "field of view of the LIDAR system" may broadly include an extent of the observable environment of LIDAR system in which objects may be detected. It is noted that the field of view (FOV) of the LIDAR system may be affected by various conditions such as but not limited to: an orientation of the LIDAR system (e.g. is the direction of an optical axis of the LIDAR system); a position of the LIDAR system with respect to the environment (e.g. distance above ground and adjacent topography and obstacles); operational parameters of the LIDAR system (e.g. emission power, computational settings, defined angles of operation), etc. The field of view of LIDAR system may be defined, for example, by a solid angle (e.g. defined using $\phi$, $\theta$ angles, in which $\phi$ and $\theta$ are angles defined in perpendicular planes, e.g. with respect to symmetry axes of the LIDAR system and/or its FOV). In one example, the field of view may also be defined within a certain range (e.g. up to 200 m).

Similarly, the term "instantaneous field of view" may broadly include an extent of the observable environment in which objects may be detected by the LIDAR system at any given moment. For example, for a scanning LIDAR system, the instantaneous field of view is narrower than the entire FOV of the LIDAR system, and it can be moved within the FOV of the LIDAR system in order to enable detection in other parts of the FOV of the LIDAR system. The movement of the instantaneous field of view within the FOV of the LIDAR system may be achieved by moving a light deflector of the LIDAR system (or external to the LIDAR system), so as to deflect beams of light to and/or from the LIDAR system in differing directions. In one embodiment, LIDAR system may be configured to scan scene in the environment in which the LIDAR system is operating. As used herein the term "scene" may broadly include some or all of the objects within the field of view of the LIDAR system, in their relative positions and in their current states, within an operational duration of the LIDAR system. For example, the scene may include ground elements (e.g. earth, roads, grass, sidewalks, road surface marking), sky, man-made objects (e.g. vehicles, buildings, signs), vegetation, people, animals, light projecting elements (e.g. flashlights, sun, other LIDAR systems), and so on.

Disclosed embodiments may involve obtaining information for use in generating reconstructed three-dimensional models. Examples of types of reconstructed three-dimensional models which may be used include point cloud models, and Polygon Mesh (e.g. a triangle mesh). The terms "point cloud" and "point cloud model" are widely known in the art, and should be construed to include a set of data points located spatially in some coordinate system (i.e., having an identifiable location in a space described by a respective coordinate system). The term "point cloud point" refer to a point in space (which may be dimensionless, or a miniature cellular space, e.g. 1 cm3), and whose location may be described by the point cloud model using a set of coordinates (e.g. (X, Y, Z), (r, φ, θ)). By way of example only, the point cloud model may store additional information for some or all of its points (e.g. color information for points generated from camera images). Likewise, any other type of reconstructed three-dimensional model may store additional information for some or all of its objects. Similarly, the terms "polygon mesh" and "triangle mesh" are widely known in the art, and are to be construed to include, among other things, a set of vertices, edges and faces that define the shape of one or more 3D objects (such as a polyhedral object). The faces may include one or more of the following: triangles (triangle mesh), quadrilaterals, or other simple convex polygons, since this may simplify rendering. The faces may also include more general concave polygons, or polygons with holes. Polygon meshes may be represented using differing techniques, such as: Vertex-vertex meshes, Face-vertex meshes, Winged-edge meshes and Render dynamic meshes. Different portions of the polygon mesh (e.g., vertex, face, edge) are located spatially in some coordinate system (i.e., having an identifiable location in a space described by the respective coordinate system), either directly and/or relative to one another. The generation of the reconstructed three-dimensional model may be implemented using any standard, dedicated and/or novel photogrammetry technique, many of which are known in the art. It is noted that other types of models of the environment may be generated by the LIDAR system.

Consistent with disclosed embodiments, the LIDAR system may include at least one projecting unit with a light source configured to project light. As used herein the term "light source" broadly refers to any device configured to emit light. In one embodiment, the light source may be a laser such as a solid-state laser, laser diode, a high power laser, or an alternative light source such as, a light emitting diode (LED)-based light source. In addition, light source 112 as illustrated throughout the figures, may emit light in differing formats, such as light pulses, continuous wave (CW), quasi-CW, and so on. For example, one type of light source that may be used is a vertical-cavity surface-emitting laser (VCSEL). Another type of light source that may be used is an external cavity diode laser (ECDL). In some examples, the light source may include a laser diode configured to emit light at a wavelength between about 650 nm and 1150 nm. Alternatively, the light source may include a laser diode configured to emit light at a wavelength between about 800 nm and about 1000 nm, between about 850 nm and about 950 nm, or between about 1300 nm and about 1600 nm. Unless indicated otherwise, the term "about" with regards to a numeric value is defined as a variance of up to 5% with respect to the stated value. Additional details on the projecting unit and the at least one light source are described below with reference to FIGS. 2A-2C.

Consistent with disclosed embodiments, the LIDAR system may include at least one scanning unit with at least one light deflector configured to deflect light from the light source in order to scan the field of view. The term "light deflector" broadly includes any mechanism or module which is configured to make light deviate from its original path; for example, a mirror, a prism, controllable lens, a mechanical mirror, mechanical scanning polygons, active diffraction (e.g. controllable LCD), Risley prisms, non-mechanical-electro-optical beam steering (such as made by Vscent), polarization grating (such as offered by Boulder Non-Linear Systems), optical phased array (OPA), and more. In one embodiment, a light deflector may include a plurality of optical components, such as at least one reflecting element (e.g. a mirror), at least one refracting element (e.g. a prism, a lens), and so on. In one example, the light deflector may be movable, to cause light deviate to differing degrees (e.g. discrete degrees, or over a continuous span of degrees). The light deflector may optionally be controllable in different ways (e.g. deflect to a degree u, change deflection angle by Δu, move a component of the light deflector by M millimeters, change speed in which the deflection angle changes). In addition, the light deflector may optionally be operable to change an angle of deflection within a single plane (e.g., θ coordinate). The light deflector may optionally be operable to change an angle of deflection within two non-parallel planes (e.g., θ and φ coordinates). Alternatively or in addition, the light deflector may optionally be operable to change an angle of deflection between predetermined settings (e.g. along a predefined scanning route) or otherwise. With respect the use of light deflectors in LIDAR systems, it is noted that a light deflector may be used in the outbound direction (also referred to as transmission direction, or TX) to deflect light from the light source to at least a part of the field of view. However, a light deflector may also be used in the inbound direction (also referred to as reception direction, or RX) to deflect light from at least a part of the field of view to one or more light sensors. Additional details on the scanning unit and the at least one light deflector are described below with reference to FIGS. 3A-3C.

Disclosed embodiments may involve pivoting the light deflector in order to scan the field of view. As used herein the term "pivoting" broadly includes rotating of an object (especially a solid object) about one or more axis of rotation, while substantially maintaining a center of rotation fixed. In one embodiment, the pivoting of the light deflector may include rotation of the light deflector about a fixed axis (e.g., a shaft), but this is not necessarily so. For example, in some MEMS mirror implementation, the MEMS mirror may move by actuation of a plurality of benders connected to the mirror, the mirror may experience some spatial translation in addition to rotation. Nevertheless, such mirror may be designed to rotate about a substantially fixed axis, and therefore consistent with the present disclosure it considered to be pivoted. In other embodiments, some types of light deflectors (e.g. non-mechanical-electro-optical beam steering, OPA) do not require any moving components or internal movements in order to change the deflection angles of deflected light. It is noted that any discussion relating to moving or pivoting a light deflector is also mutatis mutandis applicable to controlling the light deflector such that it changes a deflection behavior of the light deflector. For example, controlling the light deflector may cause a change in a deflection angle of beams of light arriving from at least one direction.

Disclosed embodiments may involve receiving reflections associated with a portion of the field of view corresponding to a single instantaneous position of the light deflector. As used herein, the term "instantaneous position of the light deflector" (also referred to as "state of the light deflector") broadly refers to the location or position in space where at least one controlled component of the light deflector is situated at an instantaneous point in time, or over a short span of time. In one embodiment, the instantaneous position of light deflector may be gauged with respect to a frame of reference. The frame of reference may pertain to at least one fixed point in the LIDAR system. Or, for example, the frame of reference may pertain to at least one fixed point in the scene. In some embodiments, the instantaneous position of the light deflector may include some movement of one or more components of the light deflector (e.g. mirror, prism), usually to a limited degree with respect to the maximal degree of change during a scanning of the field of view. For example, a scanning of the entire the field of view of the LIDAR system may include changing deflection of light over a span of 30°, and the instantaneous position of the at least one light deflector may include angular shifts of the light deflector within 0.05°. In other embodiments, the term "instantaneous position of the light deflector" may refer to the positions of the light deflector during acquisition of light which is processed to provide data for a single point of a point cloud (or another type of 3D model) generated by the LIDAR system. In some embodiments, an instantaneous position of the light deflector may correspond with a fixed position or orientation in which the deflector pauses for a short time during illumination of a particular sub-region of the LIDAR field of view. In other cases, an instantaneous position of the light deflector may correspond with a certain position/orientation along a scanned range of positions/orientations of the light deflector that the light deflector passes through as part of a continuous or semi-continuous scan of the LIDAR field of view. In some embodiments, the light deflector may be moved such that during a scanning cycle of the LIDAR FOV the light deflector is located at a plurality of different instantaneous positions. In other words, during the period of time in which a scanning cycle occurs, the deflector may be moved through a series of different instantaneous positions/orientations, and the deflector may reach each different instantaneous position/orientation at a different time during the scanning cycle.

Consistent with disclosed embodiments, the LIDAR system may include at least one sensing unit with at least one sensor configured to detect reflections from objects in the field of view. The term "sensor" broadly includes any device, element, or system capable of measuring properties (e.g., power, frequency, phase, pulse timing, pulse duration) of electromagnetic waves and to generate an output relating to the measured properties. In some embodiments, the at least one sensor may include a plurality of detectors constructed from a plurality of detecting elements. The at least one sensor may include light sensors of one or more types. It is noted that the at least one sensor may include multiple sensors of the same type which may differ in other characteristics (e.g., sensitivity, size). Other types of sensors may also be used. Combinations of several types of sensors can be used for different reasons, such as improving detection over a span of ranges (especially in close range); improving the dynamic range of the sensor; improving the temporal response of the sensor; and improving detection in varying environmental conditions (e.g. atmospheric temperature, rain, etc.).

In one embodiment, the at least one sensor includes a SiPM (Silicon photomultipliers) which is a solid-state single-photon-sensitive device built from an array of avalanche photodiode (APD), single photon avalanche diode (SPAD), serving as detection elements on a common silicon substrate. In one example, a typical distance between SPADs may be between about 10 μm and about 50 μm, wherein each SPAD may have a recovery time of between about 20 ns and about 100 ns. Similar photomultipliers from other, non-silicon materials may also be used. Although a SiPM device works in digital/switching mode, the SiPM is an analog device because all the microcells may be read in parallel, making it possible to generate signals within a dynamic range from a single photon to hundreds and thousands of photons detected by the different SPADs. It is noted that outputs from different types of sensors (e.g., SPAD, APD, SiPM, PIN diode, Photodetector) may be combined together to a single output which may be processed by a processor of the LIDAR system. Additional details on the sensing unit and the at least one sensor are described below with reference to FIGS. 4A-4C.

Consistent with disclosed embodiments, the LIDAR system may include or communicate with at least one processor configured to execute differing functions. The at least one processor may constitute any physical device having an electric circuit that performs a logic operation on input or inputs. For example, the at least one processor may include one or more integrated circuits (IC), including Application-specific integrated circuit (ASIC), microchips, microcontrollers, microprocessors, all or part of a central processing unit (CPU), graphics processing unit (GPU), digital signal processor (DSP), field-programmable gate array (FPGA), or other circuits suitable for executing instructions or performing logic operations. The instructions executed by at least one processor may, for example, be pre-loaded into a memory integrated with or embedded into the controller or may be stored in a separate memory. The memory may comprise a Random Access Memory (RAM), a Read-Only Memory (ROM), a hard disk, an optical disk, a magnetic medium, a flash memory, other permanent, fixed, or volatile memory, or any other mechanism capable of storing instructions. In some embodiments, the memory is configured to store information representative data about objects in the environment of the LIDAR system. In some embodiments, the at least one processor may include more than one processor. Each processor may have a similar construction or the processors may be of differing constructions that are electrically connected or disconnected from each other. For example, the processors may be separate circuits or integrated in a single circuit. When more than one processor is used, the processors may be configured to operate independently or collaboratively. The processors may be coupled electrically, magnetically, optically, acoustically, mechanically or by other means that permit them to interact. Additional details on the processing unit and the at least one processor are described below with reference to FIGS. 5A-5C.

System Overview

FIG. 1A illustrates a LIDAR system 100 including a projecting unit 102, a scanning unit 104, a sensing unit 106, and a processing unit 108. LIDAR system 100 may be mountable on a vehicle 110. Consistent with embodiments of the present disclosure, projecting unit 102 may include at least one light source 112, scanning unit 104 may include at least one light deflector 114, sensing unit 106 may include at least one sensor 116, and processing unit 108 may include at least one processor 118. In one embodiment, at least one processor 118 may be configured to coordinate operation of the at least one light source 112 with the movement of at least one light deflector 114 in order to scan a field of view 120. During a scanning cycle, each instantaneous position of at least one light deflector 114 may be associated with a particular portion 122 of field of view 120. In addition, LIDAR system 100 may include at least one optional optical window 124 for directing light projected towards field of view 120 and/or receiving light reflected from objects in field of view 120. Optional optical window 124 may serve different purposes, such as collimation of the projected light and focusing of the reflected light. In one embodiment, optional optical window 124 may be an opening, a flat window, a lens, or any other type of optical window.

Consistent with the present disclosure, LIDAR system 100 may be used in autonomous or semi-autonomous road-vehicles (for example, cars, buses, vans, trucks and any other terrestrial vehicle). Autonomous road-vehicles with LIDAR system 100 may scan their environment and drive to a destination vehicle without human input. Similarly, LIDAR system 100 may also be used in autonomous/semi-autonomous aerial-vehicles (for example, UAV, drones, quadcopters, and any other airborne vehicle or device); or in an autonomous or semi-autonomous water vessel (e.g., boat, ship, submarine, or any other watercraft). Autonomous aerial-vehicles and water craft with LIDAR system 100 may scan their environment and navigate to a destination autonomously or using a remote human operator. According to one embodiment, vehicle 110 (either a road-vehicle, aerial-vehicle, or watercraft) may use LIDAR system 100 to aid in detecting and scanning the environment in which vehicle 110 is operating.

It should be noted that LIDAR system 100 or any of its components may be used together with any of the example embodiments and methods disclosed herein. Further, while some aspects of LIDAR system 100 are described relative to an exemplary vehicle-based LIDAR platform, LIDAR system 100, any of its components, or any of the processes described herein may be applicable to LIDAR systems of other platform types.

In some embodiments, LIDAR system 100 may include one or more scanning units 104 to scan the environment around vehicle 110. LIDAR system 100 may be attached or mounted to any part of vehicle 110. Sensing unit 106 may receive reflections from the surroundings of vehicle 110, and transfer reflections signals indicative of light reflected from objects in field of view 120 to processing unit 108. Consistent with the present disclosure, scanning units 104 may be mounted to or incorporated into a bumper, a fender, a side panel, a spoiler, a roof, a headlight assembly, a taillight assembly, a rear-view mirror assembly, a hood, a trunk or any other suitable part of vehicle 110 capable of housing at least a portion of the LIDAR system. In some cases, LIDAR system 100 may capture a complete surround view of the environment of vehicle 110. Thus, LIDAR system 100 may have a 360-degree horizontal field of view. In one example, as shown in FIG. 1A, LIDAR system 100 may include a single scanning unit 104 mounted on a roof vehicle 110. Alternatively, LIDAR system 100 may include multiple scanning units (e.g., two, three, four, or more scanning units 104) each with a field of few such that in the aggregate the horizontal field of view is covered by a 360-degree scan around vehicle 110. One skilled in the art will appreciate that LIDAR system 100 may include any number of scanning units 104 arranged in any manner, each with an 80° to 120° field of view or less, depending on the number of units employed. Moreover, a 360-degree horizontal field of view may be also obtained by mounting a multiple LIDAR systems 100 on vehicle 110, each with a single scanning unit 104. It is nevertheless noted, that the one or more LIDAR systems 100 do not have to provide a complete 360° field of view, and that narrower fields of view may be useful in some situations. For example, vehicle 110 may require a first LIDAR system 100 having an field of view of 75° looking ahead of the vehicle, and possibly a second LIDAR system 100 with a similar FOV looking backward (optionally with a lower detection range). It is also noted that different vertical field of view angles may also be implemented.

Figure 1B:
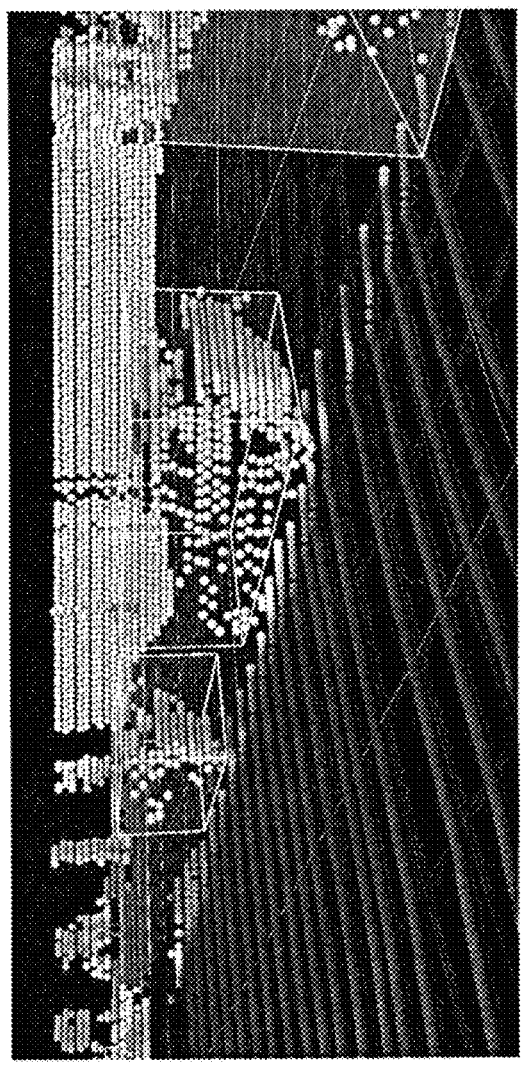
FIG. 1B is an image showing an exemplary output of single scanning cycle of a LIDAR system mounted on a vehicle consistent with disclosed embodiments.

FIG. 1B is an image showing an exemplary output from a single scanning cycle of LIDAR system 100 mounted on vehicle 110 consistent with disclosed embodiments. In this example, scanning unit 104 is incorporated into a right headlight assembly of vehicle 110. Every gray dot in the image corresponds to a location in the environment around vehicle 110 determined from reflections detected by sensing unit 106. In addition to location, each gray dot may also be associated with different types of information, for example, intensity (e.g., how much light returns back from that location), reflectivity, proximity to other dots, and more. In one embodiment, LIDAR system 100 may generate a plurality of point-cloud data entries from detected reflections of multiple scanning cycles of the field of view to enable, for example, determining a point cloud model of the environment around vehicle 110.

Figure 1C:
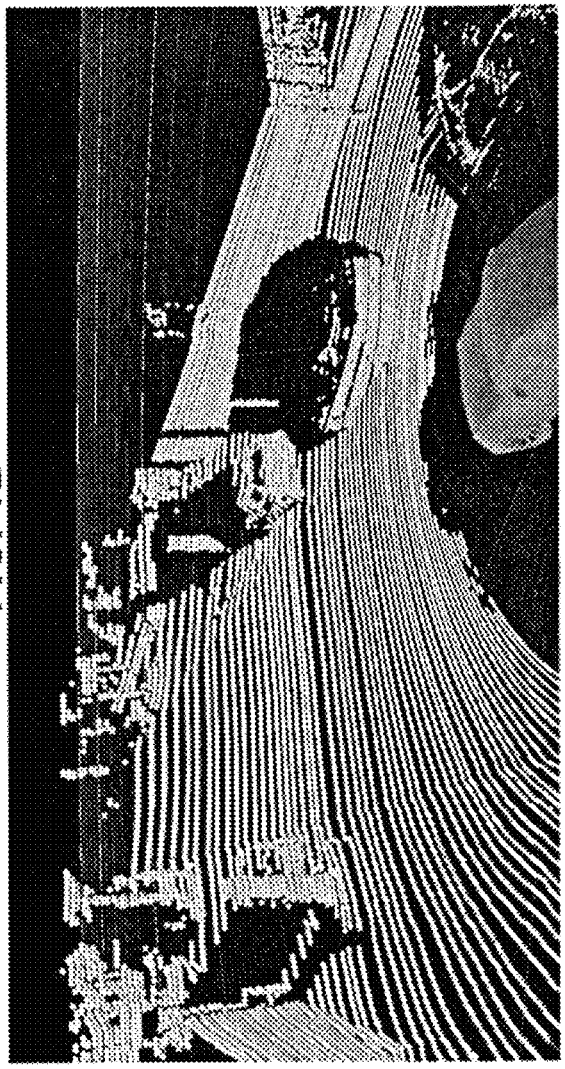
FIG. 1C is another image showing a representation of a point cloud model determined from output of a LIDAR system consistent with disclosed embodiments.

FIG. 1C is an image showing a representation of the point cloud model determined from the output of LIDAR system 100. Consistent with disclosed embodiments, by processing the generated point-cloud data entries of the environment around vehicle 110, a surround-view image may be produced from the point cloud model. In one embodiment, the point cloud model may be provided to a feature extraction module, which processes the point cloud information to identify a plurality of features. Each feature may include data about different aspects of the point cloud and/or of objects in the environment around vehicle 110 (e.g. cars, trees, people, and roads). Features may have the same resolution of the point cloud model (i.e. having the same number of data points, optionally arranged into similar sized 2D arrays), or may have different resolutions. The features may be stored in any kind of data structure (e.g. raster, vector, 2D array, 1D array). In addition, virtual features, such as a representation of vehicle 110, border lines, or bounding boxes separating regions or objects in the image (e.g., as depicted in FIG. 1B), and icons representing one or more identified objects, may be overlaid on the representation of the point cloud model to form the final surround-view image. For example, a symbol of vehicle 110 may be overlaid at a center of the surround-view image.

The Projecting Unit

Figure 2B:
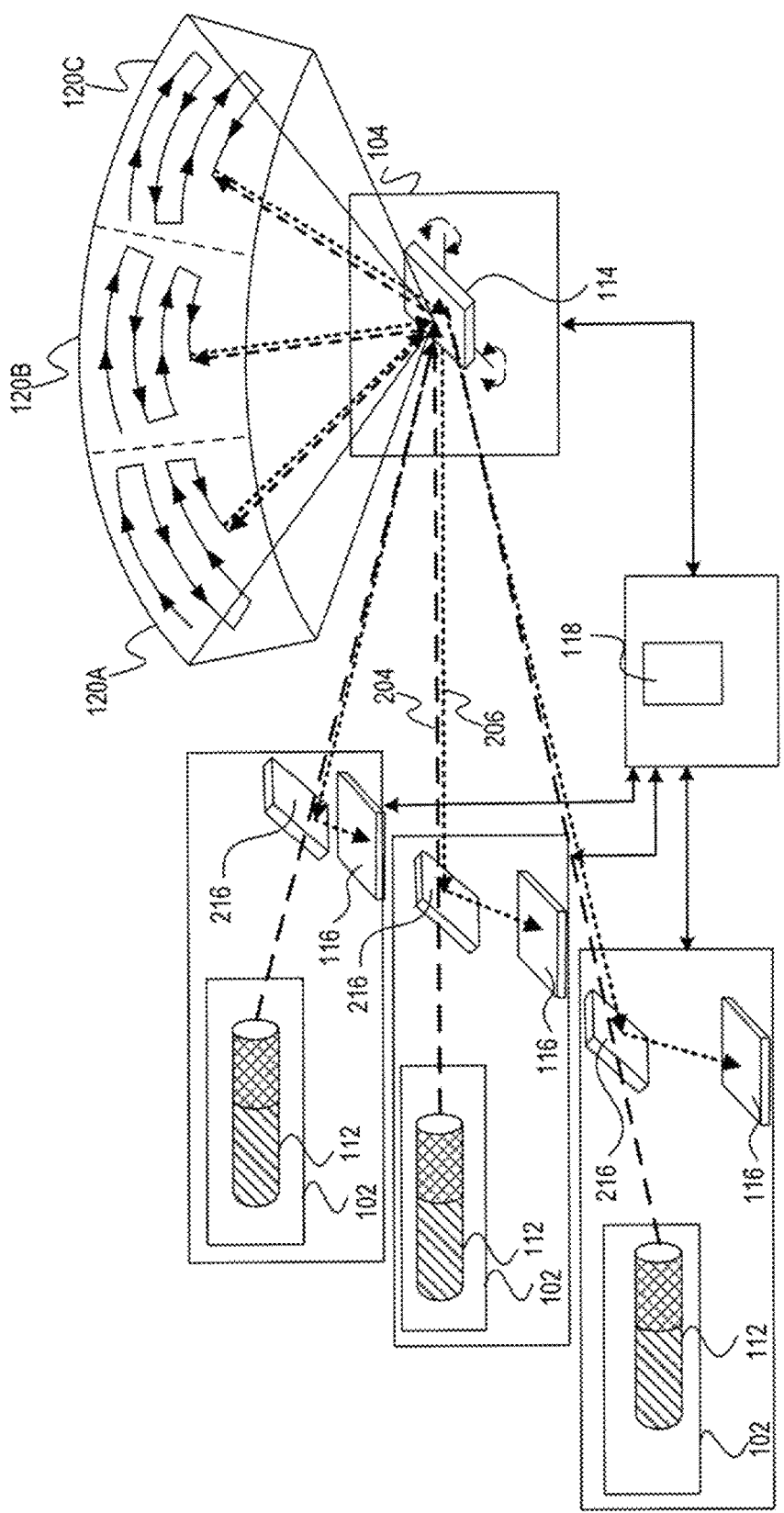
Figure 2C:
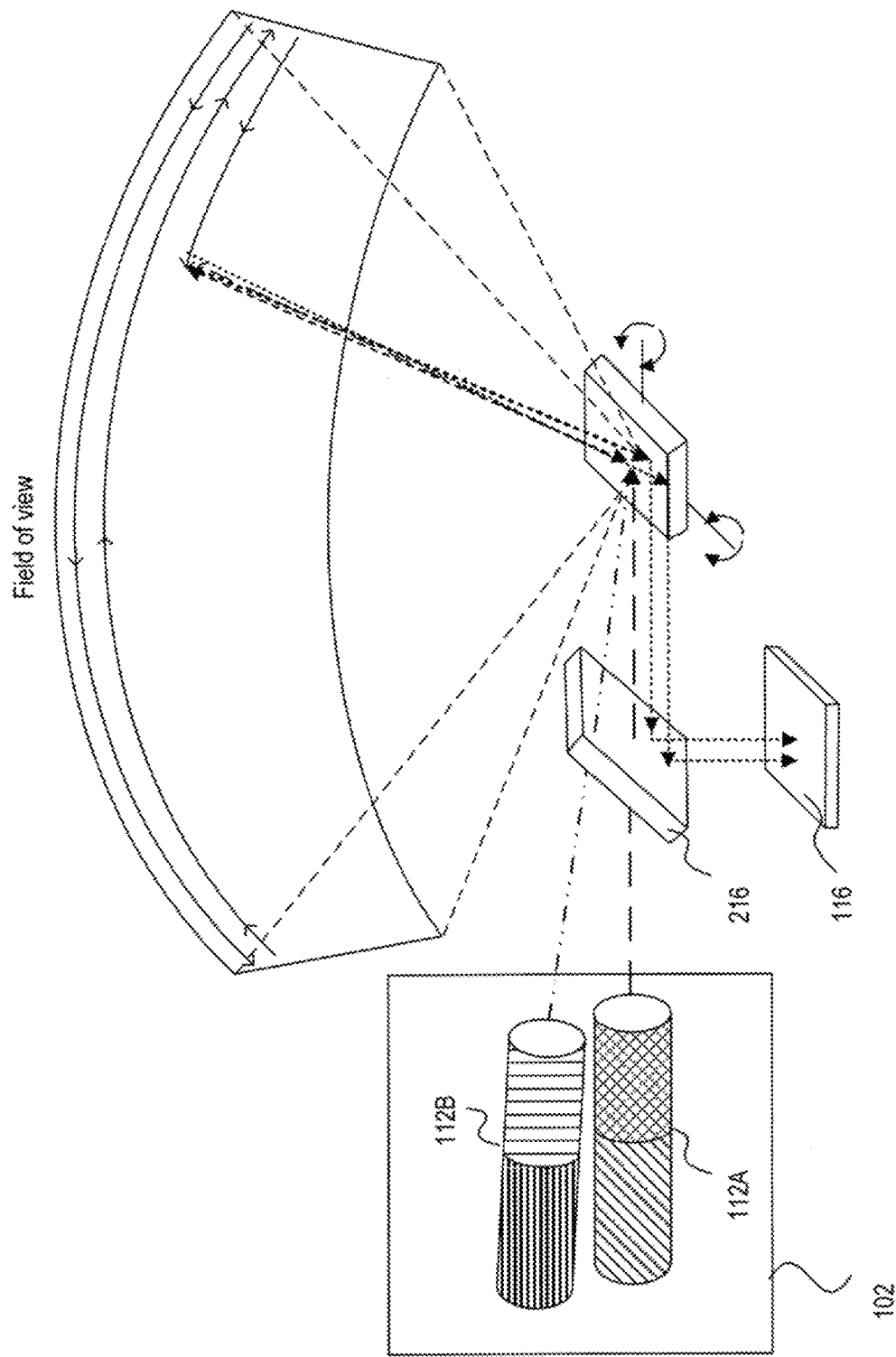
Figure 2D:
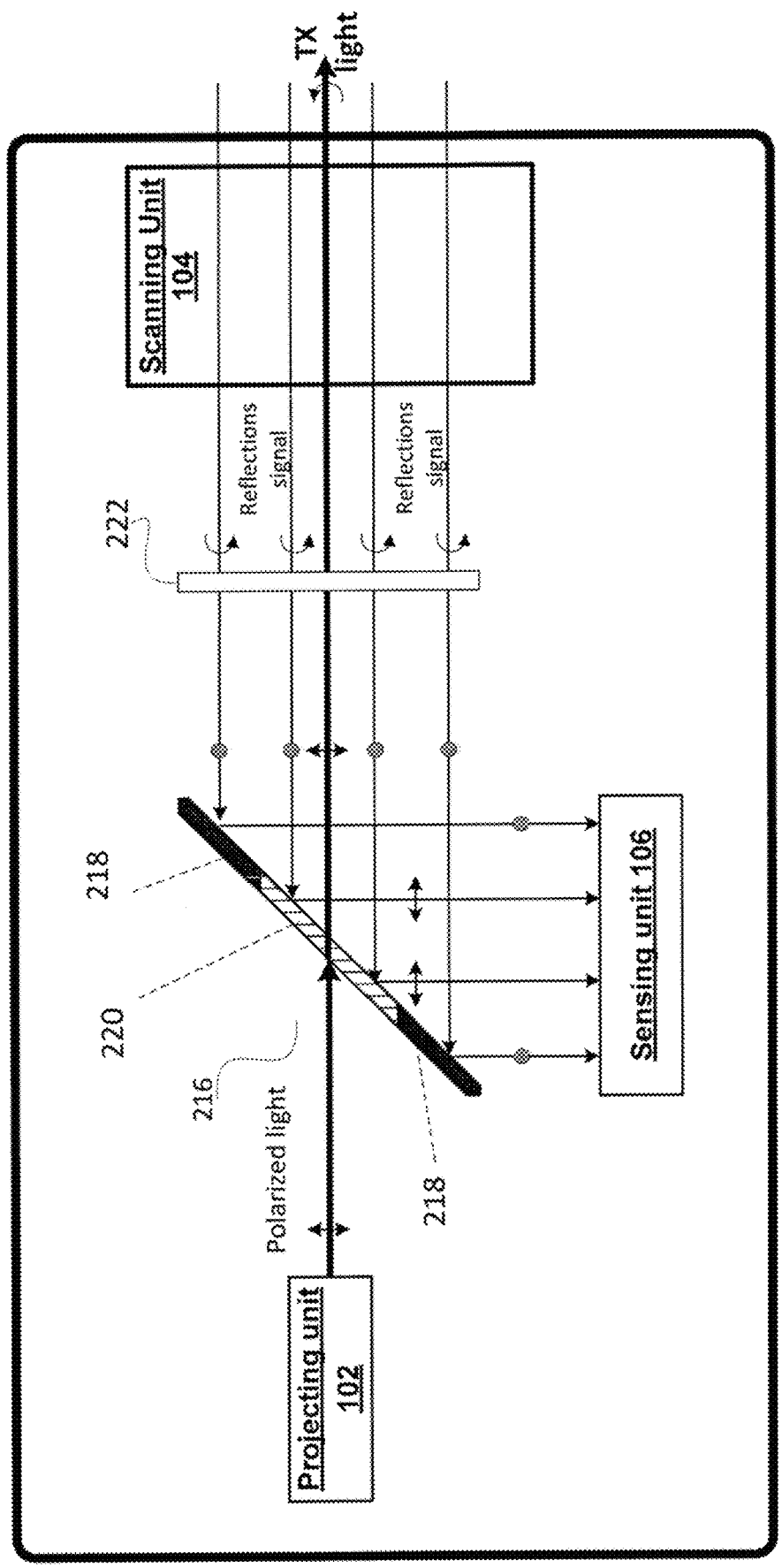
Figure 2E:
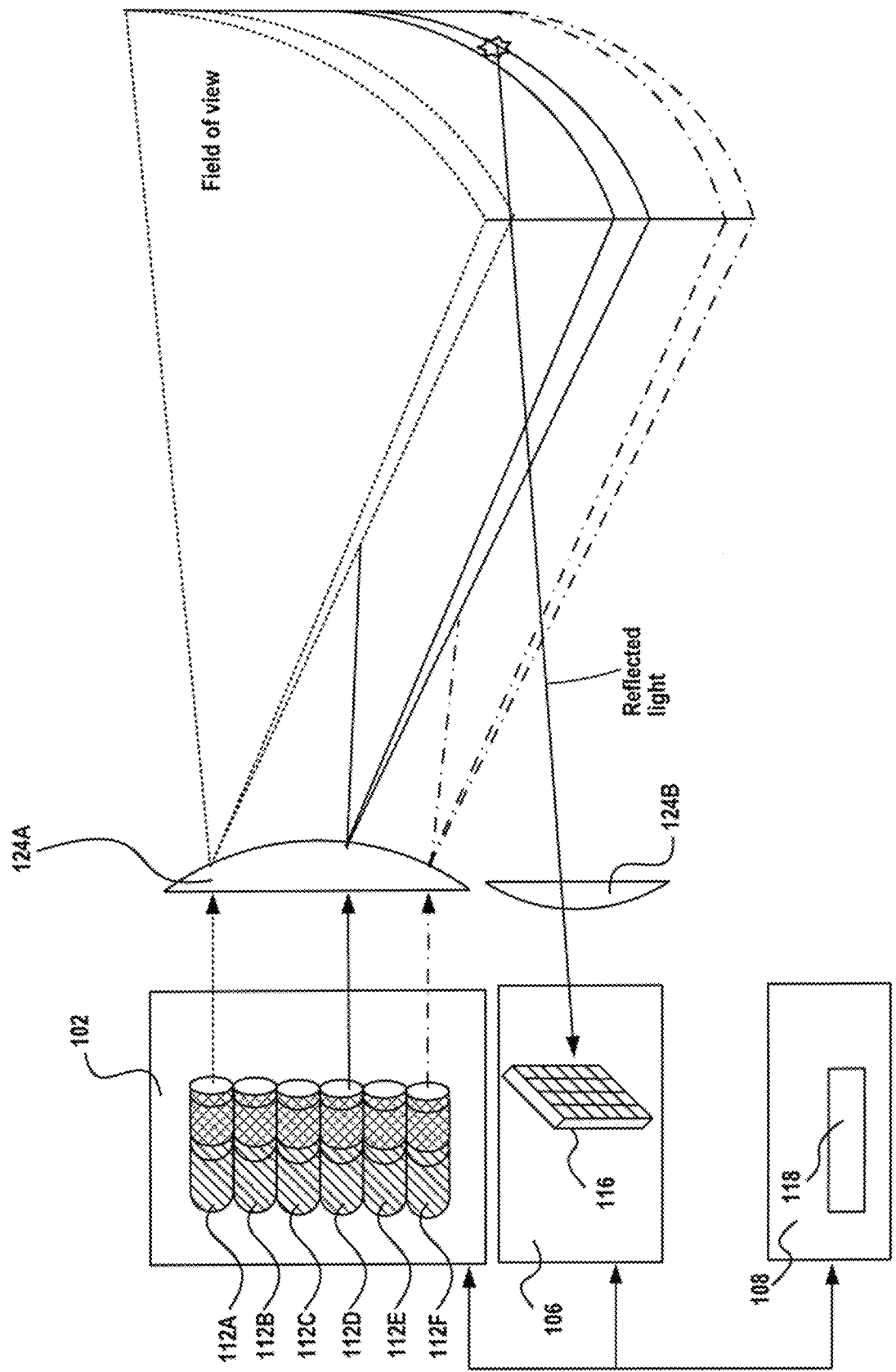
Figure 2F:
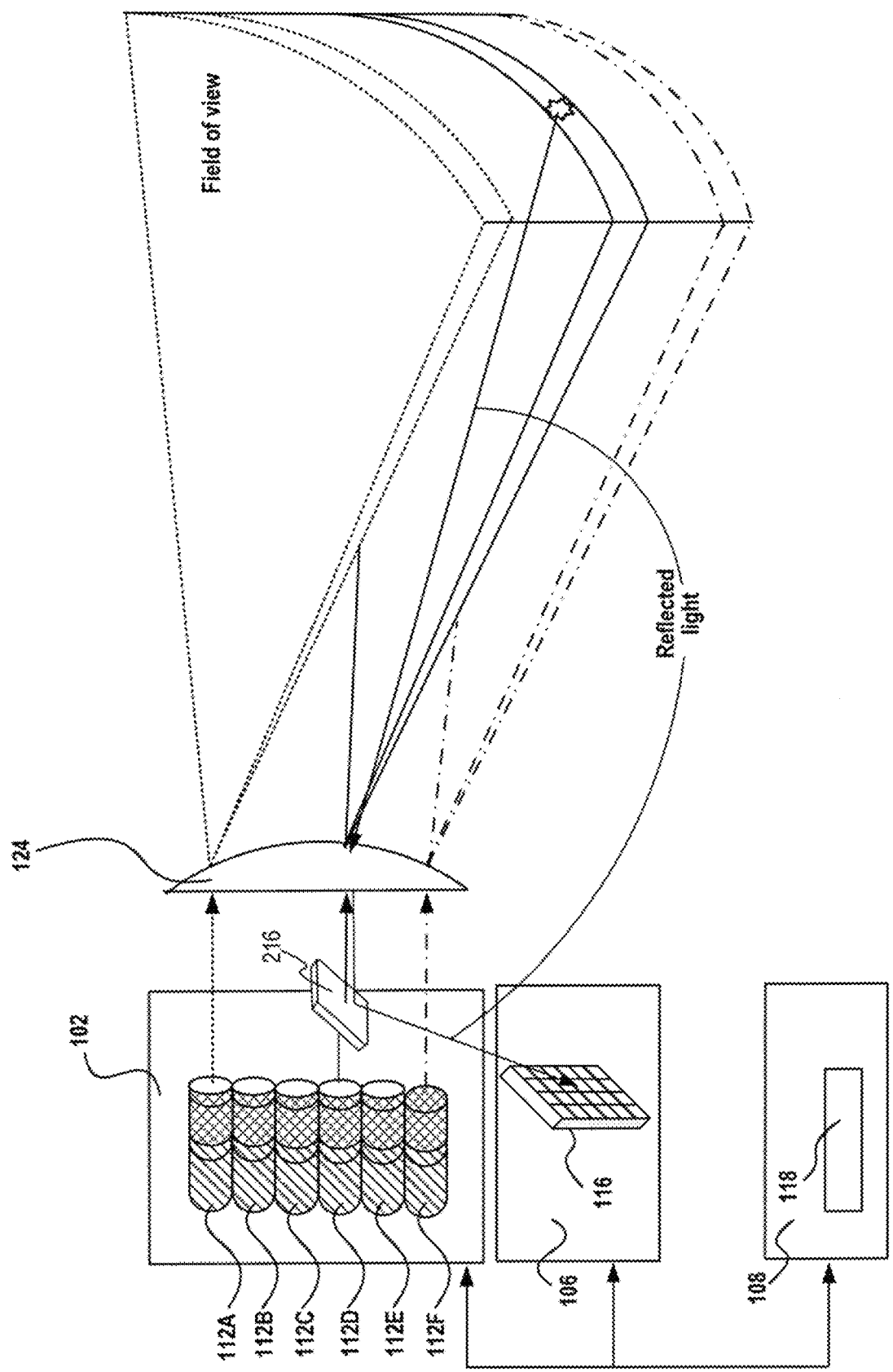
Figure 2G:
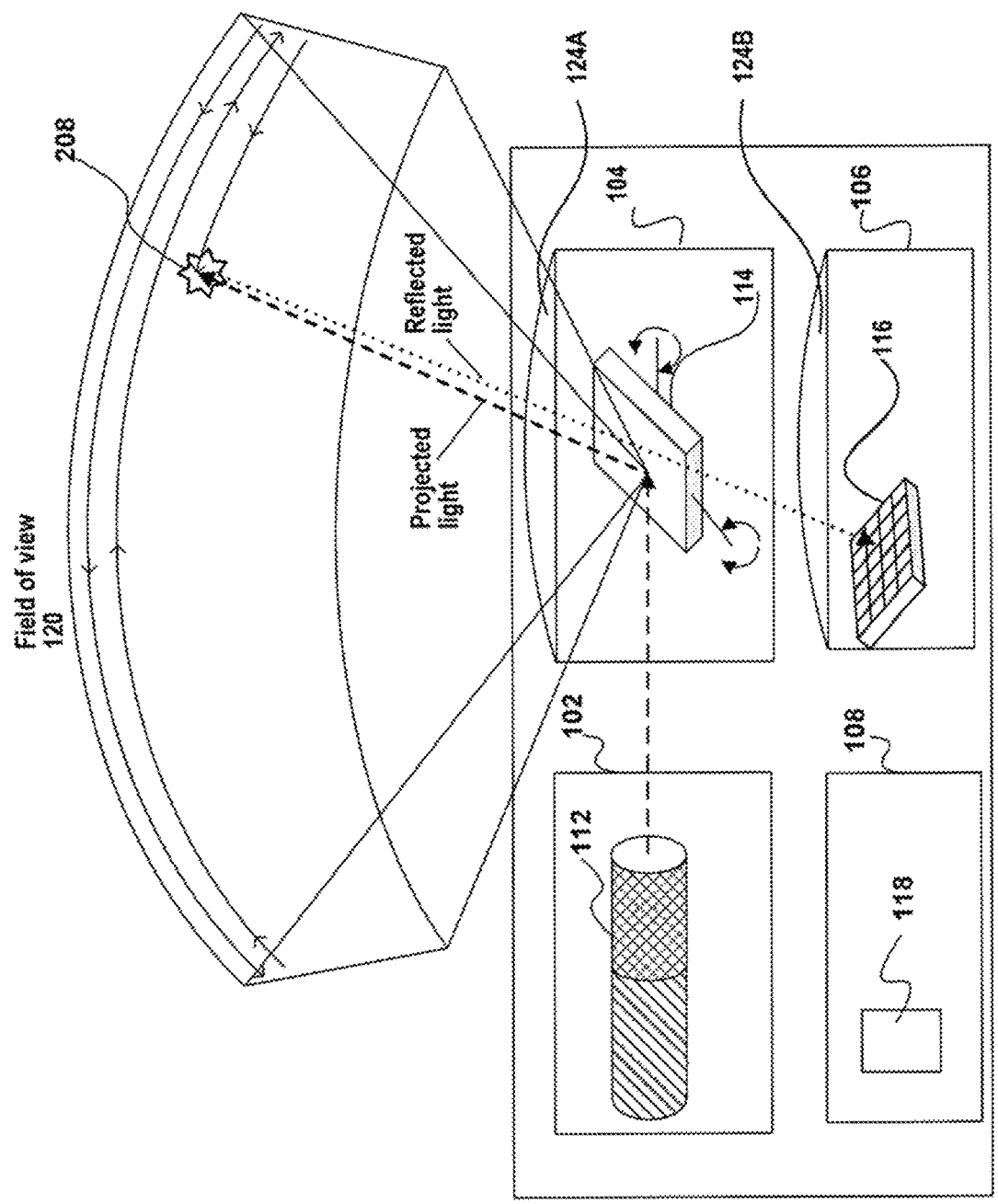

FIGS. 2A-2G depict various configurations of projecting unit 102 and its role in LIDAR system 100. Specifically, FIG. 2A is a diagram illustrating projecting unit 102 with a single light source; FIG. 2B is a diagram illustrating a plurality of projecting units 102 with a plurality of light sources aimed at a common light deflector 114; FIG. 2C is a diagram illustrating projecting unit 102 with a primary and a secondary light sources 112; FIG. 2D is a diagram illustrating an asymmetrical deflector used in some configurations of projecting unit 102; FIG. 2E is a diagram illustrating a first configuration of a non-scanning LIDAR system; FIG. 2F is a diagram illustrating a second configuration of a non-scanning LIDAR system; and FIG. 2G is a diagram illustrating a LIDAR system that scans in the outbound direction and does not scan in the inbound direction. One skilled in the art will appreciate that the depicted configurations of projecting unit 102 may have numerous variations and modifications.

FIG. 2A illustrates an example of a bi-static configuration of LIDAR system 100 in which projecting unit 102 includes a single light source 112. The term "bi-static configuration" broadly refers to LIDAR systems configurations in which the projected light exiting the LIDAR system and the reflected light entering the LIDAR system pass through substantially different optical paths. In some embodiments, a bi-static configuration of LIDAR system 100 may include a separation of the optical paths by using completely different optical components, by using parallel but not fully separated optical components, or by using the same optical components for only part of the of the optical paths (optical components may include, for example, windows, lenses, mirrors, beam splitters, etc.). In the example depicted in FIG. 2A, the bi-static configuration includes a configuration where the outbound light and the inbound light pass through a single optical window 124 but scanning unit 104 includes two light deflectors, a first light deflector 114A for outbound light and a second light deflector 114B for inbound light (the inbound light in LIDAR system includes emitted light reflected from objects in the scene, and may also include ambient light arriving from other sources). In the examples depicted in FIGS. 2E and 2G, the bi-static configuration includes a configuration where the outbound light passes through a first optical window 124A, and the inbound light passes through a second optical window 124B. In all the example configurations above, the inbound and outbound optical paths differ from one another.

In this embodiment, all the components of LIDAR system 100 may be contained within a single housing 200, or may be divided among a plurality of housings. As shown, projecting unit 102 is associated with a single light source 112 that includes a laser diode 202A (or one or more laser diodes coupled together) configured to emit light (projected light 204). In one non-limiting example, the light projected by light source 112 may be at a wavelength between about 800 nm and 950 nm, have an average power between about 50 mW and about 500 mW, have a peak power between about 50 W and about 200 W, and a pulse width of between about 2 ns and about 100 ns. In addition, light source 112 may optionally be associated with optical assembly 202B used for manipulation of the light emitted by laser diode 202A (e.g. for collimation, focusing, etc.). It is noted that other types of light sources 112 may be used, and that the disclosure is not restricted to laser diodes. In addition, light source 112 may emit its light in different formats, such as light pulses, frequency modulated, continuous wave (CW), quasi-CW, or any other form corresponding to the particular light source employed. The projection format and other parameters may be changed by the light source from time to time based on different factors, such as instructions from processing unit 108. The projected light is projected towards an outbound deflector 114A that functions as a steering element for directing the projected light in field of view 120. In this example, scanning unit 104 also include a pivotable return deflector 114B that direct photons (reflected light 206) reflected back from an object 208 within field of view 120 toward sensor 116. The reflected light is detected by sensor 116 and information about the object (e.g., the distance to object 212) is determined by processing unit 108.

In this figure, LIDAR system 100 is connected to a host 210. Consistent with the present disclosure, the term "host" refers to any computing environment that may interface with LIDAR system 100, it may be a vehicle system (e.g., part of vehicle 110), a testing system, a security system, a surveillance system, a traffic control system, an urban modelling system, or any system that monitors its surroundings. Such computing environment may include at least one processor and/or may be connected LIDAR system 100 via the cloud. In some embodiments, host 210 may also include interfaces to external devices such as camera and sensors configured to measure different characteristics of host 210 (e.g., acceleration, steering wheel deflection, reverse drive, etc.). Consistent with the present disclosure, LIDAR system 100 may be fixed to a stationary object associated with host 210 (e.g. a building, a tripod) or to a portable system associated with host 210 (e.g., a portable computer, a movie camera). Consistent with the present disclosure, LIDAR system 100 may be connected to host 210, to provide outputs of LIDAR system 100 (e.g., a 3D model, a reflectivity image) to host 210. Specifically, host 210 may use LIDAR system 100 to aid in detecting and scanning the environment of host 210 or any other environment. In addition, host 210 may integrate, synchronize or otherwise use together the outputs of LIDAR system 100 with outputs of other sensing systems (e.g. cameras, microphones, radar systems). In one example, LIDAR system 100 may be used by a security system. This embodiment is described in greater detail below with reference to FIG. 7.

LIDAR system 100 may also include a bus 212 (or other communication mechanisms) that interconnect subsystems and components for transferring information within LIDAR system 100. Optionally, bus 212 (or another communication mechanism) may be used for interconnecting LIDAR system 100 with host 210. In the example of FIG. 2A, processing unit 108 includes two processors 118 to regulate the operation of projecting unit 102, scanning unit 104, and sensing unit 106 in a coordinated manner based, at least partially, on information received from internal feedback of LIDAR system 100. In other words, processing unit 108 may be configured to dynamically operate LIDAR system 100 in a closed loop. A closed loop system is characterized by having feedback from at least one of the elements and updating one or more parameters based on the received feedback. Moreover, a closed loop system may receive feedback and update its own operation, at least partially, based on that feedback. A dynamic system or element is one that may be updated during operation.

According to some embodiments, scanning the environment around LIDAR system 100 may include illuminating field of view 120 with light pulses. The light pulses may have parameters such as: pulse duration, pulse angular dispersion, wavelength, instantaneous power, photon density at different distances from light source 112, average power, pulse power intensity, pulse width, pulse repetition rate, pulse sequence, pulse duty cycle, wavelength, phase, polarization, and more. Scanning the environment around LIDAR system 100 may also include detecting and characterizing various aspects of the reflected light. Characteristics of the reflected light may include, for example: time-of-flight (i.e., time from emission until detection), instantaneous power (e.g., power signature), average power across entire return pulse, and photon distribution/signal over return pulse period. By comparing characteristics of a light pulse with characteristics of corresponding reflections, a distance and possibly a physical characteristic, such as reflected intensity of object 212 may be estimated. By repeating this process across multiple adjacent portions 122, in a predefined pattern (e.g., raster, Lissajous or other patterns) an entire scan of field of view 120 may be achieved. As discussed below in greater detail, in some situations LIDAR system 100 may direct light to only some of the portions 122 in field of view 120 at every scanning cycle. These portions may be adjacent to each other, but not necessarily so.

In another embodiment, LIDAR system 100 may include network interface 214 for communicating with host 210 (e.g., a vehicle controller). The communication between LIDAR system 100 and host 210 is represented by a dashed arrow. In one embodiment, network interface 214 may include an integrated services digital network (ISDN) card, cable modem, satellite modem, or a modem to provide a data communication connection to a corresponding type of telephone line. As another example, network interface 214 may include a local area network (LAN) card to provide a data communication connection to a compatible LAN. In another embodiment, network interface 214 may include an Ethernet port connected to radio frequency receivers and transmitters and/or optical (e.g., infrared) receivers and transmitters. The specific design and implementation of network interface 214 depends on the communications network(s) over which LIDAR system 100 and host 210 are intended to operate. For example, network interface 214 may be used, for example, to provide outputs of LIDAR system 100 to the external system, such as a 3D model, operational parameters of LIDAR system 100, and so on. In other embodiment, the communication unit may be used, for example, to receive instructions from the external system, to receive information regarding the inspected environment, to receive information from another sensor, etc.

FIG. 2B illustrates an example of a monostatic configuration of LIDAR system 100 including a plurality projecting units 102. The term "monostatic configuration" broadly refers to LIDAR system configurations in which the projected light exiting from the LIDAR system and the reflected light entering the LIDAR system pass through substantially similar optical paths. In one example, the outbound light beam and the inbound light beam may share at least one optical assembly through which both outbound and inbound light beams pass. In another example, the outbound light may pass through an optical window (not shown) and the inbound light radiation may pass through the same optical window. A monostatic configuration may include a configuration where the scanning unit 104 includes a single light deflector 114 that directs the projected light towards field of view 120 and directs the reflected light towards a sensor 116. As shown, both projected light 204 and reflected light 206 hits an asymmetrical deflector 216. The term "asymmetrical deflector" refers to any optical device having two sides capable of deflecting a beam of light hitting it from one side in a different direction than it deflects a beam of light hitting it from the second side. In one example, the asymmetrical deflector does not deflect projected light 204 and deflects reflected light 206 towards sensor 116. One example of an asymmetrical deflector may include a polarization beam splitter. In another example, asymmetrical 216 may include an optical isolator that allows the passage of light in only one direction. A diagrammatic representation of asymmetrical deflector 216 is illustrated in FIG. 2D. Consistent with the present disclosure, a monostatic configuration of LIDAR system 100 may include an asymmetrical deflector to prevent reflected light from hitting light source 112, and to direct all the reflected light toward sensor 116, thereby increasing detection sensitivity.

In the embodiment of FIG. 2B, LIDAR system 100 includes three projecting units 102 each with a single of light source 112 aimed at a common light deflector 114. In one embodiment, the plurality of light sources 112 (including two or more light sources) may project light with substantially the same wavelength and each light source 112 is generally associated with a differing area of the field of view (denoted in the figure as 120A, 120B, and 120C). This enables scanning of a broader field of view than can be achieved with a light source 112. In another embodiment, the plurality of light sources 102 may project light with differing wavelengths, and all the light sources 112 may be directed to the same portion (or overlapping portions) of field of view 120.

FIG. 2C illustrates an example of LIDAR system 100 in which projecting unit 102 includes a primary light source 112A and a secondary light source 112B. Primary light source 112A may project light with a longer wavelength than is sensitive to the human eye in order to optimize SNR and detection range. For example, primary light source 112A may project light with a wavelength between about 750 nm and 1100 nm. In contrast, secondary light source 112B may project light with a wavelength visible to the human eye. For example, secondary light source 112B may project light with a wavelength between about 400 nm and 700 nm. In one embodiment, secondary light source 112B may project light along substantially the same optical path the as light projected by primary light source 112A. Both light sources may be time-synchronized and may project light emission together or in interleaved pattern. An interleave pattern means that the light sources are not active at the same time which may mitigate mutual interference. A person who is of skill in the art would readily see that other combinations of wavelength ranges and activation schedules may also be implemented.

Consistent with some embodiments, secondary light source 112B may cause human eyes to blink when it is too close to the LIDAR optical output port. This may ensure an eye safety mechanism not feasible with typical laser sources that utilize the near-infrared light spectrum. In another embodiment, secondary light source 112B may be used for calibration and reliability at a point of service, in a manner somewhat similar to the calibration of headlights with a special reflector/pattern at a certain height from the ground with respect to vehicle 110. An operator at a point of service could examine the calibration of the LIDAR by simple visual inspection of the scanned pattern over a featured target such a test pattern board at a designated distance from LIDAR system 100. In addition, secondary light source 112B may provide means for operational confidence that the LIDAR is working for the end-user. For example, the system may be configured to permit a human to place a hand in front of light deflector 114 to test its operation.

Secondary light source 112B may also have anon-visible element that can double as a backup system in case primary light source 112A fails. This feature may be useful for fail-safe devices with elevated functional safety ratings. Given that secondary light source 112B may be visible and also due to reasons of cost and complexity, secondary light source 112B may be associated with a smaller power compared to primary light source 112A. Therefore, in case of a failure of primary light source 112A, the system functionality will fall back to secondary light source 112B set of functionalities and capabilities. While the capabilities of secondary light source 112B may be inferior to the capabilities of primary light source 112A, LIDAR system 100 system may be designed in such a fashion to enable vehicle 110 to safely arrive its destination.

FIG. 2D illustrates asymmetrical deflector 216 that may be part of LIDAR system 100. In the illustrated example, asymmetrical deflector 216 includes a reflective surface 218 (such as a mirror) and a one-way deflector 220. While not necessarily so, asymmetrical deflector 216 may optionally be a static deflector. Asymmetrical deflector 216 may be used in a monostatic configuration of LIDAR system 100, in order to allow a common optical path for transmission and for reception of light via the at least one deflector 114, e.g. as illustrated in FIGS. 2B and 2C. However, typical asymmetrical deflectors such as beam splitters are characterized by energy losses, especially in the reception path, which may be more sensitive to power loses than the transmission path.

As depicted in FIG. 2D, LIDAR system 100 may include asymmetrical deflector 216 positioned in the transmission path, which includes one-way deflector 220 for separating between the transmitted and received light signals. Optionally, one-way deflector 220 may be substantially transparent to the transmission light and substantially reflective to the received light. The transmitted light is generated by projecting unit 102 and may travel through one-way deflector 220 to scanning unit 104 which deflects it towards the optical outlet. The received light arrives through the optical inlet, to the at least one deflecting element 114, which deflects the reflections signal into a separate path away from the light source and towards sensing unit 106. Optionally, asymmetrical deflector 216 may be combined with a polarized light source 112 which is linearly polarized with the same polarization axis as one-way deflector 220. Notably, the cross-section of the outbound light beam is much smaller than that of the reflections signals. Accordingly, LIDAR system 100 may include one or more optical components (e.g. lens, collimator) for focusing or otherwise manipulating the emitted polarized light beam to the dimensions of the asymmetrical deflector 216. In one embodiment, one-way deflector 220 may be a polarizing beam splitter that is virtually transparent to the polarized light beam.

Consistent with some embodiments, LIDAR system 100 may further include optics 222 (e.g., a quarter wave plate retarder) for modifying a polarization of the emitted light. For example, optics 222 may modify a linear polarization of the emitted light beam to circular polarization. Light reflected back to system 100 from the field of view would arrive back through deflector 114 to optics 222, bearing a circular polarization with a reversed handedness with respect to the transmitted light. Optics 222 would then convert the received reversed handedness polarization light to a linear polarization that is not on the same axis as that of the polarized beam splitter 216. As noted above, the received light-patch is larger than the transmitted light-patch, due to optical dispersion of the beam traversing through the distance to the target.

Some of the received light will impinge on one-way deflector 220 that will reflect the light towards sensor 106 with some power loss. However, another part of the received patch of light will fall on a reflective surface 218 which surrounds one-way deflector 220 (e.g., polarizing beam splitter slit). Reflective surface 218 will reflect the light towards sensing unit 106 with substantially zero power loss. One-way deflector 220 would reflect light that is composed of various polarization axes and directions that will eventually arrive at the detector. Optionally, sensing unit 106 may include sensor 116 that is agnostic to the laser polarization, and is primarily sensitive to the amount of impinging photons at a certain wavelength range.

It is noted that the proposed asymmetrical deflector 216 provides far superior performances when compared to a simple mirror with a passage hole in it. In a mirror with a hole, all of the reflected light which reaches the hole is lost to the detector. However, in deflector 216, one-way deflector 220 deflects a significant portion of that light (e.g., about 50%) toward the respective sensor 116. In LIDAR systems, the number photons reaching the LIDAR from remote distances is very limited, and therefore the improvement in photon capture rate is important.

According to some embodiments, a device for beam splitting and steering is described. A polarized beam may be emitted from a light source having a first polarization. The emitted beam may be directed to pass through a polarized beam splitter assembly. The polarized beam splitter assembly includes on a first side a one-directional slit and on an opposing side a mirror. The one-directional slit enables the polarized emitted beam to travel toward a quarter-waveplate/wave-retarder which changes the emitted signal from a polarized signal to a linear signal (or vice versa) so that subsequently reflected beams cannot travel through the one-directional slit.

FIG. 2E shows an example of a bi-static configuration of LIDAR system 100 without scanning unit 104. In order to illuminate an entire field of view (or substantially the entire field of view) without deflector 114, projecting unit 102 may optionally include an array of light sources (e.g., 112A-112F). In one embodiment, the array of light sources may include a linear array of light sources controlled by processor 118. For example, processor 118 may cause the linear array of light sources to sequentially project collimated laser beams towards first optional optical window 124A. First optional optical window 124A may include a diffuser lens for spreading the projected light and sequentially forming wide horizontal and narrow vertical beams. Optionally, some or all of the at least one light source 112 of system 100 may project light concurrently. For example, processor 118 may cause the array of light sources to simultaneously project light beams from a plurality of non-adjacent light sources 112. In the depicted example, light source 112A, light source 112D, and light source 112F simultaneously project laser beams towards first optional optical window 124A thereby illuminating the field of view with three narrow vertical beams. The light beam from fourth light source 112D may reach an object in the field of view. The light reflected from the object may be captured by second optical window 124B and may be redirected to sensor 116. The configuration depicted in FIG. 2E is considered to be a bi-static configuration because the optical paths of the projected light and the reflected light are substantially different. It is noted that projecting unit 102 may also include a plurality of light sources 112 arranged in non-linear configurations, such as a two dimensional array, in hexagonal tiling, or in any other way.

FIG. 2F illustrates an example of a monostatic configuration of LIDAR system 100 without scanning unit 104. Similar to the example embodiment represented in FIG. 2E, in order to illuminate an entire field of view without deflector 114, projecting unit 102 may include an array of light sources (e.g., 112A-112F). But, in contrast to FIG. 2E, this configuration of LIDAR system 100 may include a single optical window 124 for both the projected light and for the reflected light. Using asymmetrical deflector 216, the reflected light may be redirected to sensor 116. The configuration depicted in FIG. 2E is considered to be a monostatic configuration because the optical paths of the projected light and the reflected light are substantially similar to one another. The term "substantially similar" in the context of the optical paths of the projected light and the reflected light means that the overlap between the two optical paths may be more than 80%, more than 85%, more than 90%, or more than 95%.

FIG. 2G illustrates an example of a bi-static configuration of LIDAR system 100. The configuration of LIDAR system 100 in this figure is similar to the configuration shown in FIG. 2A. For example, both configurations include a scanning unit 104 for directing projected light in the outbound direction toward the field of view. But, in contrast to the embodiment of FIG. 2A, in this configuration, scanning unit 104 does not redirect the reflected light in the inbound direction. Instead the reflected light passes through second optical window 124B and enters sensor 116. The configuration depicted in FIG. 2G is considered to be a bi-static configuration because the optical paths of the projected light and the reflected light are substantially different from one another. The term "substantially different" in the context of the optical paths of the projected light and the reflected light means that the overlap between the two optical paths may be less than 10%, less than 5%, less than 1%, or less than 0.25%.

The Scanning Unit

Figure 3A:
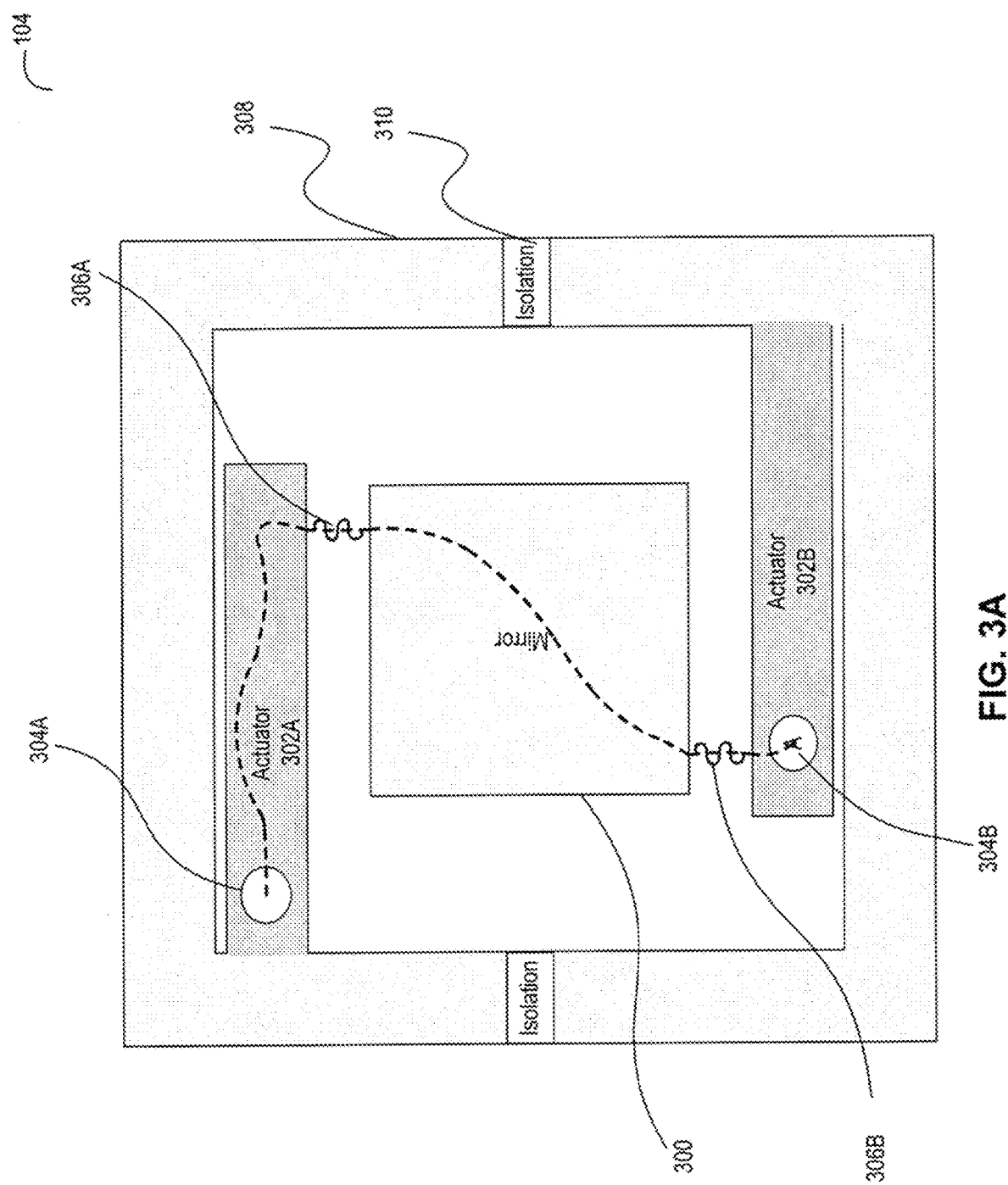
FIGS. 3A-3D are diagrams illustrating different configurations of scanning units in accordance with some embodiments of the present disclosure.
Figure 3B:
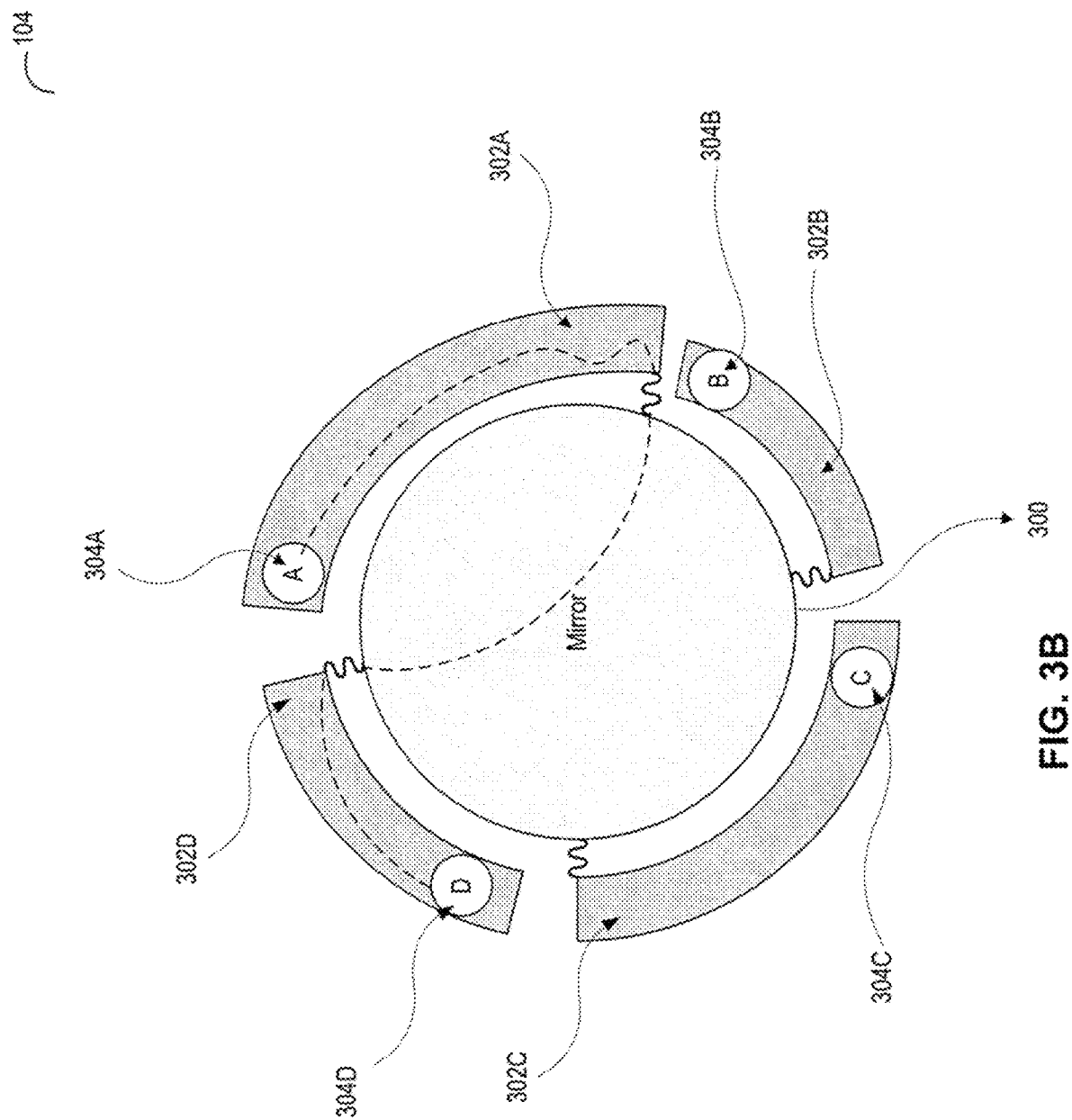
Figure 3C:
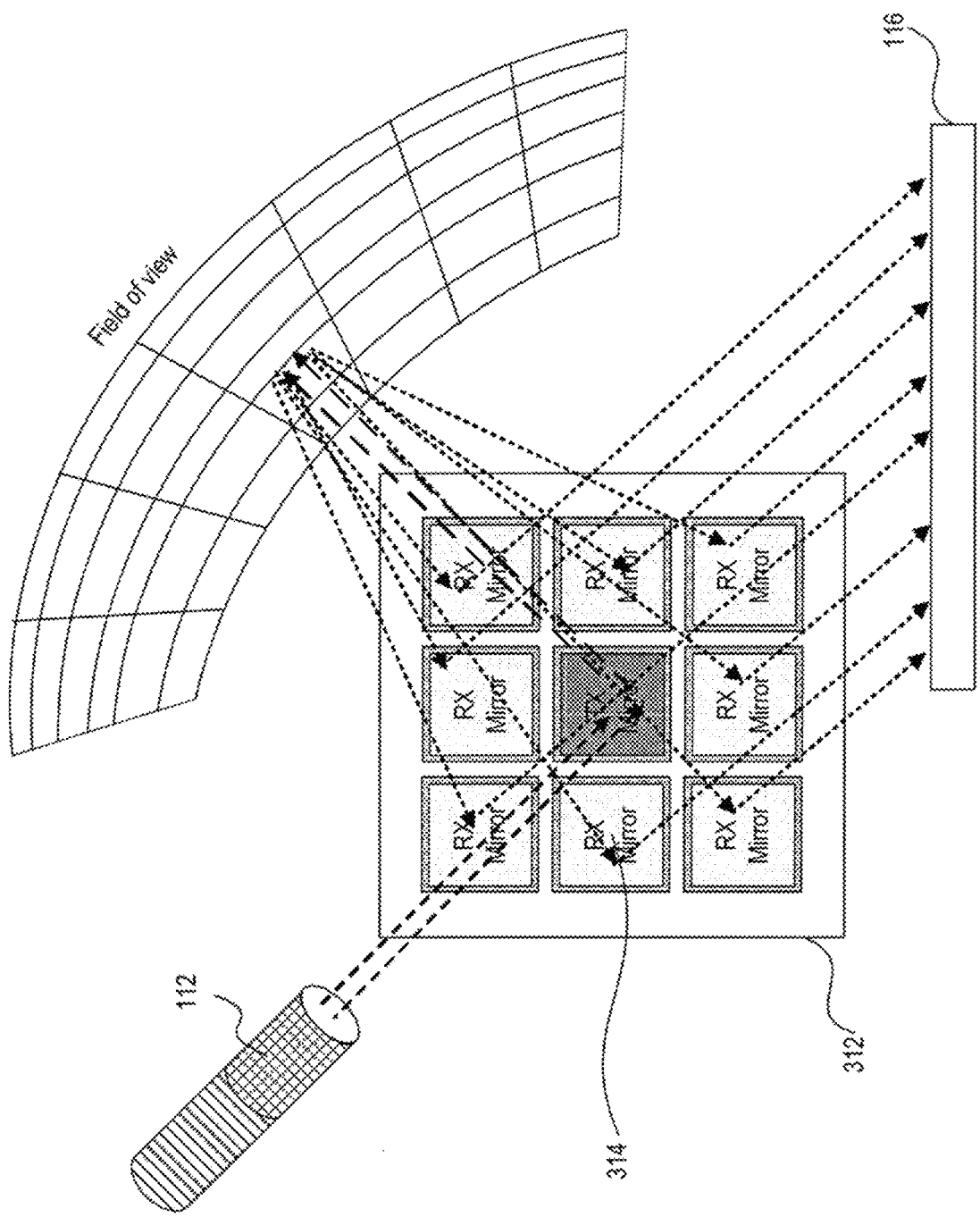
Figure 3D:
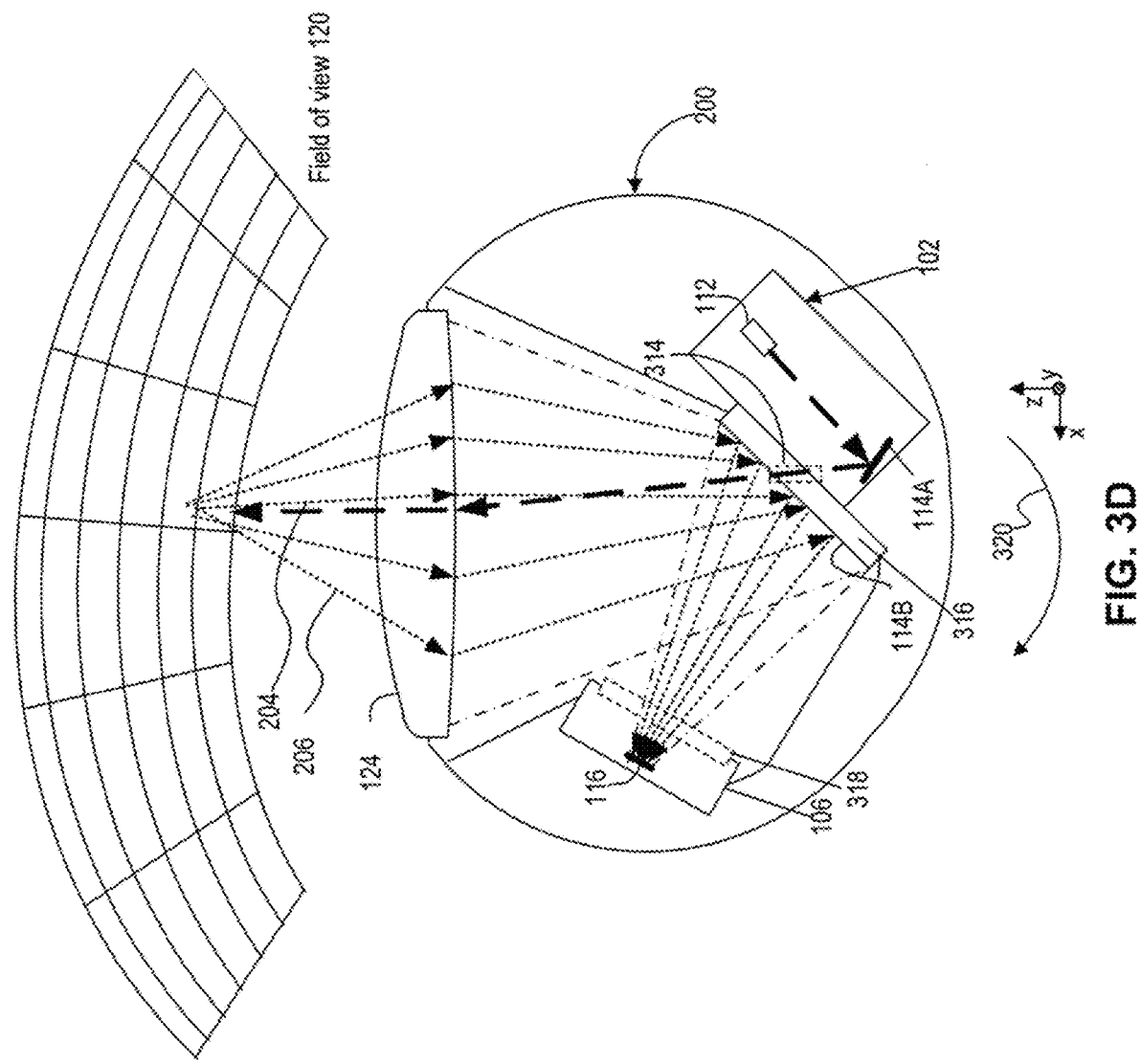

FIGS. 3A-3D depict various configurations of scanning unit 104 and its role in LIDAR system 100. Specifically, FIG. 3A is a diagram illustrating scanning unit 104 with a MEMS mirror (e.g., square shaped), FIG. 3B is a diagram illustrating another scanning unit 104 with a MEMS mirror (e.g., round shaped), FIG. 3C is a diagram illustrating scanning unit 104 with an array of reflectors used for monostatic scanning LIDAR system, and FIG. 3D is a diagram illustrating an example LIDAR system 100 that mechanically scans the environment around LIDAR system 100. One skilled in the art will appreciate that the depicted configurations of scanning unit 104 are exemplary only and may have numerous variations and modifications within the scope of this disclosure.

FIG. 3A illustrates an example scanning unit 104 with a single axis square MEMS mirror 300. In this example MEMS mirror 300 functions as at least one deflector 114. As shown, scanning unit 104 may include one or more actuators 302 (specifically, 302A and 302B). In one embodiment, actuator 302 may be made of semiconductor (e.g., silicon) and includes a piezoelectric layer (e.g. PZT, Lead zirconate titanate, aluminum nitride), which changes its dimension in response to electric signals applied by an actuation controller, a semi conductive layer, and a base layer. In one embodiment, the physical properties of actuator 302 may determine the mechanical stresses that actuator 302 experiences when electrical current passes through it. When the piezoelectric material is activated it exerts force on actuator 302 and causes it to bend. In one embodiment, the resistivity of one or more actuators 302 may be measured in an active state (Ractive) when mirror 300 is deflected at a certain angular position and compared to the resistivity at a resting state (Rrest). Feedback including Ractive may provide information to determine the actual mirror deflection angle compared to an expected angle, and, if needed, mirror 300 deflection may be corrected. The difference between Rrest and Ractive may be correlated by a mirror drive into an angular deflection value that may serve to close the loop. This embodiment may be used for dynamic tracking of the actual mirror position and may optimize response, amplitude, deflection efficiency, and frequency for both linear mode and resonant mode MEMS mirror schemes. This embodiment is described in greater detail below with reference to FIGS. 32-34.

During scanning, current (represented in the figure as the dashed line) may flow from contact 304A to contact 304B (through actuator 302A, spring 306A, mirror 300, spring 306B, and actuator 302B). Isolation gaps in semiconducting frame 308 such as isolation gap 310 may cause actuator 302A and 302B to be two separate islands connected electrically through springs 306 and frame 308. The current flow, or any associated electrical parameter (voltage, current frequency, capacitance, relative dielectric constant, etc.), may be monitored by an associated position feedback. In case of a mechanical failure—where one of the components is damaged—the current flow through the structure would alter and change from its functional calibrated values. At an extreme situation (for example, when a spring is broken), the current would stop completely due to a circuit break in the electrical chain by means of a faulty element.

FIG. 3B illustrates another example scanning unit 104 with a dual axis round MEMS mirror 300. In this example MEMS mirror 300 functions as at least one deflector 114. In one embodiment, MEMS mirror 300 may have a diameter of between about 1 mm to about 5 mm. As shown, scanning unit 104 may include four actuators 302 (302A, 302B, 302C, and 302D) each may be at a differing length. In the illustrated example, the current (represented in the figure as the dashed line) flows from contact 304A to contact 304D, but in other cases current may flow from contact 304A to contact 304B, from contact 304A to contact 304C, from contact 304B to contact 304C, from contact 304B to contact 304D, or from contact 304C to contact 304D. Consistent with some embodiments, a dual axis MEMS mirror may be configured to deflect light in a horizontal direction and in a vertical direction. For example, the angles of deflection of a dual axis MEMS mirror may be between about 0° to 30° in the vertical direction and between about 0° to 50° in the horizontal direction. One skilled in the art will appreciate that the depicted configuration of mirror 300 may have numerous variations and modifications. In one example, at least of deflector 114 may have a dual axis square-shaped mirror or single axis round-shaped mirror. Examples of round and square mirror are depicted in FIGS. 3A and 3B as examples only. Any shape may be employed depending on system specifications. In one embodiment, actuators 302 may be incorporated as an integral part of at least of deflector 114, such that power to move MEMS mirror 300 is applied directly towards it. In addition, MEMS mirror 300 may be connected to frame 308 by one or more rigid supporting elements. In another embodiment, at least of deflector 114 may include an electrostatic or electromagnetic MEMS mirror.

As described above, a monostatic scanning LIDAR system utilizes at least a portion of the same optical path for emitting projected light 204 and for receiving reflected light 206. The light beam in the outbound path may be collimated and focused into a narrow beam while the reflections in the return path spread into a larger patch of light, due to dispersion. In one embodiment, scanning unit 104 may have a large reflection area in the return path and asymmetrical deflector 216 that redirects the reflections (i.e., reflected light 206) to sensor 116. In one embodiment, scanning unit 104 may include a MEMS mirror with a large reflection area and negligible impact on the field of view and the frame rate performance. Additional details about the asymmetrical deflector 216 are provided below with reference to FIG. 2D.

In some embodiments (e.g. as exemplified in FIG. 3C), scanning unit 104 may include a deflector array (e.g. a reflector array) with small light deflectors (e.g. mirrors). In one embodiment, implementing light deflector 114 as a group of smaller individual light deflectors working in synchronization may allow light deflector 114 to perform at a high scan rate with larger angles of deflection. The deflector array may essentially act as a large light deflector (e.g. a large mirror) in terms of effective area. The deflector array may be operated using a shared steering assembly configuration that allows sensor 116 to collect reflected photons from substantially the same portion of field of view 120 being concurrently illuminated by light source 112. The term "concurrently" means that the two selected functions occur during coincident or overlapping time periods, either where one begins and ends during the duration of the other, or where a later one starts before the completion of the other.

FIG. 3C illustrates an example of scanning unit 104 with a reflector array 312 having small mirrors. In this embodiment, reflector array 312 functions as at least one deflector 114. Reflector array 312 may include a plurality of reflector units 314 configured to pivot (individually or together) and steer light pulses toward field of view 120. For example, reflector array 312 may be a part of an outbound path of light projected from light source 112. Specifically, reflector array 312 may direct projected light 204 towards a portion of field of view 120. Reflector array 312 may also be part of a return path for light reflected from a surface of an object located within an illumined portion of field of view 120. Specifically, reflector array 312 may direct reflected light 206 towards sensor 116 or towards asymmetrical deflector 216. In one example, the area of reflector array 312 may be between about 75 to about 150 mm$^2$, where each reflector units 314 may have a width of about 10 μm and the supporting structure may be lower than 100 μm.

According to some embodiments, reflector array 312 may include one or more sub-groups of steerable deflectors. Each sub-group of electrically steerable deflectors may include one or more deflector units, such as reflector unit 314. For example, each steerable deflector unit 314 may include at least one of a MEMS mirror, a reflective surface assembly, and an electromechanical actuator. In one embodiment, each reflector unit 314 may be individually controlled by an individual processor (not shown), such that it may tilt towards a specific angle along each of one or two separate axes. Alternatively, reflector array 312 may be associated with a common controller (e.g., processor 118) configured to synchronously manage the movement of reflector units 314 such that at least part of them will pivot concurrently and point in approximately the same direction.

In addition, at least one processor 118 may select at least one reflector unit 314 for the outbound path (referred to hereinafter as "TX Mirror") and a group of reflector units 314 for the return path (referred to hereinafter as "RX Mirror"). Consistent with the present disclosure, increasing the number of TX Mirrors may increase a reflected photons beam spread. Additionally, decreasing the number of RX Mirrors may narrow the reception field and compensate for ambient light conditions (such as clouds, rain, fog, extreme heat, and other environmental conditions) and improve the signal to noise ratio. Also, as indicated above, the emitted light beam is typically narrower than the patch of reflected light, and therefore can be fully deflected by a small portion of the deflection array. Moreover, it is possible to block light reflected from the portion of the deflection array used for transmission (e.g. the TX mirror) from reaching sensor 116, thereby reducing an effect of internal reflections of the LIDAR system 100 on system operation. In addition, at least one processor 118 may pivot one or more reflector units 314 to overcome mechanical impairments and drifts due, for example, to thermal and gain effects. In an example, one or more reflector units 314 may move differently than intended (frequency, rate, speed etc.) and their movement may be compensated for by electrically controlling the deflectors appropriately.

FIG. 3D illustrates an exemplary LIDAR system 100 that mechanically scans the environment of LIDAR system 100. In this example, LIDAR system 100 may include a motor or other mechanisms for rotating housing 200 about the axis of the LIDAR system 100. Alternatively, the motor (or other mechanism) may mechanically rotate a rigid structure of LIDAR system 100 on which one or more light sources 112 and one or more sensors 116 are installed, thereby scanning the environment. As described above, projecting unit 102 may include at least one light source 112 configured to project light emission. The projected light emission may travel along an outbound path towards field of view 120. Specifically, the projected light emission may be reflected by deflector 114A through an exit aperture 314 when projected light 204 travel towards optional optical window 124. The reflected light emission may travel along a return path from object 208 towards sensing unit 106. For example, the reflected light 206 may be reflected by deflector 114B when reflected light 206 travels towards sensing unit 106. A person skilled in the art would appreciate that a LIDAR system with a rotation mechanism for synchronically rotating one or more light sources or one or more sensors, may use this synchronized rotation instead of (or in addition to) steering an internal light deflector.

In embodiments in which the scanning of field of view 120 is mechanical, the projected light emission may be directed to exit aperture 314 that is part of a wall 316 separating projecting unit 102 from other parts of LIDAR system 100. In some examples, wall 316 can be formed from a transparent material (e.g., glass) coated with a reflective material to form deflector 114B. In this example, exit aperture 314 may correspond to the portion of wall 316 that is not coated by the reflective material. Additionally or alternatively, exit aperture 314 may include a hole or cut-away in the wall 316. Reflected light 206 may be reflected by deflector 114B and directed towards an entrance aperture 318 of sensing unit 106. In some examples, an entrance aperture 318 may include a filtering window configured to allow wavelengths in a certain wavelength range to enter sensing unit 106 and attenuate other wavelengths. The reflections of object 208 from field of view 120 may be reflected by deflector 114B and hit sensor 116. By comparing several properties of reflected light 206 with projected light 204, at least one aspect of object 208 may be determined. For example, by comparing a time when projected light 204 was emitted by light source 112 and a time when sensor 116 received reflected light 206, a distance between object 208 and LIDAR system 100 may be determined. In some examples, other aspects of object 208, such as shape, color, material, etc. may also be determined.

In some examples, the LIDAR system 100 (or part thereof, including at least one light source 112 and at least one sensor 116) may be rotated about at least one axis to determine a three-dimensional map of the surroundings of the LIDAR system 100. For example, the LIDAR system 100 may be rotated about a substantially vertical axis as illustrated by arrow 320 in order to scan field of 120. Although FIG. 3D illustrates that the LIDAR system 100 is rotated clock-wise about the axis as illustrated by the arrow 320, additionally or alternatively, the LIDAR system 100 may be rotated in a counter clockwise direction. In some examples, the LIDAR system 100 may be rotated 360 degrees about the vertical axis. In other examples, the LIDAR system 100 may be rotated back and forth along a sector smaller than 360-degree of the LIDAR system 100. For example, the LIDAR system 100 may be mounted on a platform that wobbles back and forth about the axis without making a complete rotation.

The Sensing Unit

Figure 4A:
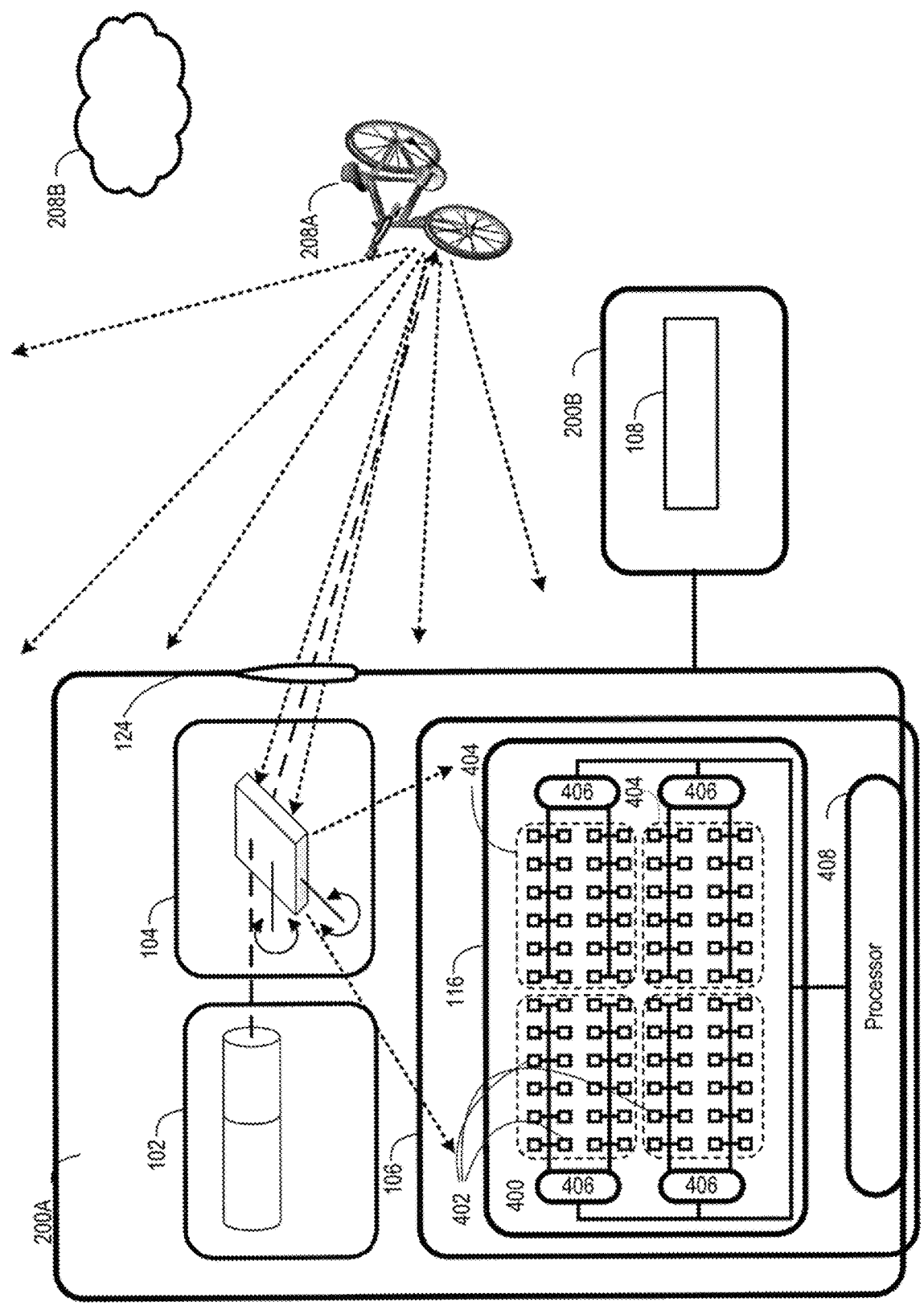
FIGS. 4A-4E are diagrams illustrating different configurations of sensing units in accordance with some embodiments of the present disclosure.
Figure 4B:
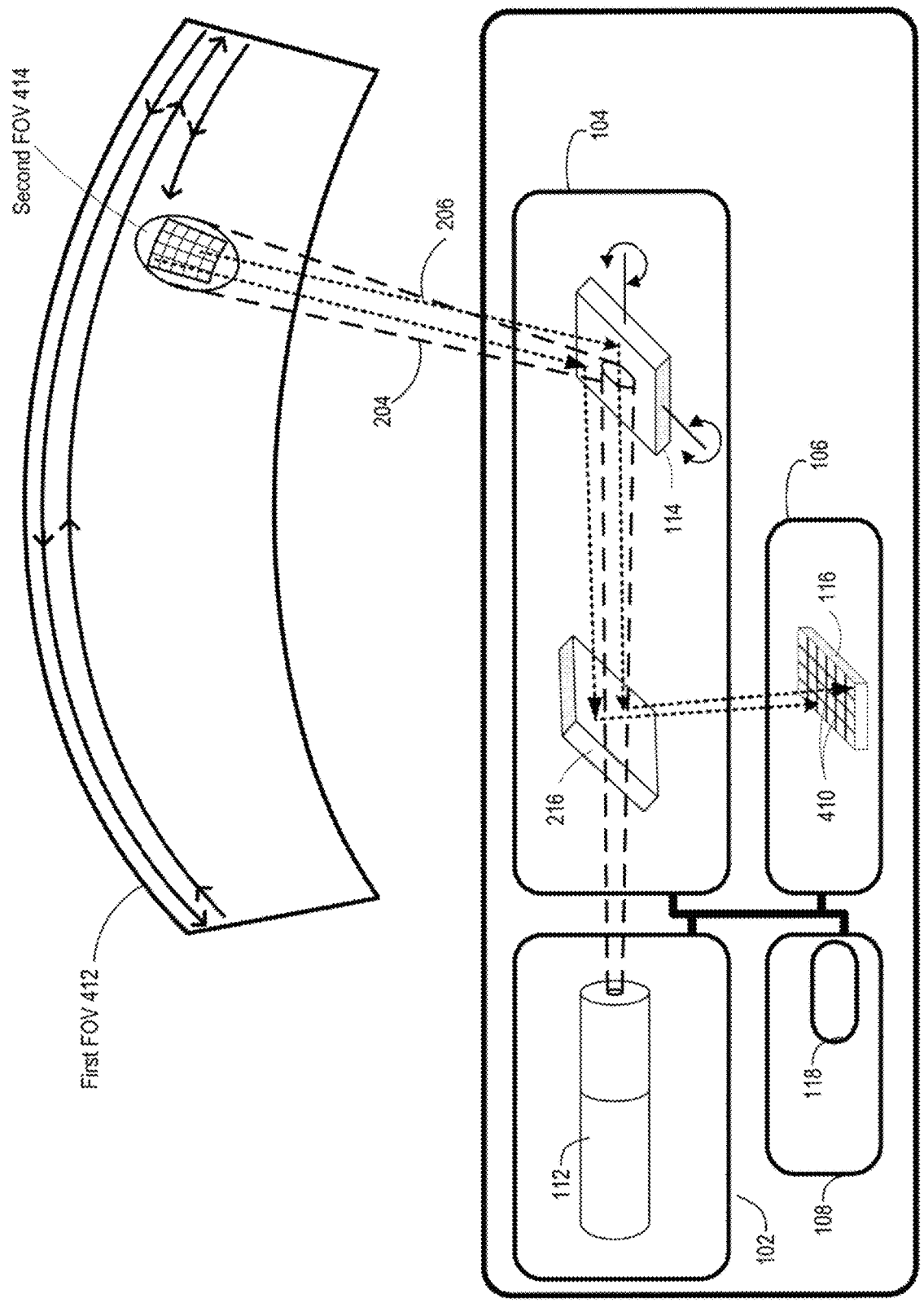
Figure 4C:
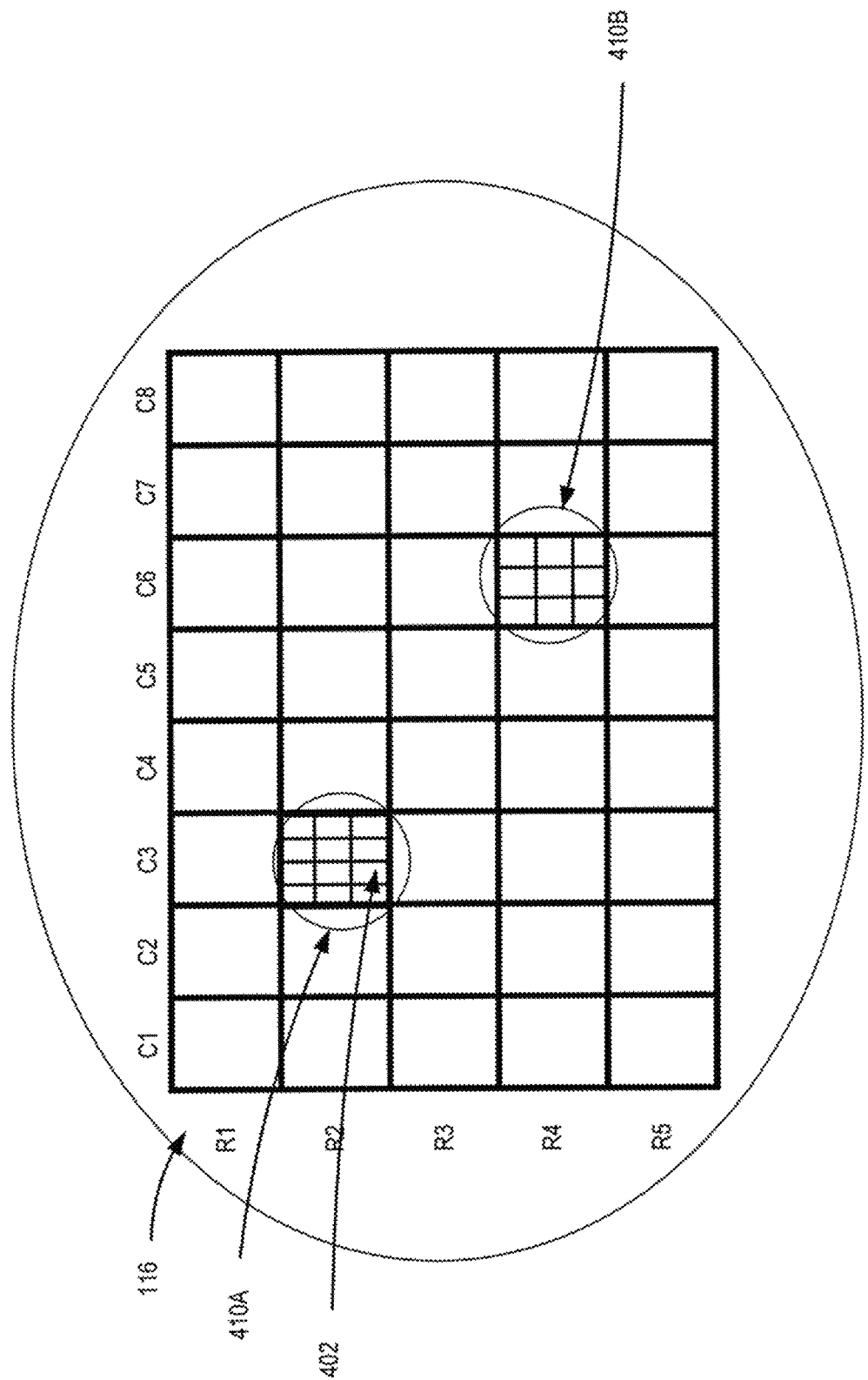
Figure 4D:
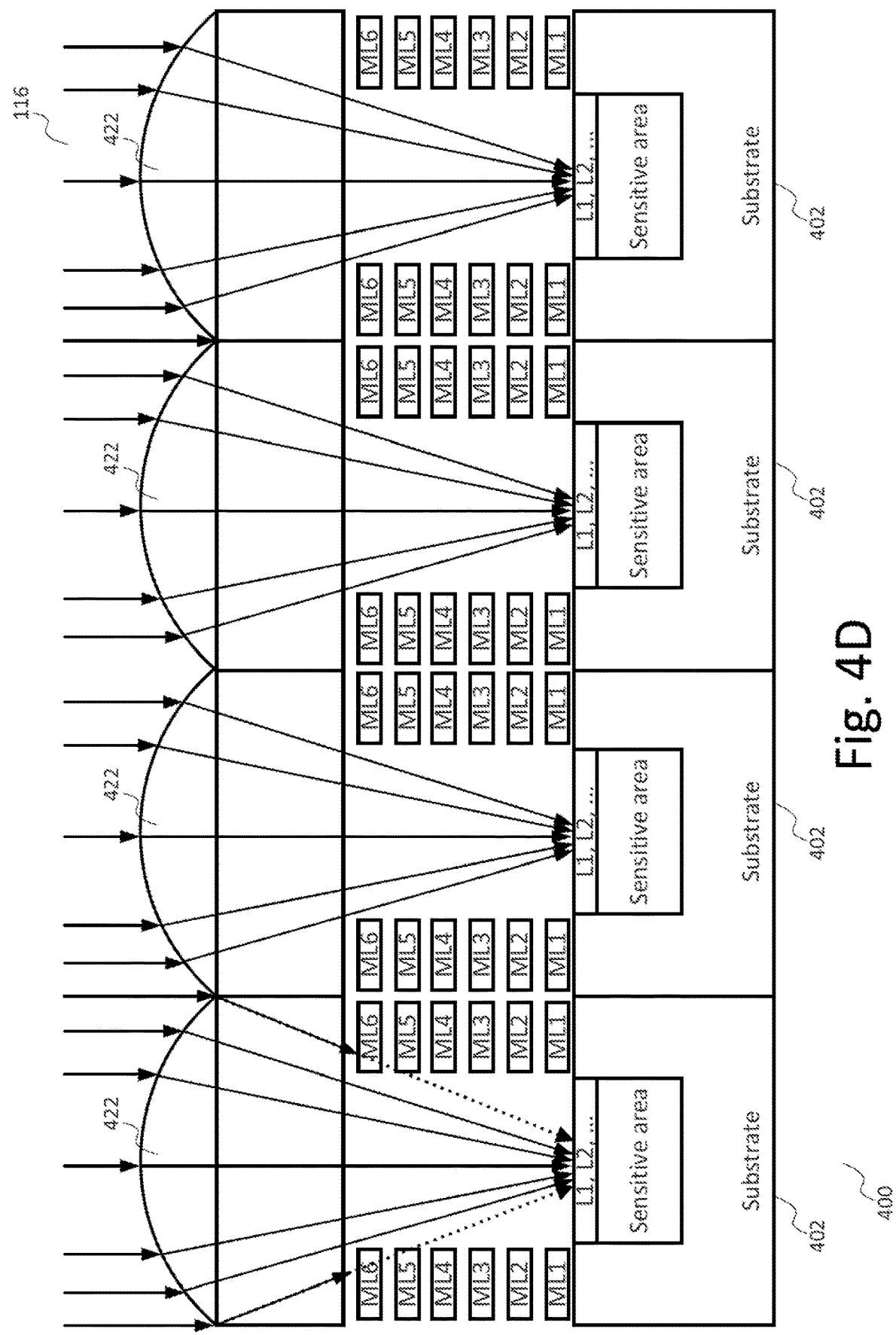

FIGS. 4A-4E depict various configurations of sensing unit 106 and its role in LIDAR system 100. Specifically, FIG. 4A is a diagram illustrating an example sensing unit 106 with a detector array, FIG. 4B is a diagram illustrating monostatic scanning using a two-dimensional sensor, FIG. 4C is a diagram illustrating an example of a two-dimensional sensor 116, FIG. 4D is a diagram illustrating a lens array associated with sensor 116, and FIG. 4E includes three diagrams illustrating the lens structure. One skilled in the art will appreciate that the depicted configurations of sensing unit 106 are exemplary only and may have numerous alternative variations and modifications consistent with the principles of this disclosure.

FIG. 4A illustrates an example of sensing unit 106 with detector array 400. In this example, at least one sensor 116 includes detector array 400. LIDAR system 100 is configured to detect objects (e.g., bicycle 208A and cloud 208B) in field of view 120 located at different distances from LIDAR system 100 (could be meters or more). Objects 208 may be a solid object (e.g. a road, a tree, a car, a person), fluid object (e.g. fog, water, atmosphere particles), or object of another type (e.g. dust or a powdery illuminated object). When the photons emitted from light source 112 hit object 208 they either reflect, refract, or get absorbed. Typically, as shown in the figure, only a portion of the photons reflected from object 208A enters optional optical window 124. As each ~15 cm change in distance results in a travel time difference of 1 ns (since the photons travel at the speed of light to and from object 208), the time differences between the travel times of different photons hitting the different objects may be detectable by a time-of-flight sensor with sufficiently quick response.

Sensor 116 includes a plurality of detection elements 402 for detecting photons of a photonic pulse reflected back from field of view 120. The detection elements may all be included in detector array 400, which may have a rectangular arrangement (e.g. as shown) or any other arrangement. Detection elements 402 may operate concurrently or partially concurrently with each other. Specifically, each detection element 402 may issue detection information for every sampling duration (e.g. every 1 nanosecond). In one example, detector array 400 may be a SiPM (Silicon photomultipliers) which is a solid-state single-photon-sensitive device built from an array of single photon avalanche diode (SPAD, serving as detection elements 402) on a common silicon substrate. Similar photomultipliers from other, non-silicon materials may also be used. Although a SiPM device works in digital/switching mode, the SiPM is an analog device because all the microcells are read in parallel, making it possible to generate signals within a dynamic range from a single photon to hundreds and thousands of photons detected by the different SPADs. As mentioned above, more than one type of sensor may be implemented (e.g. SiPM and APD). Possibly, sensing unit 106 may include at least one APD integrated into an SiPM array and/or at least one APD detector located next to a SiPM on a separate or common silicon substrate.

In one embodiment, detection elements 402 may be grouped into a plurality of regions 404. The regions are geometrical locations or environments within sensor 116 (e.g. within detector array 400)—and may be shaped in different shapes (e.g. rectangular as shown, squares, rings, and so on, or in any other shape). While not all of the individual detectors, which are included within the geometrical area of a region 404, necessarily belong to that region, in most cases they will not belong to other regions 404 covering other areas of the sensor 310—unless some overlap is desired in the seams between regions. As illustrated in FIG. 4A, the regions may be non-overlapping regions 404, but alternatively, they may overlap. Every region may be associated with a regional output circuitry 406 associated with that region. The regional output circuitry 406 may provide a region output signal of a corresponding group of detection elements 402. For example, the region of output circuitry 406 may be a summing circuit, but other forms of combined output of the individual detector into a unitary output (whether scalar, vector, or any other format) may be employed. Optionally, each region 404 is a single SiPM, but this is not necessarily so, and a region may be a sub-portion of a single SiPM, a group of several SiPMs, or even a combination of different types of detectors.

In the illustrated example, processing unit 108 is located at a separated housing 200B (within or outside) host 210 (e.g. within vehicle 110), and sensing unit 106 may include a dedicated processor 408 for analyzing the reflected light. Alternatively, processing unit 108 may be used for analyzing reflected light 206. It is noted that LIDAR system 100 may be implemented multiple housings in other ways than the illustrated example. For example, light deflector 114 may be located in a different housing than projecting unit 102 and/or sensing module 106. In one embodiment, LIDAR system 100 may include multiple housings connected to each other in different ways, such as: electric wire connection, wireless connection (e.g., RF connection), fiber optics cable, and any combination of the above.

In one embodiment, analyzing reflected light 206 may include determining a time of flight for reflected light 206, based on outputs of individual detectors of different regions. Optionally, processor 408 may be configured to determine the time of flight for reflected light 206 based on the plurality of regions of output signals. In addition to the time of flight, processing unit 108 may analyze reflected light 206 to determine the average power across an entire return pulse, and the photon distribution/signal may be determined over the return pulse period ("pulse shape"). In the illustrated example, the outputs of any detection elements 402 may not be transmitted directly to processor 408, but rather combined (e.g. summed) with signals of other detectors of the region 404 before being passed to processor 408. However, this is only an example and the circuitry of sensor 116 may transmit information from a detection element 402 to processor 408 via other routes (not via a region output circuitry 406).

FIG. 4B is a diagram illustrating LIDAR system 100 configured to scan the environment of LIDAR system 100 using a two-dimensional sensor 116. In the example of FIG. 4B, sensor 116 is a matrix of 4×6 detectors 410 (also referred to as "pixels"). In one embodiment, a pixel size may be about 1×1 mm. Sensor 116 is two-dimensional in the sense that it has more than one set (e.g. row, column) of detectors 410 in two non-parallel axes (e.g. orthogonal axes, as exemplified in the illustrated examples). The number of detectors 410 in sensor 116 may vary between differing implementations, e.g. depending on the desired resolution, signal to noise ratio (SNR), desired detection distance, and so on. For example, sensor 116 may have anywhere between 5 and 5,000 pixels. In another example (not shown in the figure) Also, sensor 116 may be a one-dimensional matrix (e.g. 1×8 pixels).

It is noted that each detector 410 may include a plurality of detection elements 402, such as Avalanche Photo Diodes (APD), Single Photon Avalanche Diodes (SPADs), combination of Avalanche Photo Diodes (APD) and Single Photon Avalanche Diodes (SPADs) or detecting elements that measure both the time of flight from a laser pulse transmission event to the reception event and the intensity of the received photons. For example, each detector 410 may include anywhere between 20 and 5,000 SPADs. The outputs of detection elements 402 in each detector 410 may be summed, averaged, or otherwise combined to provide a unified pixel output.

In the illustrated example, sensing unit 106 may include a two-dimensional sensor 116 (or a plurality of two-dimensional sensors 116), whose field of view is smaller than field of view 120 of LIDAR system 100. In this discussion, field of view 120 (the overall field of view which can be scanned by LIDAR system 100 without moving, rotating or rolling in any direction) is denoted "first FOV 412", and the smaller FOV of sensor 116 is denoted "second FOV 412" (interchangeably "instantaneous FOV"). The coverage area of second FOV 414 relative to the first FOV 412 may differ, depending on the specific use of LIDAR system 100, and may be, for example, between 0.5% and 50%. In one example, second FOV 412 may be between about 0.05° and 1° elongated in the vertical dimension. Even if LIDAR system 100 includes more than one two-dimensional sensor 116, the combined field of view of the sensors array may still be smaller than the first FOV 412, e.g. by a factor of at least 5, by a factor of at least 10, by a factor of at least 20, or by a factor of at least 50, for example.

In order to cover first FOV 412, scanning unit 106 may direct photons arriving from different parts of the environment to sensor 116 at different times. In the illustrated monostatic configuration, together with directing projected light 204 towards field of view 120 and when at least one light deflector 114 is located in an instantaneous position, scanning unit 106 may also direct reflected light 206 to sensor 116. Typically, at every moment during the scanning of first FOV 412, the light beam emitted by LIDAR system 100 covers part of the environment which is larger than the second FOV 414 (in angular opening) and includes the part of the environment from which light is collected by scanning unit 104 and sensor 116.

FIG. 4C is a diagram illustrating an example of a two-dimensional sensor 116. In this embodiment, sensor 116 is a matrix of 8×5 detectors 410 and each detector 410 includes a plurality of detection elements 402. In one example, detector 410A is located in the second row (denoted "R2") and third column (denoted "C3") of sensor 116, which includes a matrix of 4×3 detection elements 402. In another example, detector 410B located in the fourth row (denoted "R4") and sixth column (denoted "C6") of sensor 116 includes a matrix of 3×3 detection elements 402. Accordingly, the number of detection elements 402 in each detector 410 may be constant, or may vary, and differing detectors 410 in a common array may have a different number of detection elements 402. The outputs of all detection elements 402 in each detector 410 may be summed, averaged, or otherwise combined to provide a single pixel-output value. It is noted that while detectors 410 in the example of FIG. 4C are arranged in a rectangular matrix (straight rows and straight columns), other arrangements may also be used, e.g. a circular arrangement or a honeycomb arrangement.

According to some embodiments, measurements from each detector 410 may enable determination of the time of flight from a light pulse emission event to the reception event and the intensity of the received photons. The reception event may be the result of the light pulse being reflected from object 208. The time of flight may be a timestamp value that represents the distance of the reflecting object to optional optical window 124. Time of flight values may be realized by photon detection and counting methods, such as Time Correlated Single Photon Counters (TCSPC), analog methods for photon detection such as signal integration and qualification (via analog to digital converters or plain comparators) or otherwise.

In some embodiments and with reference to FIG. 4B, during a scanning cycle, each instantaneous position of at least one light deflector 114 may be associated with a particular portion 122 of field of view 120. The design of sensor 116 enables an association between the reflected light from a single portion of field of view 120 and multiple detectors 410. Therefore, the scanning resolution of LIDAR system may be represented by the number of instantaneous positions (per scanning cycle) times the number of detectors 410 in sensor 116. The information from each detector 410 (i.e., each pixel) represents the basic data element that from which the captured field of view in the three-dimensional space is built. This may include, for example, the basic element of a point cloud representation, with a spatial position and an associated reflected intensity value. In one embodiment, the reflections from a single portion of field of view 120 that are detected by multiple detectors 410 may be returning from different objects located in the single portion of field of view 120. For example, the single portion of field of view 120 may be greater than 50×50 cm at the far field, which can easily include two, three, or more objects partly covered by each other.

FIG. 4D is a cross cut diagram of a part of sensor 116, in accordance with examples of the presently disclosed subject matter. The illustrated part of sensor 116 includes a part of a detector array 400 which includes four detection elements 402 (e.g., four SPADs, four APDs). Detector array 400 may be a photodetector sensor realized in complementary metal-oxide-semiconductor (CMOS). Each of the detection elements 402 has a sensitive area, which is positioned within a substrate surrounding. While not necessarily so, sensor 116 may be used in a monostatic LiDAR system having a narrow field of view (e.g., because scanning unit 104 scans different parts of the field of view at different times). The narrow field of view for the incoming light beam—if implemented—eliminates the problem of out-of-focus imaging. As exemplified in FIG. 4D, sensor 116 may include a plurality of lenses 422 (e.g., microlenses), each lens 422 may direct incident light toward a different detection element 402 (e.g., toward an active area of detection element 402), which may be usable when out-of-focus imaging is not an issue. Lenses 422 may be used for increasing an optical fill factor and sensitivity of detector array 400, because most of the light that reaches sensor 116 may be deflected toward the active areas of detection elements 402

Detector array 400, as exemplified in FIG. 4D, may include several layers built into the silicon substrate by various methods (e.g., implant) resulting in a sensitive area, contact elements to the metal layers and isolation elements (e.g., shallow trench implant STI, guard rings, optical trenches, etc.). The sensitive area may be a volumetric element in the CMOS detector that enables the optical conversion of incoming photons into a current flow given an adequate voltage bias is applied to the device. In the case of a APD/SPAD, the sensitive area would be a combination of an electrical field that pulls electrons created by photon absorption towards a multiplication area where a photon induced electron is amplified creating a breakdown avalanche of multiplied electrons.

A front side illuminated detector (e.g., as illustrated in FIG. 4D) has the input optical port at the same side as the metal layers residing on top of the semiconductor (Silicon). The metal layers are required to realize the electrical connections of each individual photodetector element (e.g., anode and cathode) with various elements such as: bias voltage, quenching/ballast elements, and other photodetectors in a common array. The optical port through which the photons impinge upon the detector sensitive area is comprised of a passage through the metal layer. It is noted that passage of light from some directions through this passage may be blocked by one or more metal layers (e.g., metal layer ML6, as illustrated for the leftmost detector elements 402 in FIG. 4D). Such blockage reduces the total optical light absorbing efficiency of the detector.

Figure 4E:
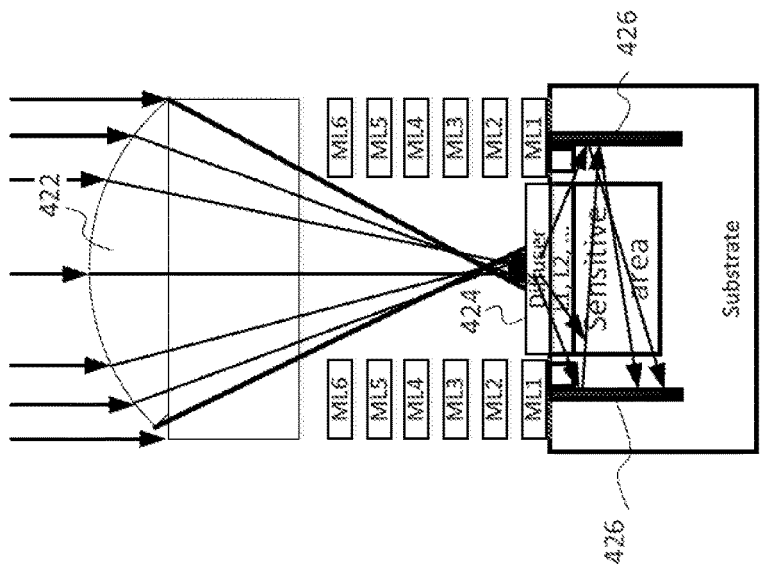
Figure 4E:
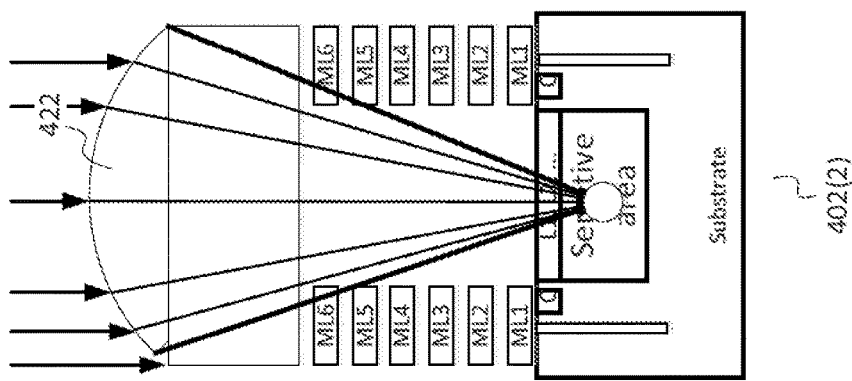
Figure 4E:
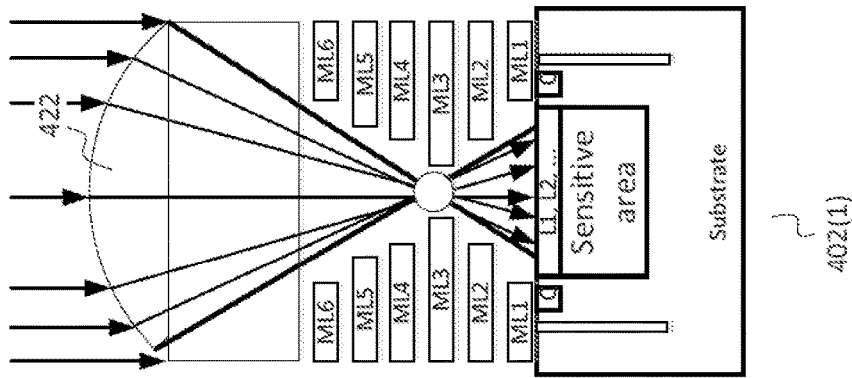

FIG. 4E illustrates three detection elements 402, each with an associated lens 422, in accordance with examples of the presenting disclosed subject matter. Each of the three detection elements of FIG. 4E, denoted 402(1), 402(2), and 402(3), illustrates a lens configuration which may be implemented in associated with one or more of the detecting elements 402 of sensor 116. It is noted that combinations of these lens configurations may also be implemented.

In the lens configuration illustrated with regards to detection element 402(1), a focal point of the associated lens 422 may be located above the semiconductor surface. Optionally, openings in different metal layers of the detection element may have different sizes aligned with the cone of focusing light generated by the associated lens 422. Such a structure may improve the signal-to-noise and resolution of the array 400 as a whole device. Large metal layers may be important for delivery of power and ground shielding. This approach may be useful, e.g., with a monostatic LiDAR design with a narrow field of view where the incoming light beam is comprised of parallel rays and the imaging focus does not have any consequence to the detected signal.

In the lens configuration illustrated with regards to detection element 402(2), an efficiency of photon detection by the detection elements 402 may be improved by identifying a sweet spot. Specifically, a photodetector implemented in CMOS may have a sweet spot in the sensitive volume area where the probability of a photon creating an avalanche effect is the highest. Therefore, a focal point of lens 422 may be positioned inside the sensitive volume area at the sweet spot location, as demonstrated by detection elements 402(2). The lens shape and distance from the focal point may take into account the refractive indices of all the elements the laser beam is passing along the way from the lens to the sensitive sweet spot location buried in the semiconductor material.

In the lens configuration illustrated with regards to the detection element on the right of FIG. 4E, an efficiency of photon absorption in the semiconductor material may be improved using a diffuser and reflective elements. Specifically, a near IR wavelength requires a significantly long path of silicon material in order to achieve a high probability of absorbing a photon that travels through. In a typical lens configuration, a photon may traverse the sensitive area and may not be absorbed into a detectable electron. A long absorption path that improves the probability for a photon to create an electron renders the size of the sensitive area towards less practical dimensions (tens of um for example) for a CMOS device fabricated with typical foundry processes. The rightmost detector element in FIG. 4E demonstrates a technique for processing incoming photons. The associated lens 422 focuses the incoming light onto a diffuser element 424. In one embodiment, light sensor 116 may further include a diffuser located in the gap distant from the outer surface of at least some of the detectors. For example, diffuser 424 may steer the light beam sideways (e.g., as perpendicular as possible) towards the sensitive area and the reflective optical trenches 426. The diffuser is located at the focal point, above the focal point, or below the focal point. In this embodiment, the incoming light may be focused on a specific location where a diffuser element is located. Optionally, detector element 422 is designed to optically avoid the inactive areas where a photon induced electron may get lost and reduce the effective detection efficiency. Reflective optical trenches 426 (or other forms of optically reflective structures) cause the photons to bounce back and forth across the sensitive area, thus increasing the likelihood of detection. Ideally, the photons will get trapped in a cavity consisting of the sensitive area and the reflective trenches indefinitely until the photon is absorbed and creates an electron/hole pair.

Consistent with the present disclosure, a long path is created for the impinging photons to be absorbed and contribute to a higher probability of detection. Optical trenches may also be implemented in detecting element 422 for reducing cross talk effects of parasitic photons created during an avalanche that may leak to other detectors and cause false detection events. According to some embodiments, a photo detector array may be optimized so that a higher yield of the received signal is utilized, meaning, that as much of the received signal is received and less of the signal is lost to internal degradation of the signal. The photo detector array may be improved by: (a) moving the focal point at a location above the semiconductor surface, optionally by designing the metal layers above the substrate appropriately; (b) by steering the focal point to the most responsive/sensitive area (or "sweet spot") of the substrate and (c) adding a diffuser above the substrate to steer the signal toward the "sweet spot" and/or adding reflective material to the trenches so that deflected signals are reflected back to the "sweet spot."

While in some lens configurations, lens 422 may be positioned so that its focal point is above a center of the corresponding detection element 402, it is noted that this is not necessarily so. In other lens configuration, a position of the focal point of the lens 422 with respect to a center of the corresponding detection element 402 is shifted based on a distance of the respective detection element 402 from a center of the detection array 400. This may be useful in relatively larger detection arrays 400, in which detector elements further from the center receive light in angles which are increasingly off-axis. Shifting the location of the focal points (e.g., toward the center of detection array 400) allows correcting for the incidence angles. Specifically, shifting the location of the focal points (e.g., toward the center of detection array 400) allows correcting for the incidence angles while using substantially identical lenses 422 for all detection elements, which are positioned at the same angle with respect to a surface of the detector.

Adding an array of lenses 422 to an array of detection elements 402 may be useful when using a relatively small sensor 116 which covers only a small part of the field of view because in such a case, the reflection signals from the scene reach the detectors array 400 from substantially the same angle, and it is, therefore, easy to focus all the light onto individual detectors. It is also noted, that in one embodiment, lenses 422 may be used in LIDAR system 100 for favoring about increasing the overall probability of detection of the entire array 400 (preventing photons from being "wasted" in the dead area between detectors/sub-detectors) at the expense of spatial distinctiveness. This embodiment is in contrast to prior art implementations such as CMOS RGB camera, which prioritize spatial distinctiveness (i.e., light that propagates in the direction of detection element A is not allowed to be directed by the lens toward detection element B, that is, to "bleed" to another detection element of the array). Optionally, sensor 116 includes an array of lens 422, each being correlated to a corresponding detection element 402, while at least one of the lenses 422 deflects light which propagates to a first detection element 402 toward a second detection element 402 (thereby it may increase the overall probability of detection of the entire array).

Specifically, consistent with some embodiments of the present disclosure, light sensor 116 may include an array of light detectors (e.g., detector array 400), each light detector (e.g., detector 410) being configured to cause an electric current to flow when light passes through an outer surface of a respective detector. In addition, light sensor 116 may include at least one micro-lens configured to direct light toward the array of light detectors, the at least one micro-lens having a focal point. Light sensor 116 may further include at least one layer of conductive material interposed between the at least one micro-lens and the array of light detectors and having a gap therein to permit light to pass from the at least one micro-lens to the array, the at least one layer being sized to maintain a space between the at least one micro-lens and the array to cause the focal point (e.g., the focal point may be a plane) to be located in the gap, at a location spaced from the detecting surfaces of the array of light detectors.

In related embodiments, each detector may include a plurality of Single Photon Avalanche Diodes (SPADs) or a plurality of Avalanche Photo Diodes (APD). The conductive material may be a multi-layer metal constriction, and the at least one layer of conductive material may be electrically connected to detectors in the array. In one example, the at least one layer of conductive material includes a plurality of layers. In addition, the gap may be shaped to converge from the at least one micro-lens toward the focal point, and to diverge from a region of the focal point toward the array. In other embodiments, light sensor 116 may further include at least one reflector adjacent each photo detector. In one embodiment, a plurality of micro-lenses may be arranged in a lens array and the plurality of detectors may be arranged in a detector array. In another embodiment, the plurality of micro-lenses may include a single lens configured to project light to a plurality of detectors in the array.

Referring by way of a nonlimiting example to FIGS. 2E, 2F and 2G, it is noted that the one or more sensors 116 of system 100 may receive light from a scanning deflector 114 or directly from the FOV without scanning. Even if light from the entire FOV arrives to the at least one sensor 116 at the same time, in some implementations the one or more sensors 116 may sample only parts of the FOV for detection output at any given time. For example, if the illumination of projection unit 102 illuminates different parts of the FOV at different times (whether using a deflector 114 and/or by activating different light sources 112 at different times), light may arrive at all of the pixels or sensors 116 of sensing unit 106, and only pixels/sensors which are expected to detect the LIDAR illumination may be actively collecting data for detection outputs. This way, the rest of the pixels/sensors do not unnecessarily collect ambient noise. Referring to the scanning—in the outbound or in the inbound directions—it is noted that substantially different scales of scanning may be implemented. For example, in some implementations the scanned area may cover 1‰ or 0.1‰ of the FOV, while in other implementations the scanned area may cover 10% or 25% of the FOV. All other relative portions of the FOV values may also be implemented, of course.

The Processing Unit

Figure 5A:
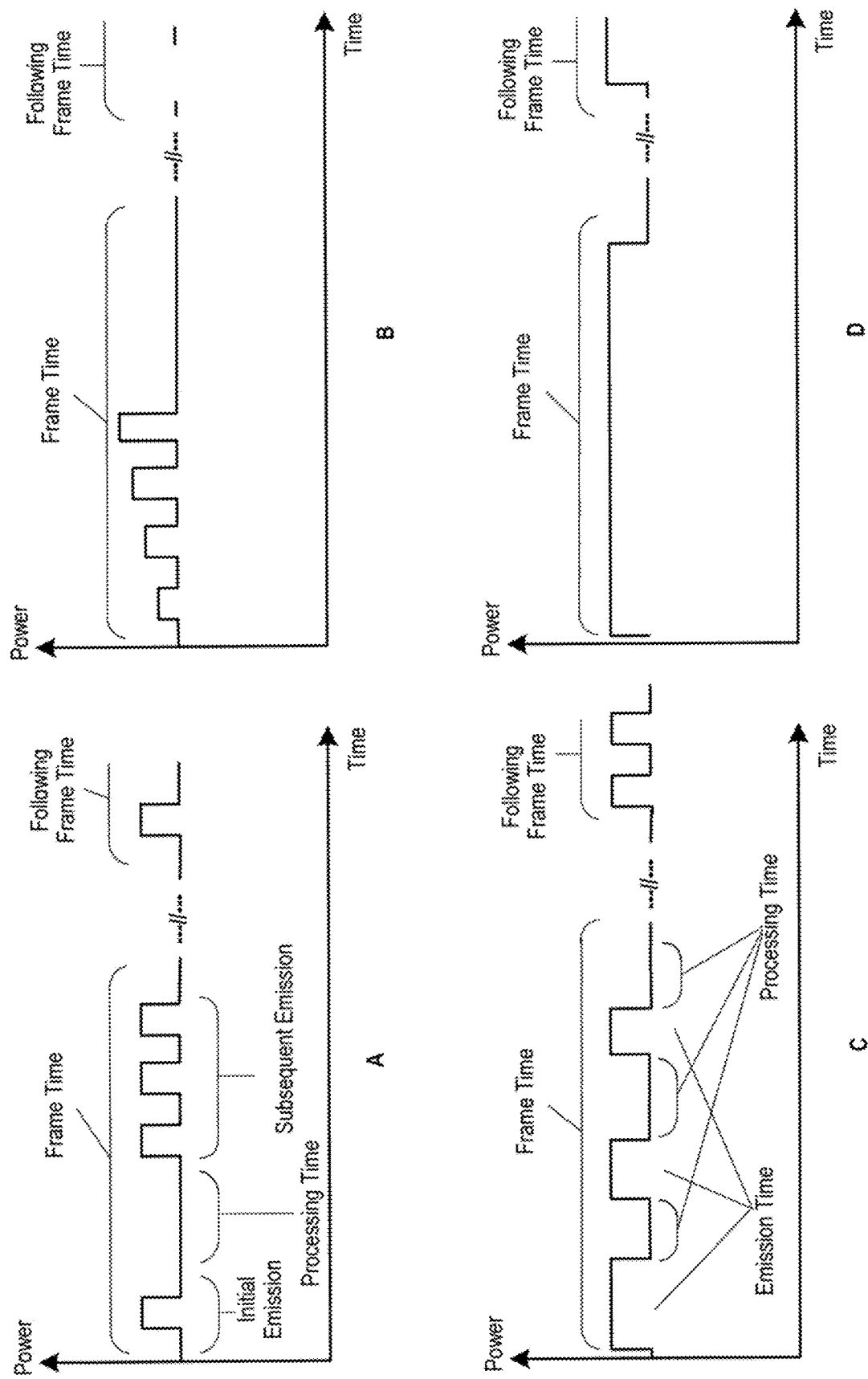
FIG. 5A includes four example diagrams illustrating emission patterns in a single frame-time for a single portion of the field of view.
Figure 5B:
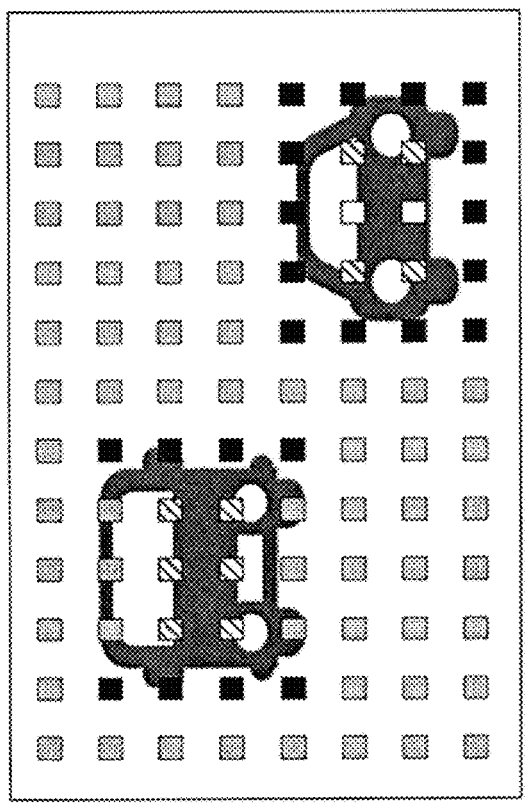
FIG. 5B includes three example diagrams illustrating emission scheme in a single frame-time for the whole field of view.
Figure 5B:
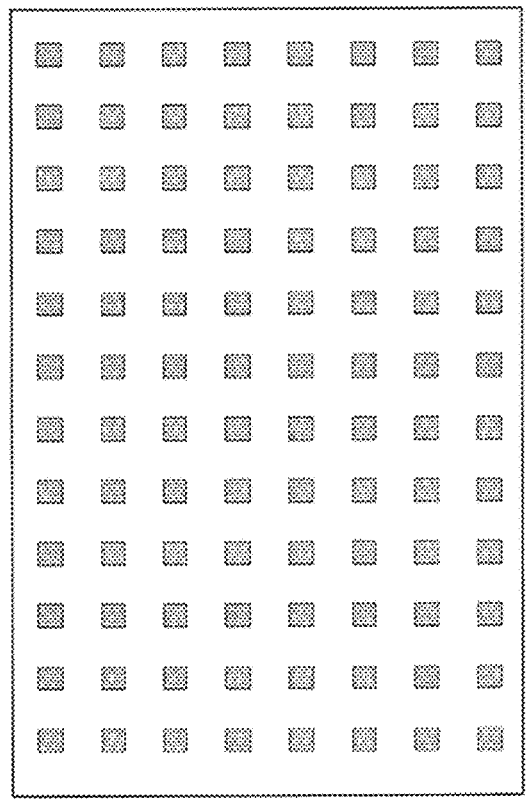
Figure 5B:
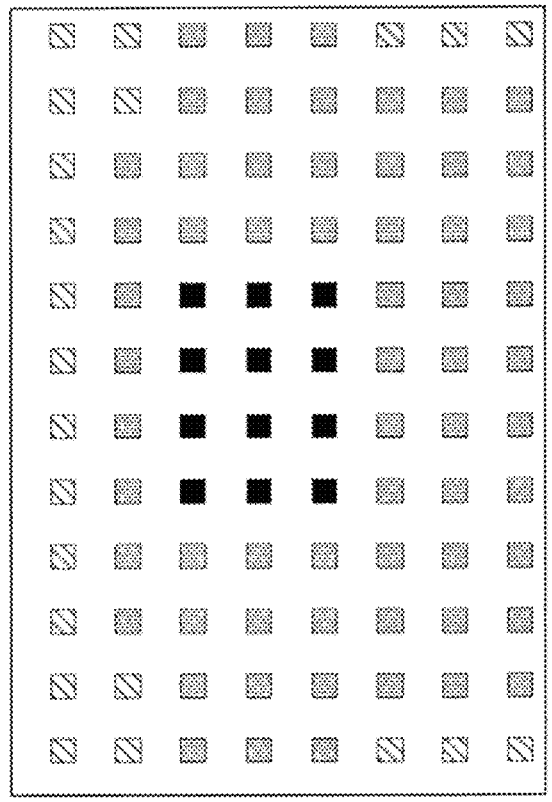
Figure 5C:
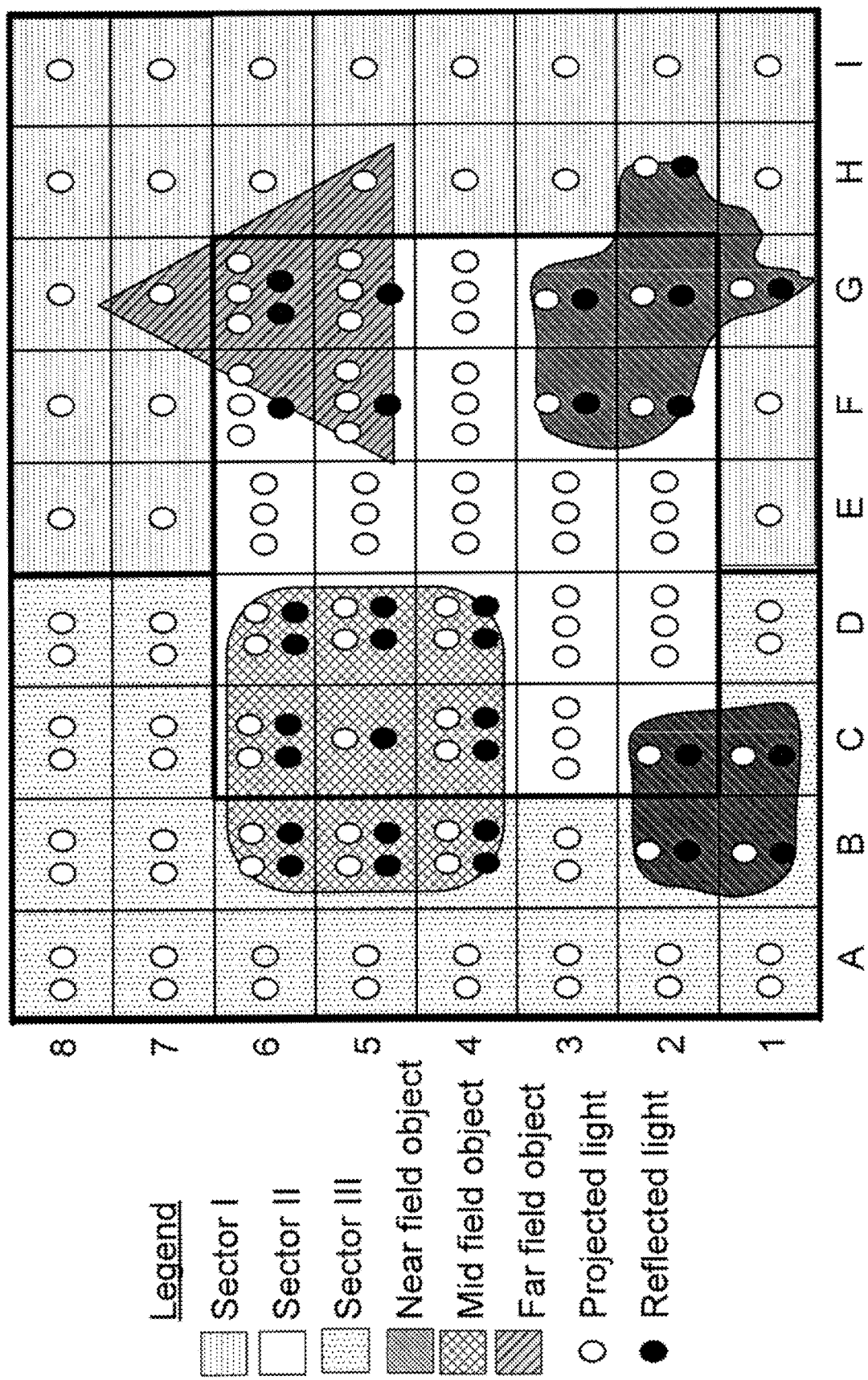
FIG. 5C is a diagram illustrating the actual light emission projected towards and reflections received during a single frame-time for the whole field of view.

FIGS. 5A-5C depict different functionalities of processing units 108 in accordance with some embodiments of the present disclosure. Specifically, FIG. 5A is a diagram illustrating emission patterns in a single frame-time for a single portion of the field of view, FIG. 5B is a diagram illustrating emission scheme in a single frame-time for the whole field of view, and. FIG. 5C is a diagram illustrating the actual light emission projected towards field of view during a single scanning cycle.

FIG. 5A illustrates four examples of emission patterns in a single frame-time for a single portion 122 of field of view 120 associated with an instantaneous position of at least one light deflector 114. Consistent with embodiments of the present disclosure, processing unit 108 may control at least one light source 112 and light deflector 114 (or coordinate the operation of at least one light source 112 and at least one light deflector 114) in a manner enabling light flux to vary over a scan of field of view 120. Consistent with other embodiments, processing unit 108 may control only at least one light source 112 and light deflector 114 may be moved or pivoted in a fixed predefined pattern.

Diagrams A-D in FIG. 5A depict the power of light emitted towards a single portion 122 of field of view 120 over time. In Diagram A, processor 118 may control the operation of light source 112 in a manner such that during scanning of field of view 120 an initial light emission is projected toward portion 122 of field of view 120. When projecting unit 102 includes a pulsed-light light source, the initial light emission may include one or more initial pulses (also referred to as "pilot pulses"). Processing unit 108 may receive from sensor 116 pilot information about reflections associated with the initial light emission. In one embodiment, the pilot information may be represented as a single signal based on the outputs of one or more detectors (e.g. one or more SPADs, one or more APDs, one or more SiPMs, etc.) or as a plurality of signals based on the outputs of multiple detectors. In one example, the pilot information may include analog and/or digital information. In another example, the pilot information may include a single value and/or a plurality of values (e.g. for different times and/or parts of the segment).

Based on information about reflections associated with the initial light emission, processing unit 108 may be configured to determine the type of subsequent light emission to be projected towards portion 122 of field of view 120. The determined subsequent light emission for the particular portion of field of view 120 may be made during the same scanning cycle (i.e., in the same frame) or in a subsequent scanning cycle (i.e., in a subsequent frame). This embodiment is described in greater detail below with reference to FIGS. 23-25.

In Diagram B, processor 118 may control the operation of light source 112 in a manner such that during scanning of field of view 120 light pulses in different intensities are projected towards a single portion 122 of field of view 120. In one embodiment, LIDAR system 100 may be operable to generate depth maps of one or more different types, such as any one or more of the following types: point cloud model, polygon mesh, depth image (holding depth information for each pixel of an image or of a 2D array), or any other type of 3D model of a scene. The sequence of depth maps may be a temporal sequence, in which different depth maps are generated at a different time. Each depth map of the sequence associated with a scanning cycle (interchangeably "frame") may be generated within the duration of a corresponding subsequent frame-time. In one example, a typical frame-time may last less than a second. In some embodiments, LIDAR system 100 may have a fixed frame rate (e.g. 10 frames per second, 25 frames per second, 50 frames per second) or the frame rate may be dynamic. In other embodiments, the frame-times of different frames may not be identical across the sequence. For example, LIDAR system 100 may implement a 10 frames-per-second rate that includes generating a first depth map in 100 milliseconds (the average), a second frame in 92 milliseconds, a third frame at 142 milliseconds, and so on.

In Diagram C, processor 118 may control the operation of light source 112 in a manner such that during scanning of field of view 120 light pulses associated with different durations are projected towards a single portion 122 of field of view 120. In one embodiment, LIDAR system 100 may be operable to generate a different number of pulses in each frame. The number of pulses may vary between 0 to 32 pulses (e.g., 1, 5, 12, 28, or more pulses) and may be based on information derived from previous emissions. The time between light pulses may depend on desired detection range and can be between 500 ns and 5000 ns. In one example, processing unit 108 may receive from sensor 116 information about reflections associated with each light-pulse. Based on the information (or the lack of information), processing unit 108 may determine if additional light pulses are needed. It is noted that the durations of the processing times and the emission times in diagrams A-D are not in-scale. Specifically, the processing time may be substantially longer than the emission time. In diagram D, projecting unit 102 may include a continuous-wave light source. In one embodiment, the initial light emission may include a period of time where light is emitted and the subsequent emission may be a continuation of the initial emission, or there may be a discontinuity. In one embodiment, the intensity of the continuous emission may change over time.

Consistent with some embodiments of the present disclosure, the emission pattern may be determined per each portion of field of view 120. In other words, processor 118 may control the emission of light to allow differentiation in the illumination of different portions of field of view 120. In one example, processor 118 may determine the emission pattern for a single portion 122 of field of view 120, based on detection of reflected light from the same scanning cycle (e.g., the initial emission), which makes LIDAR system 100 extremely dynamic. In another example, processor 118 may determine the emission pattern for a single portion 122 of field of view 120, based on detection of reflected light from a previous scanning cycle. The differences in the patterns of the subsequent emissions may result from determining different values for light-source parameters for the subsequent emission, such as any one of the following.

a. Overall energy of the subsequent emission.
   b. Energy profile of the subsequent emission.
   c. A number of light-pulse-repetition per frame.
   d. Light modulation characteristics such as duration, rate, peak, average power, and pulse shape.
   e. Wave properties of the subsequent emission, such as polarization, wavelength, etc.

Consistent with the present disclosure, the differentiation in the subsequent emissions may be put to different uses. In one example, it is possible to limit emitted power levels in one portion of field of view 120 where safety is a consideration, while emitting higher power levels (thus improving signal-to-noise ratio and detection range) for other portions of field of view 120. This is relevant for eye safety, but may also be relevant for skin safety, safety of optical systems, safety of sensitive materials, and more. In another example, it is possible to direct more energy towards portions of field of view 120 where it will be of greater use (e.g. regions of interest, further distanced targets, low reflection targets, etc.) while limiting the lighting energy to other portions of field of view 120 based on detection results from the same frame or previous frame. It is noted that processing unit 108 may process detected signals from a single instantaneous field of view several times within a single scanning frame time; for example, subsequent emission may be determined upon after every pulse emitted, or after a number of pulses emitted.

FIG. 5B illustrates three examples of emission schemes in a single frame-time for field of view 120. Consistent with embodiments of the present disclosure, at least on processing unit 108 may use obtained information to dynamically adjust the operational mode of LIDAR system 100 and/or determine values of parameters of specific components of LIDAR system 100. The obtained information may be determined from processing data captured in field of view 120, or received (directly or indirectly) from host 210. Processing unit 108 may use the obtained information to determine a scanning scheme for scanning the different portions of field of view 120. The obtained information may include a current light condition, a current weather condition, a current driving environment of the host vehicle, a current location of the host vehicle, a current trajectory of the host vehicle, a current topography of road surrounding the host vehicle, or any other condition or object detectable through light reflection. In some embodiments, the determined scanning scheme may include at least one of the following: (a) a designation of portions within field of view 120 to be actively scanned as part of a scanning cycle, (b) a projecting plan for projecting unit 102 that defines the light emission profile at different portions of field of view 120; (c) a deflecting plan for scanning unit 104 that defines, for example, a deflection direction, frequency, and designating idle elements within a reflector array; and (d) a detection plan for sensing unit 106 that defines the detectors sensitivity or responsivity pattern.

In addition, processing unit 108 may determine the scanning scheme at least partially by obtaining an identification of at least one region of interest within the field of view 120 and at least one region of non-interest within the field of view 120. In some embodiments, processing unit 108 may determine the scanning scheme at least partially by obtaining an identification of at least one region of high interest within the field of view 120 and at least one region of lower-interest within the field of view 120. The identification of the at least one region of interest within the field of view 120 may be determined, for example, from processing data captured in field of view 120, based on data of another sensor (e.g. camera, GPS), received (directly or indirectly) from host 210, or any combination of the above. In some embodiments, the identification of at least one region of interest may include identification of portions, areas, sections, pixels, or objects within field of view 120 that are important to monitor. Examples of areas that may be identified as regions of interest may include, crosswalks, moving objects, people, nearby vehicles or any other environmental condition or object that may be helpful in vehicle navigation. Examples of areas that may be identified as regions of non-interest (or lower-interest) may be static (non-moving) far-away buildings, a skyline, an area above the horizon and objects in the field of view. Upon obtaining the identification of at least one region of interest within the field of view 120, processing unit 108 may determine the scanning scheme or change an existing scanning scheme. Further to determining or changing the light-source parameters (as described above), processing unit 108 may allocate detector resources based on the identification of the at least one region of interest. In one example, to reduce noise, processing unit 108 may activate detectors 410 where a region of interest is expected and disable detectors 410 where regions of non-interest are expected. In another example, processing unit 108 may change the detector sensitivity, e.g., increasing sensor sensitivity for long range detection where the reflected power is low.

Diagrams A-C in FIG. 5B depict examples of different scanning schemes for scanning field of view 120. Each square in field of view 120 represents a different portion 122 associated with an instantaneous position of at least one light deflector 114. Legend 500 details the level of light flux represented by the filling pattern of the squares. Diagram A depicts a first scanning scheme in which all of the portions have the same importance/priority and a default light flux is allocated to them. The first scanning scheme may be utilized in a start-up phase or periodically interleaved with another scanning scheme to monitor the whole field of view for unexpected/new objects. In one example, the light source parameters in the first scanning scheme may be configured to generate light pulses at constant amplitudes. Diagram B depicts a second scanning scheme in which a portion of field of view 120 is allocated with high light flux while the rest of field of view 120 is allocated with default light flux and low light flux. The portions of field of view 120 that are the least interesting may be allocated with low light flux. Diagram C depicts a third scanning scheme in which a compact vehicle and a bus (see silhouettes) are identified in field of view 120. In this scanning scheme, the edges of the vehicle and bus may be tracked with high power and the central mass of the vehicle and bus may be allocated with less light flux (or no light flux). Such light flux allocation enables concentration of more of the optical budget on the edges of the identified objects and less on their center which have less importance.

FIG. 5C illustrating the emission of light towards field of view 120 during a single scanning cycle. In the depicted example, field of view 120 is represented by an 8×9 matrix, where each of the 72 cells corresponds to a separate portion 122 associated with a different instantaneous position of at least one light deflector 114. In this exemplary scanning cycle, each portion includes one or more white dots that represent the number of light pulses projected toward that portion, and some portions include black dots that represent reflected light from that portion detected by sensor 116. As shown, field of view 120 is divided into three sectors: sector I on the right side of field of view 120, sector II in the middle of field of view 120, and sector III on the left side of field of view 120. In this exemplary scanning cycle, sector I was initially allocated with a single light pulse per portion; sector II, previously identified as a region of interest, was initially allocated with three light pulses per portion; and sector III was initially allocated with two light pulses per portion. Also as shown, scanning of field of view 120 reveals four objects 208: two free-form objects in the near field (e.g., between 5 and 50 meters), a rounded-square object in the mid field (e.g., between 50 and 150 meters), and a triangle object in the far field (e.g., between 150 and 500 meters). While the discussion of FIG. 5C uses number of pulses as an example of light flux allocation, it is noted that light flux allocation to different parts of the field of view may also be implemented in other ways such as: pulse duration, pulse angular dispersion, wavelength, instantaneous power, photon density at different distances from light source 112, average power, pulse power intensity, pulse width, pulse repetition rate, pulse sequence, pulse duty cycle, wavelength, phase, polarization, and more. The illustration of the light emission as a single scanning cycle in FIG. 5C demonstrates different capabilities of LIDAR system 100. In a first embodiment, processor 118 is configured to use two light pulses to detect a first object (e.g., the rounded-square object) at a first distance, and to use three light pulses to detect a second object (e.g., the triangle object) at a second distance greater than the first distance. This embodiment is described in greater detail below with reference to FIGS. 11-13. In a second embodiment, processor 118 is configured to allocate more light to portions of the field of view where a region of interest is identified. Specifically, in the present example, sector II was identified as a region of interest and accordingly it was allocated with three light pulses while the rest of field of view 120 was allocated with two or less light pulses. This embodiment is described in greater detail below with reference to FIGS. 20-22. In a third embodiment, processor 118 is configured to control light source 112 in a manner such that only a single light pulse is projected toward to portions B1, B2, and C1 in FIG. 5C, although they are part of sector III that was initially allocated with two light pulses per portion. This occurs because the processing unit 108 detected an object in the near field based on the first light pulse. This embodiment is described in greater detail below with reference to FIGS. 23-25. Allocation of less than maximal amount of pulses may also be a result of other considerations. For examples, in at least some regions, detection of object at a first distance (e.g. a near field object) may result in reducing an overall amount of light emitted to this portion of field of view 120. This embodiment is described in greater detail below with reference to FIGS. 14-16. Other reasons to for determining power allocation to different portions is discussed below with respect to FIGS. 29-31, FIGS. 53-55, and FIGS. 50-52.

Additional details and examples on different components of LIDAR system 100 and their associated functionalities are included in Applicant's U.S. patent application Ser. No. 15/391,916 filed Dec. 28, 2016; Applicant's U.S. patent application Ser. No. 15/393,749 filed Dec. 29, 2016; Applicant's U.S. patent application Ser. No. 15/393,285 filed Dec.

29, 2016; and Applicant's U.S. patent application Ser. No. 15/393,593 filed Dec. 29, 2016, which are incorporated herein by reference in their entirety.

Example Implementation: Vehicle

Figure 6C:
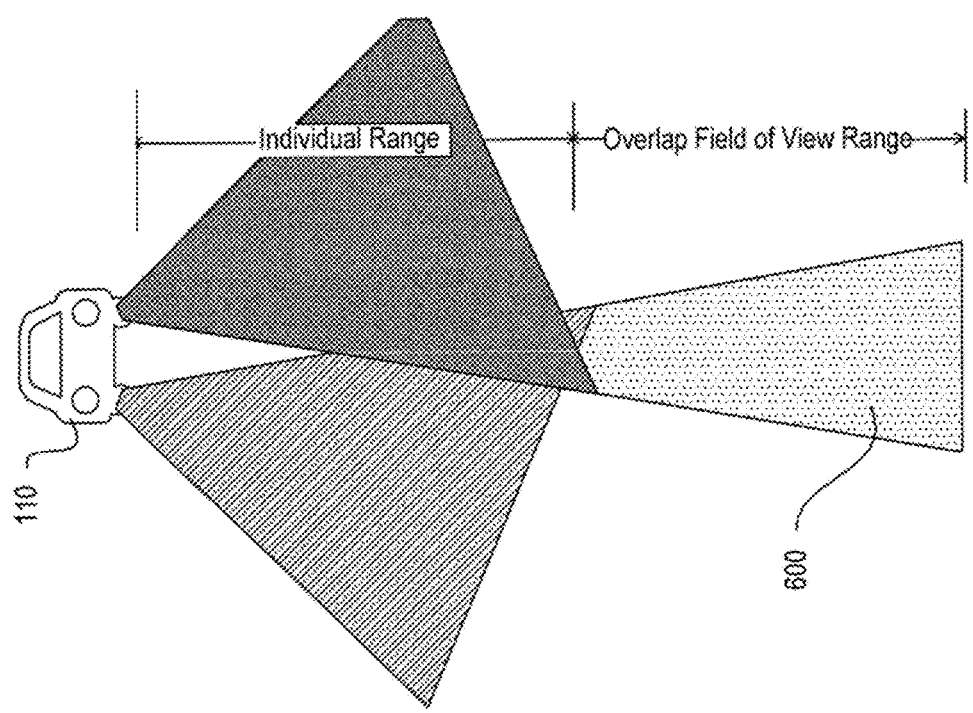
FIGS. 6A-6C are diagrams illustrating a first example implementation consistent with some embodiments of the present disclosure.
Figure 6A:
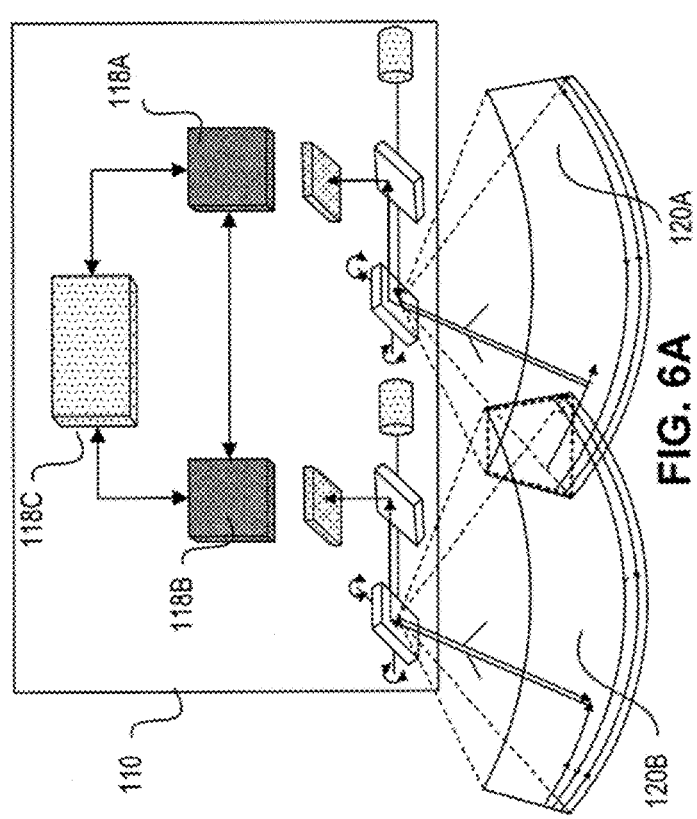
Figure 6B:
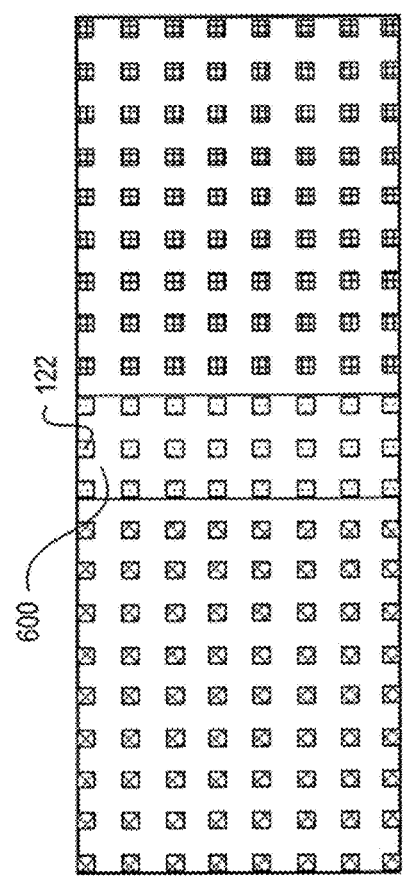

FIGS. 6A-6C illustrate the implementation of LIDAR system 100 in a vehicle (e.g., vehicle 110). Any of the aspects of LIDAR system 100 described above or below may be incorporated into vehicle 110 to provide a range-sensing vehicle. Specifically, in this example, LIDAR system 100 integrates multiple scanning units 104 and potentially multiple projecting units 102 in a single vehicle. In one embodiment, a vehicle may take advantage of such a LIDAR system to improve power, range and accuracy in the overlap zone and beyond it, as well as redundancy in sensitive parts of the FOV (e.g. the forward movement direction of the vehicle). As shown in FIG. 6A, vehicle 110 may include a first processor 118A for controlling the scanning of field of view 120A, a second processor 118B for controlling the scanning of field of view 120B, and a third processor 118C for controlling synchronization of scanning the two fields of view. In one example, processor 118C may be the vehicle controller and may have a shared interface between first processor 118A and second processor 118B. The shared interface may enable an exchanging of data at intermediate processing levels and a synchronization of scanning of the combined field of view in order to form an overlap in the temporal and/or spatial space. In one embodiment, the data exchanged using the shared interface may be: (a) time of flight of received signals associated with pixels in the overlapped field of view and/or in its vicinity; (b) laser steering position status; (c) detection status of objects in the field of view.

FIG. 6B illustrates overlap region 600 between field of view 120A and field of view 120B. In the depicted example, the overlap region is associated with 24 portions 122 from field of view 120A and 24 portions 122 from field of view 120B. Given that the overlap region is defined and known by processors 118A and 118B, each processor may be designed to limit the amount of light emitted in overlap region 600 in order to conform with an eye safety limit that spans multiple source lights, or for other reasons such as maintaining an optical budget. In addition, processors 118A and 118B may avoid interferences between the light emitted by the two light sources by loose synchronization between the scanning unit 104A and scanning unit 104B, and/or by control of the laser transmission timing, and/or the detection circuit enabling timing.

FIG. 6C illustrates how overlap region 600 between field of view 120A and field of view 120B may be used to increase the detection distance of vehicle 110. Consistent with the present disclosure, two or more light sources 112 projecting their nominal light emission into the overlap zone may be leveraged to increase the effective detection range. The term "detection range" may include an approximate distance from vehicle 110 at which LIDAR system 100 can clearly detect an object. In one embodiment, the maximum detection range of LIDAR system 100 is about 300 meters, about 400 meters, or about 500 meters. For example, for a detection range of 200 meters, LIDAR system 100 may detect an object located 200 meters (or less) from vehicle 110 at more than 95%, more than 99%, more than 99.5% of the times. Even when the object's reflectivity may be less than 50% (e.g., less than 20%, less than 10%, or less than 5%). In addition, LIDAR system 100 may have less than 1% false alarm rate. In one embodiment, light from projected from two light sources that are collocated in the temporal and spatial space can be utilized to improve SNR and therefore increase the range and/or quality of service for an object located in the overlap region. Processor 118C may extract high-level information from the reflected light in field of view 120A and 120B. The term "extracting information" may include any process by which information associated with objects, individuals, locations, events, etc., is identified in the captured image data by any means known to those of ordinary skill in the art. In addition, processors 118A and 118B may share the high-level information, such as objects (road delimiters, background, pedestrians, vehicles, etc.), and motion vectors, to enable each processor to become alert to the peripheral regions about to become regions of interest. For example, a moving object in field of view 120A may be determined to soon be entering field of view 120B.

Example Implementation: Surveillance System

FIG. 6D illustrates the implementation of LIDAR system 100 in a surveillance system. As mentioned above, LIDAR system 100 may be fixed to a stationary object 650 that may include a motor or other mechanisms for rotating the housing of the LIDAR system 100 to obtain a wider field of view. Alternatively, the surveillance system may include a plurality of LIDAR units. In the example depicted in FIG. 6D, the surveillance system may use a single rotatable LIDAR system 100 to obtain 3D data representing field of view 120 and to process the 3D data to detect people 652, vehicles 654, changes in the environment, or any other form of security-significant data.

Consistent with some embodiment of the present disclosure, the 3D data may be analyzed to monitor retail business processes. In one embodiment, the 3D data may be used in retail business processes involving physical security (e.g., detection of: an intrusion within a retail facility, an act of vandalism within or around a retail facility, unauthorized access to a secure area, and suspicious behavior around cars in a parking lot). In another embodiment, the 3D data may be used in public safety (e.g., detection of: people slipping and falling on store property, a dangerous liquid spill or obstruction on a store floor, an assault or abduction in a store parking lot, an obstruction of a fire exit, and crowding in a store area or outside of the store). In another embodiment, the 3D data may be used for business intelligence data gathering (e.g., tracking of people through store areas to determine, for example, how many people go through, where they dwell, how long they dwell, how their shopping habits compare to their purchasing habits).

Consistent with other embodiments of the present disclosure, the 3D data may be analyzed and used for traffic enforcement. Specifically, the 3D data may be used to identify vehicles traveling over the legal speed limit or some other road legal requirement. In one example, LIDAR system 100 may be used to detect vehicles that cross a stop line or designated stopping place while a red traffic light is showing. In another example, LIDAR system 100 may be used to identify vehicles traveling in lanes reserved for public transportation. In yet another example, LIDAR system 100 may be used to identify vehicles turning in intersections where specific turns are prohibited on red.

It should be noted that while examples of various disclosed embodiments have been described above and below with respect to a control unit that controls scanning of a deflector, the various features of the disclosed embodiments are not limited to such systems. Rather, the techniques for allocating light to various portions of a LIDAR FOV may be applicable to type of light-based sensing system (LIDAR or otherwise) in which there may be a desire or need to direct different amounts of light to different portions of field of view. In some cases, such light allocation techniques may positively impact detection capabilities, as described herein, but other advantages may also result.

It should also be noted that various sections of the disclosure and the claims may refer to various components or portions of components (e.g., light sources, sensors, sensor pixels, field of view portions, field of view pixels, etc.) using such terms as "first," "second," "third," etc. These terms are used only to facilitate the description of the various disclosed embodiments and are not intended to be limiting or to indicate any necessary correlation with similarly named elements or components in other embodiments. For example, characteristics described as associated with a "first sensor" in one described embodiment in one section of the disclosure may or may not be associated with a "first sensor" of a different embodiment described in a different section of the disclosure.

It is noted that LIDAR system 100, or any of its components, may be used together with any of the particular embodiments and methods disclosed below. Nevertheless, the particular embodiments and methods disclosed below are not necessarily limited to LIDAR system 100 and may possibly be implemented in or by other systems (such as but not limited to other LIDAR systems, other electrooptical systems, other optical systems, etc.—whichever is applicable). Also, while system 100 is described relative to an exemplary vehicle-based LIDAR platform, system 100, any of its components, and any of the processes described herein may be applicable to LIDAR systems disposed on other platform types. Likewise, the embodiments and processes disclosed below may be implemented on or by LIDAR systems (or other systems such as other electrooptical systems etc.) which are installed on systems disposed on platforms other than vehicles, or even regardless of any specific platform.

Calibration for Reflected Light

In some configurations, one or more sensors configured to detect light reflected from objects in a field of view (e.g., laser light, LED light, or any other type of light or EM radiation reflected from objects) may experience incident light from other sources. In some cases, incident light from these other sources may be undesirable and may cause noise that may negatively impact the LIDAR system's ability to detect objects, obtain an intended resolution relative to detected objects, determine accurate distance information relative to detected objects, etc. Such sources of noise may include ambient light from an environment of the LIDAR system and/or light from one or more discrete sources in an environment of the LIDAR system. Other sources of noise that may impact operation of the LIDAR sensors, and, therefore, the LIDAR system, may include random noise originating from various components included in the LIDAR detection path (e.g., sensors, amplifiers, filters, etc.).

Still other sources of noise may include light that is projected by one or more light sources of the LIDAR system, but which has not been received by the LIDAR system after reflection from an object in the environment of the LIDAR system. Such light, which may result from reflections internal to the LIDAR system, ambient lighting conditions within the LIDAR system during LIDAR light source activation, ambient lighting outside of the LIDAR system, coupling between light transmission (TX) and light reception (RX) paths (e.g., in a monostatic LIDAR configuration), or through other potential mechanisms other than LIDAR light reflections from objects outside of the LIDAR system, may be referred to as extraneous detected light. In other words, extraneous detected light may include any light detected by one or more detectors of the LIDAR system without that light having been reflected from an object outside of the LIDAR system prior to its detection by the one or more detectors of the LIDAR system. In many cases, a significant component of the extraneous detected light may arise from internally reflected light—i.e., light projected by the one or more light sources of the LIDAR system that does not escape from the LIDAR system, but rather reflects off of one or more surfaces internal to the LIDAR system before impinging upon a detecting sensor.

Figure 7A:
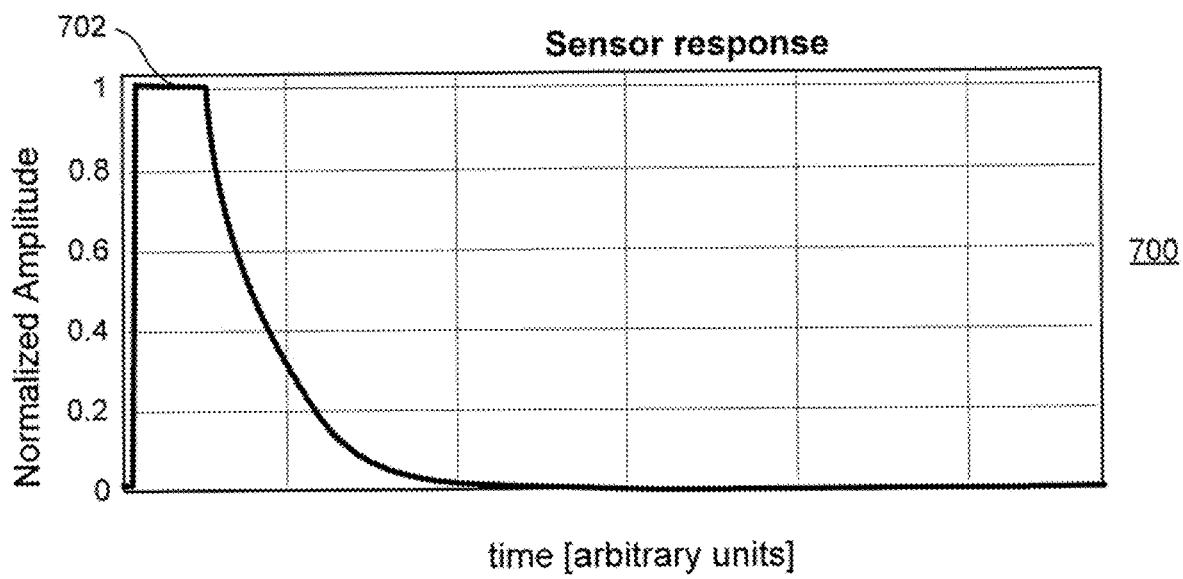
FIGS. 7A and 7B include graphs of exemplary parasitic pulses that may be encountered by a LIDAR system.
Figure 7B:
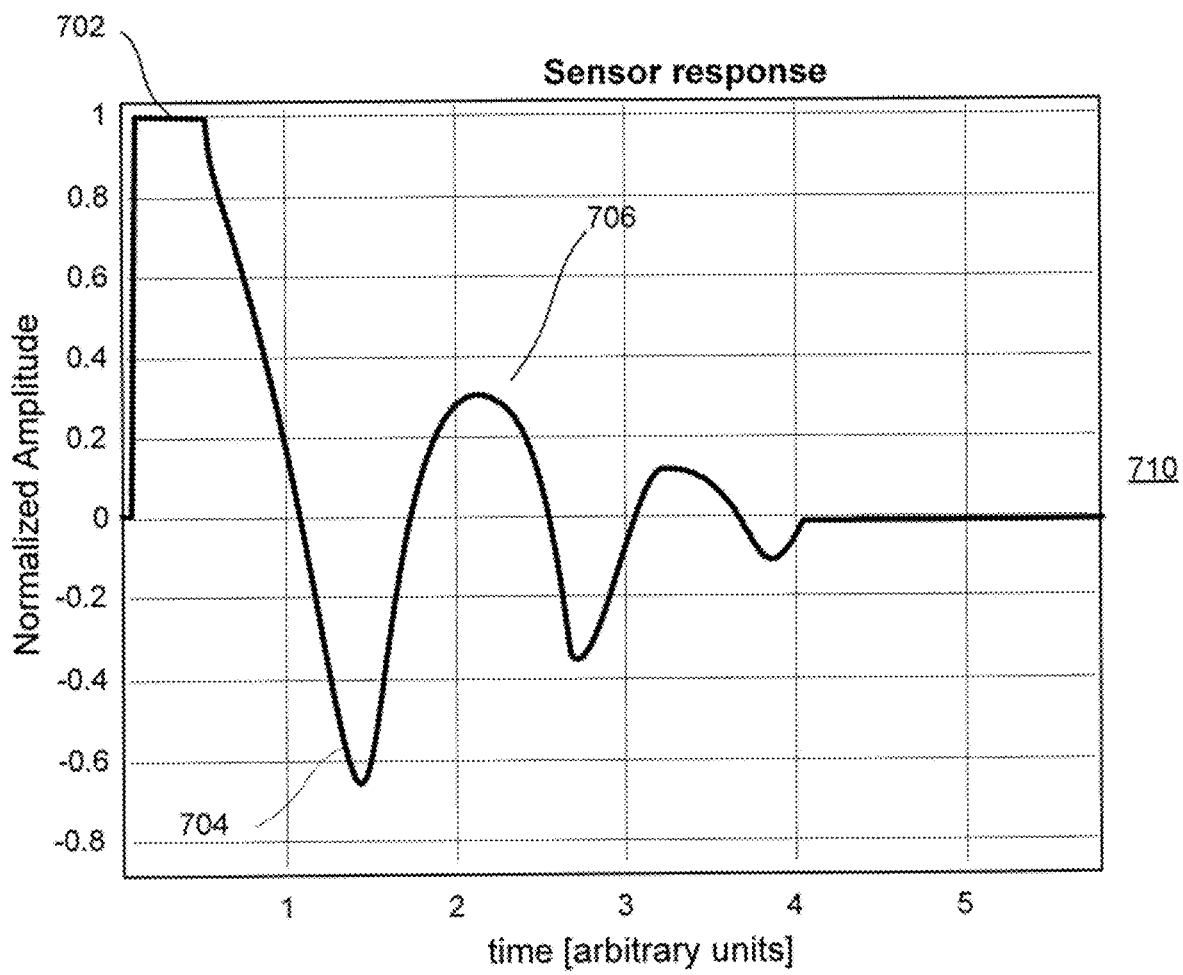

Extraneous detected light (which may include internally reflected light) may cause a variety of responses at a detector of the LIDAR system. In many cases, the type of response a LIDAR detector has to extraneous detected light may depend on the type of light source or a manner of operating the light source of the LIDAR system. For example, detector responses to extraneous detected light in a continuous wave LIDAR system may be different than detector responses to extraneous detected light in a LIDAR system in which the LIDAR light sources are pulsed, for example. In some example cases, a response of a LIDAR detector to extraneous detected light may appear as what may be referred to as a parasitic pulse. Examples of a parasitic pulse response of a LIDAR detector are shown by graph 700 and 710 in FIGS. 7A and 7B. The graphs in FIGS. 7A and 7B are exemplary only. Many other waveform shapes or responses may be generated by a LIDAR detector in response to any source of extraneous detected light.

As noted above, a LIDAR light source (such as any of the light sources described elsewhere in this disclosure) may be used to project light toward a field of view in order to illuminate one or more objects in the field of view. The LIDAR system may include at least one sensor configured to detect light that is reflected from the one or more illuminated objects in the field of view. Under an ideal scenario, the sensor may experience no other sources of incident light other than the laser light reflected from one or more illuminated objects in the field of view. Under more typical situations, however, the sensor may experience light from several different sources. In some cases, light incident on the LIDAR sensor may include LIDAR light reflected from the scene (e.g., LIDAR light source light reflected from a detected object and incident upon the sensor at relevant timings to indicate Time-of-Flight detection); light originating from the scene (e.g., ambient light fixed in time, light from time-varying sources, etc.); and/or light from internal reflections. Additionally, other sources of noise in the sensing system may exist, including random noise resulting from components of the detection path (e.g., sensors, amplifiers, filters, etc.).

Returning to FIG. 7A, graph 700 illustrates an example of a sensor response to internally reflected light incident upon the sensor. In some cases, such as a monostatic LIDAR implementation, this internally reflected light may be sensed as a result of coupling between the light transmission and light reception paths. However, such a response may be observed in any LIDAR system in which at least some portion of the light from a LIDAR light source is incident upon a LIDAR sensor prior to that light being reflected from an object in the scene.

The output of a LIDAR detector in response to extraneous detected light, examples of which are provided by graph 700 of FIG. 7A and graph 710 of FIG. 7B, may include certain characteristic elements. For example, in some cases, extraneous detected light (e.g., internally reflected light, etc.) may be detected and cause an initial rise in sensor signal amplitude (e.g., at peak 702). Such a detection peak (e.g., a parasitic pulse) can be problematic as it may saturate the sensor and render the sensor unable to detect or differentiate light reflected from an object in the LIDAR FOV from light that is internally reflected within the LIDAR system.

In some cases, a sensor response to extraneous detected light may not be limited to a single output peak response. Instead, in some cases as shown by graph 710 in FIG. 7B, the sensor may exhibit a prolonged response to the extraneous detected light. Such a response may manifest, for example, as "ringing" at the sensor. This ringing may occur as a result of the extraneous detected light exciting the sensor circuitry (e.g., including parasitic capacitances and inductances) such that the circuitry resonates at a characteristic frequency. For example, as shown by graph 710, after an initial positive response to the incident extraneous detected light, the sensor output may oscillate toward negative output values resulting in negative peak 704. The LIDAR sensor may continue to ring for a period of time dependent upon damping characteristics of the circuitry. For example, as shown in FIG. 7B, after peak 704, the sensor response may again oscillate toward positive response values at peak 706 before eventually settling back to zero amplitude.

Any LIDAR sensor response to extraneous detected light (two examples of which are shown in FIGS. 7A and 7B) may adversely impact the detection capabilities of the LIDAR system. For example, any non-zero output of the LIDAR sensor originating from light sources other than light reflected from objects in a LIDAR FOV may hinder the system's ability to differentiate between components of the sensor output originating from light reflected from objects in the LIDAR FOV and those components originating from extraneous detected light (e.g., internally reflected light, etc.). With respect to the example shown in FIG. 7B, during the initial sensor response to the extraneous detected light (e.g., peak 702) and any subsequent effects (e.g., the ringing represented by peaks 704 and 706, etc.), targets in a scene may be masked by the sensor's response to the extraneous detected light. As a result, such targets may go undetected or the detection quality may be compromised. Such masking may occur as a result of saturation of the sensor during the initial response to the extraneous detected light and during subsequent ringing of the sensor, or as a result of any other non-zero response of the LIDAR sensor(s) to extraneous detected light. Such masking may also occur at any time during the sensor response to the extraneous detected light (e.g., initial response or ringing) as a result of the extraneous detected light response being greater than the sensor's response to incoming light reflected from the scene.

This masking may be especially problematic for detecting objects within certain ranges of the LIDAR system that correspond with time periods of interest (e.g., those time periods corresponding to the time of flight for light to and from an object in an operational range of the LIDAR system (1 m to 500 m; 20 m to 250 m; etc.)). Such time periods may overlap with a LIDAR sensor's response to extraneous detected light (e.g., initial pulse 702 and/or ringing characteristics such as peaks 704, 706) which may occur over time periods during which return light reflections from objects in a LIDAR FOV are expected. For example, light travels about 0.3 meters per nanosecond. In some cases, a LIDAR sensor may exhibit at least some response to extraneous detected light over a period of 500 nanoseconds or more.

Thus, in the example shown in FIG. 7B, for example, and assuming that the sensor's response to extraneous detected light continued for 500 nanoseconds, detection of objects up to about 75 meters from the LIDAR system may be affected by the sensor response (e.g., 500 nanoseconds is the approximate time required for the projected LIDAR light to travel to an object at a distance of 75 meters from the LIDAR system, reflect from the object, and return back to the LIDAR system). Objects closer in to the LIDAR system (e.g., a distance roughly corresponding to a 250 nanosecond time of flight or less of an emitted LIDAR light pulse), may be partially or completely masked by the sensor response to extraneous detected light due to potentially larger amplitude responses of the sensor within the 250 nanosecond time range (e.g., peaks 702 as shown in FIGS. 7A and 7B). Of course, as noted, the sensor responses shown in FIGS. 7A and 7B are just two examples. In some cases, a particular sensor may exhibit a response (e.g., ringing) for a longer or shorter amount of time in response to extraneous detected light or may exhibit lower or higher amplitude responses to incident extraneous detected light.

In some embodiments, detection of close range targets (or any others affected by a sensor response to extraneous detected light, light noise, or noise from other sources) may be improved by accounting for sensor responses other than those resulting from LIDAR light reflected from target objects. In some cases, the effects of the sensor responses to unwanted light input or noise can be reduced (e.g., subtracted, canceled out, or otherwise accounted for) such that the sensor response to incident LIDAR light reflected from objects in a scene may be more discernable. Such an approach may aid in the detection of objects and the determination of ranging information relative to those objects even where those objects are associated with LIDAR light flight times that coincide with times during which noise is present on the output(s) of LIDAR sensor(s).

In order to identify sensor responses not attributable to LIDAR light reflected from objects in a scene, any suitable approach may be used. For example, in some embodiments, another sensor (e.g., a calibration sensor) may be included in the LIDAR system. This calibration sensor may be used to sense the extraneous detected light from a LIDAR light source or any other source of noise or unwanted sensor response in the LIDAR sensing system. In some cases, the calibration sensor may be shielded (e.g., partially or fully) from LIDAR light that returns to the LIDAR system after reflection from one or more objects in the LIDAR FOV. Such shielding may be provided by one or more structures arranged to block the calibration sensor from returning light or may be provided by placing the calibration sensor outside of the optical path of the reflected LIDAR light returning from the LIDAR FOV.

Thus, the output of the calibration sensor may exclude components associated with LIDAR light reflected from objects in a scene, but may include responses to extraneous detected light and/or any other sources of noise in the LIDAR sensing system. As a result, the output of the calibration sensor may be used as a guide for filtering the output of one or more imaging sensors. In some cases, for example, the output of the calibration sensor may indicate a sensor response to directly detected light, and this response may be subtracted from an observed response of one or more of the LIDAR imaging sensors that includes responses to received LIDAR light reflected from the FOV. This type of subtraction may provide conditioned outputs from one or more imaging sensors that is free or nearly free of unwanted effects of extraneous detected light. Effects of ambient light or other sources of noise may be treated similarly by observing the effects with a calibration sensor and subtracting those effects from the output of an imaging sensor. In this way, detection and ranging relative to target objects may be improved, especially for objects at relatively close range to a LIDAR system (e.g., within 10 meters, 20 meters, 50 meters, 100 meters, etc.).

Figure 8A:
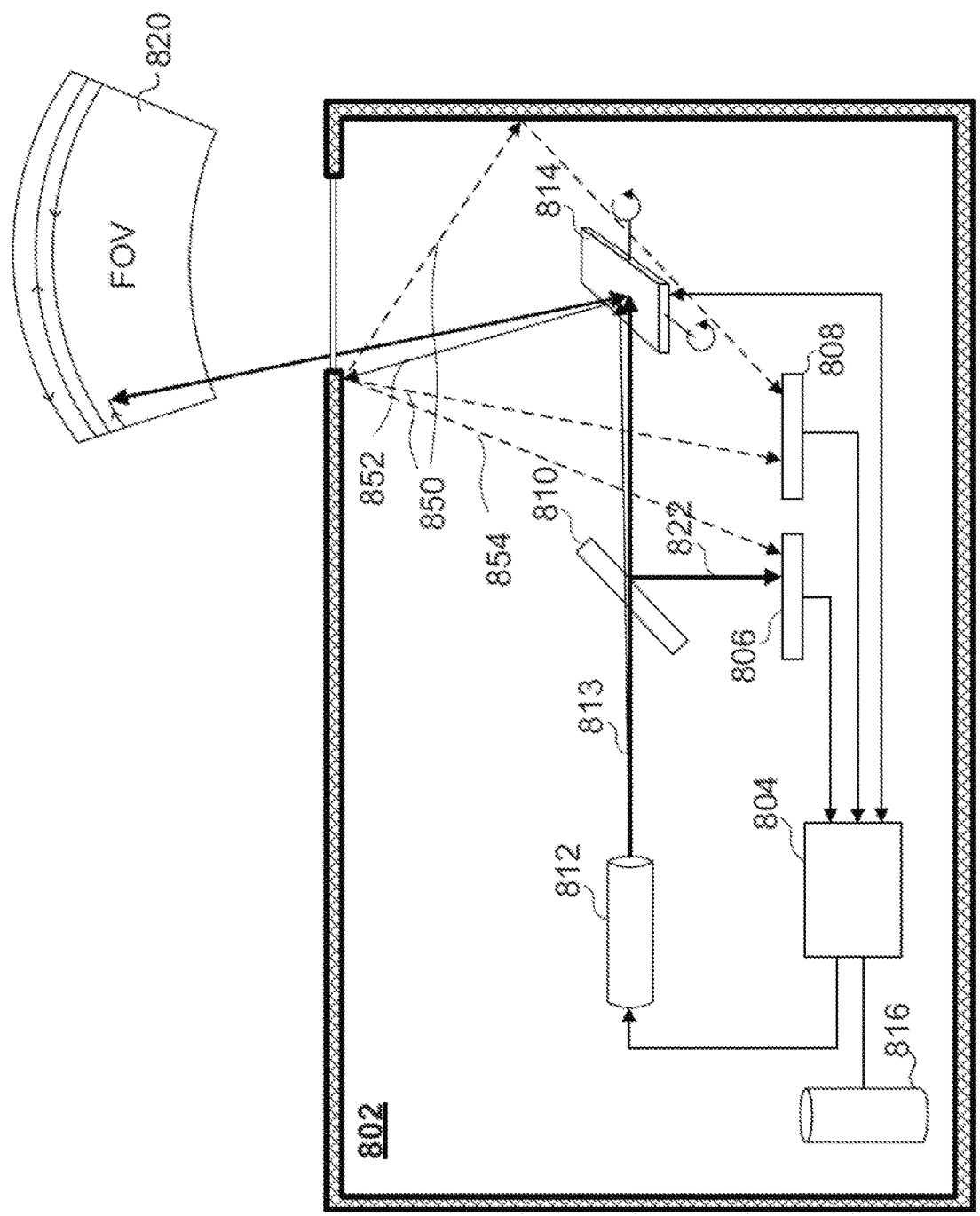
FIG. 8A includes a diagrammatic representation of a LIDAR scanning and detection system, according to exemplary disclosed embodiments.

FIG. 8A provides a diagrammatic representation of a LIDAR system 802, according to disclosed embodiments. For example, system 802 may include, among other elements, a processor 804, a light sensor 806, a supplemental light sensor 808 (e.g., a calibration sensor in some embodiments), a light guide 810, a light source 812, and a light deflector 814. In some cases, processor 804 may have access to a memory 816, which may include one or more databases, instructions for execution, etc.

In some cases, processor 804, which may include one or more processing units similar to processing unit 108 described above, may control the operation of light source 812 to selectively emit a light 813 (e.g., a LIDAR laser emitted continuously, pulsed, etc.) for illuminating at least a portion of a LIDAR FOV 820. As described in detail above, a light deflector 814 (which may be similar to light deflector 114 of scanning unit 104) may be controlled by processor 804 to move (e.g., by controlled rotation along two or more axes) in order to scan light beam 813 projected from light source 812 over LIDAR FOV 820. At each instantaneous position of the deflector 814, light reflected from one or more objects located in a corresponding region of the LIDAR FOV 820 may be incident upon deflector 814 and may be passed along toward the sensing elements of the LIDAR system.

In some cases, the LIDAR sensing system may include sensor 806, which may be similar to sensor 116 described above. Light guide 810 may include one or more components configured to pass light or to selectively alter the path of light. In some cases, light guide 810 may include one or more reflective elements (e.g., mirrors, mirrored faces, etc.), lenses, beam splitters, etc. for guiding light 813 to deflector 814 and for guiding laser light reflections received from the LIDAR FOV by deflector 814 toward sensor 806. Similar to the techniques described above, sensor 806 may generate LIDAR reflection signals corresponding to levels of reflected light incident upon sensor 806, and these signals may be collected and used by processor 804 to generate LIDAR images (e.g., point clouds where each point represents data collected for a particular FOV pixel) and to obtain ranging information relative to objects occurring in an environment of the LIDAR system within the scanned FOV 820 (e.g., each point in the point cloud may include distance information to an object or portion of an object occurring at a particular FOV pixel).

As noted, some embodiments may include supplemental sensor 808, which may be similar to or the same as sensor 806. Supplemental sensor 808 may be used to generate an output to extraneous detected light (e.g., ambient light or internally reflected light within the LIDAR system originating from operation of the light source 812). For example, as shown in FIG. 8A, sensor 808 may receive extraneous detected light in the form of internally reflected light rays 850, which may result from at least some portion of beam 813 (e.g., light ray 852) being incident upon an internal surface of a LIDAR system housing, wall, etc. While sensor 808 receives internally reflected light from the light source 812, it does not receive any reflected light from the LIDAR FOV (i.e., light 822). As a result, the output from sensor 808 is indicative of the level of internally reflected light within the LIDAR system without any contribution from reflected LIDAR light received from the LIDAR FOV. The output of sensor 808 may be used, for example, by processor 804 to remove (e.g., subtract) a similar response of sensor 806 to extraneous detected light (e.g., including internally reflected light represented by light ray 854) from source 812.

FIG. 8E diagrammatically illustrates light components incident upon sensors 806 and 808. For example, light reflected from the LIDAR FOV (e.g., light 822) is incident upon sensor 806 of FIG. 8A, but is not incident on calibration sensor 808. Extraneous detected light (e.g., internally reflected light) 849, however, includes components received by both sensor 806 and 808. For example, internally reflected light components 850 are received by sensor 808, and internally reflected light components 854 are received by sensor 806.

Thus, in operation, the at least one processor 804 may be configured to control at least one light source (e.g., source 812) for projecting light toward a field of view 820. As shown in FIG. 8A, processor 804 may receive from at least one first sensor (e.g., sensor 806) first signals associated with light projected by the at least one light source. These first signals from sensor 806 may include components resulting from received light that is reflected from an object in the field of view (e.g., light 822 reflected from objects in the FOV 820). These first signals may also include components, for example, associated with extraneous detected light (e.g., internally reflected light 854, or other light effects not associated with LIDAR light reflections from an object in the LIDAR FOV).

Processor 804 may also be configured, as shown in FIG. 8A, to receive from a sensor, such as calibration sensor 808, second signals associated with light projected by the at least one light source. In contrast to the first signals received by processor 804 from sensor 806, these second signals received from sensor 808 do not include any components resulting from received light that is reflected from an object in the field of view (e.g., light 822 reflected from objects in the FOV 820). Rather, these second signals include, at least as a primary component, signals resulting from extraneous detected light (e.g., internally reflected light 850, or other light effects not associated with LIDAR light reflections from an object in the LIDAR FOV). To correct for the effects of internally reflected light or other instances of extraneous detected light, processor 804 may correct the output from sensor 806 based on the output of sensor 808. In some cases, the correction may involve subtracting the output of sensor 808 (e.g, with applied weighting factors, after signal conditioning, etc.) from the output of sensor 806. In this way, the unwanted effects of extraneous detected light may be reduced or eliminated from the output of sensor 806.

As noted above, the at least one processor 804 may be configured to coordinate at least one light deflector 814 and the at least one light source 812 such that when the at least one light deflector 814 assumes a particular instantaneous position, a portion of a light beam 813 is deflected by the at least one light deflector 814 from the at least one light source towards an object in the field of view 820, and reflections of the portion of the light beam from the object are deflected by the at least one light deflector toward at least one sensor (e.g., as light 822).

Figure 8B:
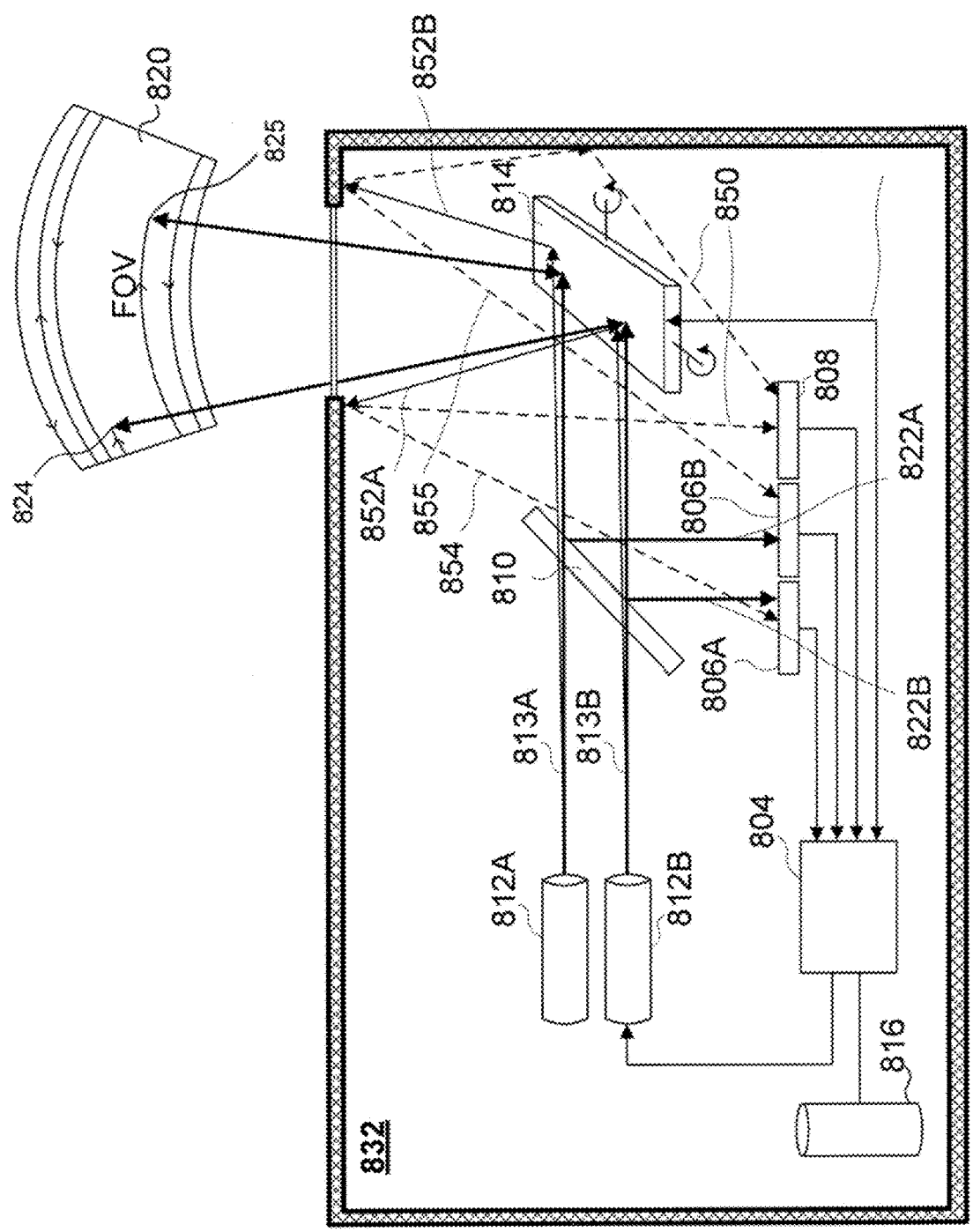
FIG. 8B includes a diagrammatic representation of a LIDAR scanning and detection system, according to exemplary disclosed embodiments.

Various other configurations of the LIDAR system may be employed. For example, as shown in FIG. 8B, a LIDAR system 832 may include components similar to LIDAR system 802. In some cases, LIDAR system 832 may include, among other elements, processor 804, light sensors 806A and 806B, supplemental light sensor 808 (e.g., a calibration sensor in some embodiments), light guide 810, a light deflector 814, and a memory 816. In contrast to LIDAR system 802, which as illustrated includes only a single light source 812, LIDAR system 832 may include multiple light sources. For example, system 832 may include a first light source 812A and a second light source 812B. Any number of additional light sources may also be employed.

In some embodiments, both light source 812A and light source 812B may be aimed at deflector 814 or may otherwise provide light output directly or indirectly to light deflector 814. In such embodiments, light source 812A may be associated with a light output 813A, and light source 812B may be associated with a light output 813B. Processor 804 may be configured to control deflector 814 such that when deflector 814 assumes a particular instantaneous position, light 813A and light 813B from the plurality of light sources 812A and 812B is projected towards a plurality of independent regions in the field of view. For example, light output 813A may be projected toward region 824, and light output 813B may be projected toward region 825.

As noted, processor 804 may develop a LIDAR image (e.g., point cloud) and/or ranging information relative to objects in the LIDAR FOV based on acquired reflections of LIDAR light that are received after reflecting from objects in the LIDAR FOV. These light reflections may be acquired, for example, using deflector 814, light guide 810, and/or sensors 806A and 806B. In addition to light reflections received from the LIDAR FOV, sensors 806A and 806B may also receive extraneous detected light (e.g., in the form of internally reflected light 854 and 855, respectively, produced by internal reflections of light rays 852A and 852B). Calibration sensor 808, on the other hand, may be shielded from light reflections received from the LIDAR FOV and, instead, may only receive extraneous detected light (e.g., in the form of internally reflected light 850 produced by internal reflections of light rays 852A and 852B). As described relative to the embodiment of FIG. 8A, the output of calibration sensor 808 may be used to correct or otherwise condition the output of sensors 806A and/or 806B to reduce or eliminate the effects of extraneous detected light.

Figure 8C:
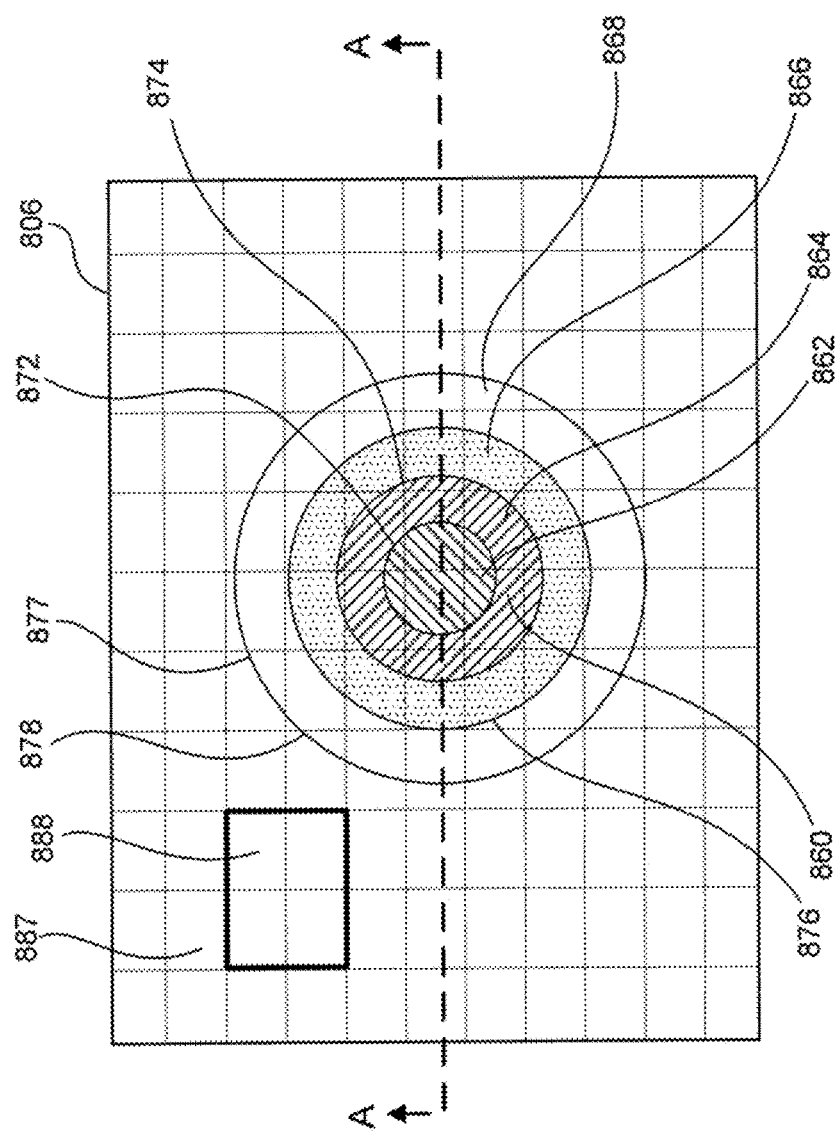
FIG. 8C includes a diagrammatic representation of a light spot incident upon a detector, according to exemplary disclosed embodiments.

While the light reflections incident upon a described light sensor (e.g., any of sensors 806, 806A, 806B, 808, etc.) may result in various patterns, in some cases, the incident light reflections may form a light spot having an outer boundary 877. Such a light spot 860, for example, is shown in FIG. 8C. While light spot 860 is shown in FIG. 8C as having a generally circular shape, light spot 860 may have various shapes, including elliptical, irregular, etc. In some cases, a light intensity level may be substantially uniform over an area of sensor 806 affected by light spot 860. In other cases, however, the intensity of incident reflected light constituting light spot 860 may vary over the area associated with light spot 860. For example, light spot 860 may have certain areas that receive higher light intensities than other areas. While higher light intensity areas may occur at any location within light spot 860, in the example show in FIG. 8C, an area 862 near a center region of light spot 860 may be associated with a certain light intensity, which may be greater than a light intensity associated with adjacent area 864. Similarly, area 864 may exhibit a higher light intensity level than an intensity level associated with area 866, and area 866, in turn, may be associated with a light intensity level higher than a light intensity level associated with area 868.

In some cases, light intensity levels may vary smoothly over the two-dimensional plane represented by sensor 806. As a result, the boundary lines separating areas 862, 864, 866, and 868 from one another may designate, for example, isolines consisting of points having the same light intensity level (e.g., similar to isobars on a pressure map) at a given time or on average over a given period. Thus, each of contour lines 872, 874, 876, and 878, as shown in FIG. 8C, may represent a line through points of equal light intensity.

FIG. 8D provides a representation of an example light intensity distribution over sensor 806 across the line A-A shown in FIG. 8C. As represented by the example illustrated in FIG. 8D, the light intensity distribution resulting from an incident light beam received subsequent to reflection from an object in a LIDAR FOV, in some cases, may approximate a Guassian distribution, although any other type of distribution may also be encountered. FIG. 8D shows the iso-intensity levels associated with each of boundary lines 872, 874, 876, and 878. FIG. 8D also provides an exemplary intensity distribution profile that may be encountered in each of areas 862, 864, 866, and 868 of sensor 806. Line 880 may represent effects of light incident on a sensor other than light reflected from objects in a LIDAR FOV. For example, in some cases, line 880 may conceptually represent the effects of extraneous detected light (e.g., internally reflected light, ambient light, or noise from other sources).

As noted above, light spot 860 may include an outer boundary 877. In some cases, outer boundary 877 may represent a boundary beyond which substantially no reflected light constituting light spot 860 is received at sensor 806. That is, in some instances, light sensitive elements associated with sensor 806 that fall outside of outer boundary 877 may receive no LIDAR light reflected from objects in the LIDAR FOV. In other cases, however, outer boundary 877 may correspond to a light iso-intensity level (or threshold) that is significantly reduced, for example, with respect to a peak light intensity level associated with light spot 860. For example, as shown in FIGS. 8C and 8D, outer boundary 877 may correspond with boundary line 878. Beyond boundary line 878, some reflected light is received at sensor 806, but in this area, the reflected light received at sensor 806 has an intensity level significantly reduced relative to a peak intensity value associated with area 862, for example. Outer boundary 877, when not corresponding to an absolute light intensity boundary beyond which no reflected light is incident upon sensor 806, may be associated with various light intensity levels that may be expressed as a percentage of a maximum light intensity level associated with light spot 860. For example, in some cases, outer boundary 877/boundary 878 may correspond to a light intensity level that is less than 1%, 2.5%, or 5% of a peak light intensity level associated with light spot 860. In other cases, outer boundary 877/boundary 878 may have a light intensity level that is up to 10% of a peak light intensity level (or even up to 15%, 20% or 25% of a peak light intensity level) associated with light spot 860.

Returning to FIGS. 8A and 8B, in some embodiments, calibration sensor 808 may be provided as a sensor unit separate from and spaced apart from sensors 806, 806A, or 806B. In such cases, the reflected LIDAR light received back from a scene may be made incident upon sensor 806 (e.g., as shown in FIG. 8C), such that sensor 806 may produce output signals indicative of the received reflected LIDAR light. On the other hand, calibration sensor 808 may be isolated from the reflected LIDAR light such that substantially none of the received LIDAR light reflections are provided to calibration sensor 808. Instead, calibration sensor 808 may receive light noise (e.g., internally reflected light, etc.) and may generate signals responsive to the received light noise.

Such light noise may originate from multiple different sources. In some cases, as described above, the light noise received at calibration sensor 808 may include extraneous detected light, which may result at calibration sensor 808 through similar mechanisms that cause the extraneous detected light to be received at sensor 806 (e.g., internal reflection, coupling between transmission and reception paths, coupling between optical elements in the light project path/light guiding path, etc.). The light noise received at calibration sensor 808 may also include light received from ambient light within the LIDAR system, in the environment of the LIDAR system, or any other source of light that may produce or contribute to unwanted light noise at the detectors of the LIDAR system.

While the calibration sensor may be separate from sensor 806, in some cases, the sensor or sensor element used for calibration may be included with or may form part of sensor 806. For example, in some cases a calibration sensor 887 (FIG. 8C) may constitute a single sensor element (e.g., a single SPiM comprising a group of light sensitive elements such as avalanche photo diodes, etc.) of sensor 806. In other cases, a calibration sensor 888 may include a plurality of sensor elements of sensor 806. The plurality of sensor elements selected for inclusion in calibration sensor 888 may include a contiguous group of sensor elements (as shown in FIG. 8C) or may include two or more sensor elements associated with sensor 806 that are spaced apart from one another. Notably, in embodiments where a calibration sensor constitutes one or more sensor elements of sensor 806, those sensor element(s) selected for use in calibration may fall outside of outer boundary 877 and/or boundary line 878.

Regardless of whether the calibration sensor constitutes a part of sensor 806 or whether it is separate from sensor 806, the output of the calibration sensor may be used to mitigate unwanted effects of light noise on the LIDAR system. For example, processor 804 may receive signals generated by calibration sensor 808, 887, 888, etc. and based on those received signals, processor 804 may determine an indicator of a magnitude of light noise at the calibration sensor. Such an indicator may have various forms. In some embodiments, the indicator may include a parameter value associated with any of the signals generated by the calibration sensor (e.g., amplitude, current level, voltage level, etc.). In other cases, the indicator may be any indirectly determined quantity or value that may be associated with an intensity level incident upon the calibration sensor, etc.

With the determined indicator of the magnitude of light noise at the calibration sensor, processor 804 may condition one or more signals output from sensor 806 (or 806A, 806B) in response to incident light spot 860. In other cases, the signals output from sensor 806 (or 806A, 806B) may be used together with the determined indicator to arrive at an output from the LIDAR system or a subsystem of the LIDAR system that is at least partially corrected for light noise effects. For example, based on the determined indicator and the signals received from sensor 806, a distance may be determined to an object in the LIDAR FOV from which reflected LIDAR light was received. The distance calculation that accounts for light noise may be more accurate. In some cases, distance calculations that were otherwise not possible in view of light noise may become possible through correction based on the outputs from sensor 806 (or 806A, 806B) and calibration sensor 808, 887, 888. The same principle may also hold true for object detection. That is, in some cases, the presence of light noise may mask an object from detection by the LIDAR system or may make detection difficult or unreliable. Removing at least some of the effects of light noise may result in more object detections and higher confidence in object detections. Conditioning the output signals from sensor 806 (or otherwise accounting for light noise) based on the indicator of light noise determined based on the output of calibration sensor 808, 887, 888 may at least partially (or fully) remove the effects of light noise from the signals output from sensor 806.

As noted, in some embodiments, the mitigation of light noise effects may be accomplished by processor 804 being configured to correct the signals received from sensor 806 (or 806A, 806B) using the indicator of light noise determined based on the output of the calibration sensor 808, 887, 888. Correction of the signals from sensor 806 (or 806A, 806B) may include any appropriate correction technique. In some cases, processor 804 may determine a sensor response to light noise from calibration sensor 808, 887, 888. With an assumption that the calibration sensor 808, 887, 888 has a response to the light noise similar to or the same as sensor 806 (or 806A, 806B), processor 804 may subtract the output of calibration sensor 808, 887, 888 (or an approximation of that output, a function or curve generated based on the output, etc.) from the output of sensor 806 (or 806A, 806B).

Such as correction may be performed at any point in time during operation of the LIDAR system. In some cases, the correction may be performed periodically during operation of the LIDAR system. For example, as the deflector is scanned through each of the instantaneous positions associated with different locations of the LIDAR FOV, a correction of the output of sensor 806 (or 806A, 806B) may be determined relative to each of the instantaneous positions based on the output of the calibration sensor 808, 887, and/or 888. In practice, processor 804 may determine based on the output of calibration sensor 808, 887, and/or 888 a plurality of indicators, where each indicator represents a magnitude of light noise associated with a corresponding, particular instantaneous position through which the deflector is scanned. Processor 804 may then use the determined plurality of indicators to correct the signals received from sensor 806 (or 806A, 806B). Additionally, for each of the instantaneous positions through which the deflector is scanned, processor 804 may store the determined indicator value or values indicative of an amount of light noise associated with the instantaneous position of the deflector/particular region of the LIDAR FOV.

In addition to correcting the output of sensor 806 (or 806A, 806B) based on the calibration sensor output (or otherwise determining an actual contribution of LIDAR light reflections to the sensor 806 output (free or partially free of light noise) based on the output of the calibration sensor(s)), other uses of the calibration sensor output may also be realized. For example, in some cases, the output of the calibration sensor(s) may be used to monitor performance characteristics of LIDAR system components. In some cases, processor 804 may monitor and determine performance changes of at least one sensor (e.g., sensor 806) over a period of time. By storing light noise information (e.g., a detected magnitude associated with a extraneous detected light associated with a LIDAR light source) at various time periods (e.g., daily, weekly, monthly, etc.), information may be inferred regarding the operation of the light source. For example, if there are changes over time in the amplitude or other characteristics of the extraneous detected light, processor 804, e.g., may infer that the LIDAR light source is deteriorating or operating outside of specified or intended parameters. Additionally, especially in cases where the calibration sensor constitutes a part of sensor 806

(e.g., sensor element 887 or elements 888), a change over time in measured magnitude or other characteristic of the extraneous detected light may indicate deterioration of sensor 806 or operation of sensor 806 outside normal parameters.

Various configurations of calibration sensors may be used in the presently disclosed LIDAR systems. As noted above, the calibration sensor may be included as part of a LIDAR sensor (such as sensor 806). In other cases, the calibration sensor may be separate from the LIDAR sensor, such as sensor 806, configured to receive reflections of LIDAR light from objects in a field of view. In such cases, the calibration sensor may be similar to the sensor that receives the LIDAR light reflections. Such similarity, for example, may facilitate correlation between the output of the LIDAR reflections sensor (e.g., sensor 806) and the calibration sensor and may facilitate correction of the output of the LIDAR reflections sensor. In some instances, the calibration sensor may be of a same type as the main LIDAR sensors (e.g. SiPM, APD), but this is not necessarily so, as the calibration sensors may also be formed of sensor types or configuration arrangements different from the main LIDAR sensors. Further, in some embodiments, the calibration sensor may be caused to operate with the same optical/electric/operational characteristics as the main LIDAR sensors, but again, this is not necessarily so. Nonetheless, in one embodiment a calibration sensor may be employed that has an identical or nearly identical configuration as the main LIDAR sensor (e.g., formed of the same type and number of light sensitive elements, etc.) and may be operated according to identical or nearly identical parameter values as used to operate the main LIDAR sensor. In this way, the calibration sensor(s) may exhibit the same or similar behavior, light input response, dynamic range, blinding, etc. as the main LIDAR sensor(s), which may facilitate correction for light noise according to the processes described above.

In some embodiments, one or more calibration sensors included in the LIDAR system may have a configuration different from a main LIDAR sensor or may be operated differently, as compared to a main LIDAR sensor. For example, in some cases, a main LIDAR sensor (e.g., sensor 806) may include a sensor array including more than one type of sensor. Such sensor arrays, for example, may include SiPM sensor elements for longer range detection, APD sensor elements for nearer field detection, etc. In some cases, a sensor array may include one or more sensor elements operated using operational setting different from those employed relative to one or more other sensor elements. Multiple calibration sensors may be used. For example, a different calibration sensor may be included for each different type of main LIDAR sensor or set of different operational settings of a main LIDAR sensor. In other cases, however, a LIDAR system may include fewer calibration sensors than main LIDAR sensors. For example, in some embodiments a LIDAR system may include a single calibration sensor along with two or more different types of main LIDAR sensors/sensor elements or may include a single calibration sensor where sensor elements of the LIDAR system are operated according to different parameter settings.

Various techniques may be used for correlating the output of a single calibration sensor with multiple different main LIDAR sensor types or multiple different operational settings for different main LIDAR sensors. For example, based on predetermined testing or on-the-fly calibration procedures, the response of a single calibration sensor may be correlated with multiple different main LIDAR sensor types or multiple different operational settings for different main LIDAR sensors. Such correlation, for example, may be obtained by observing and storing (e.g., in one or more lookup tables) a response of the calibration sensor to a certain lighting condition and by observing and storing responses of the main LIDAR sensors to the same lighting conditions, relative positions with respect to light sources, etc. Then, during LIDAR system operation, processor 804 may correct the output of one or more main LIDAR sensors based on an observed output of the calibration sensor by accessing populated lookup tables and determining/accessing a stored correlation between the calibration sensor and the type of main LIDAR sensor used and/or the set of operational parameters used for each of the main LIDAR sensors. In this way, processor 804 may be configured to apply differing corrections to differing ones of a plurality of detection elements (e.g., included in sensor 806), relative to different sensor units, sensor unit detection elements, or relative to different detection elements or sensor units being operated according to different operational parameter values. In cases where a main LIDAR sensor includes a plurality of detection elements, processor 804 may associate a different correction factor (e.g., based on observed outputs from one or more calibration sensors) to each of the plurality of detection elements within the main LIDAR sensor.

As noted above, the calibration sensor may be part of or formed separately from a main LIDAR sensor (e.g., sensor 806) and may include similar detection elements to those included in the main LIDAR sensor. In some embodiments, for example, at least one sensor 806 may include a plurality of detection elements of a single type (e.g., SiPM, APD, SPAD, PIN diode, etc.), and at least one calibration sensor may include at least one detection element of the same type. In some cases, at least one sensor 806 may include a plurality of detection elements including more than one type of detection element (e.g., detection elements of a first type, such as APDs, along with detection elements of a second type, such as PIN diodes, etc.). In such cases, the at least one calibration sensor may include at least one detection element of the first type and at least one detection element of the second type.

Moreover, as noted above, a LIDAR system may include more than one calibration sensor. For example, a LIDAR system may include a plurality of calibration sensors 808, 887, and/or 888. Each of the included calibration sensors may be located outside an outer boundary 877 of light spot 860. In some cases, each calibration sensor may be paired with one or more different LIDAR sensors 806 (or 806A, 806B). On the other hand, in some cases, more than one calibration sensor may be paired with a single LIDAR sensor 806 (or 806A, 806B). For example, processor 804 may correct (or otherwise account for light noise associated with) the output of a single LIDAR sensor using a combination of two or more different calibration sensors 808, 887, and/or 888, etc. In some cases, different weighting factors may be associated with each available calibration sensor such that a correction of a particular sensor 806 output may depend more upon one calibration sensor than upon another calibration sensor. In this way, a plurality of calibration sensors (e.g., a combination or number of sensors 808, 887, and/or 888, etc.) may be used by processor 804 to determine a plurality of corresponding indicators of light noise. Processor 804 may then use those plurality of indicators to correct the signals received from sensor 806, for example, to subtract or account for the effects of light noise on sensor 806.

As noted, certain LIDAR systems may employ at least one calibration sensor and at least one main sensor. The calibration sensor and the main sensor may both be formed of the same type or configuration of detector or they may be formed of different types of sensor or configured differently. The calibration sensor and the main sensor may be formed on the same die or substrate or may be formed on different die or substrates. Regardless of the configuration of calibration sensor(s) and main LIDAR sensor(s), the LIDAR system may be capable of accounting for differences in responses between any two or more sensors. Such a capability may facilitate compensation for light noise in one or more sensors based on the output observed in one or more different light sources, as even identical or nearly identical sensors can have different responses to sources of light noise (e.g., where sensors are positioned in different locations or orientations, etc.).

In some embodiments, a translation function may be determined for tow or more sensors that may enable translation between a signal of a calibration sensor, for example, to a signal of a relevant "main" pixel of the main LIDAR sensor. For example, a suitable translation function may have the form: Y1(t)=g·Y2(t−τ), where Y1, Y2 represent the relevant signals, and g and τ represent translation coefficients to be determined. t is the sampling time (e.g. stored as a vector element). It should be noted that g and τ can change with time (i.e. drift) and with laser power. Such changes may occur non-linearly. The translation coefficients can be computed at any suitable times. In some cases, the translation coefficients may be determined for pulses/frames in which no targets are detected (e.g., in the near-field). Then, the translation coefficients may be used or applied in response to LIDAR pulses and sensor outputs to account for light noise effects during times in which targets exist in a scanned portion of the LIDAR FOV (which would render the translation difficult or impossible to determine directly). In certain cases, the system may include an optical barrier for preventing some light reaching this sensor, but not necessarily so. Such an optical barrier may aid in determining relevant translation functions between sensors.

Figure 9:
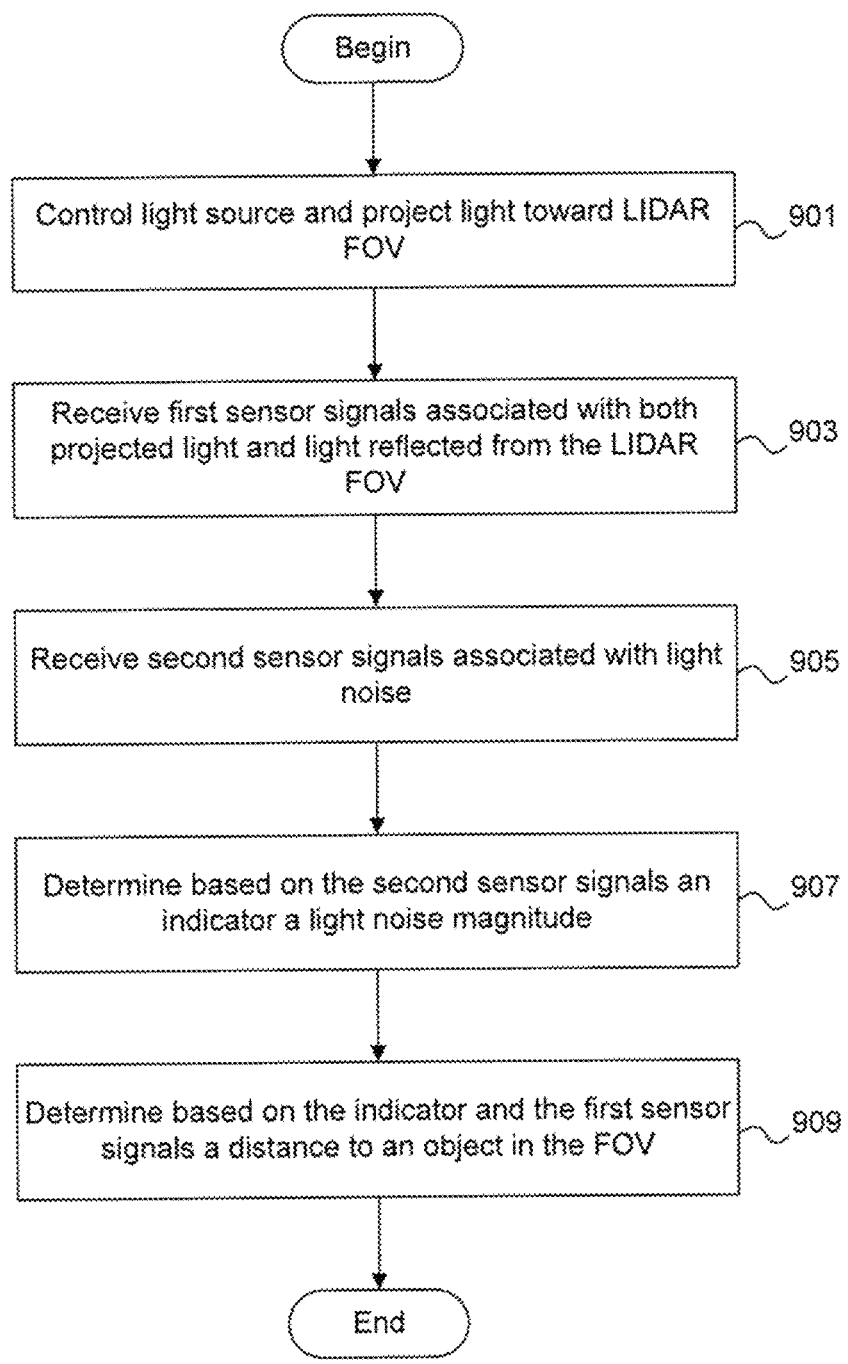
FIG. 9 includes a flowchart representation of a method, according to exemplary disclosed embodiments.

The present disclosed embodiments also may include a method for using a LIDAR system to detect objects. Such a method may employ any of the techniques described above for accounting for effects of light noise on a LIDAR sensor. For example, as outlined in FIG. 9, an exemplary method may include a step 901 of controlling at least one light source for projecting light toward a field of view. At step 903, processor 804 may receive from at least one first sensor (e.g., sensor 806) signals associated with light projected by the at least one light source and reflected from an object in the field of view. Reflected light impinging on the at least one first sensor may be in a form of a light spot having an outer boundary. At step 905, processor 804 may receive from at least one second sensor (e.g., calibration sensor 808, 887, and/or 888), signals associated with light noise, wherein the at least one second sensor is located outside the outer boundary of the light spot. At step 907, processor 804 may determine, based on the signals received from the at least one second sensor, an indicator of a magnitude of the light noise. At step 909, processor 804 may determine, based on the indicator and the signals received from the at least one first sensor, a distance to an object in the LIDAR FOV. The presently disclosed embodiments may also include a non-transitory computer-readable storage medium including stored instructions that, when executed by at least one processor, cause the at least one processor to perform a method for compensating for light noise in a LIDAR system. The method may include any of the steps shown in the flow chart of FIG. 9.

Pattern Recognition Used to Characterize LIDAR Window Obstruction

In a bi-static system, e.g., a LIDAR system and/or RADAR system, consistent with embodiments of the present disclosure, obstructions on the protective window of the system may block light passage through the protective window. For example, the vehicle may come in contact with salt, mud, road grime, snow, rain, dust, bug debris, pollen, and bird droppings (among other things) which may block light from passing through the protective window of the system. Such blockages of light may be complete or partial. For example, in some cases, the blockage may be substantially opaque or, alternatively, may be translucent or semi-transparent and may allow at least some light to pass. In some cases, the blockage may limit an amount of incident light through refraction of light (e.g., especially away from an intended light reception path or away from relevant sensors). In such cases, the blockage may even be transparent. Additionally, a blockage may occur only over a portion of the protective window relevant to the system or may be more widespread. In some embodiments, discussed in detail below, a type of obstruction may be determined, and one or more remedial actions may be taken. For example, in some cases, an obstruction pattern may be detected by the system, and based on this pattern, the system may classify the obstruction and implement a process for cleaning the obstruction based on the classification. For example, based on the detection and/or classification of the obstruction pattern, the system may modify an illumination scheme, a scanning scheme, a detection scheme or any other operational parameters of the system based on the results of the analysis of the obstruction.

Figure 10A:
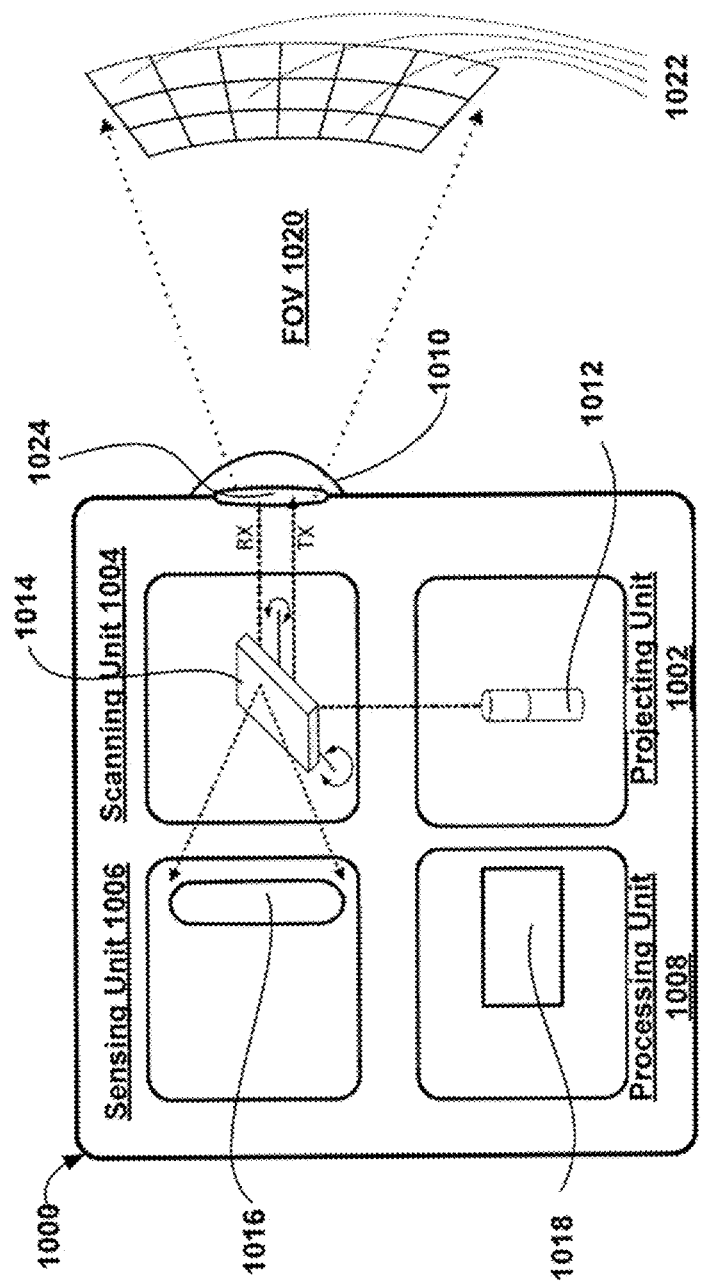
FIG. 10A is a diagram illustrating an exemplary obstruction detection system consistent with disclosed embodiments.

FIG. 10A illustrates an exemplary system 1000 for detecting blockages and/or impaired sensing including a projecting unit 1028, a scanning unit 1004, a sensing unit 1006, a processing unit 1008, and a protective window 1010. System 1000 may be included in a LIDAR system, RADAR system, other bistatic system, or the like. Consistent with embodiments of the present disclosure, projecting unit 1028 may include at least one light source 1012, scanning unit 1004 may include at least one light deflector 1014, sensing unit 1006 may include at least one sensor 1016, and processing unit 1008 may include at least one processor 1018. In one embodiment, at least one processor 1018 may be configured to coordinate operation of the at least one light source 1012 with the movement of at least one light deflector 1014 in order to scan a field of view 1020. During a scanning cycle, each instantaneous position of at least one light deflector 1014 may be associated with a particular portion 1022 of field of view 1020. In addition, system 1000 may include at least one optional optical window 1024 for directing light projected towards field of view 1020 and/or receiving light reflected from objects in field of view 1020. Optional optical window 1024 may serve different purposes, such as collimation of the projected light and focusing of the reflected light. In one embodiment, optional optical window 1024 may be an opening, a flat window, a lens, or any other type of optical window.

In some embodiments, the above described elements of system 1000 may be similar to or the same as those described with reference to FIG. 1A. For example, projecting unit 1028, scanning unit 1004, sensing unit 1006, and processing unit 1008 may be the same as projecting unit 102, scanning unit 104, sensing unit 106, and processing unit 108, respectively.

System 1000, may include a processor 1018, which may be processor 118 as described with reference to FIGS. 5A-5C. In some embodiments, the system 1000 may be a LIDAR system 100 mounted on a vehicle 110, as shown with reference to FIG. 1A. In some embodiments, system 100 may also be, or include, a processor of a host (i.e., higher level system). For example, system 1000 may be included in a LIDAR system 100. Processor 1018 may be separate from processor 118, which executes the distance measurement or other LIDAR-specific actions. If processor 1018 is separate from processor 118, processor 1018 may not control the light source of LIDAR system 100 and may be configured to communicate with processor 118 or another component of LIDAR system 100.

System 1000 may include a protective window 1010 disposed between at least one component of the system 1000 (e.g., the sensor 1016) and a scene to be imaged. The protective window 1010 may include any light transmissive medium through which light (e.g., laser light transmitted to a scene to be imaged, reflected laser light received from the scene, ambient light, light from an internal light source, etc.) may at least partially pass. In some embodiments, the protective window 1010 is included as a component of system 1000. Additionally or alternatively, the protective window 1010 may be associated with a platform upon which system 1000 is associated (e.g., a vehicle). In still other embodiments, the protective window 1010 may include light transmissive components from both system 1000 and the platform upon which system 1000 is deployed. In some embodiments, the protective window 1010 may include optical window 1024 of the system 1000. In some embodiments, e.g., in which the system 1000 is mounted in the interior of a vehicle, the protective window 1010 may be or include the windshield or a window of the vehicle. The protective window 1010 may be formed of any suitable material for passing at least some light therethrough. In some embodiments, the protective window 1010 or any of its components may be made from glass, plastic, or any other suitable material, such as materials having low refractive indices. The protective window 1010 may be flat, curved, or of any other shape and may possibly serve an optical purpose in addition to being protective (e.g. collimating light, filtering certain wavelengths, and so on), but not necessarily so.

System 1000 may include one of more light deflectors, e.g., deflectors 1014, which may be deflectors 114A, 114B, and/or 214. The processor 1018 may be configured to control the at least one light deflector 1014 such that during a scanning cycle of the field of view 1020, the at least one light deflector 1014 assumes a plurality of instantaneous positions. Additionally, the processor 1018 may be configured to coordinate operation of the at least one light deflector 1014 and the at least one light source 1012 such that when the at least one light deflector 1014 assumes a particular instantaneous position, a portion of a light beam is deflected by the at least one light deflector 1014 from the at least one light source 1012 towards an object in the field of view 1020, and reflections of the portion of the light beam from the object are deflected by the at least one light deflector 1014 toward at least one sensor 1016. The system 1000 may include a plurality of light sources aimed at the at least one light deflector 1014, wherein the at least one processor 1018 is further configured to control the at least one light deflector 1014 such that when the at least one light deflector 1014 assumes a particular instantaneous position, light from the plurality of light sources 1012 is projected towards a plurality of independent regions, e.g., regions 1022, in the field of view 1020.

In some embodiments, the processor 1018 may be configured to control at least one light source 1012 of the system 1000. As previously described, the processor 1018 may receive reflection signals from at least one sensor, e.g., sensor 1016. Reflection signals may include indications of light incident on the at least one sensor 1016. In some cases, the incident light may include light reflected from the protective window 1010. Additionally or alternatively, the incident light may include light reflected from objects in the field of view 1020. This reflected light may pass through the protective window 1010 prior to reaching the at least one sensor 1016.

The presently disclosed system may operate in conjunction with light supplied by a primary light source, e.g., light source 1012 of the system 1000. That is, light incident on the sensor and used to determine the presence of a blockage on a protective window, at type of blockage, etc., may include light that originated from the primary light source 1012 of system 1000. For example, in some embodiments, a bistatic LIDAR system (e.g., a system including different transmission and reflection paths) may include a primary light source from which some or all of an illumination signal (pulse or otherwise) may be directed toward a window of the sensing path. In such embodiments, internal reflections from the window may become incident upon one or more sensors, and from this incident light, the blockage analysis (described in more detail below) may be performed. Alternatively or additionally, the light incident on the at least one sensor used to perform the blockage analysis may include light from one or more light sources ancillary to the primary light source 1012 of the system 1000. For example, some embodiments may include an ancillary light source located relative to the reception path (e.g., within a housing or compartment associated with a sensor (which may be optically independent from a housing or compartment including the primary light source)). The ancillary light source may be used to illuminate the protective window. Blockage analysis in such embodiments may be based, for example, at least partially upon light from the ancillary source that is reflected from the protective window and made incident upon at least one sensor.

Moreover, in some embodiments, the at least one sensor used in the blockage analysis may include sensor 1016 of the system. In some cases, however, one or more additional or alternative sensors may be included for receiving incident light used in analyzing blockages on the protective window. For example, in addition to sensor 1016, which may be positioned in the light reception path of the system, one or more light sensitive devices may be included in the transmission path of the system to monitor light reflections in the transmission path. Such reflections may be used to analyze protective window blockages.

It should be noted that the presently disclosed systems for analyzing protective window blockages and for taking remedial actions may be based on any suitable configuration of light sources and light sensors. In some cases, the disclosed systems for detecting and analyzing window blockages may be based exclusively upon the light sources and sensors used by the system 1000 to detect objects in the FOV 1020. In other cases, one or more ancillary sensors and/or one or more ancillary light sources may be included (in either or both of the transmission path and reception path of relevant LIDAR systems) for detecting and analyzing window blockages.

Blockages on a protective window may be identified and/or characterized based on any suitable techniques consistent with the disclosed system 1000 and/or LIDAR systems. In some embodiments, if an obstruction is present, processor 1018 may detect the presence of a particular obstruction and potentially a particular pattern or pattern type associated with the detected obstruction on and/or in the protective window 1010. Exemplary obstructions may be caused by salt, mud, road grime, snow, rain, dust, bug debris, pollen, bird droppings, or any other material that may at least partially obscure a protective window 1010. In some cases, other exemplary obstructions may be caused by scratches and/or deformations in or on the protective window itself. In response to a detected obstruction, the processor 1018 may initiate an analysis to determine a type of obstruction. Based on a determined type of obstruction, processor 1018 may initiate at least one remedial action based on the detected obstruction. Some obstructions may also occur between the sensor and the protective window (either on components of the system 1000 or in the spaces between such components). The techniques consistent with the disclosed LIDAR systems may optionally be used, mutatis mutandis, to detect such obstructions and to possibly take remedial actions based on the detection.

Figure 10B:
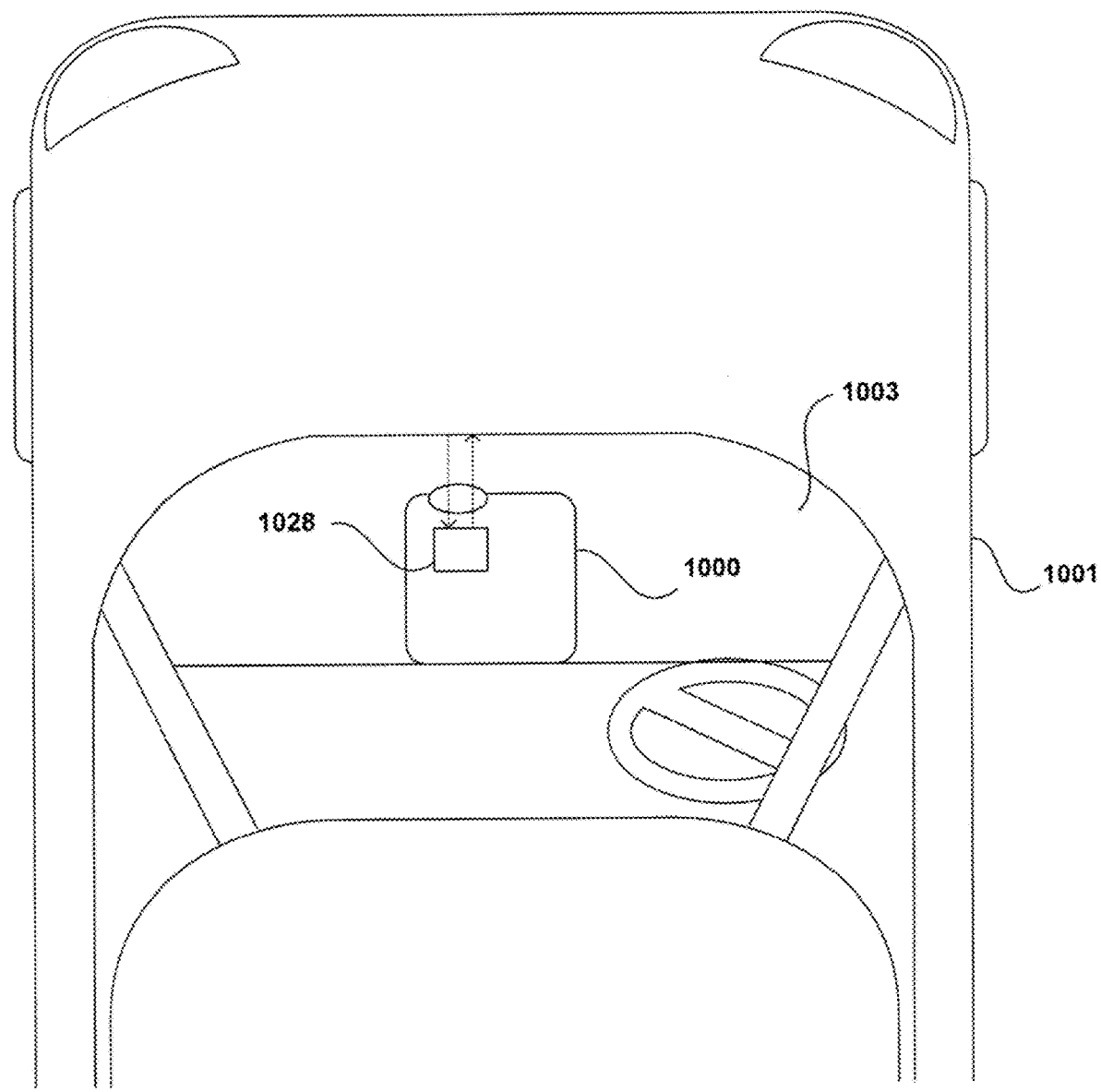
FIG. 10B is a diagram illustrating an exemplary obstruction detection system consistent with disclosed embodiments.

FIG. 10B illustrates an exemplary system 1000 for detecting blockages and/or impaired sensing including a projecting unit 1028, and a scanning unit 1004, a sensing unit 1006, a processing unit 1008 (not shown). System 1000 may be mounted in a vehicle 1001. For example, system 1000 may be mounted on the dashboard of vehicle 1001. In this example, the windshield 1003 of vehicle 1001 functions as protective window 1010. In some embodiments, system 1000 may have a protective window 1010 and be positioned in a vehicle such that the windshield of the vehicle is between the light source and FOV.

Figure 10C:
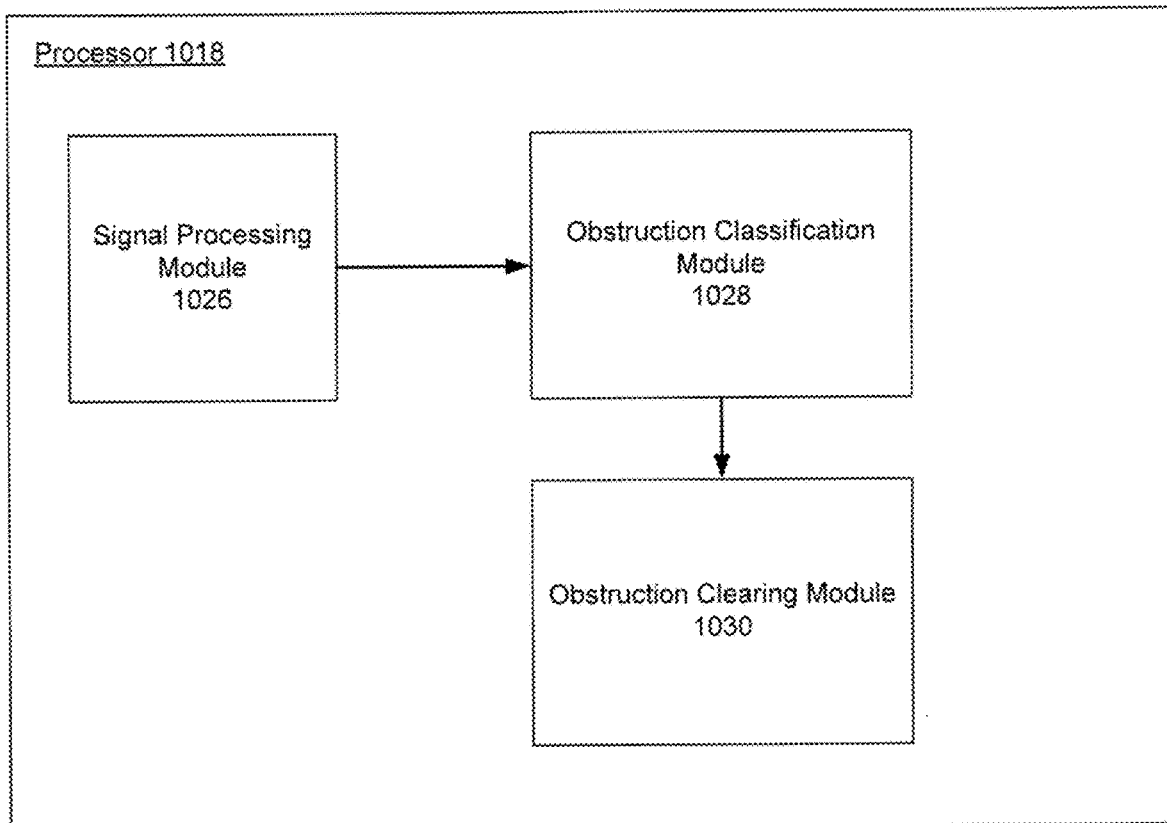
FIG. 10C is a block diagram of an exemplary processor included in an obstruction detection system consistent with disclosed embodiments.

FIG. 10C is a block diagram representation of processor 1018 including several software modules implemented by processor 1018 consistent with the present disclosure. For example, among other blocks, processor 1018 may implement signal processing module 1026, obstruction classification module 1028, and obstruction clearing module 1030. Modules 1026, 1028, and 1030 may contain software instructions for execution by at least one processor, e.g., processor 1018, included with the system 1000. In some embodiments modules 1026, 1028, and 1030 may be implemented by respective circuitry, e.g., hardware and/or firmware, instead of or in addition to software implementations. Signal processing module 1026, obstruction classification module 1028, and obstruction clearing module 1030 may cooperate to process reflection signals received by a sensor to determine the presence of an obstruction, identify characteristics associated with detected obstructions, identify reference obstruction patterns matching the detected obstructions, and classify the obstruction. The modules may also cooperate to cause performance of one or more processes selected based on the classification to clear the obstruction.

Signal processing module 1026 may receive reflection signals from one or more sensors and process the signals to extract data from the signal characteristics and determine if an obstruction on a protective window is present. In some embodiments, signal processing module 1026 may be implemented by processor 1018. In another embodiment, signal processing module 1026 may be implemented by a dedicated ASIC or other logic circuit. Signal processing module 1026 may use any one or combination of techniques for processing signal information including one or more algorithms, neural networks, machine learning software, etc. Signal processing module 1026 may be the signal processing module which is used for the processing of reflections arriving from the FOV of the system, a dedicated signal processing module used solely for obstruction detection, or any other signal processing module of the processor.

Within the context of obstruction detection, the term "reflection signals" (which are used for detection of obstruction) is used broadly and may pertain to any one or more of the following:
  a. Internal reflection signals from the protective window. Such internal reflection may include internal reflections of light originating from an internal light source may be used (whether that source includes the primary LIDAR light source or whether that source includes any other supplemental light source internal to LIDAR system 100). The internal reflection signals may include signals other than light-signals reaching the protective window from within the LIDAR system and reaching a matching sensor, such as other types of electromagnetic waves (e.g., radar signals or others), acoustic waves, and so on.
  b. External reflections signals originating from a LIDAR-associated light source (whether located inside the LIDAR system or not). Such external reflections signals pass through the protective window. Such external reflections may include light originating from outside the protective window and passing into the LIDAR system through the protective window (e.g., where scratches, water, or other materials on the protective window cause unexpected external reflections from certain areas of the protective window). The system may monitor and detect areas of reduced light transmission (e.g., areas not passing as much light as neighboring areas). The external reflection signals may include signals—other than light-signals—which pass through the protective window into the LIDAR system and reaching a matching sensor, such as other types of electromagnetic waves (e.g., radar signals or others), acoustic waves, and so on.
  c. Ambient reflections signals arriving from unassociated light sources (e.g., sun, streetlights, headlights of other vehicles) or from their reflections by other objects (e.g., sunlight reflecting off cars, streetlamps light reflecting off buildings and roads). Such Ambient reflections signals pass through the protective window. Such ambient reflections may include light originating from outside the protective window and passing into the LIDAR system through the protective window (e.g., where scratches, water, or other materials on the protective window cause unexpected ambient reflections from certain areas of the protective window). The system may monitor and detect areas of reduced light transmission (e.g., areas not passing as much light as neighboring areas). The ambient reflection signals may include signals—other than light-signals—which pass through the protective window into the LIDAR system and reaching a matching sensor, such as other types of electromagnetic waves (e.g., radar signals or others), acoustic waves, and so on.

In some embodiments, if an obstruction is detected, signal processing module 1026 may store an obstruction pattern associated with the obstruction. The obstruction pattern of the detected obstruction may include information on obstructed pixels and their spatial orientation. In some embodiments, a particular detected obstruction pattern may be associated with at least two neighboring instantaneous positions of the at least one light deflector. The particular detected obstruction pattern may be associated with at least two separate instantaneous positions.

Figure 10D:
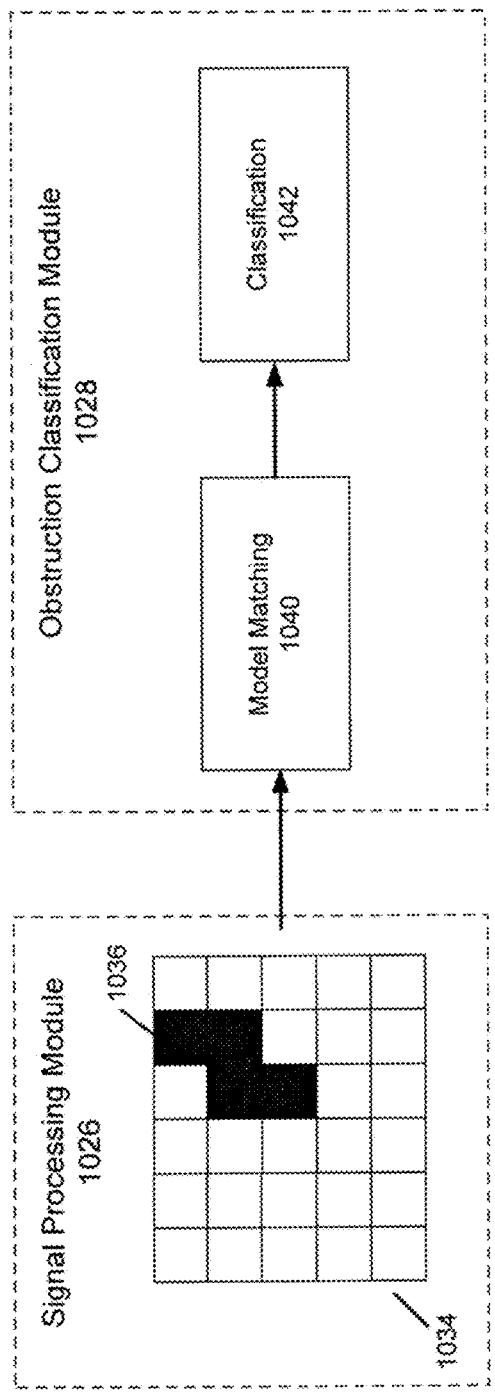
FIG. 10D is a diagram illustrating an exemplary process for obstruction classification consistent with disclosed embodiments.

FIGS. 10D and T0E are diagrams illustrating exemplary components and inputs for obstruction classification by the processor 1018 consistent with disclosed embodiments. In some embodiments, signal processing module 1026 may receive image data indicative of an obstruction pattern. Image data indicating a detected obstruction may include information received per-pixel of sensor 1016, for example. With reference to FIGS. 10D and T0E, a hit/miss map 1032 of an illustrative five-by-six pixel array shows obstructing elements detected in four pixels 1034. The actual field of view of the system may include many more pixels (e.g. 1,000, 1,000,000, etc.). In some embodiments, a scattering pattern of obstructed pixels may be detected in multi-pixel and/or full frame applications. The decision of blocked items may be done at the pixel level, at a multi-pixel level (e.g., pertaining to groups of 2×2 or 3×4 pixels), or in any other spatial division of the FOV. If the system includes a scanning system, the pixels are not necessarily different pixels of the sensor, but may include information collected from one or more pixels at different times. For example, the obstruction pattern may result from capturing light when the deflector is located in a plurality of instantaneous positions of the deflector, but corresponding to different locations on the protective window (which may be stationary). If the processor is adapted to detect obstruction in internal components of the system, similar techniques may be implemented, mutatis mutandis, and the pixels may pertain to locations on the deflector or on any other component (e.g. for detecting scratches or other flaws in a scanning mirror). In some embodiments, the pixels may correspond to pixels of the light sensors. In some embodiments, each pixel corresponds to a spatial angle in the FOV of the system. For example, in a sensor having only one pixel, the system may scan the FOV to capture a plurality of spatial angles.

In some embodiments, output information of the signal processing module 1026 may be used to estimate an ability of the system to detect objects in the field of view. For example, if an obstruction is detected, the analyzed signal information may be used to estimate the efficiency, accuracy, and/or ability with which the system 1000 may operate to detect objects in the environment of the LIDAR system 1000 and/or vehicle 1010.

Obstruction classification module 1028 may receive obstruction information from signal processing module 1026. Obstruction information may include, for example, obstruction pattern, indication of blocked deflector positions, returned power of the reflection off the obstruction, whether the field of view is partially or fully blocked, temporal information regarding the evolving of obstruction across the FOV, etc. Optionally, obstruction classification module 1028 may classify a detected obstruction by analyzing the shape and profile of the received signal and/or by analyzing the pixel-by-pixel obstruction pattern created by the obstruction. Based on this analysis, obstruction classification module 1028 may classify a detected obstruction based on its obstruction pattern to identify a likely type of obstruction, e.g., mud, pollen, snow, etc. In some embodiments, a single module may perform the functions of signal processing module 1026 and obstruction classification module 1028.

In some embodiments, obstruction classification module 1028 may compare the obstruction pattern of the detected obstruction to a reference obstruction pattern. System 1000 may include an obstruction pattern database of obstruction patterns and their respective characterizations. In some embodiments, the obstruction patterns may be stored in memory of the system 1000. Obstruction classification module 1028 may employ one or more techniques for comparing an obstruction pattern with a reference obstruction pattern and identifying a match.

Figure 10E:
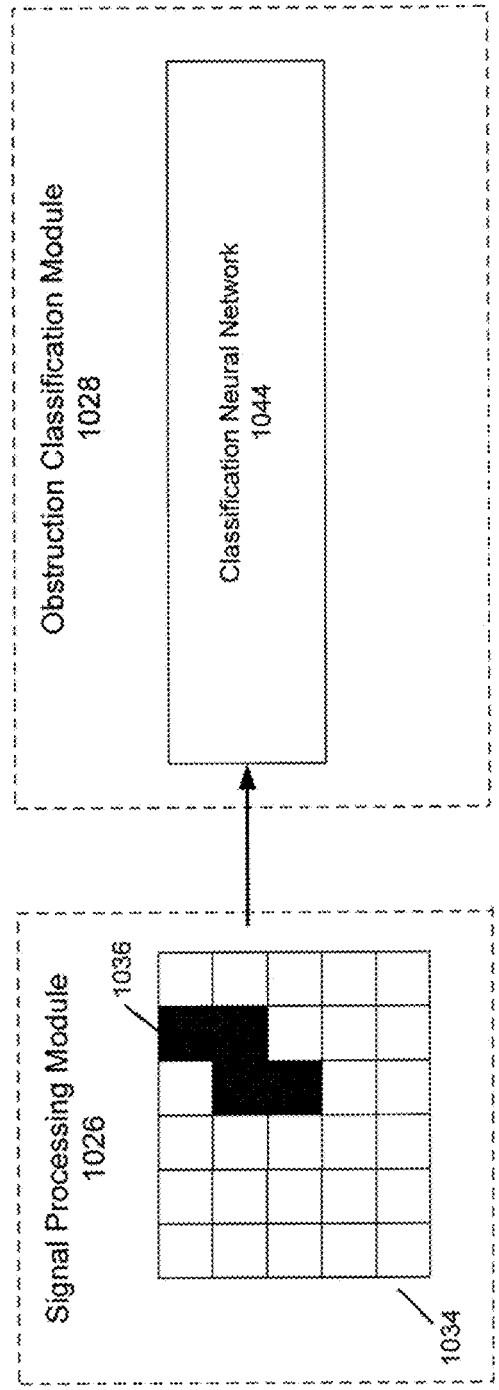
FIG. 10E is a diagram illustrating an exemplary process for obstruction classification consistent with disclosed embodiments.
Figure 10F:
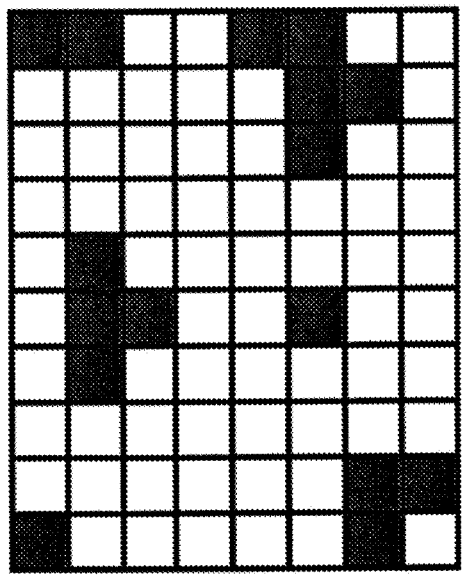
FIG. 10F is illustrates exemplary obstruction patterns consistent with disclosed embodiments.
Figure 10F:
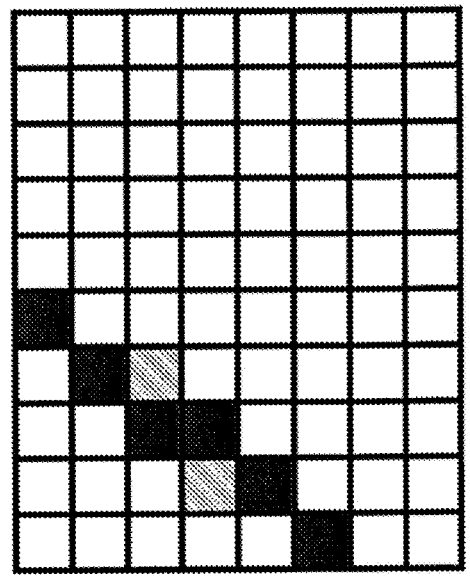
Figure 10F:
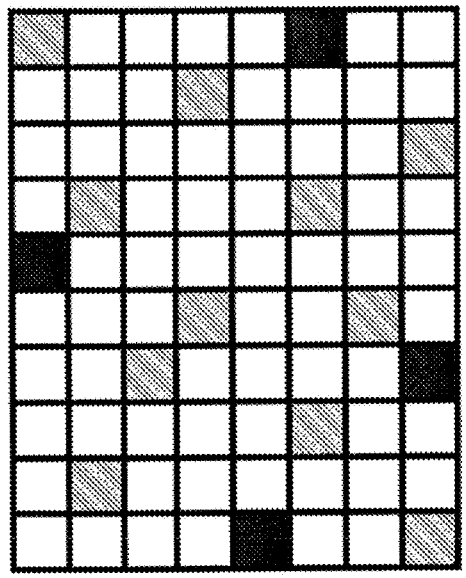
Figure 10F:
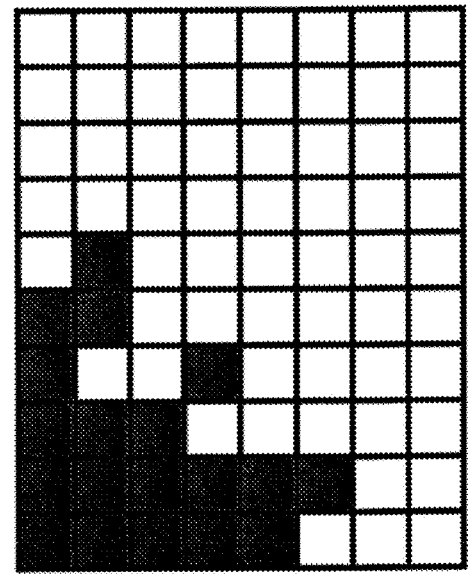

In some embodiments, the processor 1018 may be configured to apply at least one pattern recognition algorithm when comparing the detected obstruction pattern with the reference obstruction patterns. An exemplary pattern recognition algorithm may include a temporal pattern analysis of the detected obstruction pattern. For example, a pattern recognition algorithm may analyze a reflection signal as shown in FIG. 10F during a certain time frame. In another example, the system 1000 may detect a smear on the protective window from rain drops accumulating on and then running down the protective window.

In another embodiment, the pattern recognition algorithm may include a spatial pattern analysis of the detected obstruction pattern. In some embodiments, the processor 1018 may use model matching 1040 to compare the detected obstruction pattern 1036 with a known model, e.g., a reference obstruction pattern, and may use one or more recognition techniques for pattern classification 1042. For example, obstruction classification module 1028 may apply a pattern recognition algorithm to compare a hit/miss map, e.g., as shown in FIGS. 10D and 10E, with the spatial data of a reference obstruction pattern. In some embodiments, a matching reference obstruction pattern may be identified using a machine learning algorithm or a neural network 1044. Exemplary obstructions that may be classified via spatial analysis include mud, bird droppings, bug parts, and/or smog residue. An obstruction may cover a single area of the protective window, e.g., a chunk of mud, or may be distributed across the protective window, e.g., a plurality of raindrops.

FIG. 10F includes illustrative examples of obstruction patterns, in accordance with disclosed embodiments. FIG. 10F illustrates the spatial aspects of the obstruction pattern, but temporal aspects (e.g., the pace and/or order in which areas get obstructed) may also be used for classifying the obstruction.

Figure 10G:
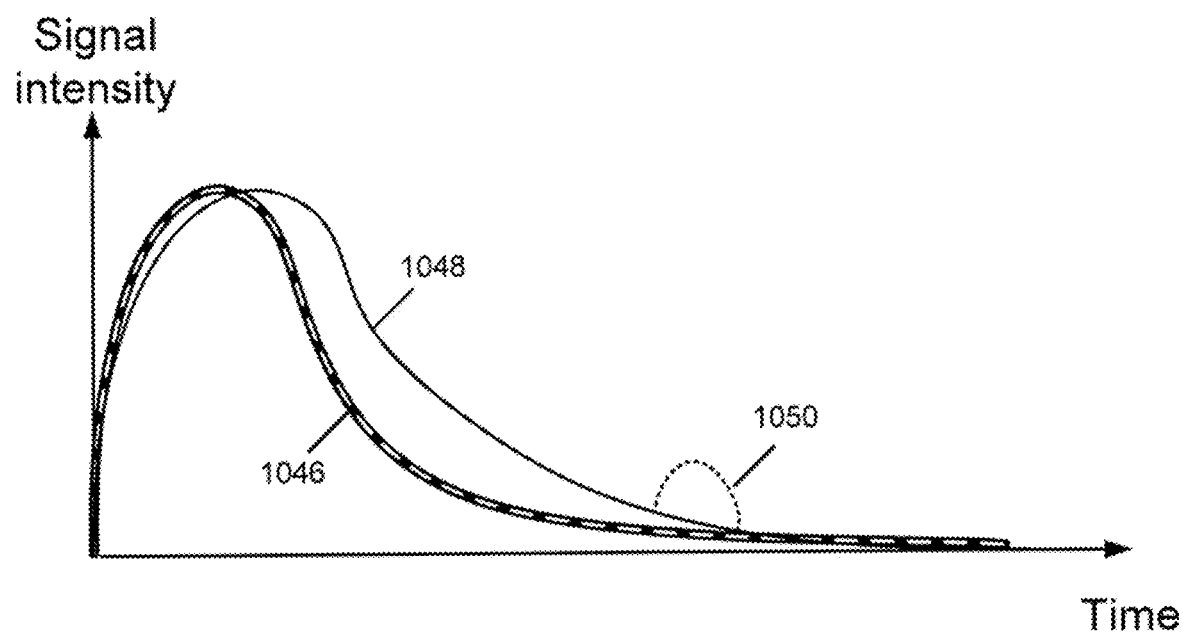
FIG. 10G is an exemplary graph of three types of returning signals consistent with disclosed embodiments.

As aforementioned, a possible way of detecting obstructions is by using internal reflection of light emitted by a light source of the system and reflected back—almost instantaneously—from the protective window. This may be implemented in systems in which the illumination assembly is optically connected to the light detection assembly. Nevertheless, this may also be implemented in systems in which the illumination assembly is separated from the light detection assembly, e.g., using a dedicated light source for the sensor compartment, or a dedicated sensor for the light source compartment. FIG. 10G provides light intensity versus time curves for three types of signals that may be experienced by system 1000, including LIDAR system 100. Signal 1046 represents a signal produced by an internal reflection in the system through a clean part of the protective window 1010. The temporal amplitude profile of the signal depends on various factors such as light source intensity and duration, sensing path sensitivity and temporal behavior, reflectivity of the protective window, incidence angle of the light onto the protective window, and so on. Signal 1048 represents a signal produced by an internal reflection in the system through a partially blocked part of the protective window. Since the blockage causes more internal reflections from the protective window, the signal is stronger and/or spans over a longer time (e.g., due to the temporal response behavior of the sensor), as exemplified in the diagram. Signal 1050 represents a signal generated upon receipt of light that was reflected from a target object in a scene and subsequently passed through the protective window at a later time.

Signal processing module 1026 may receive signal data for a pulse and compare the received signal to a known internal reflection signal of the system. If the comparison is indicative of a different signal, i.e., not an internal reflection signal, the difference in signal may be used to determine the presence and type of blockage. In some embodiments, the received signals and internal reflection signals may be compared directly, or by processing parameters of the received signal. For example, if the time it takes the received signal to fall below a threshold intensity is longer than predetermined duration, then the received signal is indicative of an obstruction. In some embodiments, determining the spatial pattern of a blockage across an area of the window/windshield, or temporal blockage across different frames, may include using a dedicated light source on the other side of the window/windshield, and determining how much light is transferred toward the sensor.

For example, in some embodiments, received LIDAR reflections signals from at least one sensor, may include indications of light reflected from the protective window inside the LIDAR system. Signal processing module 1026 may determine internal reflection parameters from the LIDAR reflections signals and access memory storing signal baseline parameters associated with the LIDAR system. The system may use the internal reflection parameters and the signal baseline parameters to identify at least one obstructed portion of the field of view and to alter a light source parameter such that more light is projected toward other portions of the field of view than light projected toward the at least one obstructed portion of the field of view.

In another example, with reference to FIG. 10G, the system may determine that a certain pixel is blocked based on a comparison of the received signal and the known internal reflection signal, as described above. In this example, the system may not classify the obstruction, but may use (without necessarily classifying any larger obstruction; useful for example for stopping further illumination to this direction, or on the contrary—increasing light intensity if possible to shine through partly transparent obstruction).

Received signal characteristics may include the spatial and/or temporal width of a received pulse. Signal processing module 1026 may also determine if an obstruction is present based on one or more threshold parameters. Such a threshold parameter may include, for example, a temporal parameter, such as the duration of the internal reflection of an internal reflection signal, its rate of ascend and/or descend, and so on. For example, if a detected signal has a greater duration than the threshold, signal processing module 1026 may determine that an obstruction is present. In another example, if the intensity of the detected light signal exceeds a predetermined threshold within a predetermined time window from the emission of the light pulse, and so on. Other parameters such as polarization of the detected signal and so on may also be used. Signal 1050 may be superimposed on signal 1046 if there is an external object, but differences such as timing, intensity, polarization, temporal profile, and so on may be used to distinguish between reflection resulting from blockage and reflection from an external object. In some embodiments, the processor may be configured to use indications of light reflected from objects in the field of view and passing through the protective window to determine the likely obstruction-pattern match.

In some embodiments, signal processing module 1026 may analyze one or more received signals to determine an obstruction pattern created by a detected obstruction. In some embodiments, the processor may be configured to detect the particular obstruction pattern based on differences between signal baseline parameters and internal reflection parameters associated with one or more areas (or the entire area) of the protective window. For example, the signal received from internal reflection 1048 may have profile different from a signal generated by an internal reflection from an obstruction. In some embodiments, the processor may be configured to detect the particular obstruction pattern by determining from the reflections signals internal reflection parameters associated with different areas of the protective window.

In some embodiments, the processor may be configured to detect the particular obstruction pattern based on light detected during a time period between light leaving the at least one light source and reflection impinging on the least one sensor. For example, rain may be detected over several frames (e.g. seconds or tens of seconds)—where obstructions (e.g., raindrops) are accumulating, moving (e.g. sliding down the window or sideways due to wind), and so on.

In some embodiments, the patterns stored in the memory may be stored in neural network parameters. Patterns may be stored in terms of parameters including: physical dimensions of obstructions, aspect ratio, scattering across the window, transparency levels, scattering, and so on.

Reflection signals may include any signal or portion of a signal originating from a reflection event in a system 1000, e.g., a LIDAR system 100, RADAR system, or other bi-static system. In some cases, such reflection events may occur outside the system (e.g., an object in the LIDAR FOV reflecting at least a portion of incident laser light from the LIDAR system). In other cases, such reflection events may be internal to the LIDAR system or may be associated with a platform upon which a LIDAR system may be deployed. For example, (e.g., internal light reflections from one or more LIDAR system components or light reflections from a windshield (e.g., windshield 1003) or other component of a vehicle or other platform upon which a LIDAR system is mounted). LIDAR reflections signals may refer to reflected light incident upon one or more LIDAR sensors. In other cases, the LIDAR reflections signals may refer to electrical signals generated by one or more LIDAR sensors in response to incident light originating from one or more reflections events. Such electrical signals may be provided to one or more processors for object detection analysis, blockage analysis, etc. Contributors to the LIDAR reflections signals may include, among other things, light reflected from a LIDAR FOV (e.g., from a detected or to-be-detected object in the FOV), light originating from the scene in the FOV, light from LIDAR system or LIDAR platform internal reflections, and/or random noise resulting from various detection path components (sensors, amplifiers, filters, etc.).

After identifying one or more reference obstruction patterns matching the detected obstruction pattern, a classification process 1047 may assign one or more classification characteristics to the detected obstruction. Characteristics associated with a reference obstruction pattern may include opacity, size, effect on system efficiency, cleaning method, etc. In some embodiments, one or more parameters may be determined directly from the specific obstruction (e.g., the dimensions of the mud spot). One or more of these parameters may be stored in the memory and be associated in the class of blockages. In some embodiments, one or more detected parameters may be used for further decisions (e.g., decision about cleaning procedures timing may be associated with rules stored in the memory, with knowledge about how much time can you wait before cleaning is mandatory, and so on). In some embodiments, the processor may be configured to access stored information characterizing reference obstruction patterns for at least four of salt, mud, road grime, snow, rain, dust, bug debris, pollen, and bird droppings. In another embodiment, the processor may be configured to access stored information characterizing reference obstruction patterns for salt and at least one of mud, road grime, snow, rain, dust, bug debris, pollen, and bird droppings. As described previously, characterization information associated with reference obstruction patterns may be stored in a database and/or in a memory of the system 1000.

Obstruction clearing module 1030 may receive obstruction classification information indicating a reference obstruction pattern and associated characteristics for a detected obstruction from obstruction classification module 1028. Based on the obstruction pattern characteristics, obstruction clearing module 1030 may output information instructing one or more systems within the system 1000 and/or vehicle 1001 to execute a remedial action. For example, obstruction clearing module 1030 may control activation parameters of one or more cleaning mechanisms, e.g., wipers, washing fluid, condensed air, etc. In another embodiment, obstruction clearing module 1030 may alert an operator of the vehicle or another system (e.g., host) of the detected obstruction and/or type of obstruction.

In some embodiments, obstruction clearing module 1030 may instruct a system of the system 1000 and/or vehicle 1001 to execute the remedial action of cleaning a protective window, e.g., window 1010 or windshield 1003. In some embodiments, the remedial action may include a window cleaning request. For example, the window cleaning request may instruct a wiper system to clear the protective window of the system 1000. In some embodiments, the processor may be configured to output information that includes a window cleaning request associated with a determined cause of the obstruction of the protective window based on the obstruction-pattern match. In some embodiments, the processor may be configured to select a cleaning process associated with the determined cause of the obstruction of the protective window, and to output information that includes a window cleaning request associated with the selected cleaning process. For example, obstruction classification module may classify a detected obstruction as having an obstruction pattern matching dust. Based on this obstruction pattern, obstruction clearing module 1030 may send instructions to a system of the system 1000 or vehicle 1001 to spray washing fluid on the protective window and to activate one or more wipers.

In some embodiments, the processor of the system 1000 may be (or include) a processor of the host (i.e., higher level system such as vehicle 1001). For example, in a LIDAR system, e.g., LIDAR system 100, processor 118 which executes the distance measurement or other LIDAR-specific actions may be separate from processor 1018.

In some embodiments, the processor may be configured to cause a change in light flux projected from the at least one light source based on the detected obstruction pattern and the determined cause of the obstruction of the protective window. For example, obstruction clearing module 1030 may execute instructions causing the light source to emit less light to a blocked region. In other example, a remedial action may be to increase the light emitted if the obstruction is transparent. In some embodiments, the processor may be configured to cause a change in a sensitivity of the at least one sensor based on the detected obstruction pattern and the determined cause of the obstruction of the protective window. For example, obstruction clearing module 1030 may execute instructions to increase the sensitivity of the pixels not obstructed by the obstruction.

Figure 11:
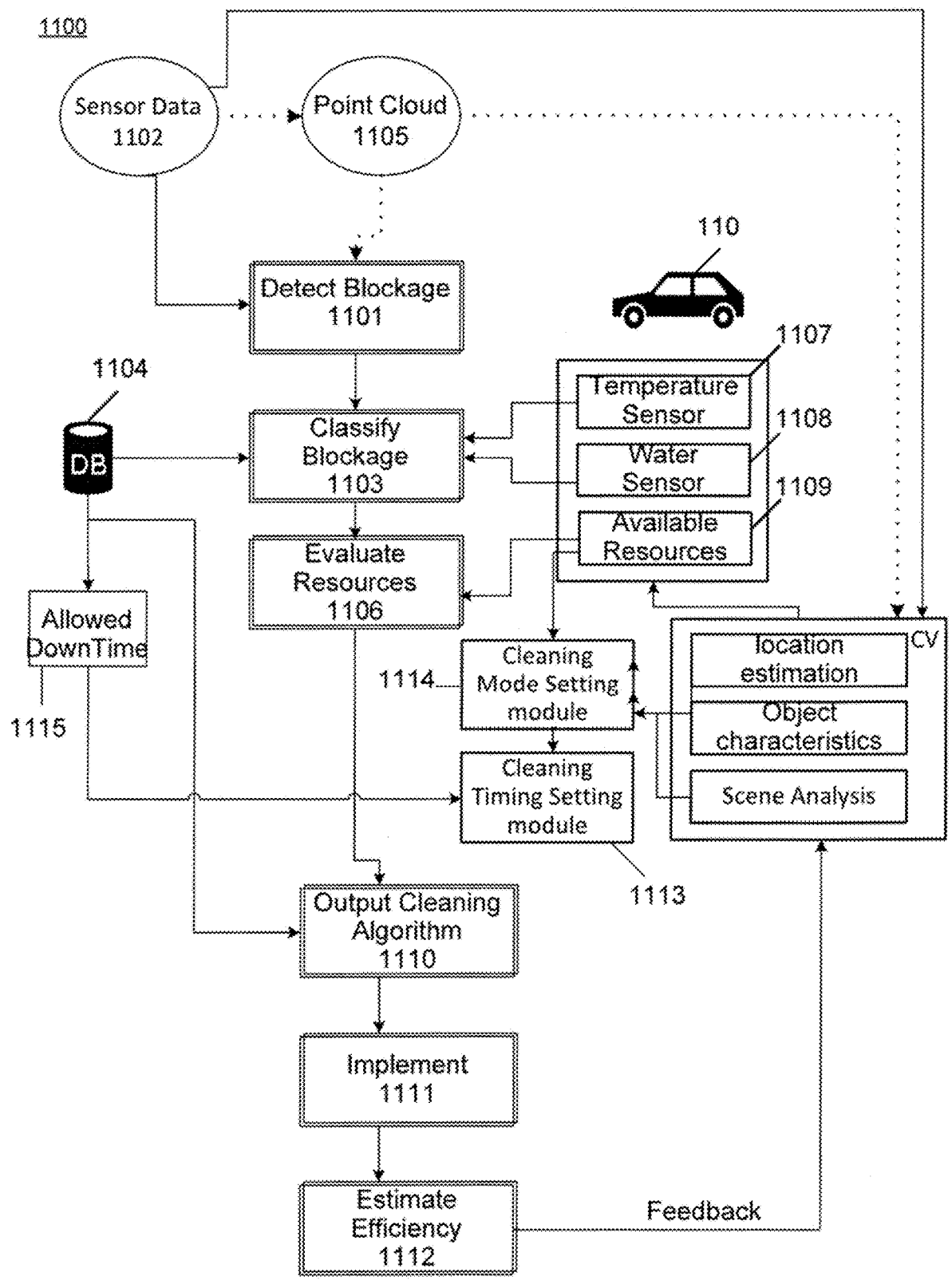
FIG. 11 is a flow chart of an exemplary method for detecting and classifying obstructions.

FIG. 11 is a flow chart of an exemplary method 1100 for detecting and classifying obstructions. As previously described, signal processing module 1026 may detect an obstruction (step 1101) by analyzing sensor data 1102. Additionally, sensor data 1102 may be used to generate a point cloud 1105 as previously described. Data from point cloud 1105 may be used to determine the obstruction pattern of the detected obstruction.

In some embodiments, the signal processing part of the LIDAR system 100 may output semi-points as part of the point cloud data, indicating blocked areas of the FOV. For example, instead of outputting a parameter set ($\theta i$, $\phi i$, distance, reflectivity) for a point, the processor may output ($\theta i$, $\phi i$, obstruction (flag), obstruction parameters (if any)). In another embodiment, a higher level processing module (such as the computer vision processor) may process the point cloud and determine an obstruction. For example, if a given pixel is dark for a predetermined number of frames, while surrounding pixels are systematically not dark, the system may define the pixel as obstructed).

Information about the obstruction, including its obstruction pattern may be sent to obstruction classification module 1028. Using one or more algorithms, e.g., a temporal or spatial pattern matching algorithm, and/or neural network software, obstruction classification module 1028 may match the obstruction pattern with a reference obstruction pattern stored in a database 1104 (step 1103). The reference obstruction pattern may contain classification information and characterization information about the type of obstruction. Additional input may be used to match the detected obstruction pattern to a reference obstruction pattern. For example, a temperature sensor 1107 of the system 1000 may indicate the ambient temperature of the environment of the system is below the freezing point of water (or any other temperature). In this example, temperature information coupled with a distributed and translucent obstruction pattern may indicate that the obstruction is ice on the protective window. In another example, a water sensor 1108 of the system 1000 may be used classify an obstruction pattern as spattered water, or continuous rainfall, which require different remedial actions.

At step 1106, obstruction clearing module 1030 may evaluate available cleaning resources 1109 based on the obstruction classification. One or more systems of the system 1000 and/or vehicle 1001 may control resources available for cleaning the protective window of the system 1000 or the windshield 1003 of vehicle 1001. For example, one or more systems may control a wiper system, washer fluid, de-icing fluid, a compressed air system, defogging system, etc. Clearing module 1030 may identify unavailable resources, e.g., a washer fluid container is empty, and alert the operator of the vehicle that the resource is unavailable. In other embodiments, the system may identify other resources that may be used to clean an obstruction if certain resources are unavailable. For example, obstruction clearing module 1030 may execute instructions to eject a stream of compressed air at the protective window to remove dust if washer fluid is unavailable.

At step 1110, the processor outputs the optimal algorithm for cleaning the obstruction based on the obstruction pattern and available resources. At step 1111, the one or more system 1000 or vehicle 1001 systems may execute the instructions output by obstruction clearing system 1030 to clear the detected obstruction.

At step 1112, the system provides feedback data to the processor. For example, feedback data may include instructions to the light source, e.g., not to illuminate towards blocked part of the window. Feedback data may further include instructions to one or more system components to, for example, correct the point cloud by using software, to alert one or more system processors that the pointcloud is defective, and/or to compensate for the blockage using one or more cameras of the vehicle.

At step 1112, the processor 1018 may estimate the efficiency of the system to provide feedback. For example, the processor 1018 may determine that the detection efficiency increased to a default level after a cleaning cycle was executed, indicating that the blockage was cleared effectively. In another example, the system 1000 may continue to operate at an insufficient efficiency, causing the obstruction clearing module to execute instructions to alert a user of the system that the system is blocked.

In some embodiments, a cleaning time setting module 1113 may cause a cleaning mode setting module 1114 to intermittently execute a default cleaning process at predetermined time intervals. For example, module 1114 may receive instructions to execute a window cleaning process once every ten minutes as dictated by the allotted downtime 1115 and timing module 1113. In other embodiments, module 1114 may receive instructions to decrease the time between cleaning cycles if, for example, blockage data indicates frequent blockages. In one example, a vehicle 1001 may be passing by a dusty construction site. Upon detection of frequent blockages, the system may decrease the time between cleaning cycles, such that the dust is cleared from the system window more frequently.

Figure 12:
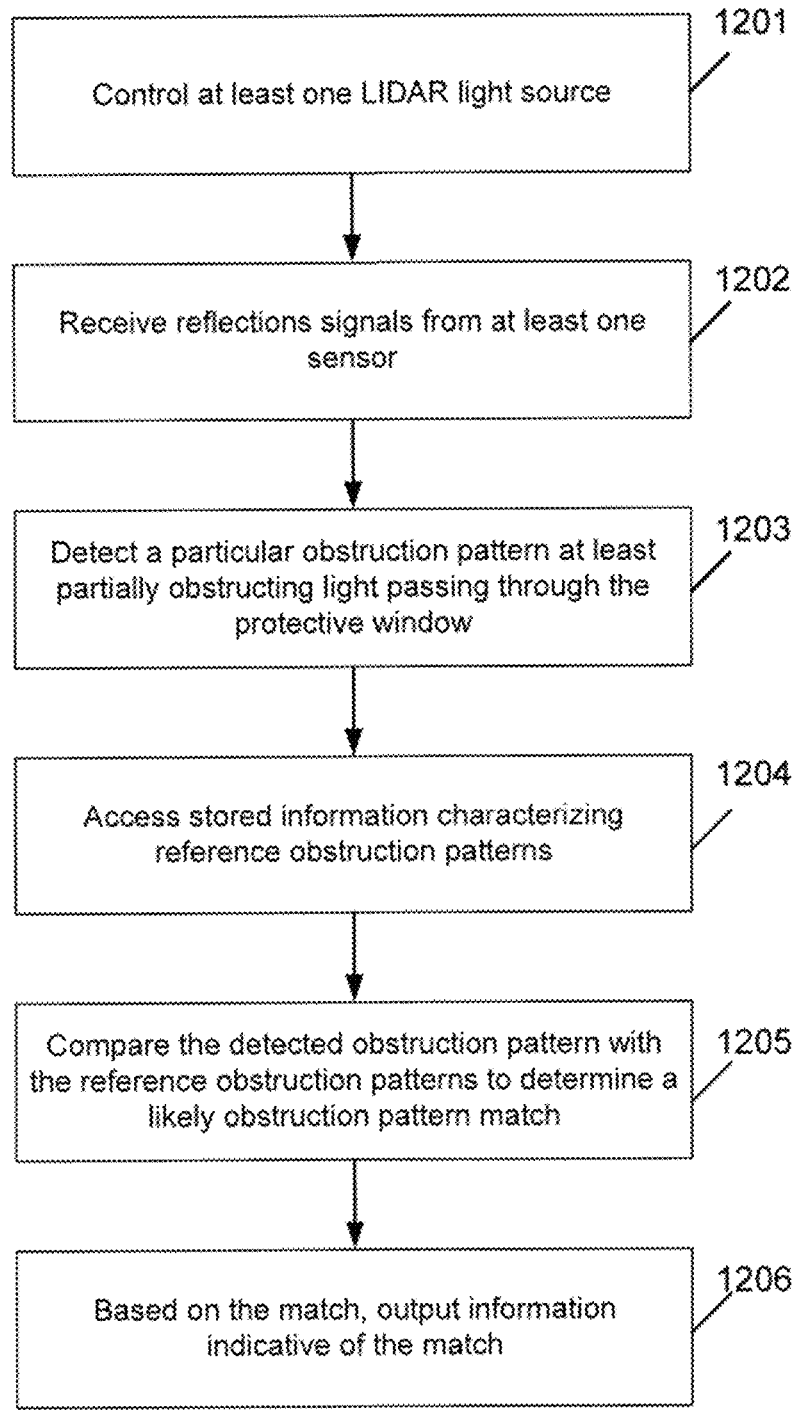
FIG. 12 is a flow chart of an exemplary process for detecting and classifying obstructions consistent with disclosed embodiments.

FIG. 12 is a flowchart of an exemplary process 1200 for detecting and cleaning an obstruction consistent with the closed embodiments. Referring to the examples set forth with respect to the previous drawings, process 1200 may be executed by processor 118 and/or processor 1018. At step 1201 the processor 1018 controls at least one light source, e.g., light source 1012, to emit light in the direction of the field of view. As previously described, the system 1000 may control an additional light source to emit light to detect obstructions.

At step 1202, the processor receives reflections signals from at least one sensor, e.g., sensor 1016. Reflections signals may be analyzed by signal processing module 1026 as previously described. Reflections signals may include indications of light reflected from the protective window and light reflected from objects in the field of view and passing through the protective window prior to reaching the at least one sensor.

At step 1203, the processor may detect a particular obstruction pattern at least partially obstructing light passing through the protective window of the system 1000. These reflections signals may include indications internal reflections of light from an internal light source off the protective window; (b) external reflections of light from an internal light source; and (c) ambient light. An obstruction may be any object or defect blocking the protective window, e.g., salt, mud, road grime, snow, rain, dust, bug debris, pollen, condensation, ice, and bird droppings, or a defect or scratch in the protective window.

At step 1204, the processor may access stored information characterizing reference obstruction patterns for at least one of salt, mud, road grime, snow, rain, dust, bug debris, pollen, and bird droppings. Exemplary obstruction patterns may include those shown in FIG. 10F. For example, obstruction classification module 1028 may access a database 1104, or other memory device to retrieve one or more reference obstruction patterns corresponding to one or more types of possible obstruction.

At step 1205, the processor may compare the detected obstruction pattern with the reference obstruction patterns in order to determine a likely obstruction-pattern match. As previously described, obstruction classification module 1028 may use one or more pattern matching algorithms and/or neural network or machine learning software to match the detected obstruction pattern to a reference obstruction pattern.

At step 1206, the processor may output information indicative of the match based on the likely match. Parameters of the matching reference obstruction pattern may be output to obstruction clearing module 1030 and used to determine a remedial action for clearing the detected obstruction. In some embodiments, reference obstruction pattern data received from a database storing reference obstruction patterns may include an optimal cleaning algorithm. The processor may further output information to alert vehicle operator that an obstruction was detected.

In some embodiments, output may include obstruction location (e.g. with respect to the window/windshield), obstruction location with respect to the point cloud (e.g., for changing illumination levels), parameters of the obstruction (e.g., classification, dimensions, time-stamp, temporal profile, transparency), raw data (detected signals), indication of blocked pixels, and so on.

Aggregating Pixel Data Associated with Multiple Distances or Aggregating Over Time to Improve Image Quality Signal Aggregation Across Distances In some embodiments, LIDAR systems of the present disclosure may aggregate data across different distances to improve image quality. For example, the aggregation may improve spatial resolution, distance estimates, surface angle determinations, object classifications, or any other measurements performed by the LIDAR system. In addition, the aggregation may provide for more accurate processing of split field of view pixels. Split FOV pixels are those including both foreground and background information. As used herein, "foreground" may refer to portions of a field of view, such as objects, road markings, or the like, that are within a particular distance (whether measured in Cartesian coordinates or spherical coordinates) of a light source and/or a detector of the LIDAR system while "background" may refer to portions of the field of view, such as objects, road markings, or the like, that are beyond the particular distance of the light source and/or the detector of the LIDAR system. Alternatively, any object, road marking, or the like may be classified as "foreground" with reference to another object, road marking, or the like that is farther from the light source and/or the detector of the LIDAR system than the foreground object and thus classified as "background."

In some embodiments, the classification of an FOV pixel as "background," "foreground," or "split" may be explicit. For example, the explicit classification may be based on determined distances based on signals from the pixel caused by received reflections from the field of view. Alternatively, the classification of a pixel as "background," "foreground," or "split" may be an implicit consequence of implementing a binning scheme. For example, a group of avalanche photodiodes may generate a plurality of input signals indicative of reflections of light from objects in the field of view, and the plurality of input signals may be placed in a plurality of bins, each bin corresponding to input signals caused by reflections from a region of the field of view. Accordingly, pixels may be "background," "foreground," or "split" as a consequence of binning and the objects, road markings, or the like present within the regions corresponding to the bins rather than based on an explicit classification.

In some embodiments, one or more FOV pixels may fall outside these three categories. For example, some pixels may be "intermediate pixels" whose associated object distances from the LIDAR system are longer than those associated with the "foreground" pixels, and shorter than those associated with the "background" pixels. As mentioned above, different definitions of "background," "foreground," and "intermediate" may be used in different implementations of the invention, and possibly by a single LIDAR system at different times or settings. For example, foreground objects may include objects closer to the LIDAR system than a first threshold distance such as 20 m, 30 m, 40 m, 50 m, or the like. For example, background objects may include objects further from the LIDAR system than a second threshold distance such as 40 m, 50 m, 75 m, 100 m, or the like. In a given system, the second threshold distance may be equal or larger than the first threshold distance.

Figure 13A:
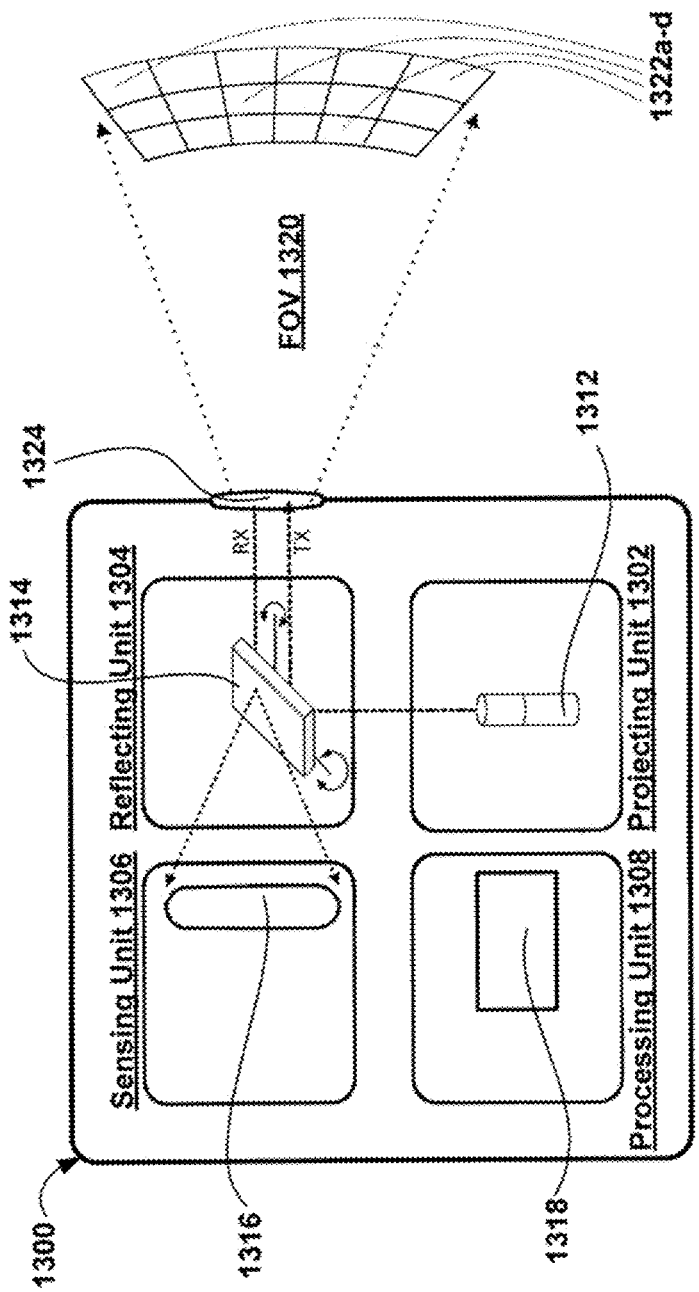
FIG. 13A is a diagram illustrating an exemplary LIDAR system having for capturing information relative to a plurality of field of view pixels consistent with disclosed embodiments.

FIG. 13A is a diagram illustrating an exemplary LIDAR system 1300 having a plurality of pixels. As depicted in FIG. 13A, the LIDAR system 1300 may include projecting unit 1302, which may include at least one light source 1312; scanning unit 1304, which may include at least one light deflector 1314 and optional optical window 1324; and sensing unit 1306, which may include at least one sensor 1316. As further depicted in FIG. 13A, the field of view 1322 may include a plurality of pixels, e.g., pixels 1322a to 1322d. Accordingly, each "pixel" may comprise a portion of the field of view.

Figure 13B:
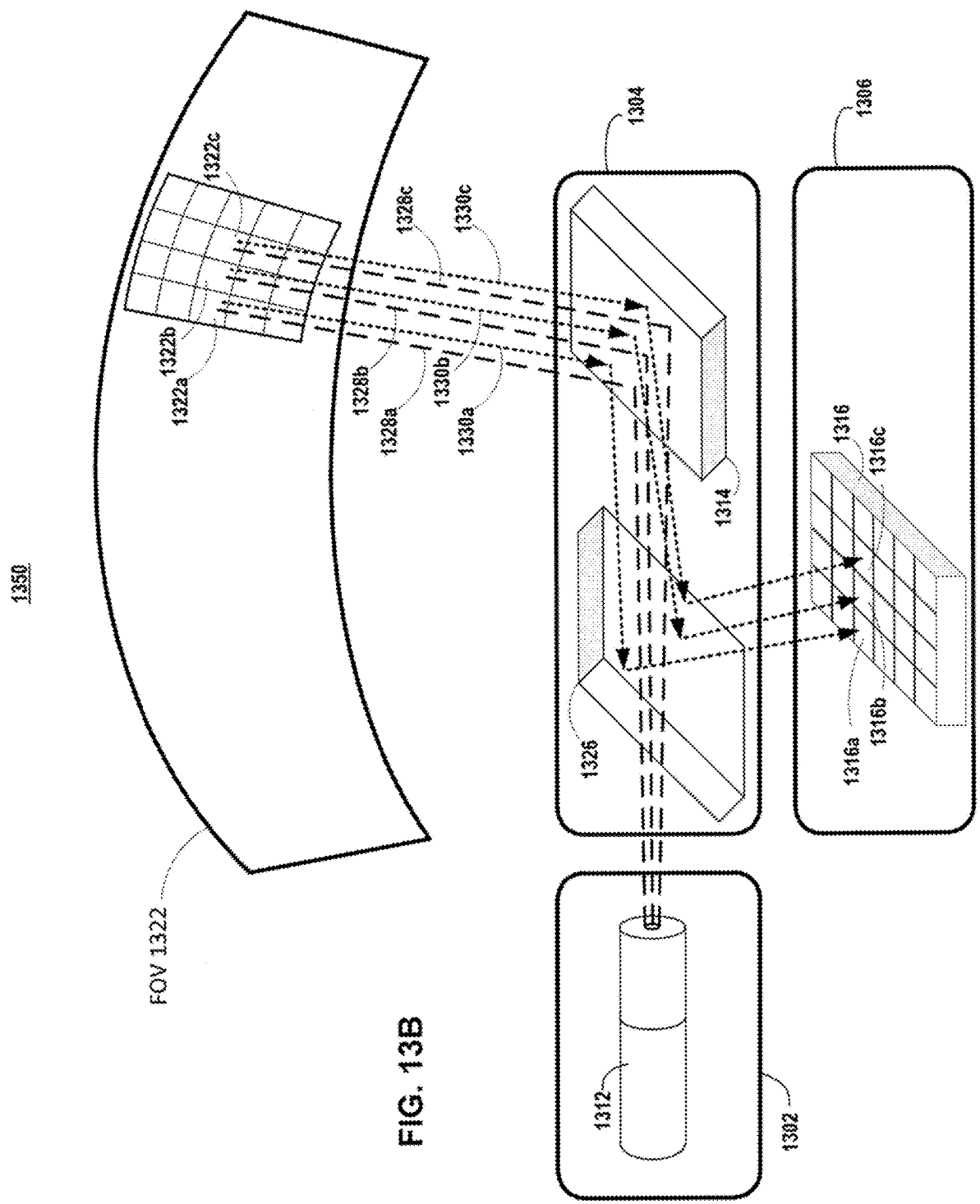
FIG. 13B is a diagram illustrating an exemplary LIDAR system having for capturing information relative to a plurality of field of view pixels consistent with disclosed embodiments.

FIG. 13B is a diagram illustrating an implementation 1350 of LIDAR system 1300 of FIG. 13A. The implementation 1350 of FIG. 13B is a scanning and monostatic LIDAR; however, any other LIDAR system, such as non-scanning systems, multistatic systems, or the like, may be used to implement the embodiments described below. The example LIDAR system 1350 of FIG. 13B may include projecting unit 1302 (which may, for example, be similar to projecting unit 102 of FIG. 1A, 2A, 2B, or 2C, described above), which may include at least one light source 1312 (which may, for example, be similar to light source 112 of FIG. 1A, 2A, or 2B, described above). The example system 1350 of FIG. 13B may further include scanning unit 1304 (which may, for example, be similar to scanning unit 104 of FIG. 1A, 2A, 2B, or 2C described above), which may include at least one outgoing light deflector 1314 and at least one incoming light deflector 1326 (which may, for example, be similar to deflectors 114A and 114B of FIG. 2A described above); however, in alternate implementations, one or more deflectors may be used for both outgoing and incoming transmissions, such as deflector 114 of FIG. 2B, described above. The example system 1350 of FIG. 13B may further include sensing unit 1306 (which may, for example, be similar to sensing unit 106 of FIG. 1A or 2A, described above), which may include at least one sensor 1316 (which may, for example, be similar to sensor 116 of FIG. 1A, 2A, 2B, or 2C described above). Sensor 1316 may include a plurality of detection elements, e.g., elements 1316a, 1316b, and 1316c. As explained above, each pixel in field of view 1322 may be detected by a plurality of detection elements, such as Avalanche Photo Diodes (APD), Single Photon Avalanche Diodes (SPADs), combination of Avalanche Photo Diodes (APD) and Single Photon Avalanche Diodes (SPADs), or other detecting elements that measure both the time of flight from a laser pulse transmission event to the reception event and the intensity of the received photons. The outputs of the detection elements corresponding to each FOV pixel may be summed, averaged, or otherwise combined to provide a unified output.

Accordingly, as used herein, the terms "pixel" or "FOV pixel" refer to any three-dimensional portion of the field of view (e.g., defined by four Cartesian values such as (x+dx, y+dy), (x±dx, y±dy), or the like or defined by four angular values such as ($\theta$+d$\theta$, $\phi$+d$\phi$), ($\theta$±d$\theta$, $\phi$±d$\phi$), or the like). Each pixel's size (e.g., determined by dx and dy or by d$\theta$ and d$\phi$) may be the same or may differ. Some pixels may be mutually exclusive (i.e., non-overlapping) while other pixels may at least partially overlap. Some pixels may be defined by adjacent portions of the detector (e.g., at least one sensor 1316) and/or by adjacent detection elements on the detector while other pixels may be associated with non-neighboring detection elements. As referenced elsewhere, an FOV pixel refers to a region of the field of view from which one or more received reflections signals are combined together to generate a single data point within the point cloud generated by a LIDAR system.

As depicted in FIG. 13B, light source 1312 may emit one or more light beams (or groups of light beams), e.g., projected beams 1328a, 1328b, and 1328c, toward field of view 1322. The projected beams may reflect off objects, road markings, or the like, in field of view 1322, causing corresponding one or more reflected light beams (or groups of light beams), e.g., reflected beams 1330a, 1330b, and 1330c, to travel back towards the LIDAR system. As further depicted in FIG. 13B, each projected beam may be associated with a particular region of field of view 1322. Accordingly, each reflected beam may also be associated with a corresponding region.

Furthermore, each pixel may be associated with the region corresponding to the region of field of view 412 from which the one or more reflected beams received on the pixel originate. For example, as depicted in the example of FIG. 13, detection element 1316a receives reflected beam 1330a caused by projected beam 1328a, detection element 1316b receives reflected beam 1330b caused by projected beam 1328b, and detection element 1316c receives reflected beam 1330c caused by projected beam 1328c. Although depicted as a one-to-one correspondence in FIG. 13B, one or more of the projected light beams may illuminate a plurality of pixels in the field of view 1322. Moreover, as explained in further detail below, a processing unit (not depicted), which may include at least one processor, may aggregate data across pixels associated with different regions to improve accuracy, resolution, or the like.

Figure 14A:
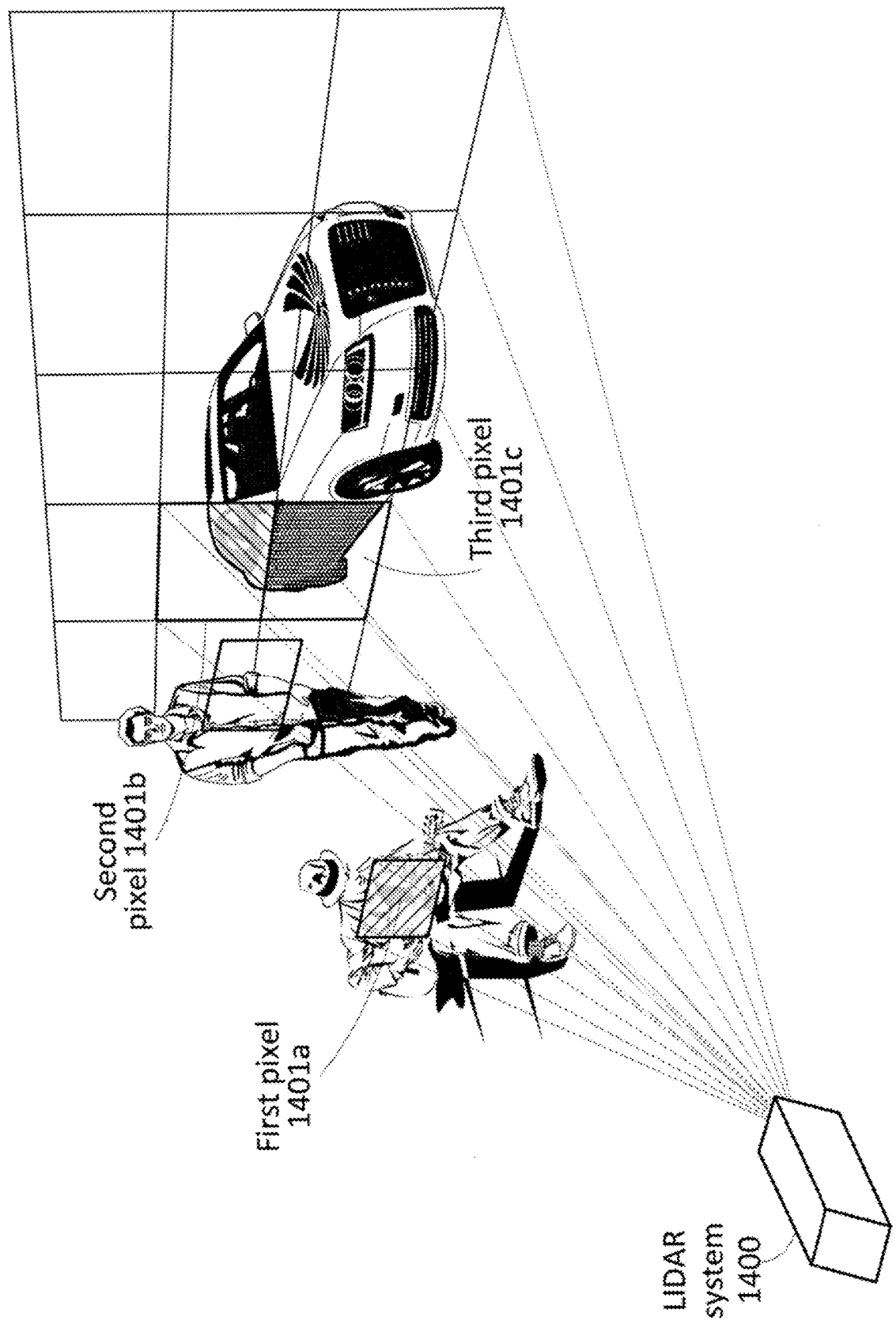
FIG. 14A is a diagram representative of a background field of view pixel, an intermediate field of view pixel, and a foreground field of view pixel imaged by an exemplary LIDAR system consistent with disclosed embodiments.
Figure 14B:
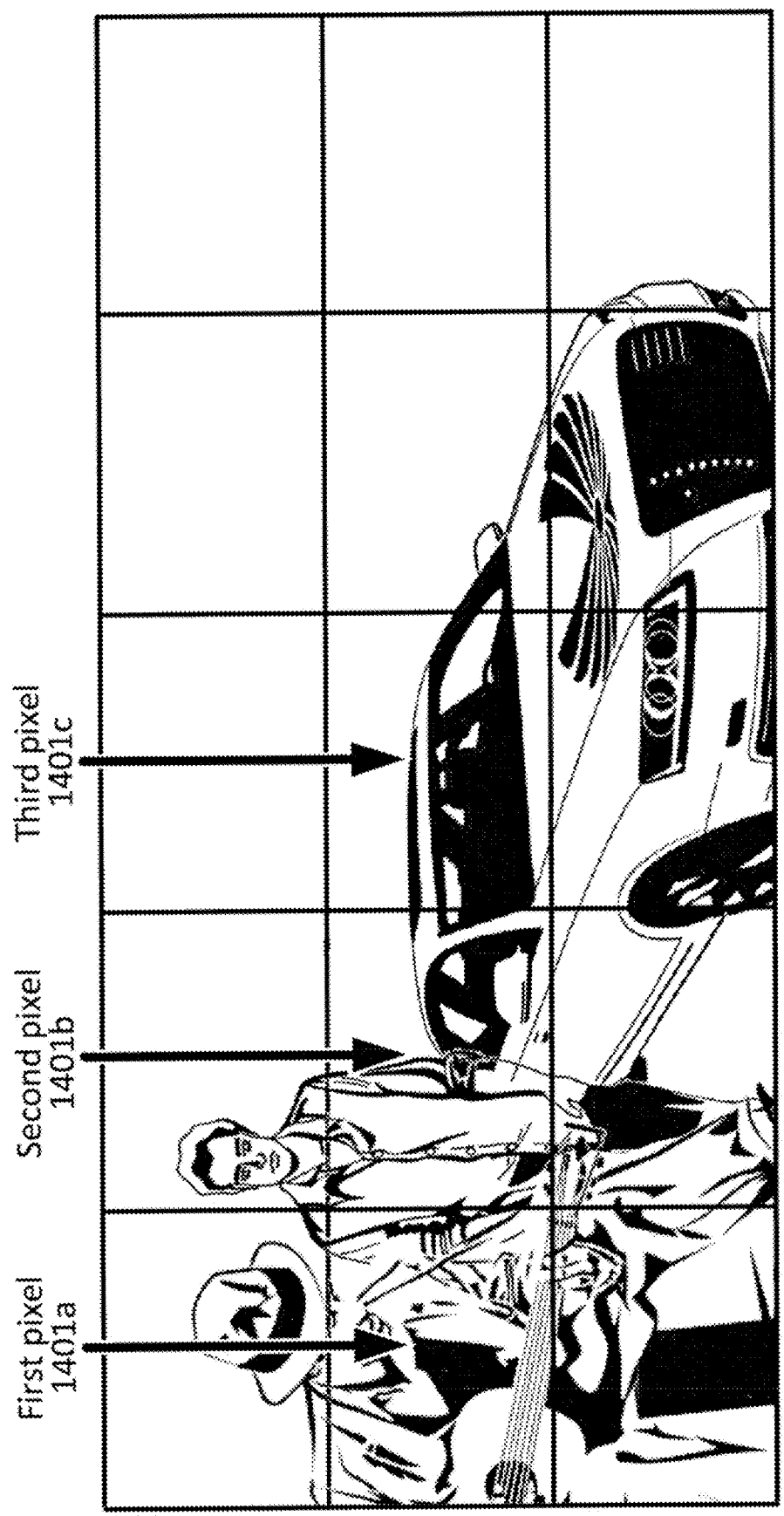
FIG. 14B is a diagram illustrating a front-facing view of the pixels of FIG. 14A.

FIG. 14A is a diagram illustrating an exemplary LIDAR system 1400 for collecting information from at least three pixels in the field of view. In the example of FIG. 14A, system 1400 has at least a field of view with a first pixel 1401a, a second pixel 1401b, and a third pixel 1401c. As further depicted in FIG. 14B, first pixel 1401a includes a portion of a foreground object and an intermediate object, second pixel 1401b includes a portion of the intermediate object and a background object, and third pixel 1401c includes the background object. Accordingly, first pixel 1401a may be classified as a foreground pixel and/or a split pixel, second pixel 1401b may be classified as an intermediate pixel and/or a split pixel, and third pixel 1401c may be classified as a background pixel. FIG. 14B is a diagram illustrating a front-facing view of the pixels of FIG. 14A.

Figure 14D:
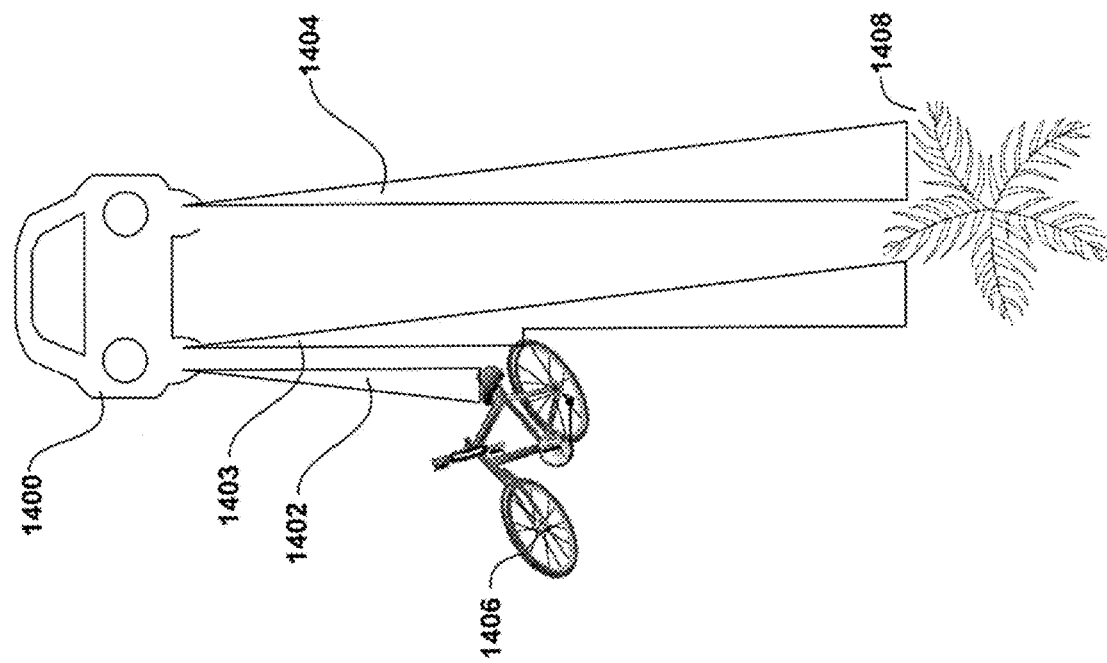
FIG. 14D is a diagram illustrating an exemplary vehicle with a LIDAR system for capturing information relative to at least three FOV pixels to detect a foreground object and a background object consistent with disclosed embodiments.
Figure 14C:
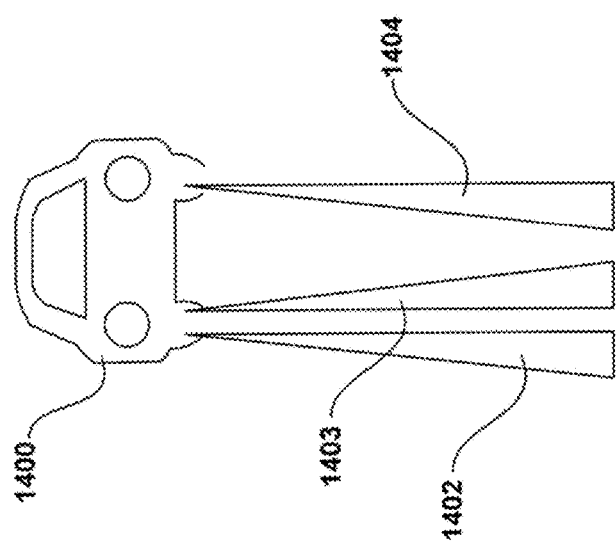
FIG. 14C is a diagram illustrating an exemplary vehicle with a LIDAR system for capturing information relative to at least three FOV pixels consistent with disclosed embodiments.

FIG. 14C is a diagram illustrating an exemplary vehicle with a LIDAR system 1400. In the example of FIG. 14C, the field of view of system 1400 has at least three pixels. For example, system 1400 may comprise system 1300 of FIGS. 13A and/or 13B, described above. As depicted in FIG. 14C, system 1400 may output data corresponding to at least three pixels associated with regions of a field of view, e.g., regions 1401, 1402, and 1403. Each of these pixels may be associated with one or more foreground objects, one or more background objects, or divided between one or more foreground objects and one or more background objects. For example, as shown in the example of FIG. 14D, foreground object 1406 may be classified as "foreground" because it is within a threshold distance of the LIDAR system 1400 and background object 1408 may be classified as "background" because it is beyond the threshold distance. In the example of FIG. 14D, region 1402 includes foreground object 1406, region 1404 includes background object 1408, and region 1403 is split between foreground object 1406 and background object 1408. Although depicted with three pixels, LIDAR system 1400 may detect more than three pixels in its FOV, and may have varying numbers of any of the pixels types described above (e.g., described for regions 1402, 1403, and 1404). In some embodiments, each pixel of the LIDAR system may detect different objects in different times, and therefore the classification of pixels to such categories may also change with time. As described above, some of the pixels of the LIDAR system may not fall into these categories (such as pixels with no detected image, malfunctioning or erroneous equipment output relative to certain pixels, and pixels detecting objects with intermediary distances).

Figure 14F:
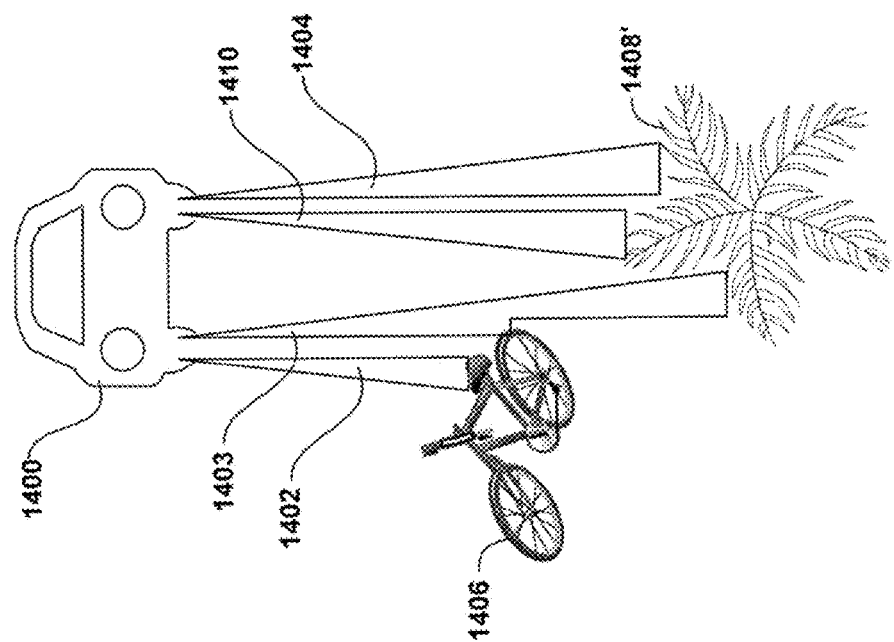
FIG. 14F is a diagram illustrating an exemplary vehicle with a LIDAR system for capturing information relative to at least four FOV pixels to detect a foreground object and a background object consistent with disclosed embodiments.
Figure 14E:
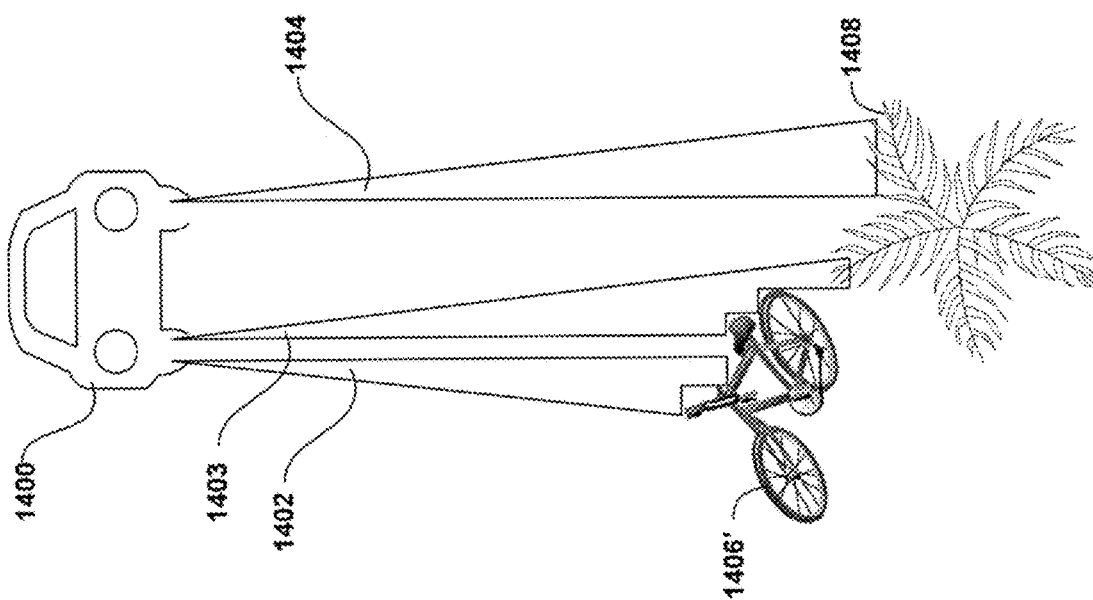
FIG. 14E is a diagram illustrating an exemplary vehicle with a LIDAR system for capturing information relative to at least three FOV pixels to detect a foreground object partially occluding a background object consistent with disclosed embodiments.

In another example depicted in FIG. 14E, foreground object 1406' may at least partially occlude background object 1408. Furthermore, as shown in the example of FIG. 14E, foreground object 1406' may be classified as "foreground" because it is closer to LIDAR system 1400 as compared to background object 1408. In the example of FIG. 14E, region 1402 includes foreground object 1406', region 1404 includes background object 1408, and region 1403 is split between foreground object 1406' and background object 1408.

In any of the examples of FIGS. 14C, 14D, and 14E, signals associated with region 1403 (e.g., corresponding to one or more pixels comprising output based on reflections from region 1403) may be aggregated with signals associated with region 1404 (e.g., corresponding to one or more pixels comprising output based on region 1404). This aggregation may improve signal accuracy, resolution, or the like for signals related to background object 1408. Additionally or alternatively, signals associated with region 1403 (e.g., corresponding to one or more pixels comprising output based on region 1403) may be aggregated with signals associated with region 1402 (e.g., corresponding to one or more pixels comprising output based on region 1402). This aggregation may improve signal accuracy, resolution, or the like for signals related to foreground object 1406 (or foreground object 1406').

Although the examples of FIGS. 14C, 14D, and 14E depict three pixels, additional pixels may be used. For example, as depicted in the example of FIG. 14F, region 1402 includes foreground object 1406, region 1404 and split region 1410 include background object 1408', and region 1403 is between foreground object 1406 and background object 1408'. Accordingly, similar to FIGS. 14C, 14D, and 14E, region 1403 (e.g., corresponding to one or more pixels comprising output based on region 1403) may be aggregated with signals associated with region 1404 (e.g., corresponding to one or more pixels comprising output based on region 1404) and/or region 1410 (e.g., corresponding to one or more pixels comprising output based on region 1410). This aggregation may improve signal accuracy, resolution, or the like for signals related to background object 1408'. Additionally or alternatively, signals associated with region 1403 (e.g., corresponding to one or more pixels comprising output based on region 1403) may be aggregated with signals associated with region 1402 (e.g., corresponding to one or more pixels comprising output based on region 1402). This aggregation may improve signal accuracy, resolution, or the like for signals related to foreground object 1406.

Figure 15:
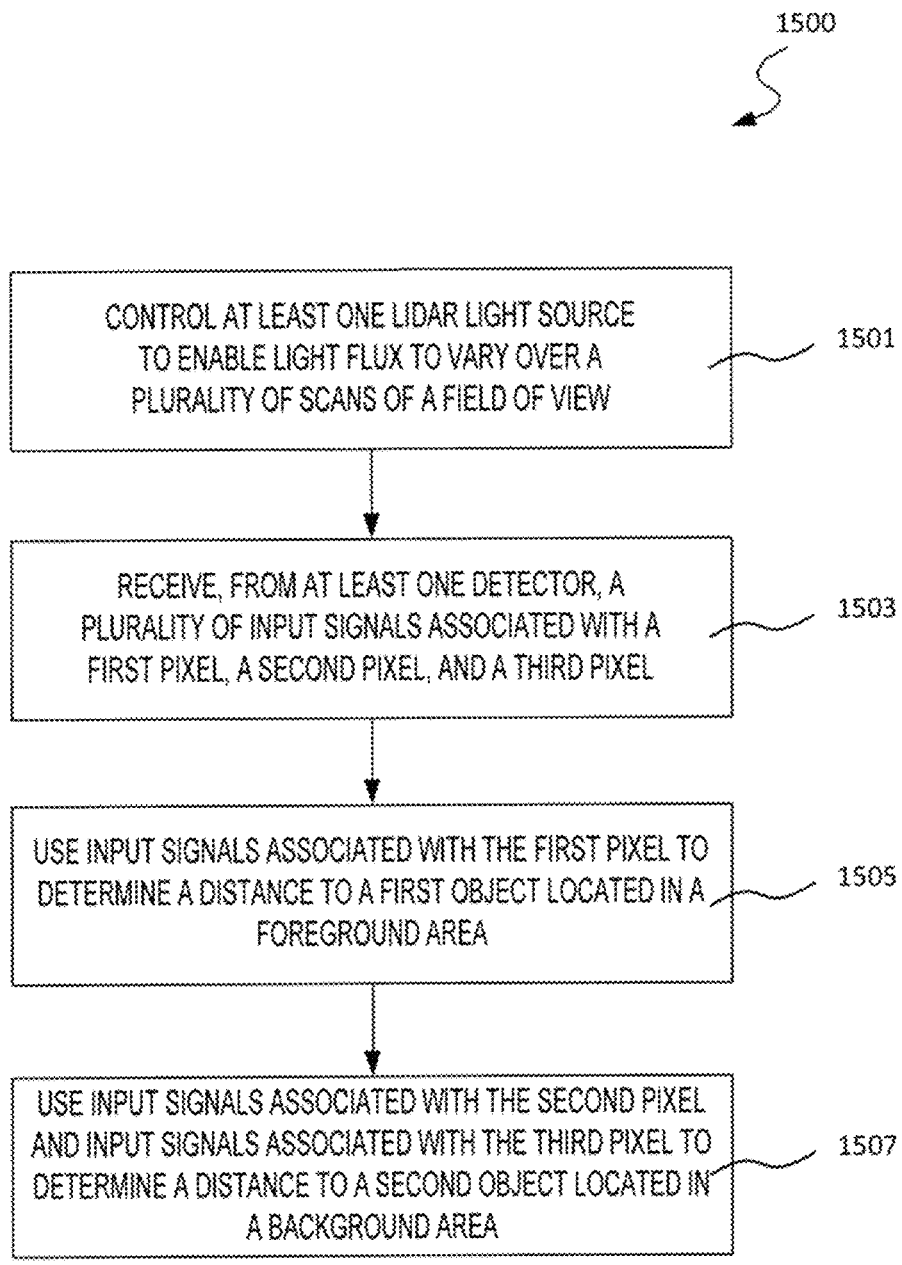
FIG. 15 is a diagram illustrating a flowchart of an exemplary method for aggregating pixel data from a plurality of pixels consistent with disclosed embodiments.

FIG. 15 is a flowchart of method 1500 for using LIDAR to determine distances to objects in a field of view. For example, method 1500 may be implemented by at least one processor of a LIDAR system (e.g., at least one processor 1318 of LIDAR system 1300, at least one processor 118 of LIDAR system 100, or the like) and/or by at least one processor within a body of a vehicle (e.g., processor 408 of housing 200B of vehicle 110).

At step 1501, the at least one processor may control at least one LIDAR light source in a manner enabling light flux to vary over a plurality of scans of a field of view. For example, the at least one processor may vary the timing of pulses from the at least one light source. Alternatively or concurrently, the at least one processor may vary the length of pulses from the at least one light source. By way of further example, the at least one processor may alternatively or concurrently vary a size (e.g., length or width or otherwise alter a cross-sectional area) of pulses from the at least one light source. In a yet further example, the at least one processor may alternatively or concurrently vary the amplitude and/or frequency of pulses from the at least one light source. In certain aspects, the at least one processor may vary the light flux during a single scan and/or across a plurality of scans. Additionally or alternatively, the at least one processor may vary the light flux across a plurality of regions in the field of view (e.g., during a scan and/or across a plurality of scans).

In some embodiments, method 1500 may further include controlling at least one light deflector to deflect light from the at least one light source such that during a single scanning cycle the at least one light deflector instantaneously assumes a plurality of instantaneous positions. In one example, the at least one processor may coordinate the at least one light deflector and the at least one light source such that when the at least one light deflector assumes a particular instantaneous position, a portion of a light beam is deflected by the at least one light deflector from the at least one light source towards an object in the field of view, and reflections of the portion of the light beam from the object are deflected by the at least one light deflector toward at least one sensor. In another example, the at least one light source may comprise a plurality of lights sources aimed at the at least one light deflector, and the at least one processor may control the at least one light deflector such that when the at least one light deflector assumes a particular instantaneous position, light from the plurality of light sources is projected towards a plurality of independent regions in the field of view.

In such embodiments, for each instantaneous position of the at least one light deflector, the group of detectors may be configured to generate input signals corresponding to an instantaneous portion of the field of view. For example, the input signals may be explicitly associated with the instantaneous position (e.g., by adding an address or other indicator to the signal) or may be implicitly associated (e.g., by being generated within a time frame that associates them to a particular instantaneous position).

Additionally or alternatively, the generated input signals corresponding with the instantaneous position of the at least one light deflector may be associated with a plurality of pixels. For example, the input signals may be explicitly associated with the pixels (e.g., by adding an address or other indicator to the signal) or may be implicitly associated (e.g., by being generated by detectors associated with the pixels).

In other embodiments, method 1500 may be performed without varying the light flux of the at least one light source. For example, method 1500 may be performed with a LIDAR system that is fixed-power rather than variable-power.

In some embodiments, the at least one processor may further control the at least one light source in a manner enabling modulating the projected light and to distinguish between light reflected from objects in the field of view and light emitted by objects in the field of view. For example, the at least one processor may pulse the at least one light source such that the gap between pulses is sufficiently long to receive light emitted by objects in the field of view rather than light reflected from objects in the field of view.

The field of view may include a foreground area and a background area. As explained above, the foreground area may include a portion of the field of view within a threshold distance of the LIDAR system (or a component thereof). Accordingly, the background area may include another portion of the field of view outside the threshold distance. In some embodiments, different thresholds may be used by the LIDAR system at different times and/or in different parts of the field of view. For example, the threshold may be determined based on operational parameters (e.g., illumination level, sensitivity of sensor), on environmental characteristics (e.g., sky, road, vehicles, vegetation), or the like. Alternatively, the foreground area and the background area may be defined with respect to relationships between objects, road markings, or the like in the field of view. For example, an object may be designated as a "foreground" object if it is closer to the LIDAR system (or a component thereof) than a reference object designated as a "background" object or vice versa.

At step 1503, the at least one processor may receive from at least one detector a plurality of input signals indicative of light reflected from the field of view. For example, the at least one processor may receive signals from at least one detector associated with a first pixel.

A representation of a portion of the field of view associated with a plurality of pixels may be constructible from the plurality of input signals. For example, a point cloud map may be constructible using distances determined based on the input signals. In such an example, the at least one processor could generate a point cloud map by determining time-of-flight for one or more of the input signals, determining distances based on times-of-flight, and generating the point cloud map based on the determined distances.

The plurality of input signals may be associated with a first pixel that covers a portion of the foreground area, a second pixel that covers a portion of the foreground area and a portion of the background area, and a third pixel that covers a portion of the background area. As explained above, "background" and "foreground" may be defined using a distance threshold or using relative distances. For example, the "background area" may simply include one or more points that are further from the LIDAR system (or a component thereof) than one or more points in the "foreground area." In addition, as explained above, each pixel may include a plurality of detectors, each detector generating one or more input signals. Furthermore, as explained above, the first pixel, the second pixel, and the third pixel may be non-overlapping or may at least partially overlap. In some embodiments, any two or more of the first pixel, the second pixel, and the third pixel may be adjacent to each other.

In some embodiments, the at least one processor may identify the first pixel that covers a portion of the foreground area, the second pixel that covers a portion of the foreground area and a portion of the background area, and the third pixel that covers a portion of the background area. For example, the at least one processor may use time-of-flight to identify the first pixel, the second pixel, and the third pixel, the time-of-flight for at least some signals associated with the first pixel being shorter than the time-of-flight for at least some signals associated with the second pixel and the time-of-flight for at least some signals associated with the third pixel.

Alternatively, the at least one processor may not explicitly identify the first pixel, the second pixel, and the third pixel. For example, the at least one processor may receive, from a group of avalanche photodiodes the plurality of input signals indicative of reflections of light from objects in the field of view and then process a first subset of the input signals associated with a first region and process a second subset of the input signals associated with a first region. By processing the signals using this or similar binning techniques, the at least one processor may divide the plurality of input signals into the first pixel, the second pixel, and the third pixel without explicit identification of the FOV pixels themselves.

Although described above and below using three pixels, a larger number of pixels may also be used. For example, in embodiments employing a 2×2 binning scheme, a plurality of "third" pixels may be used. Accordingly, any aggregation described below may include additional pixels covering a portion of the background area.

In embodiments employing binning, the at least one processor may bin the input signals in a plurality of ways. Accordingly, one binning scheme may produce a first pixel, a second pixel, and a third pixel (e.g., groupings of input signals combined together to generate a single data point in the point cloud output) such that aggregating the second pixel and the third pixel does not result in an object-existence-certainty level above a threshold while another binning scheme may produce a different first pixel, second pixel, and third pixel such that aggregating the second pixel and the third pixel does result in an object-existence-certainty level above a threshold.

As explained above, each pixel may correspond to a plurality of detection elements, such as a plurality of SPADs, which may be aggregated to a single SiPM. Such aggregation is not considered binning because it is implemented via a dedicated hardware architecture intended to yield the input signals (e.g., a single output signal for an SiPM at any given moment) rather than being implemented on a higher level (e.g., using the at least one processor) and being performed on the produced input signals (e.g., combining the concurrent outputs of two or more SiPMs).

As explained above input signals associated with the second pixel may be generated in response to a plurality of reflections impinging on the group of detectors. Moreover, the plurality of reflections may include a first reflection associated with a first time-of-flight and a second reflection associated with a second time-of-flight longer than the first time-of-flight. Additionally or alternatively, the plurality reflections may include a first reflection associated with a first direction relative to the at least one light source and a second reflection associated with a second direction relative to the at least one light source.

At step 1505, the at least one processor may use input signals associated with the first pixel to determine a distance to a first object located in the foreground area. For example, as explained above, time-of-flight of at least some signals associated with the first pixel may be used to determine the distance.

At step 1507, the at least one processor may use input signals associated with the second pixel and input signals associated with the third pixel to determine a distance to a second object located in the background area. For example, as explained above, time-of-flight of at least some signals associated with the second pixel and time-of-flight of at least some signals associated with the third pixel may be used to determine the distance. The times-of-flight from the second pixel and the third pixel may be combined prior to determining the distance and/or distances based on the second pixel and third pixel may be determined and then combined.

In some embodiments, the input signals associated with the second pixel and the input signals associated with the third pixel may be insufficient by themselves to determine a distance to the second object located in the background area. Accordingly, as explained above, the at least one processor may combine the input signals to determine the distance.

In some embodiments, step 1507 may further include initially processing only input signals associated with the third pixel. When a certainty level associated with an existence of the second object is below a threshold, the at least one processor may combine input signals associated with the second pixel and input signals associated with the third pixel to improve the certainty level associated with the existence of the second object. Accordingly, the certainty levels for a presence of an object in either the second pixel or the third pixel may be below a detection threshold, but the combining of both signals may allow detection of the second object by raising the certainty level above the detection threshold.

In any of the embodiments discussed above, a Signal to Noise Ratio (SNR) associated with the third pixel may be lower than an SNR associated with the second pixel. In any of the embodiments discussed above, the second pixel may be adjacent to the third pixel. In such embodiments, the at least one processor may assign a same distance to the second pixel and the third pixel. Alternatively, the second pixel may be non-adjacent to the third pixel.

In any of the embodiments described above, the first pixel may be associated with a first number of detectors, the second first pixel may be associated with a second number of detectors, and the third pixel may be associated with a third number of detectors. For example, the first pixel may be composed of input signals from four detectors, the second first pixel may be composed of input signals from eight detectors, and the third pixel may be composed of input signals from twelve detectors. Accordingly, the at least one processor may assign differing numbers of detectors out of the group of detectors to the second pixel and to the third pixel. The assignment may be explicit or a consequence of the application of one or more binning schemes, as discussed above.

Method 1500 may further include additional steps. For example, method 1500 may further include determining a direction for the second object is based on directions of the second pixel and the third pixel. In such embodiments, the at least one processor may generate a point cloud and include a direction that is a combination of the direction based on the second pixel and the direction based on the third pixel (e.g., an average of these directions). Similar to the distance determine in step 1507, the direction based on the second pixel and the direction based on the third pixel may be combined prior to determining the combined direction and/or directions based on the direction of the second pixel and the direction of the third pixel may be determined and then combined.

Method 1500 may further include using input signals associated with the second pixel and input signals associated with the first pixel to determine a distance to the first object located in the foreground area. Accordingly, aggregation may be used to improve distance measurements for a foreground object in addition to a background object.

In addition to determining the distance, method 1500 may further include using the input signals associated with the first pixel to determine at least one of: a velocity of the first object, a surface angle of the first object, a reflectivity level of the first object, and ambient light associated with the first object. Additionally or alternatively, method 1500 may further include using the input signals associated with the second pixel and the third pixel to determine at least one of: a velocity of the second object, a surface angle of the second object, a reflectivity level of the second object, and ambient light associated with the second object.

In any of the embodiments described above, method 1500 may include outputting information associated with the first object located in the foreground area and/or outputting information associated with the second object located in the background area. The output information may be used in further determinations (such as surface angle determination, point cloud generation, or the like) and/or stored for future use.

As explained above, any number of pixels may be used, even though the example of method 1500 uses three. For example, the at least one processor may identify (whether explicitly or implicitly using binning, as explained above) a fourth pixel. The fourth pixel may be adjacent or non-adjacent to the third pixel and may cover another portion of the background area. In such an example, similar to step 1507, the at least one processor may use input signals associated with the second pixel, the third pixel, and the fourth pixel to determine a distance to the second object located in the background area. The number of additional pixels used for the determination of the distance to the second object may be determined in advance and/or dynamically determined based on the detection results themselves (e.g., of one or more of pixels and/or aggregated pixels).

Signal Aggregation Across Time

Additionally or alternatively to aggregation across distances, as explained above, LIDAR systems of the present disclosure may aggregate signals across time. For example, the aggregation may improve detection rate, spatial resolution, distance estimates, surface angle determinations, object classifications, or any other measurements performed by the LIDAR system. In some embodiments, the aggregation may be performed only when one of more of the received signals fall below one or more thresholds (e.g., brightness threshold(s), confidence threshold(s), or the like). Additionally or alternatively, a cascade of aggregations may be applied until the aggregated signal exceeds a threshold (e.g., a brightness threshold, a confidence threshold, or the like).

Although described below with respect to signal strength and confidence, any measurement derived from the received signals (and/or a confidence score associated with the measurement) may be aggregated. Accordingly, any measurement (and/or a confidence score associated with the measurement) may be compared to one or more thresholds to determine when to aggregate and/or when to terminate a cascading aggregation.

Figure 16:
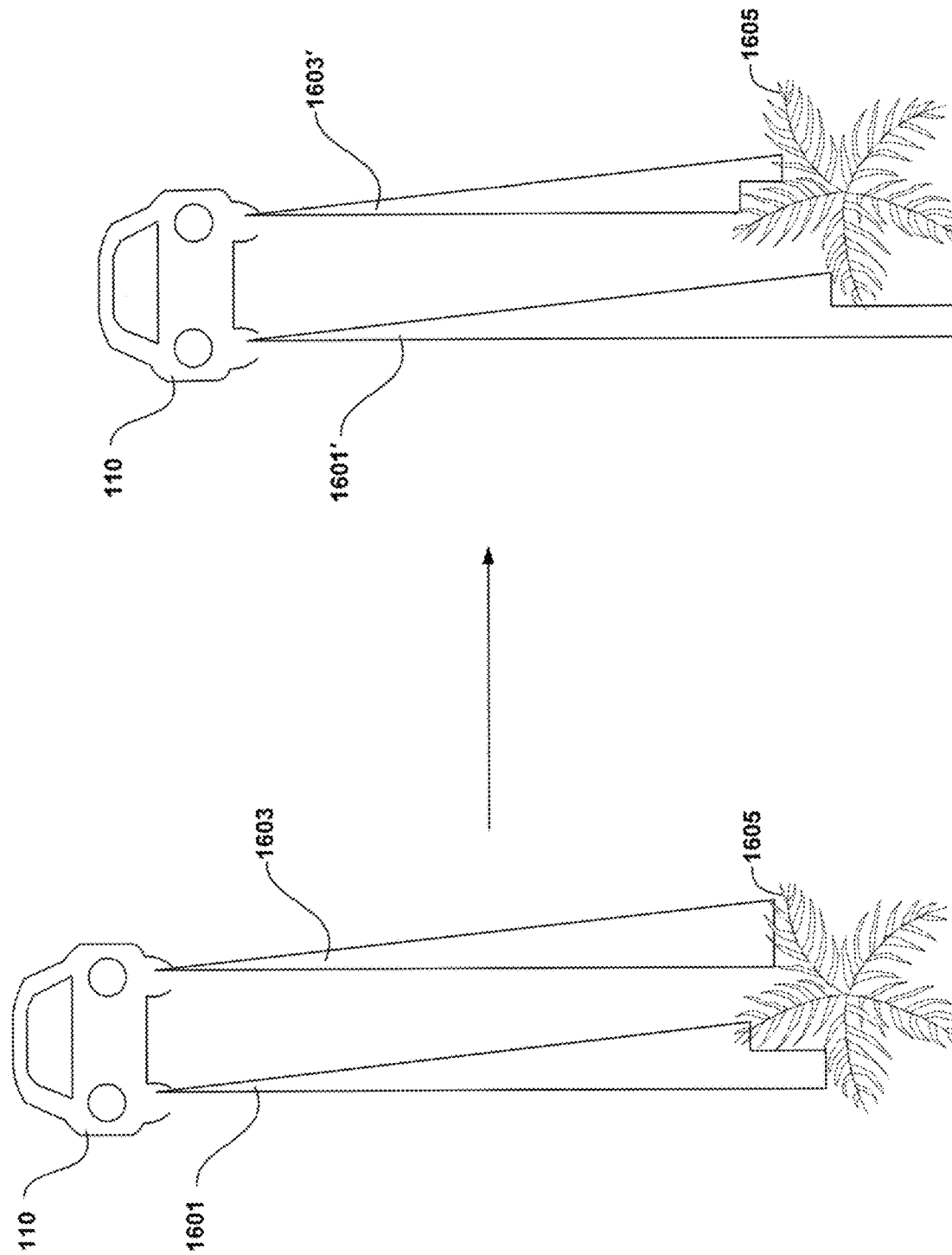
FIG. 16 is a diagram illustrating an exemplary vehicle with a LIDAR system using at least two scan cycles to detect objects consistent with disclosed embodiments.

FIG. 16 is a diagram illustrating an exemplary vehicle 110 with a LIDAR system using at least two scan cycles to detect objects. For example, vehicle 110 may include the system of FIG. 13B, described above. Vehicle 110 may include at least two pixels associated with regions of a field of view. Moreover, vehicle 110 may scan the associated regions over the course of multiple scan cycles, e.g., scanning regions 1601 and 1603 in the first scan cycle and scanning regions 1601' and 1603' in the second scan cycle. Vehicle 110 may receive signals associated with objects, road markings, or the like during scan cycles, e.g., object 1605.

In the example of FIG. 16, signals associated with the first scan cycle may be aggregated with signals associated with the second scan cycle. This aggregation may improve signal accuracy, resolution, or the like for signals related to object 1605. Additionally, signals from the first scan cycle associated with one region may be aggregated with signals from the second scan cycle associated with the same region, e.g., signals associated with region 1601 combined with signals associated with region 1601', signals associated with region 1603 combined with signals associated with region 1603', or the like. This aggregation may improve signal accuracy, resolution, or the like for signals related to object 1605. Although the example of FIG. 16 depicts that the aggregated regions in the first cycle and in the second cycle do not overlap, these regions may overlap in other embodiments not depicted (e.g., if both the LIDAR system and the detected objects are stationary, or if both move in the same speed).

Figure 17A:
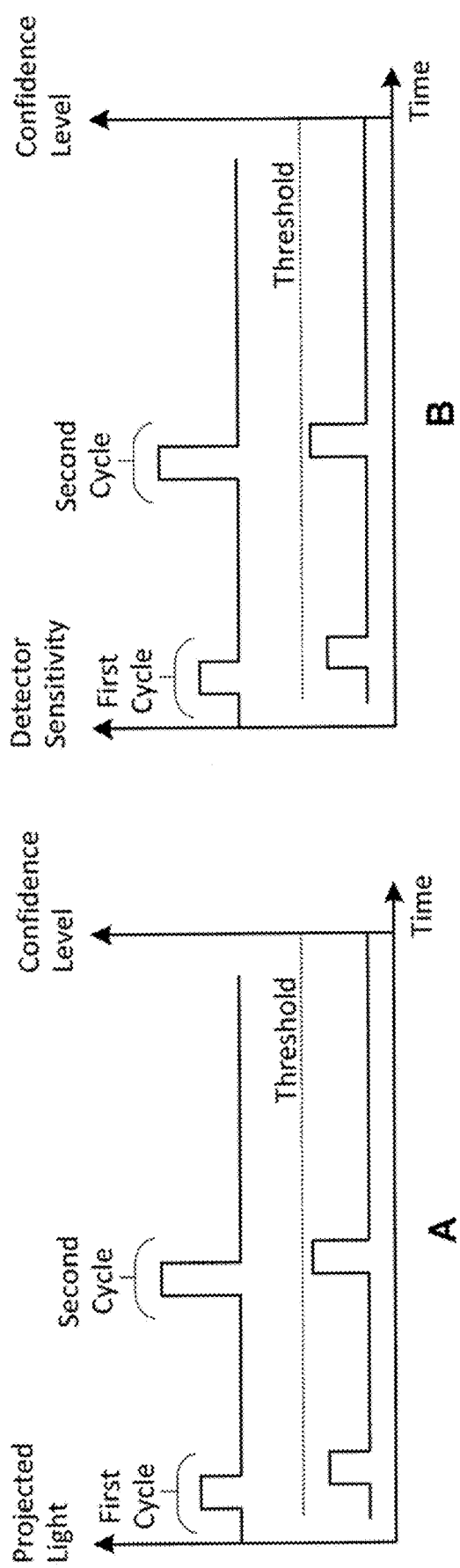
FIG. 17A is a diagram illustrating adjusting an operating parameter between scan cycles consistent with disclosed embodiments.

FIG. 17A is a diagram illustrating adjusting an operating parameter between scan cycles. In example A of FIG. 17A, a confidence level associated with a reflection caused by a pulse from the first cycle of a LIDAR scan is below a threshold. Although depicted as a confidence level associated with the reflection itself, the confidence level could be associated with any detection (such as confidence of the presence of an object, also called an "object-existence-certainty level") and/or measurement based on the reflection (such a surface angle, reflectivity, object surface composition, or the like. In example A, because the confidence level is below the threshold, the LIDAR system adjusts a corresponding pulse (e.g., projected towards the same area, object, or the like as the pulse from the first scan cycle) in the second scan cycle to have an increased amplitude.

Similarly, in example B of FIG. 17A, because the confidence level is below the threshold, the LIDAR system adjusts a sensitivity of one or more corresponding detectors (e.g., detectors that received the pulse from the first scan cycle) in the second scan cycle to have an increased sensitivity. The sensitivity may be increased by adjusting a parameter of the detector itself (e.g., decreasing a threshold below which detection does not occur) and/or by adjusting a parameter of at least one processor of the LIDAR system (e.g., decreasing a threshold below which a measurement is disregarded). Additionally or alternatively, sensitivity may be increased by adjusting a parameter along the detection path, such as increasing the level of amplification of received signals before transmission to the at least one processor.

Figure 17B:
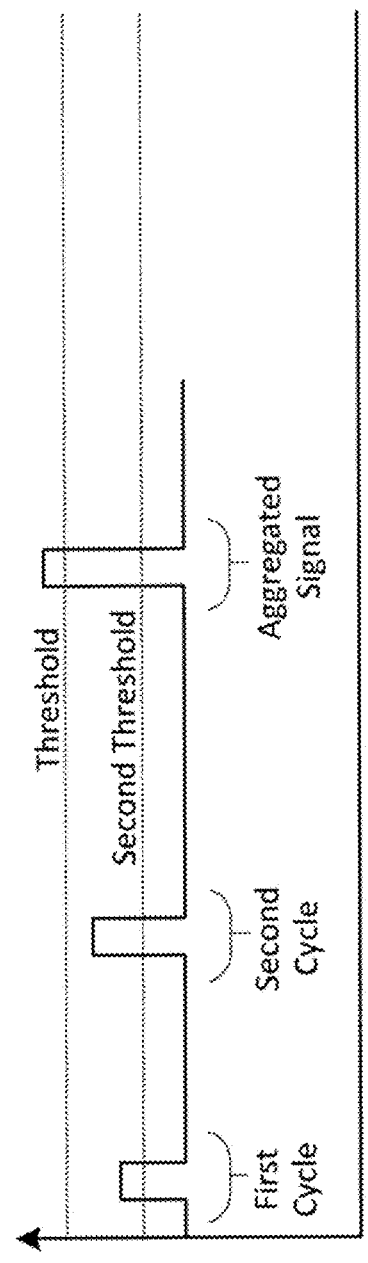
FIG. 17B is a diagram illustrating using a plurality of thresholds to trigger signal aggregation consistent with disclosed embodiments.

FIG. 17B is a diagram illustrating using a plurality of thresholds to trigger signal aggregation. In the example of FIG. 17B, a confidence level, such as an object-existence-certainty level or other measurement described above with reference to FIG. 17A, associated with a reflection caused by a pulse from the first cycle of a LIDAR scan is below a first threshold but above a second threshold. Similarly, a confidence level, such as an object-existence-certainty level or other measurement described above with reference to FIG. 17A, associated with a reflection caused by a pulse from the second cycle of a LIDAR scan is also below the first threshold but above the second threshold. The second threshold may ensure that noise and other insignificant signals are not aggregated, which may increase accuracy and conserve valuable processing resources. Because the confidence levels are below the first threshold but above the second threshold, the LIDAR system combines the first signal and the second signal to generate an aggregated signal. As depicted in FIG. 17B, the aggregated signal may exceed the first threshold.

Figure 17C:
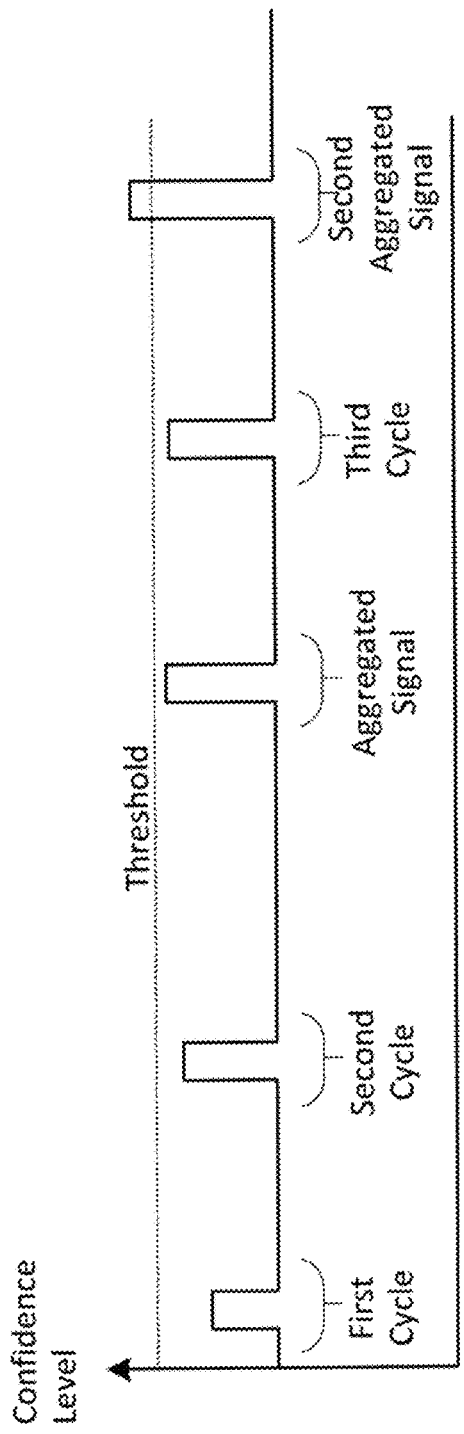
FIG. 17C is a diagram illustrating using a threshold to trigger further signal aggregation consistent with disclosed embodiments.

FIG. 17C is a diagram illustrating using a threshold to trigger further signal aggregation. In the example of FIG. 17C, a cascading aggregation may be applied. For example, as depicted in FIG. 17C, a confidence level, such as an object-existence-certainty level or other measurement described above with reference to FIG. 17A, associated with a reflection caused by a pulse from the first cycle of a LIDAR scan is below a threshold. In addition, a confidence level, such as an object-existence-certainty level or other measurement described above with reference to FIG. 17A, associated with a reflection caused by a pulse from the second cycle of a LIDAR scan is also below the threshold. Because the confidence levels are below the threshold, the LIDAR system combines the first signal and the second signal to generate an aggregated signal. Moreover, the aggregated signal (comprising the reflection caused by the pulse from the first cycle and the reflection caused by the pulse from the second cycle) is also below the threshold. Accordingly, the LIDAR system combines a third signal (comprising a reflection caused by a pulse from the third cycle of a LIDAR scan) with the aggregated signal to generate a second aggregated signal. As depicted in FIG. 17C, the second aggregated signal may exceed the threshold.

Although depicted using three scan cycles, any number of scan cycles may be used. For example, the LIDAR system may continue to aggregate signals from further scan cycles until the most recent aggregated signal exceeds the threshold. In such embodiments, a cap on the number of aggregations may be implemented. For example, the aggregation may be disregarded if the threshold is not exceeded after three, four, five, ten, or the like scan cycles.

Although depicted separately, the cascading example of FIG. 17C may be combined with the two thresholds of FIG. 17B. For example, signals may be required to be above the second threshold to be included in the cascading aggregation. Additionally or alternatively, the cascading aggregation may not be started and/or may be terminated when one or more signals below the second threshold are received.

Figure 17D:
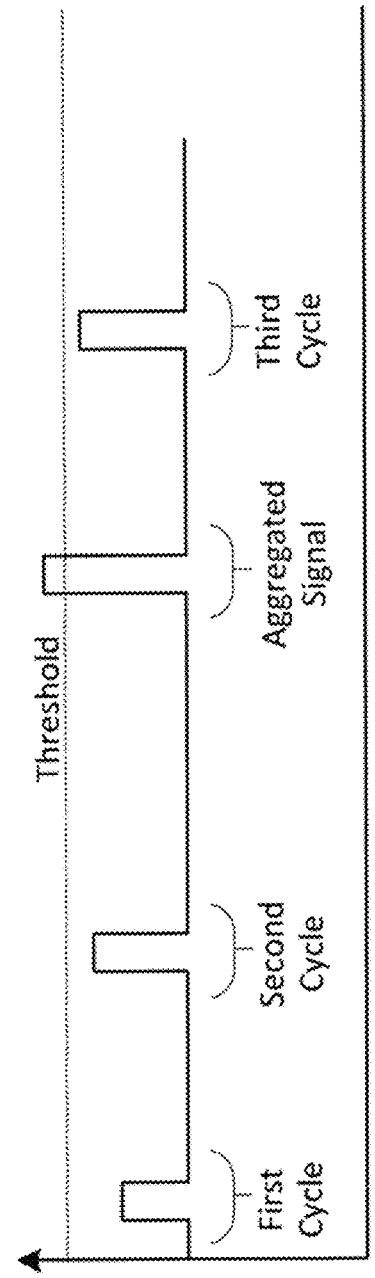
FIG. 17D is a diagram illustrating using further signal aggregation to improve resolution consistent with disclosed embodiments.

FIG. 17D is a diagram illustrating using further signal aggregation to improve resolution. In the example of FIG. 17D, an alternative cascading aggregation may be applied. For example, as depicted in FIG. 17D, a confidence level, such as an object-existence-certainty level or other measurement described above with reference to FIG. 17A, associated with a reflection caused by a pulse from the first cycle of a LIDAR scan is below a threshold. In addition, a confidence level, such as an object-existence-certainty level or other measurement described above with reference to FIG. 17A, associated with a reflection caused by a pulse from the second cycle of a LIDAR scan is also below the threshold. Because the confidence levels are below the threshold, the LIDAR system combines the first signal and the second signal to generate an aggregated signal. Moreover, the aggregated signal (comprising the reflection caused by the pulse from the first cycle and the reflection caused by the pulse from the second cycle) is above the threshold. Accordingly, in order to improve the point resolution of the aggregated signal and/or to increase the accuracy of a measurement based on the aggregated signal, the LIDAR system combines a third signal (comprising a reflection caused by a pulse from the third cycle of a LIDAR scan) with the aggregated signal to generate a second aggregated signal (not shown). A point resolution of the second aggregated signal and/or the accuracy of a measurement determined based on the second aggregated signal may be increased compared to that of the aggregated signal.

Although depicted using three scan cycles, any number of scan cycles may be used. For example, the LIDAR system may continue to aggregate signals from further scan cycles until the point resolution of or accuracy of a measurement (e.g., based on an associated confidence level) based on the most recent aggregated signal exceeds a threshold. In such embodiments, a cap on the number of aggregations may be implemented. For example, the aggregation may be halted if the threshold is not exceeded after three, four, five, ten, or the like scan cycles.

Although depicted separately, the cascading example of FIG. 17D may be combined with the two thresholds of FIG. 17B. For example, signals may be required to be above the second threshold to be included in the cascading aggregation. Additionally or alternatively, the cascading aggregation may not be started and/or may be halted when one or more signals below the second threshold are received.

Although the examples of FIGS. 17A, 17B, 17C, and 17D all use static thresholds, any of the thresholds depicted may be dynamic. In some embodiments, the threshold for one scan cycle may be different than another scan cycle. For example, the threshold may be adjusted based on an amplitude of the projected light during the scan cycle, based on a level of ambient light received during (or immediately before and/or after) the scan cycle, or the like. Additionally or alternatively, the threshold for one pixel may be different than for another pixel. For example, the threshold may be adjusted based on an expected amplitude of the received reflection(s), a level of ambient light received on the pixel during (or immediately before and/or after) the scan cycle, or the like.

Figure 17E:
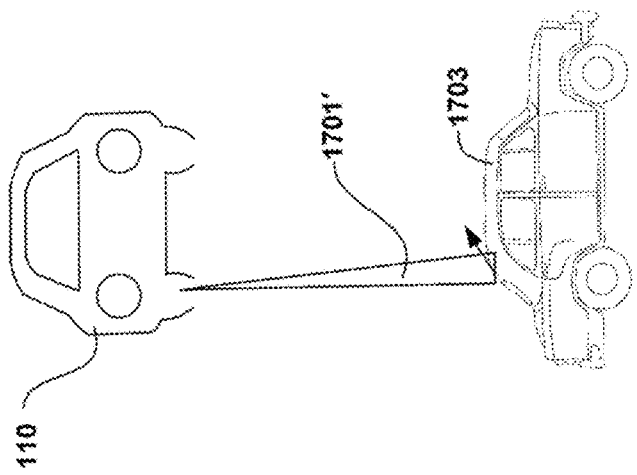
FIG. 17E is a diagram illustrating an exemplary vehicle with a LIDAR system using measured properties across scan cycles to detect objects consistent with disclosed embodiments.
Figure 17E:
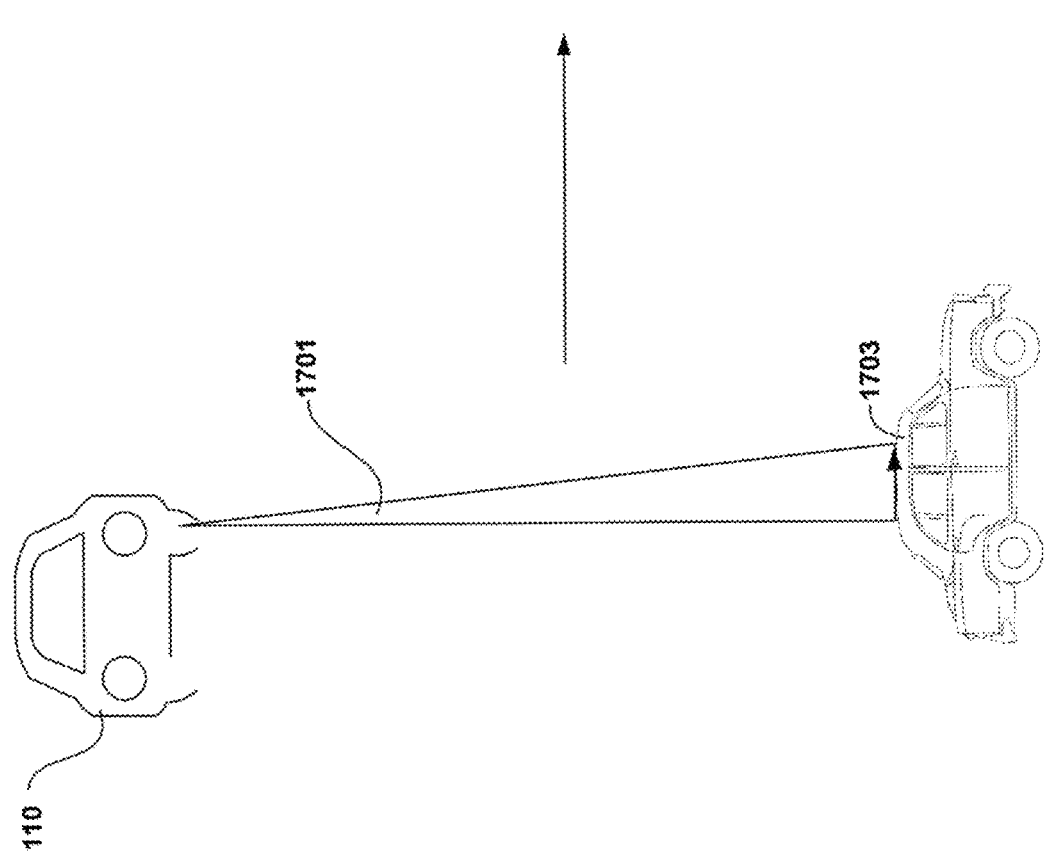

FIG. 17E is a diagram illustrating an exemplary vehicle 110 with a LIDAR system using measured properties across scan cycles to detect objects. For example, vehicle 110 may include the system of FIG. 13, described above. Vehicle 110 may include at least one pixel associated with regions of a field of view. Moreover, vehicle 110 may scan the associated regions over the course of multiple scan cycles, e.g., scanning region 1701 in the first scan cycle and scanning regions 1701' in the second scan cycle. Vehicle 110 may receive signals associated with objects, road markings, or the like during scan cycles, e.g., object 1703.

In the example of FIG. 17E, a surface angle measured in region 1701 may be aggregated with a surface angle measured in region 1701'. This aggregation may allow for more accurate classification of object 1703. Additionally or alternatively, the surface angle measured in region 1701 and the surface angle measurement in region 1701' may be used to increase an object-existence-certainty level (or other confidence level) associated with signals from region 1701 and signals from region 1701' (e.g., after being aggregated). For example, the LIDAR system may determine that the surface angles are consistent with the existence of a vehicle (i.e., object 1703) and thus increase the object-existence-certainty level.

Although FIG. 17E uses surface angles, any measured property may be aggregated to improve classification and/or used to increase confidence scores of aggregated signals. For example, reflectivity levels, object surface compositions, or the like may be used similar to the surface angles described above.

Figure 17F:
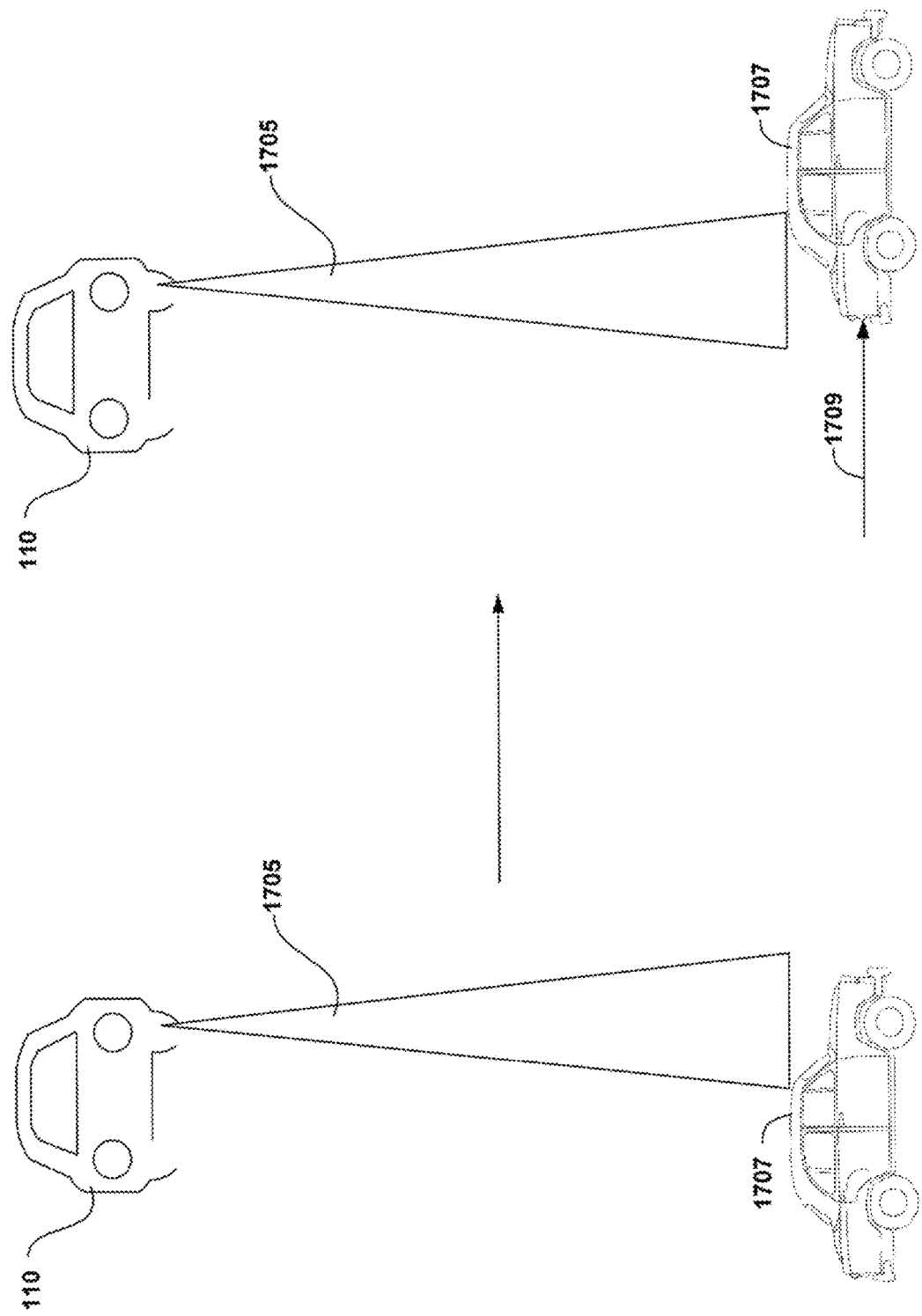
FIG. 17F is a diagram illustrating an exemplary vehicle with a LIDAR system using detected motion across scan cycles to detect objects consistent with disclosed embodiments.

FIG. 17F is a diagram illustrating an exemplary vehicle 110 with a LIDAR system using detected motion across scan cycles to detect objects. For example, vehicle 110 may include the system of FIG. 13, described above. Vehicle 110 may include at least one pixel associated with regions of a field of view. Moreover, vehicle 110 may scan the associated regions over the course of multiple scan cycles, e.g., a first scan of region 1705 in a first cycle (shown on the left) and a second scan of region 1705 in a second cycle (shown on the right). Vehicle 110 may receive signals associated with objects, road markings, or the like during scan cycles, e.g., object 1707.

In the example of FIG. 17F, object 1707 may undergo motion between scan cycles. Accordingly, the LIDAR systems may determine one or more properties of the motion based on signals from the first cycle and signals from the second cycle. For example, the LIDAR system may determine differences between representations of object 1707 in the first cycle and the second cycle, determine offset between locations of object 1707 (or of an identifiable part thereof) in the two representations, determine one or more translation parameters of object 1707 (or of an identifiable part thereof) in the two representations (e.g., rotation angles, expansion, or the like), and determine a velocity of object 1707. In some embodiments, the LIDAR system may use the offset and/or the one or more translation parameters without proceeding to determine the velocity.

In any of the examples above, the motion information may be used to assist with classification of object 1707. For example, certain motion profiles may be associated with vehicles and other motion profiles associated with pedestrians, allowing for motion information to assist with classification of an object as a vehicle or a pedestrian. Additionally or alternatively, the motion information may be used to increase an object-existence-certainty level (or other confidence level) associated with signals from the first cycle and signals from the second cycle (e.g., after being aggregated). For example, the LIDAR system may determine that the motion information is consistent with the existence of a vehicle (i.e., object 1707) and thus increase the object-existence-certainty level.

Although depicted with vehicle 110 being stationary, vehicle 110 may also undergo motion between scan cycles. Accordingly, the detected motion of object 1707 may be adjusted using motion information from one or more sensors of vehicle 110 in order to determine relative motion between vehicle 110 and object 1707.

Although depicted separately, aggregation of one or more properties as depicted in FIG. 17E and use of motion information depicted in FIG. 17F may be combined. For example, the LIDAR system may use both surface angles and/or other measured properties as well as motion information to increase an object-existence-certainty level (or other confidence level) associated with signals aggregated across time. Additionally or alternatively, the LIDAR system may use surface angles and/or other measured properties as well as motion information to improve the accuracy of a classification of the detected object.

Figure 18A:
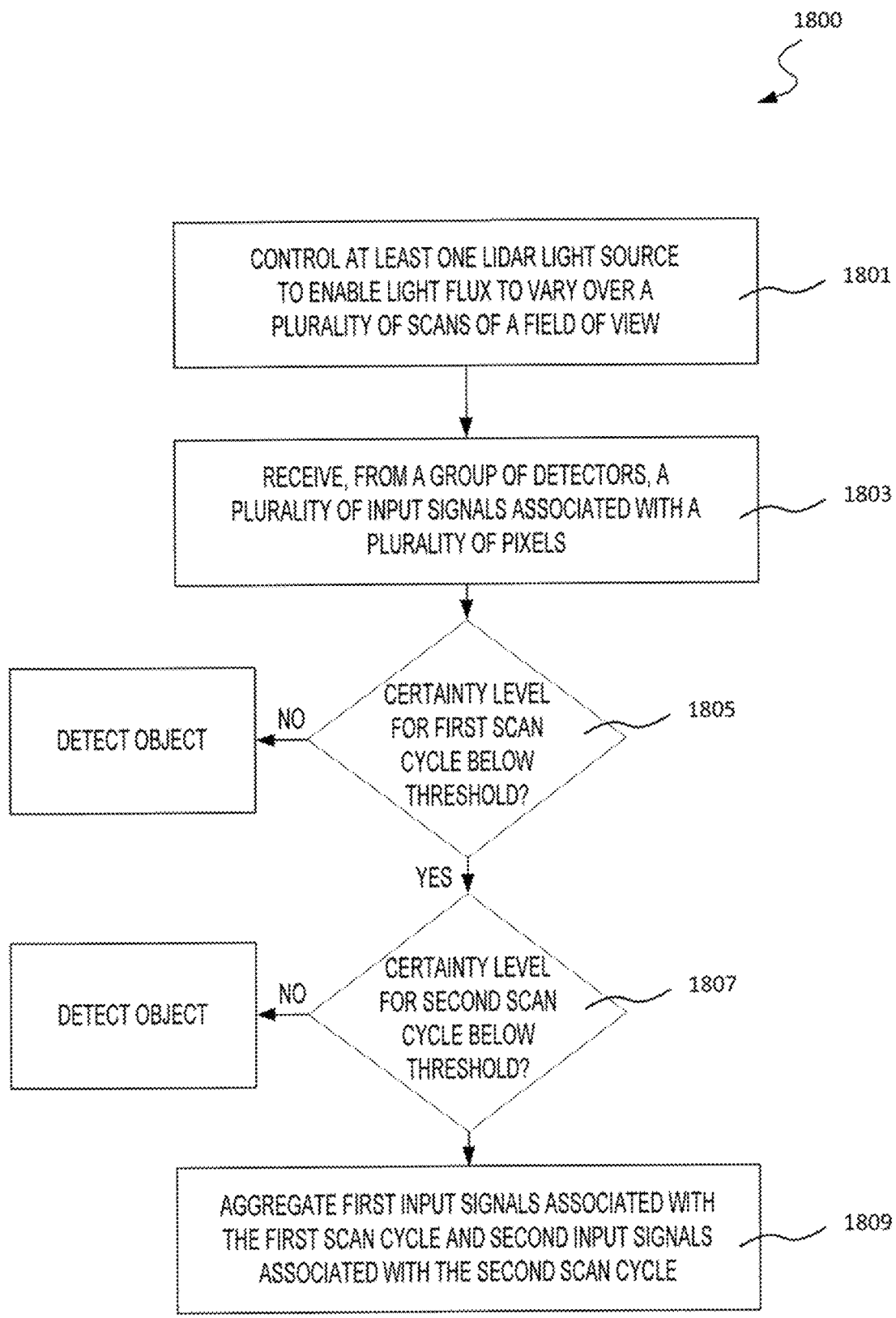
FIG. 18A is a diagram illustrating a flowchart of an exemplary method for aggragating pixel data over scan cycles to improve object detection consistent with disclosed embodiments.

FIG. 18A is a flowchart of method 1800 for using LIDAR system to detecting objects in a field of view. For example, method 1800 may be implemented by at least one processor of a LIDAR system (e.g., at least one processor 118 of LIDAR system 100) and/or by at least one processor within a body of a vehicle (e.g., processor 408 of housing 200B of vehicle 110).

At step 1801, the at least one processor may control at least one LIDAR light source in a manner enabling light projected from the at least one light source to vary over a plurality of scans of a field of view, the field of view including a foreground area and a background area. For example, step 1801 may be performed in a manner similar to that described above for step 1501 of method 1500.

At step 1803, the at least one processor may receive from a group of detectors a plurality of input signals indicative of reflections of the projected light from the field of view. For example, step 1803 may be performed in a manner similar to that described above for step 1503 of method 1500. Moreover, as explained above with respect to method 1500, a representation of a portion of the field of view associated with a plurality of pixels is constructible from the plurality of input signals.

At step 1805, the at least one processor may detect a possible existence of an object in the background area based on first input signals associated with a first scanning cycle. For example, the at least one processor may determine that the first input signals caused by one or more reflections from the field of view represent possible reflections from an object. An object-existence-certainty level in the first scanning cycle may be below a threshold.

As explained above with respect to FIGS. 17A-17D, the threshold may be dynamic. For example, the threshold may depend on an amplitude of the projected light during the scan cycle, on a level of ambient light received during (or immediately before and/or after) the scan cycle, or the like. Additionally or alternatively, the threshold may depend on a type of detected object. For example, the threshold may be higher for objects expected to have greater reflectivity (such as bright objects, vehicles or parts thereof, etc.) and lower for objects expected to have lesser reflectivity (such as pavement, pedestrians, etc.). Additionally or alternatively, the threshold may depend on a distance to a detected object, e.g., from the at least one light source. For example, the threshold may be adjusted downward when the time(s)-of-flight for the reflection(s) causing the input signal(s) is longer and adjusted upward when the time(s)-of-flight for the reflection(s) causing the input signal(s) is shorter. Any of the adjustments discussed above may be subject to a minimum (such that the at least one processor may not lower the threshold below the minimum) and/or subject to a maximum (such that the at least one processor may not increase the threshold above the maximum).

In some embodiments, the threshold may comprise a range. For example, the threshold may be a static range such that a signal is only above the threshold if exceeding the maximum of the range and is only below the threshold if below the minimum of the range. Alternatively, the threshold may be a dynamic range. For example, the threshold may be a static range that is adjusted across pixels and/or adjusted across scan cycles. Similar to the single threshold described above, any adjustments to the range may be subject to an absolute minimum (such that the at least one processor may not lower the minimum of the range below the absolute minimum) and/or subject to an absolute maximum (such that the at least one processor may not increase the maximum of the range above the absolute maximum).

In some embodiments, the at least one processor may adjust one or more operating parameters of the LIDAR system based on the input signals. For example, as depicted in FIG. 17A, when the object-existence-certainty level in the first scanning cycle is below the threshold, the at least one processor may cause more light to be projected towards the object during the second scanning cycle compared to light was projected towards the object in the first scanning cycle. Additionally or alternatively, as depicted in FIG. 17A, when the object-existence-certainty level in the first scanning cycle is below the threshold, the at least one processor may increase a sensitivity level of at least some of the group of detectors in the second scanning cycle compared to the sensitivity level of the at least some of the group of detectors in the first scanning cycle.

In any of the embodiments described above, as depicted in FIG. 17B, a second threshold may be used. This may ensure that only suspect detections, e.g., an object-existence-certainty level having a medium confidence level (e.g., a confidence level which exceeds a required lower threshold), are aggregated while noise remains filtered out.

At step 1807, the at least one processor may detect a possible existence of the object based on second input signals associated with a second scanning cycle. For example, the at least one processor may determine that the second input signals caused by one or more reflections from the field of view represent possible reflections from an object. An object-existence-certainty level in the second scanning cycle may be below the threshold.

In some embodiments, the at least one processor may select the second input signals based on a direction associated with the first input signals and at least one kinetic parameter of an object in the FOV. For example, as depicted in FIG. 17F, motion information associated with the detected object may be used determine which second input signals to use. Accordingly, the at least one processor may ensure that the second input signals are associated with the same (or at least partially overlapping) area of the object as the first input signals. Additionally or alternatively, the at least one processor may use motion information from one or more sensors of the LIDAR system to compensate for motion of the LIDAR system.

Accordingly, as explained above, the first and second input signals may be associated with a same portion of the field of view or with differing but overlapping portions of the field of view. Moreover, in any of the embodiments discussed above, the second scanning cycle may be consecutive with the first scanning cycle or non-consecutive with the first scanning cycle. For example, in a cascading aggregation, one or more scanning cycles may be skipped if input signals from that scanning cycle are below a second threshold (and therefore classified as noise rather than suspect detections).

At step 1809, the at least one processor may aggregate the first input signals associated with the first scanning cycle and the second input signals associated with the second scanning cycle to detect an existence of the object at an object-existence-certainty level higher than the threshold. As explained above with reference to FIGS. 17E and 17F, the at least one processor may take into account an angular orientation of a surface identified in the first input signal and second input signal, a reflectivity level identified in the first and second input signals, or the like to increase the object-existence-certainty level. In addition, the at least one processor may take into account a velocity of a vehicle having the LIDAR system when combining the first input signals and the second input signals. Additionally or alternatively, the at least one processor may detect a change of at least one of a presence indication, a surface angle, and a reflectivity level in the second input signals compared to the first input signals, and take into account the detected change to increase the object-existence-certainty level.

Step 1809 may further include initially processing individually input signals associated with the first and second scanning cycles. When the object-existence-certainty level in both the first and second scanning cycles is below the threshold but higher than a second threshold, the at least one processor may combine input signals associated with the first and second scanning cycles. Similar to the threshold discussed above, the first threshold and/or the second threshold may be static. Alternatively, the first threshold and/or the second threshold may be dynamic. In either embodiment, the first threshold and/or the second threshold may comprise a range.

Additionally or alternatively, method 1800 may include aggregating input signals from a third scanning cycle when the object-existence-certainty level associated with the combined the first and second input signals is lower than the threshold to detect the existence of the object at the object-existence-certainty level higher than the threshold. For example, as described above with respect to FIG. 17D, a cascading aggregation may be implemented.

Additionally or alternatively, method 1800 may include taking into account input signals from a third scanning cycle when the object-existence-certainty level associated with the first and second input signals is above the threshold, in order to obtain a point resolution for the object greater than a point resolution achievable with the first and second input signals alone. For example, as described above with respect to FIG. 17E, a cascading aggregation may be implemented.

In any of the embodiments listed above, method 1800 may include accessing stored classification information, and based on the classification information and the first and second input signals, classify the object. For example, the stored information may comprise stored signals associated with classifications such that an aggregation of the first and second input signals may be mapped to one or more stored signals, producing possible classifications. Any possible classifications may have associated confidence levels, e.g., based on the level of match between a stored signal and the aggregation. Moreover, as described above with respect to FIGS. 17E and 17F, measured properties and/or motion information may further supplement the first and second input signals to improve classification.

Although described using object-existence-certainty level, method 1800 may be implemented using any other measurement (or confidence level associated with a measurement), such as reflectivity, surface angle, surface composition, or the like. Accordingly, method 1800 may allow for signal aggregation to improve confidence regarding a property of an object in addition to or in lieu of existence of the object itself.

Method 1800 combined with method 1500. For example, signals from a plurality of pixels may be aggregated using method 1500, and this aggregated signal may further be aggregated with signals from another scan cycle using method 1800. The aggregation across time may be performed first or the aggregation across space may be performed first. In some combinations, signals from a first scan cycle may be aggregated from a plurality of pixels and then aggregated with signals from fewer or greater pixels in a second scan cycle. Additionally or alternatively, signals from a first scan cycle may be aggregated from a first plurality of pixels and then aggregated with signals from a second plurality of pixels in a second scan cycle, the second plurality of pixels having at least some pixels that are not in the first plurality of pixels.

Figure 18B:
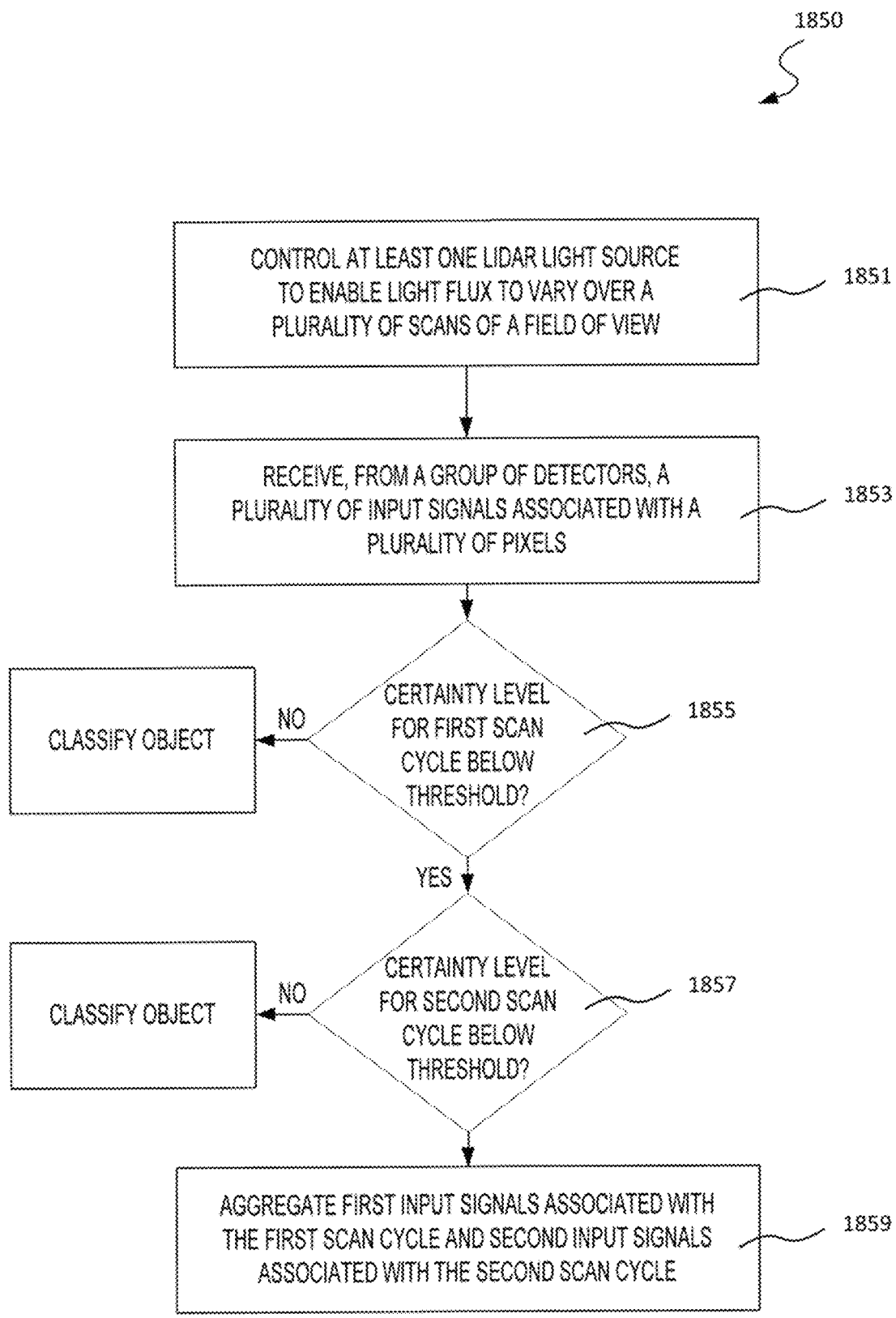
FIG. 18B is a diagram illustrating a flowchart of an exemplary method for aggragating pixel data over scan cycles to improve object classification consistent with disclosed embodiments.

FIG. 18B is a flowchart of method 1850 for using LIDAR system to detecting objects in a field of view. For example, method 1850 may be implemented by at least one processor of a LIDAR system (e.g., at least one processor 118 of LIDAR system 100) and/or by at least one processor within a body of a vehicle (e.g., processor 408 of housing 200B of vehicle 110).

Steps 1851 and 1853 may be performed in manners similar to steps 1801 and 1803, respectively, as described above.

At step 1855, the at least one processor may classify an object based on first input signals associated with a first scanning cycle. For example, the at least one processor may determine that the first input signals caused by one or more reflections from the field of view match one or more stored or otherwise known signals associated with one or more classifications. The one or more classifications may have associated confidence levels representing the certainty of the classification. The confidence level(s) in the first scanning cycle may be below a threshold. Accordingly, step 1855 may be performed in a similar manner to step 1805 but using object classification rather than object detection.

At step 1857, the at least one processor may classify an object based on second input signals associated with a second scanning cycle. For example, the at least one processor may determine that the second input signals caused by one or more reflections from the field of view match one or more stored or otherwise known signals associated with one or more classifications. The one or more classifications may have associated confidence levels representing the certainty of the classification. The confidence level(s) in the second scanning cycle may be below a threshold. Accordingly, step 1857 may be performed in a similar manner to step 1807 but using object classification rather than object detection.

At step 1859, the at least one processor may aggregate the first input signals associated with the first scanning cycle and the second input signals associated with the second scanning cycle to classify the object with a confidence level higher than the threshold. Accordingly, step 1859 may be performed in a similar manner to step 1809 but using object classification rather than object detection.

Moreover, similar to method 1800, method 1850 may include taking into account an angular orientation of a surface identified in the first input signal and second input signal, a reflectivity level identified in the first and second input signals, or the like to increase the confidence level of the classification. In addition, the at least one processor may take into account a velocity of a vehicle having the LIDAR system when combining the first input signals and the second input signals. Additionally or alternatively, the at least one processor may detect a change of at least one of a presence indication, a surface angle, and a reflectivity level in the second input signals compared to the first input signals, and take into account the detected change to increase the confidence level of the classification.

Method 1850 combined with method 1500. For example, as explained above with respect to the combination of method 1800 and method 1500, signals may be aggregated across space and time in order to improve classification in addition to or in lieu of improving detection.

Binning and Non-Binning of Sensor Pixel Outputs

LIDAR systems (such as the LIDAR systems described above) may be deployed on any platform where distance ranging information to objects in a platform environment may be useful. In some cases, for example, the disclosed LIDAR systems may be deployed on a vehicle to provide ranging information relative to objects in an environment of the vehicle. Object detection capability may depend on a variety of factors, including distance between the object and the LIDAR system, reflectivity of the object, ambient light levels, interfering light reflections, etc. In some cases, objects in the foreground that are relatively close to the LIDAR system may be detected more easily as compared to objects that are more distant from the LIDAR system. Also, objects exhibiting relatively low reflectivity characteristics may be more difficult to detect as compared to higher reflectivity objects. For example, there may be instances when a LIDAR system may detect distant, highly reflective objects more readily that close-in objects of low reflectivity (even where the more distant objects may occupy fewer field of view pixels (e.g., a single FOV pixel), as compared to a closer object).

The disclosed LIDAR systems may enhance detection capability of objects within a LIDAR FOV. For example, the disclosed techniques of processing LIDAR sensor outputs, described in detail below, may enable and/or enhance detections of distant objects, low reflectivity objects, etc. Such techniques may aid in identifying objects that otherwise would have gone undetected and/or may increase confidence levels in range information, object envelope detection, etc. relative to detected objects.

In some embodiments, the challenges associated with object detection may be addressed through techniques associated with processing of LIDAR sensor outputs. Such techniques, for example, may include binning processing schemes and non-binning processing schemes. As will be discussed in detail below, the disclosed LIDAR system may apply on the same frame both a non-binned detection scheme (e.g., signals of individual sensor pixels may be analyzed individually) and a binned detection scheme (e.g., signals of two or more sensor pixels may be considered together or otherwise combined).

Binning of sensor-element outputs may be performed in any suitable manner and may enable detection of distant objects and/or detection of objects of lower reflectivity. For example, binning of sensor outputs may be selectively applied based on object distance from the LIDAR system and/or object reflectivity. In some cases, the disclosed LIDAR system may process input signals (e.g., sensor output signals) associated with objects in the foreground individually on a sensor-pixel by sensor-pixel basis and may bin the input signals associated with an object in the background. Such binning schemes may combine the outputs of a plurality of detector-elements, which in some cases, may increase detection sensitivity or may increase a confidence level associated with object detections.

Binning of LIDAR sensor outputs may be performed as part of a sensor output processing technique. For example, a processor may receive as input signals outputs from individual LIDAR sensor-elements (e.g., pixels associated with one or more LIDAR sensors). In some cases, the sensor pixel output signals may be directly provided to one or more processors as input signals to the processor(s). In other cases, the sensor pixel output signals may be indirectly provided to one or more processors as input signals to the processor(s). For example, the sensor pixel output signals may be conditioned, amplified, etc. before being provided as input signals to the processor(s). The individual sensor pixel outputs may be stored and used by a processor either individually or combined in various groupings. For example, two or more sensor pixel output signals provided as input signals to a processor may be summed according to a predetermined binning scheme or according to a binning scheme determined on the fly. Such binning schemes may provide or enhance various LIDAR functions (e.g., object detection under certain conditions, ranging, etc.).

Because the sensor outputs may be used or re-used individually or in various different combinations, the disclosed binning techniques differ from signal aggregation configurations. For example, as described above, in some cases, a LIDAR sensor may include a plurality of pixels that each may correspond to an individual SiPM or other type of light sensitive element. In some cases, an individual SiPM may constitute a plurality of light sensitive subelements (e.g., SPADs). The outputs of multiple SPADS within a single SiPM "pixel" are often aggregated together to provide the output of the corresponding SiPM (e.g., a sensor pixel). Such aggregation, however, is generally not performed selectively, as it is performed on the hardware level. Further, in such hardware-based aggregation, the outputs of individual SPADs are not be preserved after aggregation.

On the other hand, the disclosed binning techniques may selectively occur as part of a processing phase where outputs of two or more sensor pixels (e.g., two or more SiPM outputs) may be combined or otherwise considered together in performing certain LIDAR functions. Because this process may be selective, certain SiPM or pixel outputs may be considered individually, may be selectively combined with certain other SiPM outputs, may be uncombined from SiPM outputs, and/or may be recombined with the same or different SiPM outputs. Simple aggregation of sensor subelement outputs by combining multiple sensor subelement outputs together without selectivity does not provide the same functionality as the disclosed binning techniques. For example, such hardware-based aggregation techniques cannot provide an ability to consider subelement outputs individually in some cases while considering different selected combinations of subelement outputs in other cases.

The disclosed binning techniques may be selectively performed by at least one LIDAR processor and may be accomplished by performing one or more logic operations or any other suitable combinatory technique on two or more sensor pixel outputs. For example, binning of two or more sensor-pixel outputs may be based on or include signal addition, center of gravity determinations, binary mapping, or others. For purposes of this disclosure, a sensor element (e.g., an individual SiPM) may be used interchangeably with the term sensor pixel.

Such a system may provide various potential benefits. For example, by utilizing binning and non-binning processing schemes by the same system—especially if applied on overlapping groups of detection signals—the system may offer increased detection capability under certain conditions. Additionally, the use of binning and non-binning processing schemes may enhance confidence level in detections, provide more accurate range information, reflectivity data, angular and position information, and/or may also increase efficiency. For example, the system may require low processing requirements with bins employed and may unbin, as needed.

Moreover, by utilizing both binning and non-binning processing schemes, the system may avoid constraints associated with non-selective sensor output aggregation. In some prior art systems, outputs of two or more sensor-element are irreversibly combined together in a fixed manner. In such cases, there is no capability for selectively considering the underlying sensor outputs individually, or to selectively sensor-element consider different combinations of sensor-element outputs. Rather, such constant sensor output aggregation architectures provide fixed combinations of element outputs in all cases without selectivity (e.g., a group of SPAD outputs are summed together to provide an SiPM output, and the processor has no way of accessing the individual SPAD signals before their summation). In such cases, the underlying sensor-pixel sub-element (e.g., SPADs) outputs may be unavailable for individual processing. For example, individual SPAD outputs in an SiPM may be aggregated together without an ability to selectively consider any of the SPAD outputs individually.

On the other hand, the disclosed LIDAR system and binning techniques may preserve individual sensor-element contributions, which may allow for selective binning, unbinning, and rebinning in different combinations and configurations. In many cases, such binning, unbinning, and/or rebinning may be accomplished without the need to collect more sensor data. In some embodiments, the underlying individual contributions of sensor-elements outputs may be preserved (e.g., by storage in memory) such that the individual contributions may be selectively and individually processed/analyzed in some cases or processed/analyzed together with one or more other sensor-element outputs in other cases. As a processing technique, binning of sensor-element outputs may be selectively performed. Even after two or more sensor pixel outputs are binned together, those same sensor pixel outputs may later be unbinned and re-binned in different combinations (e.g., with other sensor pixel outputs). For example, where a particular selected binning arrangement does not provide a desired performance level, detection sensitivity, etc., a different bin of sensor pixel outputs including any combination of the same or different sensor outputs may be selectively binned and analyzed. Such selective binning and unbinning may be performed relative to sensor pixel outputs captured during a single FOV frame scan or captured across FOV frame scans.

In the presently disclosed embodiments, binning may be performed according to a predetermined pattern (e.g., certain pixels associated with near field regions of the LIDAR FOV may remain unbinned while other pixels associated with far field regions of the LIDAR FOV may be binned together during processing). On the other hand, in some cases, binning, unbinning, and/or rebinning in different combinations may be performed dynamically during operation of the LIDAR system (e.g., based on detection related feedback, observed system performance, etc.).

The disclosed systems may have a variety of configurations. In one example, the disclosed systems may include LIDAR system components for illumination and collection of reflections (e.g. deflectors, actuators, light sources, and sensors), LIDAR system components for processing of input signals and outputting information indicative of object distance (e.g., one or more processors).

Any light source may be used depending on the requirements of a particular application. In some cases, the light source may illuminate a field of view. In some cases, as depicted in the example of FIG. 1A, processor 118 of LIDAR system 100 may coordinate operation of light source 112 with the movement of light deflector 114 by actuator 302 of FIG. 3A in order to illuminate a field of view. Of course, any light source configured to operation in any desired mode of operation (e.g., continuous wave, pulsed, etc.) may be used. It should also be noted that while references are made to system 100 shown in FIG. 1A and other figures, the disclosed binning techniques may be applicable to the output signals generated by light sensitive detectors other than those described herein. The disclosed binning techniques are also applicable to light sensitive detectors employed in various types of LIDAR systems (e.g., scanning, non-scanning (flash), etc.) or in other types of ranging, detection, imaging systems, etc.

Any deflector may be used depending on the requirements of a particular application. In some cases, processor 118 of LIDAR system 100 may be configured to control a light deflector in a scanning cycle to deflect light from the light source such that during the scanning cycle the light deflector moves through a plurality of different instantaneous positions. In some embodiments, each instantaneous position of the light deflector may correspond to a different region of the LIDAR FOV (e.g., region C4 in FIG. 19B).

Any one or more LIDAR sensors and/or LIDAR sensor-elements may be used, depending on the requirements of a particular application. As previously noted, a suitable LIDAR sensor may be comprised of an array of light sensitive elements (e.g., SPADs) that are each sensitive to incident photons reflected from a objects in a region of the LIDAR field of view (e.g., region C4 in FIG. 19B). As shown in FIGS. 4A-4C, groups of SPADs may be arranged together, where each grouping of SPADs may correspond to an SiPM, where each individual SiPM of the LIDAR sensor may provide a pixel level output of the LIDAR sensor. In some cases, the SPADs or avalanche photo diodes that make up a LIDAR sensor may be formed on a common silicon substrate. In one example, a distance between SPADs may be between about 10 µm and about 50 µm, wherein each SPAD may have a recovery time of between about 20 ns and about 100 ns. As described with respect to FIG. 4A, sensor 116 may include a plurality of detection elements 402 for detecting photons of a photonic pulse reflected back from field of view 120. The detection elements may all be included in detector array 400, which may have a rectangular arrangement (e.g. as shown) or any other arrangement.

In an exemplary operation, scanning unit 104 of FIG. 2A may include a return deflector 114B that directs photons (reflected light 206) reflected from an object 208 within field of view 120 toward sensor 116. The reflected light may be detected by individual SPADs within sensor 116, and outputs of groupings of individual SPADs may be aggregated together to provide individual SiPM or pixel outputs. Based on the pixel outputs, processing unit 108 may determine information about an object (e.g., the distance to the object, etc.). In some cases, the outputs from a group of pixels may be used to form a LIDAR image of the LIDAR FOV. For example, the outputs from pixels of sensor 116 may be used to image area C4 of FIG. 19B along with other regions of the FOV.

As will be discussed in detail below, various binning operations may be performed consistent with the presently disclosed embodiments. In some cases, binning of two or more sensor pixel outputs may be implemented according to a predetermined scheme (e.g., certain sensor pixel outputs may be considered together, combined, etc. according to a predetermined pattern of sensor pixels). In other cases, binning of sensor pixel outputs may be accomplished based on observed characteristics of objects or other aspects of a scene associated with the LIDAR FOV. For example, where no objects are detected or where objects are detected, but not with a desired SNR (e.g., objects of low reflectivity or more distant objects), certain sensor pixel outputs may be binned together to enhance object detection and LIDAR system output.

Figure 19A:
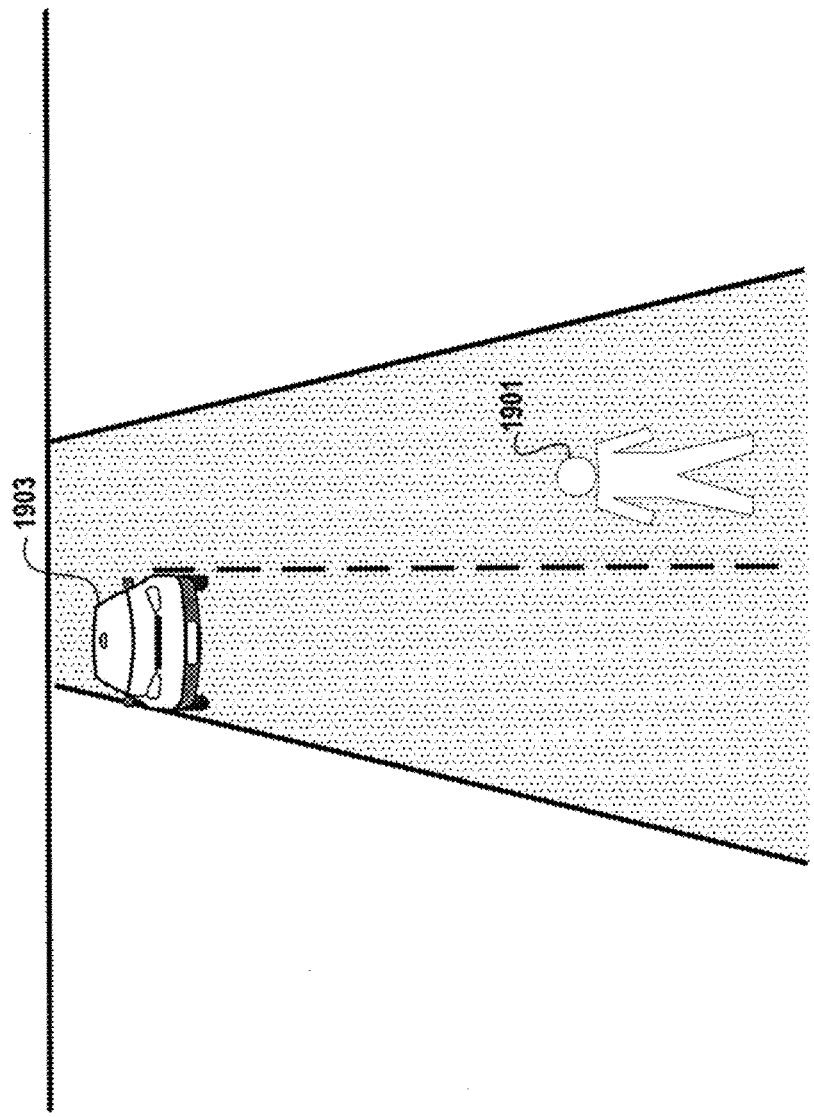
FIG. 19A is a diagram illustrating an exemplary scene including objects in an environment of a LIDAR system.
Figure 19B:
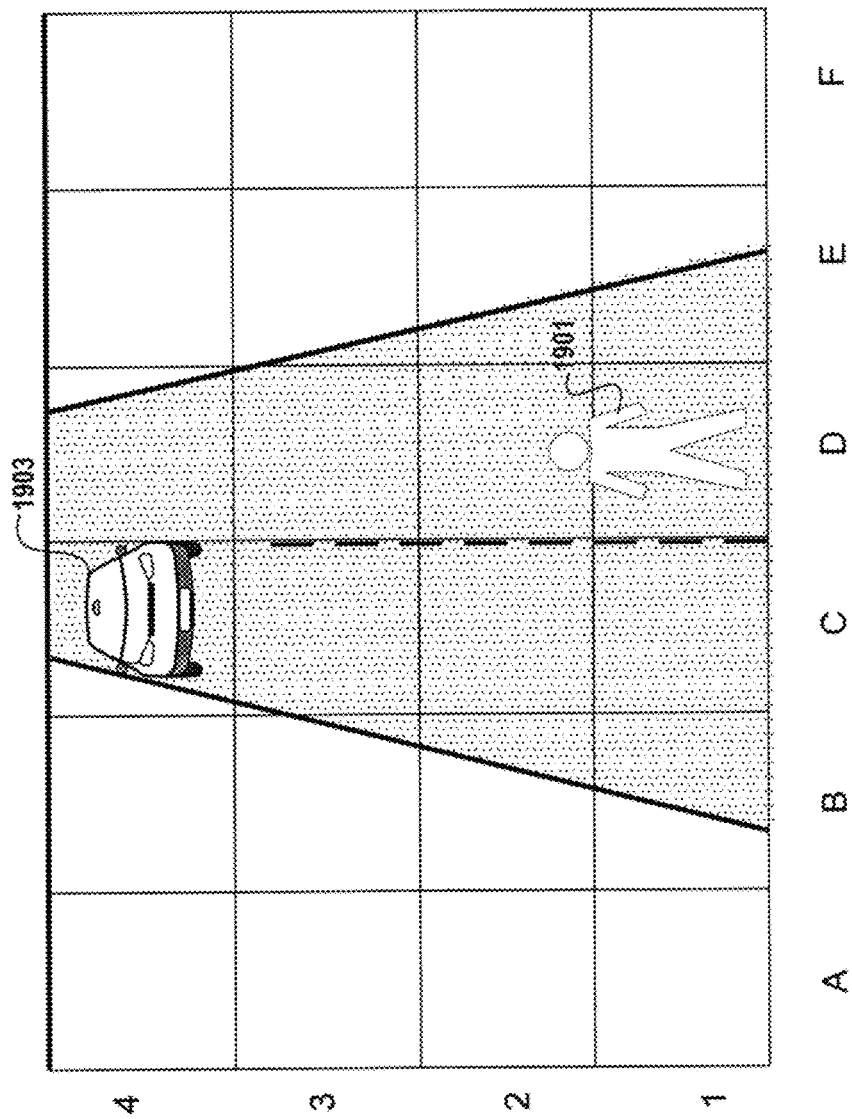
FIG. 19B is a diagram illustrating an exemplary scene including a near field object and a far field object in a field of view of the LIDAR system.

In some embodiments, the LIDAR system may include at least one processor configured to control at least one LIDAR light source for illuminating a field of view. During operation, as previously noted, the processor may receive from a group of light detectors of the LIDAR sensor a plurality of input signals indicative of reflections of light from objects in the field of view. Each light detector of the LIDAR sensor may correspond to a pixel of the sensor. In some cases, each light detector may include an SiPM, which includes a plurality of light sensitive subelements (e.g., SPADs or other type of light sensitive element). In some embodiments, as previously described, a light deflector may be scanned through a plurality of different instantaneous positions. At each instantaneous position, the LIDAR sensor may output a plurality of signals corresponding to one or more of the pixel outputs of the LIDAR sensor. These pixel outputs may be provided to at least one LIDAR processor such that over the course of a full scan of the LIDAR FOV over a plurality of instantaneous positions of the light deflector, the processor may receive a plurality of input signals from the LIDAR sensor that represent sensor pixel outputs collected at the instantaneous positions of the deflector, where each instantaneous position of the deflector may correspond to a different field of view pixel of the LIDAR FOV. In some embodiments, sensor signals collected relative to a single field of view pixel are combined together to provide a single data point in a point cloud output of the LIDAR system. Thus, each data point in the point cloud may be related to and derived from reflection signals received from a particular FOV pixel. The plurality of input signals collected from the sensor may represent light reflection information collected by pixels of the sensor from different regions of the LIDAR FOV (e.g., regions F4, E4, D4, C4, B4, A4, A3, . . . , D1, E1, F1 of FIG. 19B) as the deflector is scanned over the LIDAR FOV. It should be noted that while FIG. 19B shows a LIDAR FOV having 24 field of view pixels, a LIDAR FOV may have fewer or more pixels. In some cases, the LIDAR FOV may have many more pixels, as the LIDAR FOV may be divided into horizontal and/or vertical rows of pixels spaced apart by 0.2 degrees or any other suitable angular spacing.

Any of the input signals received from the sensor may be binned together or considered individually, consistent with the presently disclosed embodiments. In some cases, input signals corresponding to sensor pixel outputs all acquired from a particular region of the LIDAR FOV (e.g., FOV pixel C4 in FIG. 19B) may be binned together. For example, FOV pixel C4 may overlap with a distant object or an object of low reflectivity. As a result, a light reflection received at the LIDAR sensor may result in a non-zero output signal being generated by one or more of the sensor pixels. However, individually, the sensor pixel outputs may each fall below a detection threshold, may exhibit poor signal to noise ratios, or exhibit another characteristic rendering a positive detection determination or an accurate range determination to be difficult or impossible. In such cases, sensor pixel outputs may be binned together, and the sensor pixel outputs may be summed, for example. Binning sensor pixel outputs by summing, for example, may result in a combined output that exceeds a detection threshold, offers a better signal to noise ratio, enables more accurate ranging, etc.

In other cases, input signals corresponding to sensor pixel outputs acquired from different regions (e.g., FOV pixels) of a LIDAR FOV (e.g., region C4 and region C3 in FIG. 19B) may be binned together. Binning of input signals received from any combination of regions or FOV pixels of the LIDAR FOV may also be performed. In some cases, sensor pixel outputs associated with a first region of the LIDAR FOV may be processed according to a first binning scheme (e.g., unbinned, 2×2 bins, etc), and sensor pixel outputs associated with a second region of the LIDAR FOV, which may be spatially separated from the first region of the LIDAR FOV, may be processed according to a different binning scheme. In some cases, however, the first region of the LIDAR FOV and the second region of the LIDAR FOV processed according to different binning schemes may at least partially overlap.

In some cases, a same group of detector elements (e.g., a group of sensor pixels) may generate both a first subset of input signals processed according to a first binning scheme and a second subset of input signals processed according to a second binning scheme different from the first. For example, the first subset of input signals may be acquired by the detector elements during a first portion of a scan of a LIDAR FOV (e.g., over a first period of time during capture of a first frame of the LIDAR FOV), and the second subset of input signals may be acquired by the same detector elements during a second portion of a LIDAR FOV scan (e.g., during a second period of time during capture of the first frame of the LIDAR FOV later than the first period of time) or during a subsequent scan of the LIDAR FOV altogether (e.g., during a capture of a second or later frame of the LIDAR FOV).

According to an exemplary binning technique, the processor may process a first subset of the received input signals associated with a first region of the field of view (e.g., an FOV pixel in the FOV) to detect a first object in the first region, wherein processing the first subset is performed individually on each input signal of the first subset of the input signals. In the example scene shown in FIG. 19B, the plurality of input signals collected from the collection of sensor pixels relative to region D1 of the FOV (e.g., FOV pixel D1) may be processed by the processor without binning. That is, the pixel outputs of the LIDAR sensor collected relative to FOV pixel D1 may be processed individually. In this example, an object (e.g., pedestrian 1901) may be located close to the LIDAR system, or in a near field region of the LIDAR system, and individually processing sensor pixel outputs, without binning, may be suitable for detection, ranging, etc.

On the other hand, the processor may be configured to process a second subset of the input signals associated with a second region of the field of view to detect at least one second object in the second region, wherein the at least one second object is located at a greater distance from the at least one light source than the first object and wherein processing of the second subset includes processing together input signals of the second subset. For example, returning to FIG. 19B, the second subset of input signals may correspond to sensor pixel outputs acquired relative to region C4 (e.g., the FOV pixel corresponding to region C4) of the LIDAR FOV. Region C4 may include, for example, a vehicle 1903 that is located further from the LIDAR system than pedestrian 1901. In such cases, whether processing occurs according to a predetermined binning scheme or a binning plan developed dynamically, sensor pixel output signals acquired relative to region C4 (e.g., as the LIDAR deflector is positioned during a scanning cycle at an instantaneous position that corresponds to FOV pixel C4) may be processed by binning (e.g., combining, considering together, etc.) two or more of the pixel output signals acquired relative to region C4 that are provided as inputs to the processor. In such a process, the LIDAR system may more readily detect vehicle 1903, may determine more accurate distance measurements relative to vehicle 1903, may have a higher confidence level in measurements made relative to vehicle 1903, etc.

Further, processor 118 may be configured to process a third subset of the input signals associated with a third region of the field of view to detect a third object in the third region. The third object may be located at a greater distance from the light source than the at least one second object. Additionally, processing of the third subset of input signals may include combining input signals of the third subset (e.g, binning those signals together). Based on the detected third object, the LIDAR system may output information including a distance to the third object. Rather than, or in addition to, being more distant than the second object described above, the third object may be less reflective than the second object. In addition to providing distance information relative to any of the first, second, or third detected objects (or any other detected objects), the LIDAR system may also provide additional measurements including (but not limited to) any one or more of the following measurements: a velocity of any of the detected objects, a surface angle of any of the detected objects, a reflectivity level of any of the detected objects, ambient light associated with of any of the detected objects, and a confidence level in any of these measurements (e.g., based on an SNR, etc.).

Figure 19C:
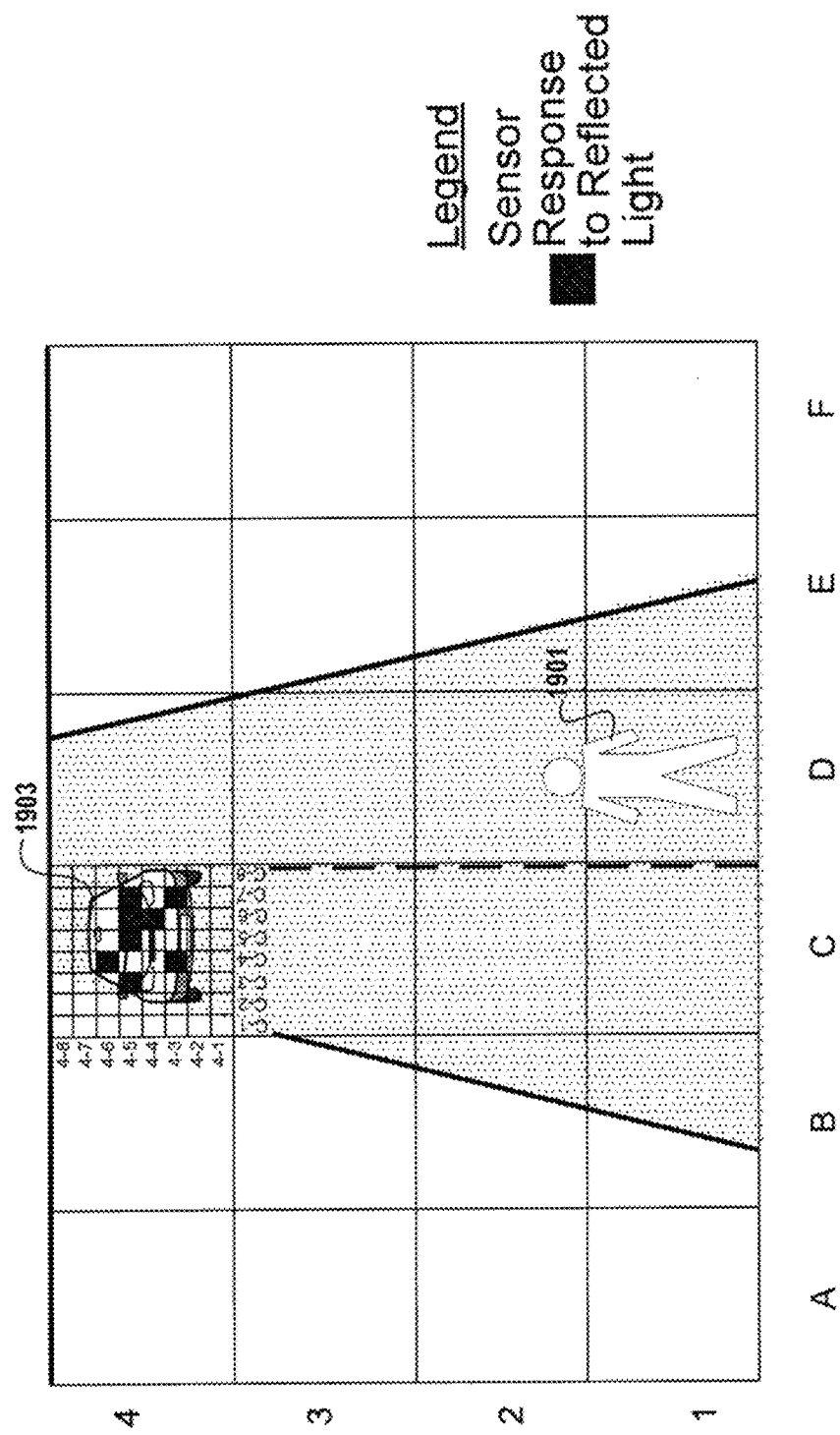
FIG. 19C is a diagram illustrating an exemplary sensor response to reflected light received during a scan of a portion of the LIDAR FOV depicted in FIG. 19B.
Figure 19D:
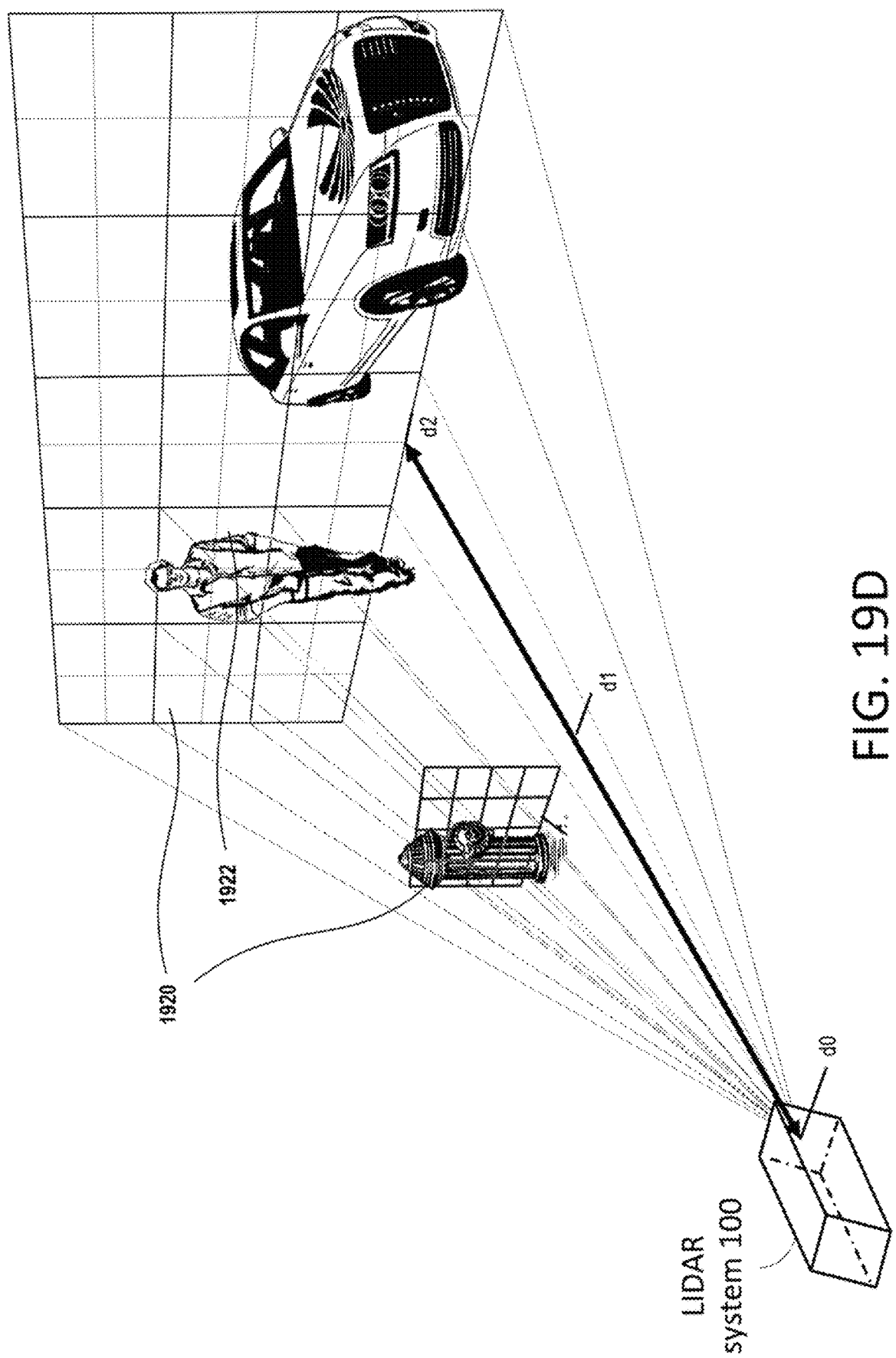
FIG. 19D is a diagram illustrating an exemplary LIDAR FOV, according to disclosed embodiments.

While the LIDAR FOV of FIG. 19B is diagrammatically represented in a two-dimensional view, the regions of the LIDAR FOV (e.g., each FOV pixel) represents a three-dimensional section within the LIDAR FOV. For example, as shown in FIG. 19D, each FOV pixel to which LIDAR light is projected and from which reflected LIDAR light is collected includes a three-dimensional volume in space that spans a range of distance values from the LIDAR system 100 (e.g., beginning a the LIDAR system light output as the origin and extending over the entire operating range of the LIDAR (e.g., 200 m, 500 m, or beyond). As an example, a first FOV pixel 1920 in the LIDAR FOV may extend from LIDAR system 100 at a distance d0, through a distance d1 (a distance that may correspond with at least a portion of the fire hydrant), out to a distance d2 (a distance to a normal plane that may intersect at least a portion of the pedestrian), and beyond.

When the deflector is located in an instantaneous position corresponding to FOV pixel 1920, the sensor may receive LIDAR light reflected from a portion of the fire hydrant overlapping with FOV pixel 1920. In some cases, in response to the received LIDAR light reflected from the fire hydrant (especially where the fire hydrant is a highly reflective object or where distance d1 is relatively small—10 m, 15 m, 20 m, etc.) the signals generated by more than one sensor pixel may be sufficient to accurately detect the presence of a portion of the fire hydrant overlapping FOV pixel 1920 and/or determine a distance range to the overlapping portion of the fire hydrant. In such cases, the sensor pixel outputs may be analyzed without binning.

In another example, however, when the deflector is located in an instantaneous position corresponding to FOV pixel 1922, the sensor may receive LIDAR light reflected from a portion of the pedestrian overlapping with FOV pixel 1922. In some cases, in response to the received LIDAR light reflected from the pedestrian (especially where the reflectivity of the pedestrian is low or where distance d2 is relatively large—50 m, 75 m, 100 m, 150 m, etc.) the signals generated by individual sensor pixels collecting the received reflected light may be insufficient on their own to accurately detect the presence of the portion of the pedestrian overlapping FOV pixel 1922 and/or determine a distance range to the overlapping portion of the pedestrian. In such cases, two or more of the sensor pixel outputs may be combined and analyzed together by applying any of the binning schemes described herein.

With reference to the example shown in FIG. 19D, based on the non-binned, individual sensor pixel outputs acquired relative to FOV pixel 1920, the LIDAR processor may determine a distance to a portion of the fire hydrant and may output information indicative of a distance to the fire hydrant (e.g., a data point in a point cloud representing a distance to a location on the fire hydrant (e.g., corresponding to a center of FOV pixel 1920)). Similarly, based on at least some of the binned sensor pixel outputs acquired relative to FOV pixel 1922, the LIDAR processor may determine a distance to a portion of the pedestrian and may output information indicative of a distance to the portion of the pedestrian overlapping with FOV pixel 1922.

Returning to FIG. 19B, in some cases, a first region of the field of view (e.g., FOV pixel D1) may include relatively near objects and, therefore, may be associated with a foreground portion of the LIDAR field of view. A second region of the field of view (e.g., FOV pixel C4 in FIG. 19B) may include more distant objects and, therefore, may be associated with a background portion of the field of view. A foreground portion may be associated with the near field region of the LIDAR system (e.g., between 5 and 50 meters, between 5 and 100 meters, between 1 and 50 meters, between 1 and 100 meters, etc.). A background portion may be associated with a mid or far field region relative to the LIDAR system (e.g., between 50 and 500 meters, between 100 and 500 meters, or more). In some embodiments, the foreground and background regions may be determined based on distance. For example, if the system may identify an object at a certain distance, anything closer to the LIDAR system than the object may be considered foreground and anything farther from the LIDAR system than the object may be considered background. In some embodiments, foreground and background positions may be determined based on results of the scan. In some embodiments, the foreground and background position may be determined based on map/topological simultaneous localization and mapping (SLAM). In some embodiments, the foreground and background regions may be determined based on previous frames. In some embodiments, the foreground and background position may be determined based on signal levels. In some embodiments, first and second subsets of the input signals are received during the scanning cycle.

Returning to FIG. 19A, a diagrammatic illustration is provided of a scene 1900 including an object, i.e., pedestrian 1901, in a foreground, near field region and a second object, i.e., vehicle 1903, in background, far field region of the LIDAR FOV (e.g., FOV 120). As noted, FIG. 19B provides a diagrammatic illustration of a scene 1910 that corresponds to the scene 1900 of FIG. 19A. FIG. 19B, however, identifies exemplary regions of the LIDAR FOV (e.g., FOV pixels A1, B1 . . . E4, F4, etc.). Each of the regions of the LIDAR FOV may correspond to an instantaneous position of the LIDAR deflector through which the LIDAR deflector passes during a single scan of the LIDAR FOV. In some embodiments, the LIDAR system sensor may receive more reflected light from pedestrian 1901 in the near field region than from vehicle 1903 in the far field region. In some cases, the difference in reflected light may be due to the difference in distance. In other cases, the difference in reflected light may be associated with the reflectivity of the object. As noted above, while only 24 FOV pixels are shown in FIG. 19B, there may be many more FOV pixels in practice, as an FOV pixel may occur every 0.2 degrees in horizontal and/or vertical directions of the FOV.

In some embodiments, sensor 116 of FIG. 1A (or any other LIDAR sensor) may enable an association between the reflected light from a single portion of field of view 120 (e.g., a single FOV pixel) and the outputs of individual light detectors (e.g., sensor pixels each constituting an SiPM). As the LIDAR deflector including scans through a plurality of different instantaneous positions, light reflected from each particular LIDAR FOV region (e.g., FOV pixel) corresponding to the different instantaneous positions of the deflector may be acquired. The incident reflected light may be sensed by detection elements 402 (e.g., SPADs), and outputs of groups of SPADs may provide the output of a single pixel 404 (e.g., an SiPM), as represented by FIG. 4A. As represented by FIG. 4C, LIDAR sensor 116 may include a plurality of detectors (e.g., 410A and 410B) corresponding to sensor pixels, where each pixel may include a plurality of light sensitive elements (e.g., detection elements 402 (e.g., SPADs)).

Returning to the example of FIG. 19B, as a result of scanning the deflector through a plurality of instantaneous positions, sensor 116 may acquire reflected light at different times (e.g., sequentially) from each of the scanned regions of the LIDAR FOV (e.g., regions F4, E4 . . . E1, F1). Thus, when sensor 116 collects reflected light from region D1, many of the pixels associated with sensor 116 may receive reflected light from pedestrian 1901 (in the example where a sensor having more than one pixel sensor is used to scan one FOV pixel at a time). Similarly, when sensor 116 collects reflected light from region C4, many of the pixels associated with sensor 116 may correspond to vehicle 1903. Because vehicle 1903 is in a far field region of the LIDAR system, not all pixels of sensor 116 that overlap with vehicle 1903 when imaging region C4 may provide output indicative of the receipt of reflected light. In some cases, this may be because less reflected light is received at the sensor 116 from more distant objects. A similar effect may exist as objects exhibit less reflectivity. For at least this reason, outputs of pixels associated with sensor 116 may be selectively binned during processing by the LIDAR processor.

Looking more specifically to region C4 of the LIDAR FOV, as shown in FIG. 19B, when the deflector is positioned such that reflected LIDAR light is acquired from FOV pixel C4, at least some of the sensor pixels of sensor 116 may output a signal indicative of light received from FOV pixel C4 of the LIDAR FOV. Each pixel of sensor 116 may generate an output, and these outputs of the sensor pixels may be provided to the LIDAR processor as input signals. Each pixel output may be indicative of reflected light received by the light sensitive elements associated with a particular pixel.

The amount of reflected light received from vehicle 1903 may determine a whether a positive detection of vehicle 1903 can be made and/or whether an accurate distance to vehicle 1903 may be determined. The amount of reflected light received from vehicle 1903, however, depends on the distance of vehicle 1903 from the LIDAR system and on the reflectivity of vehicle 1903. The farther vehicle 1903 is located relative to the LIDAR system and/or the less reflective that vehicle 1903 is, the less reflected light may be received at the LIDAR system and detected by pixels of the LIDAR sensor. As a result, the output from any one sensor pixel may fall below a positive detection threshold or may exhibit a poor signal to noise ratio.

In such cases, the output of the pixels of the LIDAR sensor may not enable the LIDAR processor to accurately detect vehicle 1903, determine a distance to vehicle 1903, etc. A diagrammatic representation of such an example situation is shown in FIG. 19C. As shown in FIG. 19C (not necessarily to scale), a LIDAR sensor including multiple sensor pixels represented by the grid overlaying region C4 of the LIDAR FOV may collect reflected light from region C4 of the LIDAR FOV. In this conceptual example, the sensor includes 64 pixels in an 8×8 array (including elements C-1, 4-1; C-2, 4-2 . . . C-8, 4-8). In the example represented by FIG. 19C, only some of the sensor pixels generate an output signal indicative of received reflected light. As shown by sensor pixels in black in FIG. 19C, sensor pixels C-4, 4-3; C-7, 4-3; C-6, 4-4; among several others have generated output signals indicative of received reflected light On the other hand, several of the sensor pixels (e.g., C-3, 4-4; C-7, 4-4; C-6, 4-6; etc.) have not produced output signals indicative of received reflected light (or at least from which at least one signal feature supercedes a detection threshold or differentiates from signal noise to a sufficient degree to positively indicate received light). In such cases, binning of the sensor pixel outputs may increase detection confidence, signal to noise ratios, and/or accuracy of a distance determination relative to vehicle 1903.

In the example described above relative to FIGS. 19A-19C, the LIDAR FOV is scanned one LIDAR FOV pixel at a time using a LIDAR sensor having multiple sensor pixels. As a result, each FOV pixel is associated with outputs from multiple sensor pixels. In such an example, the described binning schemes may be used to combine one or more sensor pixel outputs relative to a single FOV pixel.

Figure 20A:
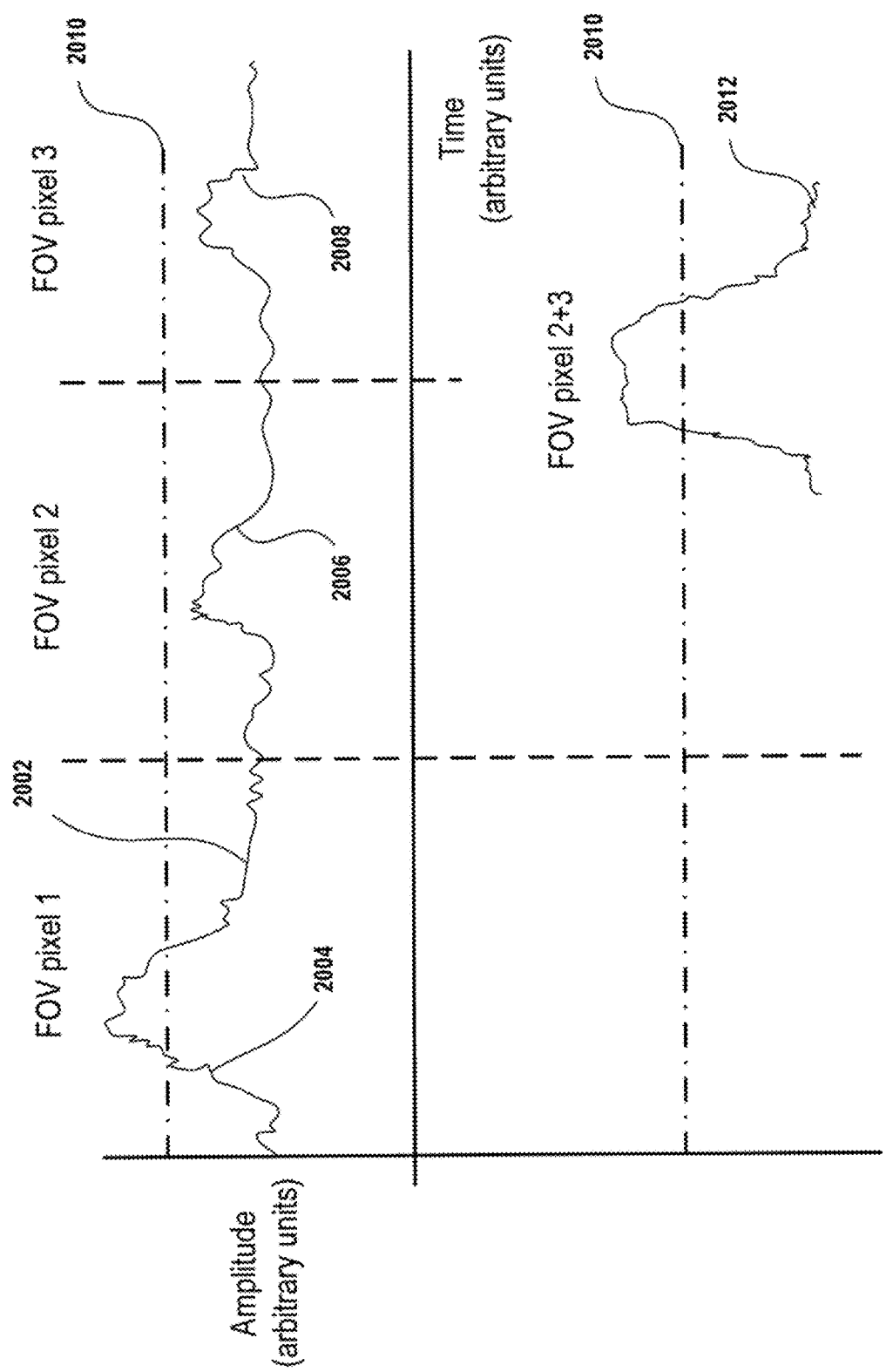
FIG. 20A is a diagram illustrating sensor pixel outputs and an example binning technique, according to disclosed embodiments.

The disclosed binning techniques, however, may be applied to many other examples. In some cases, each single sensor pixel may be associated with a corresponding single FOV pixel. For example, in some cases, a LIDAR sensor may include only a single pixel sensor, and the FOV may be scanned one FOV pixel at a time. In this case, a sensor pixel output may be acquired for each different instantaneous position of the deflector and in response to sensed reflected light collected at each different instantaneous position of the deflector. As a result, each acquired sensor pixel output may correspond to a different FOV pixel. For example, as shown in FIG. 20A curve 2002 represents output signals generated over time by the single pixel of a LIDAR sensor. As shown, the sensor pixel output may be acquired at each of three different instantaneous positions of the LIDAR deflector based on light projected to the FOV pixels corresponding to those instantaneous positions of the deflector. As a result, an acquired pixel output including signal 2004 may be associated with FOV pixel 1, a sensor pixel output including 2006 may be associated with FOV pixel 2, and a sensor pixel output including signal 2008 may be associated with FOV pixel 3. As shown, signal 2004 associated with FOV pixel 1 may exceed a positive detection threshold 2010. On the other hand, signals 2006 and 2008 associated with FOV pixels 2 and 3, however, may fall below the positive detection threshold 2010. In such cases, it may be desirable to bin two or more of the sensor pixel outputs. For example, the sensor pixel outputs corresponding to FOV pixel 2 and FOV pixel 3 may be binned together by, e.g., summing together signals 2006 and 2008. Curve 2012 represents summed signals 2006 and 2008, which may exceed positive detection threshold 2010, provide a higher SNR, etc. Thus, summing the sensor pixel output signals corresponding to FOV pixel 2 and FOV pixel 3 may provide a higher detection confidence level and/or may enable a more accurate distance determination based on the summed/binned signals.

A LIDAR system may include as an output a point cloud where each data point represents a distance determination (e.g., to an object or portion of an object) made relative to a particular FOV pixel. Where signals 2004, 2006, and 2008 of FIG. 20A are not binned, these signals (if possible) may be used to generate a distance determination relative to FOV pixel 1, FOV pixel 2, and FOV pixel 3, respectively. Spatially, the centers of each of these FOV pixels will be separated from the centers of adjacent FOV pixels by an angular displacement determined by the angular change of the LIDAR deflector between sequential instantaneous positions. Thus, where no binning is performed, the LIDAR point cloud associated with the example in FIG. 20A will include three points, equally spaced angularly, each representative of a distance to a detected object or portion of an object in the three FOV pixels.

Where binning occurs, however, the points in the point cloud may not be equally spaced from one another. For example, if signals 2006 and 2008 are summed as part of a binning process, a distance determination relative to the combined FOV pixel 2+3 may be based on summed signal 2012. This distance determination may be represented by a data point in the point cloud that is assigned to the center of the FOV region corresponding to combined FOV pixel 2 and FOV pixel 3. Spatially, the data point assigned to the center of the combined area of FOV pixel 2 and FOV pixel 3 will be farther from the data point representing FOV pixel 1 than a data point assigned to FOV pixel 2 in the absence of binning.

Of course, other binning schemes may be applied to the example of FIG. 20A. For example, rather than summing the sensor pixel signals associated with FOV pixel 2 (2006) and FOV pixel 3 (2008), the sensor pixel signal associated with FOV pixel 1 (2004) could be binned/summed with signal 2006 and/or 2008.

Additionally, because the signal information obtained over time from each sensor pixel relative to each FOV pixel may be stored in memory, binning may be performed relative to any two pre-acquired sensor pixel output signals. For example, a sensor pixel output signal associated with a first FOV pixel may be binned/summed with any other sensor pixel output signal acquired relative to any other FOV pixel, whether the signals are acquired during a single FOV scan or during separate FOV scans. Such a binning capability may allow for combining sensor signal outputs associated with adjacent FOV pixels along a horizontal scan line (e.g., as may be the case in FIG. 20A if signals associated with FOV pixel are binned with signals associated with FOV pixel 2, or signals associated with FOV pixel 2 are combined with signals associated with FOV pixel 3). The disclosed binning techniques, however, may also allow for binning of sensor pixel output signals associated with vertically adjacent FOV pixels (e.g., vertically adjacent FOV pixels located in different horizontal scan lines). Further still, sensor pixel output signals acquired with respect to any FOV pixel may be binned or combined with the sensor pixel output signals acquired with respect to any other FOV pixel or group of FOV pixels, whether those FOV pixels are adjacent or contiguous or not.

Additionally, rather than binning sensor pixel output signals associated with different FOV pixels (e.g., a spatial binning of signals), binning may also be performed relative to sensor pixel output signals acquired at different times for a single FOV pixel. In one example, the binning of sensor pixel output signals acquired relative to a particular FOV pixel may be performed relative to signals acquired during one FOV frame scan. For example, multiple light pulses can be provided to a single FOV pixel. Each projected light pulse may result in a corresponding received reflected light pulse at the sensor. In turn, each received reflected light pulse may result in a discrete, observable sensor pixel output signal spaced apart by a certain time period (which may correspond to the time duration between light projections to the FOV pixel). Two or more of these discrete sensor pixel output signals acquired at different times for a particular FOV pixel during a single FOV frame scan may be binned together. Because sensor pixel output signal information in the disclosed embodiments may be stored in memory, in another example, the binning of sensor pixel output signals acquired relative to a particular FOV pixel may also be performed relative to signals acquired during different FOV frame scans.

In another example, light may be projected to multiple FOV pixels simultaneously. In such embodiments, a LIDAR sensor may be configured to include a plurality of sensor pixels, where together with appropriate optical components, as needed, each sensor pixel may collect light from a different, corresponding FOV pixel. In one example, a scanning LIDAR system may project a beam of light having a first dimension (e.g., a height) equal to a single FOV sensor dimension and a second dimension (e.g., a width) that spans multiple FOV pixels. For example, a projected beam may simultaneously illuminate two, four, six or more FOV pixels in a single horizontal FOV scan line, and in such cases, the LIDAR sensor may have two, four, six or more sensor pixels configured to collect light from corresponding FOV pixels.

In other example, such as a flash LIDAR system, light may be simultaneously projected to an entire FOV, and a LIDAR sensor having a plurality of sensor pixels may collect light reflected from the FOV. In such cases, the resolution of the LIDAR system corresponds with the number of pixels in the sensor. Further, in this example, the FOV pixels are effectively defined by and correspond to the different sensor pixels.

Figure 20B:
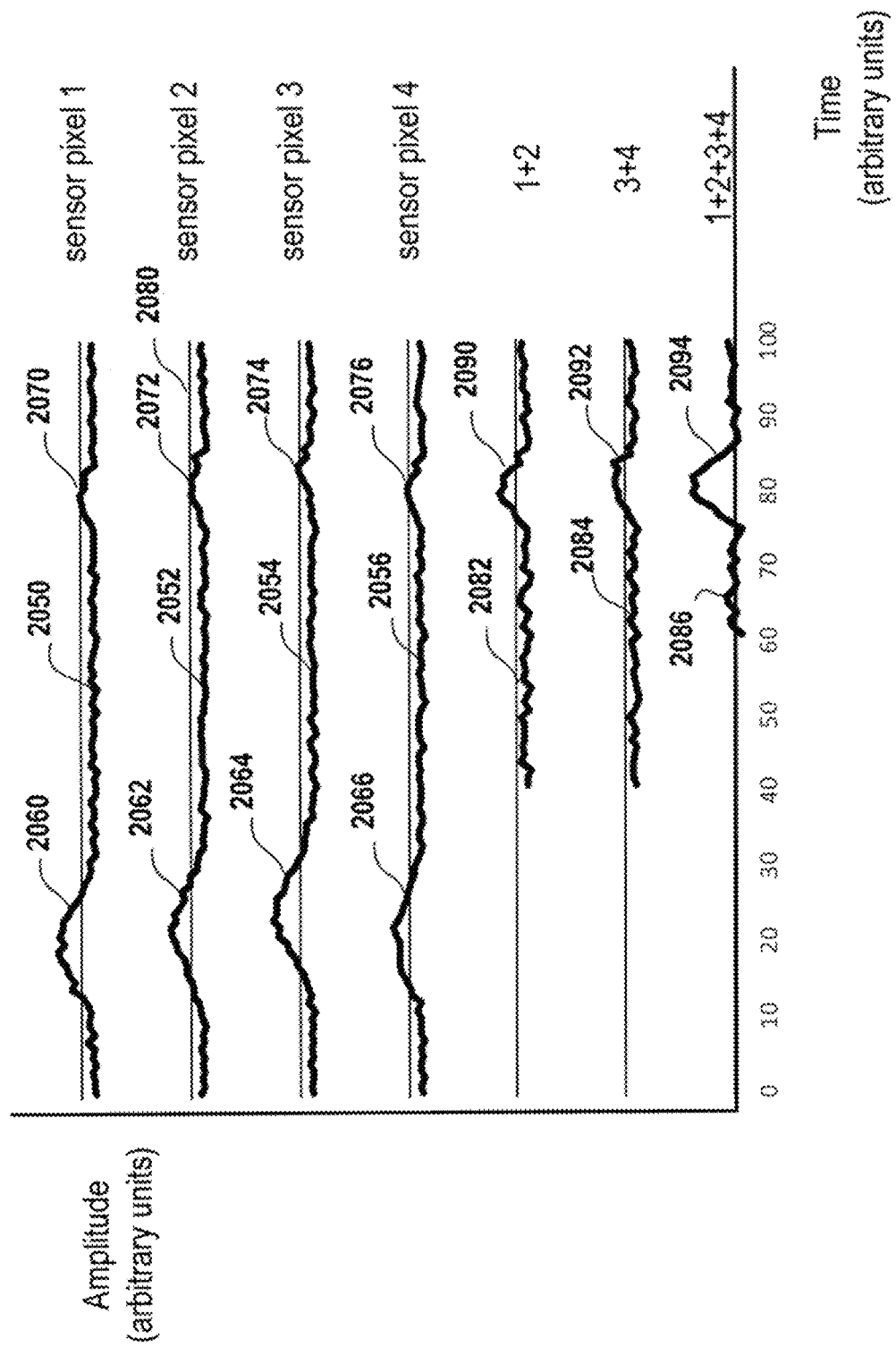
FIG. 20B is a diagram illustrating sensor pixel outputs and another example binning technique, according to disclosed embodiments.

In these examples, binning may be applied by the LIDAR processor according to any of the techniques described herein. For example, any signals generated by any single sensor pixel in response to reflected light received from a particular FOV pixel may be binned/summed/combined, etc. with any other signals generated by any other single sensor pixel or group of sensor pixels. FIG. 20B diagrammatically illustrates one example of binning in a case where signals from four sensor pixels are collected simultaneously in response to simultaneous illumination of four corresponding FOV pixels. In this example, a first curve 2050 represents the signal output from a first sensor pixel, a second curve 2052 represents the signal output from a second sensor pixel, a third curve 2054 represents the signal output from a third sensor pixel, and a fourth curve 2056 represents the signal output from a fourth sensor pixel. At a first time, four FOV pixels may be illuminated, and sensor pixels 1, 2, 3, and 4 may collect light reflected from the corresponding four FOV pixels. In response, sensor pixels 1, 2, 3, and 4 may generate output signals 2060, 2062, 2064, and 2066. Any combination of these signals may be binned together. Because each of these signals exceeds a detection threshold 2080, binning may be less important. At a later time, for example, after the LIDAR deflector moves to a new instantaneous location, four new FOV pixels may be simultaneously illuminated and sensor pixels 1, 2, 3, and 4 may collect reflected light from the corresponding four FOV pixels. In response, sensor pixels 1, 2, 3, and 4 may generate output signals 2070, 2072, 2074, and 2076. In some cases these output signals may not exceed detection threshold 2080. Any combination of signals 2070, 2072, 2074, and 2076 may be binned together and analyzed. For example, binning of the outputs of sensor pixels 1 and 2 may result in a curve 2082 including summed signal 2090. Binning of the outputs of sensor pixels 3 and 4 may result in a curve 2084 including summed signal 2092, and binning of the outputs of sensor pixels 1, 2, 3, and 4 may result in a curve 2086 including summed signal 2094. Notably, each of summed signals 2090, 2092, and 2094 may exceeds detection threshold 2080.

In addition to the binning combinations shown in FIG. 20B, any first sensor pixel output signal, acquired at any time and for any FOV pixel, may be binned together with the output signals (acquired at any time) from any other sensor pixel or group of sensor pixels relative to any FOV pixel or group of FOV pixels. In one example, signal 2060 could be binned with signal 2070 (signals relative to different FOV pixels, but generated from the same sensor pixel 1); signal 2066 may be binned with signal 2070 (signals from different sensor pixels, but from potentially adjacent FOV pixels); and any other combination of sensor pixel output signals may be binned together.

The LIDAR processor may apply any of various binning schemes to sensor pixel outputs (or to values associated with the received pixel outputs) acquired from the LIDAR sensor. For example, pixel outputs received by the processor may be binned together in groupings such that at least one group of binned sensor pixel outputs includes two or more pixel outputs summed together. The groupings may have different sizes either relative to an arrangement of sensor pixels (e.g., FIG. 19C embodiment) or relative to an arrangement of FOV pixels (e.g., FIG. 20B embodiment). The groupings may be 1×2, 2×1, 2×2, 3×1, 2×3, 3×3, 4×4, etc. Any combination of pixel outputs may be used. The binned groupings may be contiguous (e.g. where two or more of the grouped pixels touch one another) or discontiguous (e.g., where grouped pixels are spaced apart from one another). Further, not all binned pixel groupings need to have the same size. Some binned groupings may have a size of 2×2 pixels, while others have a 4×4 or 8×4 grouping size, for example. Further still, not all pixels of the sensor need be binned relative to a particular region of the LIDAR FOV. For example, in some cases, only certain sensor pixel outputs relative to certain FOV pixels, while others are left unbinned. Binned sensor pixel groupings may be predetermined (e.g., based on regions of an FOV associated with near field or far field objects) or may be determined on the fly (e.g., based on feedback indicating received reflected light levels, noise levels, potential object detections, etc.).

In some cases, an applied binning scheme may depend on or may correlate with amounts of light projected by the LIDAR to particular regions of the LIDAR FOV. For example, in some cases, certain regions of the LIDAR FOV may be allocated with fewer light pulses from the LIDAR light source, as compared to other regions of the FOV Where less light is supplied to a certain region of an FOV, however, the likelihood of detecting objects in that region or accurately determining distance relative to those objects, etc. may be reduced. To increase the likelihood of making such detections, increase the accuracy of distance measurements, etc., any of the binning techniques described herein may be employed based on an amount of light supplied to regions of the LIDAR FOV. In one example, certain regions of the LIDAR FOV may be supplied with one light pulse from the LIDAR light source. In those regions, the sensor pixel outputs corresponding to two or more FOV pixels may be binned according to any suitable binning scheme. In other regions, more light pulses may be projected toward those FOV regions. In those regions, the sensor pixel outputs may remained unbinned. Or, in some embodiments, the sensor pixel outputs may be binned, but the binned groupings may have shapes or sizes different from the binned groupings associated with those FOV regions supplied with less projected light.

Processing of the binned pixel outputs may also be performed according to any suitable algorithm or technique. In some cases, the outputs of binned pixels may be summed together, and the summed value may be assigned to the binned pixel grouping as a whole (as noted relative to FIG. 20A).

In some embodiments, binning, the decision to implement a binning scheme, non-binning scheme, or more than one binning scheme on a part of the field of view may depend on the results of a non-binned detection and/or a binning detection. The size or shape of bins and/or the application of pixel bins to certain FOV regions may be determined dynamically based on acquired detection information. For example, based on the detection results relative to one or more regions of a LIDAR FOV during a first scan, the LIDAR processor may apply a binning scheme or may change an applied binning scheme to one or more regions of the FOV during a current scan of the FOV or during a subsequent scan of the FOV.

Different binning schemes may also be applied relative to a single set of pixel outputs. For example, the LIDAR processor may be programmed to apply a first binning scheme to a set of pixel outputs (e.g., based on any of the factors described herein). Based on the detection results associated with the first binning scheme, the processor may determine that a different binning scheme should be applied to the set of pixel outputs. In some cases, the different binning scheme may include more or fewer bins, differently shaped bins, larger or smaller bins, contiguous or non-contiguous bins, etc. In this way, a set of pixel outputs may be processed and re-processed using different binning schemes until a desired outcome is achieved.

In one example, as a result of a medium-low confidence of detection of a far field object from a non-binning scheme, processor 118 may implement a new binning scheme and re-process the outputs of the previously non-binned pixels. Additionally, for example, as a result of a low confidence of detection of a far field object determined with a binning scheme, processor 118 may alter the binning scheme (e.g., change the size, shape, number of the bins, etc.). In another embodiment, processor 118 may alter the binning scheme in order to improve confidence on a mid-level object detection. In another embodiment, binning may depend on regions of interest. For example, where 20 meters ahead of the LIDAR system is a region of interest, processor 118 may implement a binning scheme for non-binning sensor pixel output signals corresponding to reflections from objects up to 20 meters and binning sensor pixel output signals corresponding to reflections from objects from 20 meters and on. In another embodiment, binning may depend on results of previous frames. For example, processor 118 may detect an object ahead. As a result of the detection in the previous frame, processor 118 may adapt the binning scheme for greater confidence of detection or accuracy in distance determinations, etc., during subsequent scans. In another embodiment, binning may depend on computation and timing constraints. In another embodiment, binning may depend on host instructions. In another embodiment, binning may depend on optical budget allocation.

In some embodiments, as noted, processor 118 may individually process a first subset of input signals provided by sensor pixels outputs associated with a first region of the LIDAR FOV. For example, in the illustration shown in FIG. 19C, processor 118 may employ a non-binning approach in analyzing the outputs of pixels acquired based reflected light collection from region D1 of the LIDAR FOV, which includes pedestrian 1901 in a near field region of the field of view. As noted, processor 118 may also individually process signals 2060, 2062, 2064, and 2066 (FIG. 20B) without binning. In some cases, non-binned processing may occur relative to objects in a near field region, and binned processing may be performed relative to more distant and/or less reflective objects. In some embodiments, processor 118 may implement a non-binning scheme in situations where the sensor pixel output signals indicate that enough reflected light was individually received from each corresponding FOV pixel to provide a certain threshold confidence level in detection (e.g., at least 50% certain, 75% certain, 95% certain, or any other percentage certainty of a detection). In some embodiments, the system may require a higher confidence level for detection of objects in the near field region than for detection of objects in the far field region. As a result, in some cases, binning may be applied relative to certain pixel outputs associated with near field regions even where similar outputs from far field regions would not warrant application of a binning scheme.

In some embodiments, processor 118 may process a second subset of the input signals provided by the LIDAR sensor pixels and may apply a binning scheme during processing of the second subset of input signals. For example, as discussed above, processor 118 may apply a binning scheme to pixel outputs associated with far field objects. The applied binning scheme may enable detection of an object that is located a greater distance from the light source than another object or that is less reflective than another object. In one embodiment, processor 118 may consider sensor pixel output signals associated with objects in the foreground individually (e.g., without binning) and may bin sensor pixel output signals associated with an object in the background.

In some embodiments, some objects may be detected in the binning scheme, but not when binning is not applied. For example, a distant object may not be identified in a non-binning scheme because the sensor may not receive enough reflected light to make a positive id of a target object, but the distant object may be detected when a binning scheme is applied and the received light reflections are considered together.

In other embodiments, some objects may be detected in a non-binning scheme and not detected in a binning scheme. In some cases, processor 118 may apply both non-binning schemes and binning schemes to a common set of sensor pixel outputs and make a determination of which provides higher quality detection information.

Assigned detection directions to portions of identified target objects may occur "off grid" relative to the pixels of a LIDAR sensor when a binning scheme is applied. For example, usual non-binning detections may occur, if at all, every 0.2 degrees. In a binning scheme, however, where groups of sensor pixel outputs and their corresponding FOV pixels may be considered together, it may be possible to determine a detection direction that does not correlate with the FOV pixel grid/point cloud data point spacing or lie within a center of any particular FOV pixel. Rather, in some cases, the determined detection direction to a target object or a portion of a target object (based on a binning scheme) may be at 7.3 degrees (or any other value based on the parameters of a particular set of binned sensor pixel output signals) which may be off the standard FOV pixel grid. In some embodiments, the determined location of a target object detected using binning may be in the center of any FOV pixel, off center from any FOV pixel, on a line separating FOV pixels, or on an intersection of two lines separating FOV pixels. In some embodiments, the direction assigned to a binned detection point cloud point may not necessarily be in the middle of the FOV pixels affecting by binning, but rather may, be based on an average location of detections or a center of gravity of the FOV pixels affected by binning of the corresponding sensor pixel outputs. Additionally, binning can be implemented in different shapes of sensor pixel outputs corresponding to FOV pixels, not only N×N squares of FOV pixels. In some embodiments, binning can be implemented in a rectangular shape (e.g., any N×M grouping), a triangular shape, generally circle shaped, elliptically shaped, etc. In some embodiments, binning of sensor pixel outputs may be based on temporal considerations. For example, as noted above, different sensor pixel outputs may be combined based on timing (e.g. combining items of vectors to provide a binning vector, or adding the analog signal over time).

In some embodiments, processor 118 may process a stream of sensor pixel outputs according to unbinned or binned processing schemes. In some cases, as previously noted, whether to bin two or more pixel outputs may be based on prior detection determinations relative to one or more pixel outputs. For example, in some cases, processor 118 may initially process a subset of sensor pixel outputs (which are provided as a plurality of input signals to the processor) without binning. If no object is definitively detected based on analysis of the subset of sensor pixel output signals, processor 118 may re-process the subset of sensor pixel output signals by combining together at least two sensor pixel output signals of the subset according to a determined binning scheme. In some embodiments, processor 118 may process some or all of the sensor pixel output signals/processor input signals of the subset according to a binning scheme. Similarly, if at least some of the received sensor pixel output signals/processor input signals are determined to be associated with or to provide insufficient detection information, the processor may process those sensor pixel output signals/processor input signals by combining at least two of the input signals according to a binning scheme.

In some embodiments, application of a binning scheme may depend on a determined confidence level in a detection of a target object. For example, processor 118 may initially determine based on analysis of a subset of input signals that a potential target object exists in a region of the FOV corresponding to the analyzed input signal. The object detection, however, may not be associated with a confidence level that exceeds a predetermined level (e.g., 40%, 60%, 75%, etc.). In a subsequent process, processor 118 may apply a binning scheme such that two or more of the input signals are re-processed together.

In some embodiments, more than one binning scheme may be applied to a group of sensor pixel outputs (e.g., as part of a series of processes performed relative to a set of input signals). For example, in a first process, processor 118 may process a subset of pixel outputs received as input signals by applying a first binning scheme (e.g., a non-binning scheme, a 2×2 binning scheme, etc.) relative to the input signals. Such a process may result in the identification of an existence of a first object in a particular region of the LIDAR FOV associated with the processed input signals. In some cases, processor 118 may re-process the input signals according to a different binning scheme (e.g., a 4×4 binning scheme, etc.). Such re-processing of the input signals may result in the detection of a second object in the particular region of the LIDAR FOV associated with the re-processed input signals. In some cases, the second object may be more distant, less reflective, etc. than the first object. In other cases, however, the second object may be more reflective, less distant, etc. relative to the first object. Additionally, in some cases, the second object may not be identifiable in the first processing scheme.

In some cases, two or more binned groups of pixel outputs may be considered together in order to determine the presence of a target object in a LIDAR FOV. For example, in some embodiments, processor 118 may combine the results obtained from an application to a group of input signals (pixel outputs) of a first binning scheme (e.g., non-binned, 2×2 bins, etc.) and application of a second binning scheme (3×3 bins, etc.) in order to identify an object in a region of the LIDAR FOV. In some cases, the identified object may not have been identified through processing of the input signals individually (unbinned) or through processing of the input signals according to the first binning scheme alone or the second binning scheme alone.

Any binning scheme may be employed by processor 118 depending on the requirements of a particular application. In some embodiments, a first processing scheme may be applied to a first group of input signals relative to a particular LIDAR FOV region, and a second processing scheme may be applied relative to a second group of input signals relative to the particular LIDAR FOV. In some cases, the first and second processing schemes may be different.

In some embodiments, processor 118 may select a binning scheme based on illumination levels associated with particular regions of the LIDAR FOV. For example, processor 118 may bin together pixel outputs associated with FOV regions where less light is projected and may process pixel outputs individually (or with smaller bins) relative to regions of the LIDAR FOV where more light is projected.

In some cases, binning of sensor pixel outputs may be accomplished by combining (or considering together) sensor pixel outputs derived from non-spatially separated FOV pixels (FOV pixels that share at least one border, corner, etc.). In other cases, binning of sensor pixel outputs may be accomplished by combining (or considering together) sensor pixel outputs derived from spatially separated FOV pixels (FOV pixels that do not share at least one border, corner, etc.). Not all pixel outputs received from the LIDAR sensor relative to a particular LIDAR FOV need be binned if a binning scheme is applied. Rather, in some cases, a binning scheme may be applied to only a subset of sensor pixel outputs associated with particular regions of FOV pixels of the LIDAR FOV. Other sensor pixel outputs corresponding to other regions or FOV pixels associated with the same LIDAR FOV may remain unbinned. For example, in some embodiments, processor 118 may apply a non-binning scheme for sensor pixel outputs associated with objects in near field region and may apply a binning scheme for pixel outputs associated with objects in far field region. In some cases (e.g., where a near field and far field overlap or where pixel outputs may represent both close in and background portions of a scene), some sensor pixel outputs within a particular set of input signals to the processor may be used for both non-binning and binning schemes.

Binning schemes may also be applied based on other types of feedback. For example, in some cases, a region of interest (ROI) may be identified (e.g., a region occurring in a particular range relative to the LIDAR system, a region where target objects of a particular type are expected, a region where a past object detection occurred, etc.). A binning scheme may be selected and applied relative to a particular LIDAR FOV region or subregion based on whether such a region or subregion includes an ROI.

Any suitable bin size can be used depending on the requirements of a particular application. In some cases, the bin size may be based on the size of a detected object (or expected object) relative to a LIDAR FOV region (e.g., how many FOV pixels a particular object at a particular range is expected to occupy). In some cases, regions of the FOV to which a binning scheme is applied may be predefined, and the sizes of those regions may be predefined. In other cases, the sizes of the regions to which a binning scheme is to be applied may be determined dynamically. For example, a region of a LIDAR FOV to which binning is applied or not applied to associated sensor pixel outputs may be predefined based on whether detected objects are within 50 m from the LIDAR system, are farther than 50 m from the LIDAR system, etc. Binning schemes may also be employed based on a detected driving environment. For example, when the processor determines that a host vehicle is in a rural environment or an urban environment, processor 118 may employ predefined binning schemes—at least one binning scheme associated with a detected rural environment, and at least one different binning scheme associated with a detected urban environment. In some cases, binning may be predetermined based on a region of the LIDAR FOV. For example, in some cases, all sensor pixel outputs associated with the FOV pixels in an upper third of a LIDAR field of view may be processed according to at least one predefined binning scheme, while sensor pixel outputs associated with the FOV pixels in the other two thirds of the LIDAR FOV may be processed according to a different binning scheme (e.g., unbinned or binned according to a different size, shape, etc.). The size of an FOV region to which a binning scheme is to be applied by combining at least two sensor outputs associated with that region may be determined dynamically based on at least one of detected ambient lighting conditions, object reflectivity, noise levels, vehicle speed, and/or driving environment.

In some embodiments, processor 118 may dynamically define a size or shape of a bin relative to a LIDAR FOV region and associated pixel outputs. Such a definition may be based on a variety of factors (e.g., detected road conditions, changes in reflection signals received, ambient lighting conditions, object reflectivity, detected noise levels, detected vehicle speed, detected driving environment, etc.). The application of a binning scheme may also depend on a detected horizon location. For example, in some cases, sensor pixel outputs associated with regions above a detected horizon may be binned while those associated with FOV regions below a detected horizon may be processed according to a different binning scheme (unbinned, different size or shape of bins, etc.). Binning of sensor pixel outputs may also depend on range values relative to the LIDAR system. For example, in a rural environment, up to 25 m in front of the LIDAR system may be considered a foreground and outputs of sensor pixels acquiring light from regions of the LIDAR FOV within this range may be unbinned. Ranges greater than 26 m, for example, may be considered background and associated sensor pixel outputs may processed by binning.

In some embodiments, a binning scheme may be applied to conserve computational resources. For example, processor 118 may implement a binning scheme relative to all or a portion of the sensor pixel outputs associated with an entire scan of the LIDAR FOV. Such binned processing may require less computational resources as compared to processing of all of the sensor pixel outputs individually. Based on the results of the binning process, however, processor 118 may re-process any of the sensor pixel outputs for the acquired scan of the LIDAR FOV according to different binning scheme (e.g., no binning, different sizes or shaped bins selectively applied to different ROIs, for example). For example, if a host vehicle is determined to be traveling on a rural road, processor 118 may implement a binning scheme for 50%, 75%, 90%, 100%, etc. of the sensor pixel outputs associated with the LIDAR field of view. If, for example, processor 118 detects an object on the rural road, processor 118 may unbin sensor pixel outputs or implement a new binning scheme relative to those sensor pixel outputs corresponding to a portion of the LIDAR FOV determined to include the detected object. As a result, a higher resolution of LIDAR distance data may be obtained relative to the detected object (e.g., a point cloud with a higher density of data points), but the higher resolution, more computationally demanding process may be implemented as needed based on object detections. Such a technique may conserve computational resources.

In some cases, sensor pixel outputs may be binned across different scans of a LIDAR FOV. For example, unbinned or binned sensor pixel outputs acquired relative to a first scan of a LIDAR FOV may be combined (or considered together) with unbinned or binned sensor pixel outputs acquired relative to at least one subsequent scan of the LIDAR FOV.

In some embodiments, illumination of certain regions of a LIDAR FOV may be related to an applied binning scheme. For example, processor 118 may process sensor pixel outputs associated with FOV pixels in a first region of a LIDAR FOV that receive a certain illumination level according to a first binning scheme (e.g., unbinned, 2×2 bins, etc.) and may process sensor pixel outputs associated with FOV pixels in a second region of the LIDAR FOV that receive a different illumination level according to a different binning scheme. The illumination level may be determined based on the binning scheme employed. Conversely, the binning scheme may be determined based on the illumination scheme employed. In some cases, the binning scheme applied to the second region may include bins larger than bins applied relative to the first region. Based on the applied binning scheme, processor 118 may control a LIDAR light source to illuminate the FOV pixels of the first region of the field of view at a first illumination level and illuminate the FOV pixels of the second region of a field of view at a second illumination level lower than the first illumination level. For example, the binned scheme applied to the second region, including larger binned groups than used relative to the first region, may not require as high of an illumination level. In other embodiments, processor 118 may control the LIDAR light source to illuminate the FOV pixels of the second region of the field of view at an illumination level higher than an illumination level applied to the FOV pixels of the first region. For example, a more distant object located in the second region may benefit from a higher illumination level for greater confidence of detection.

Figure 21:
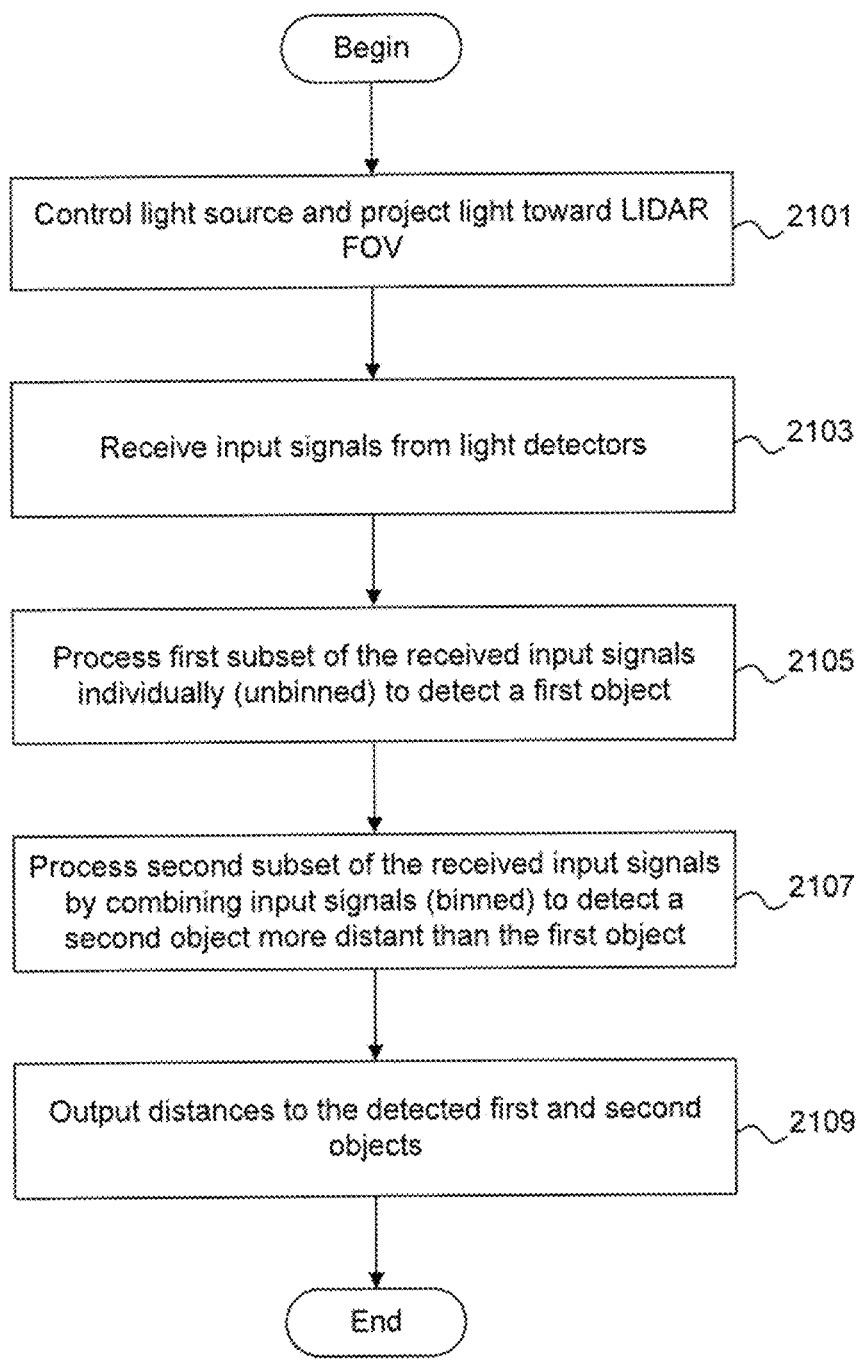
FIG. 21 provides a flowchart representation of a binning method according to exemplary disclosed embodiments.

FIG. 21 provides a flow chart of an exemplary method for using a LIDAR system to determine distances to objects in a field of view. At step 2101, the method may include controlling at least one light source for illuminating the field of view. At step 2103, a plurality of input signals indicative of reflections of light from objects in the field of view may be received by processor 118 from a group of detectors (e.g., pixels), for example. At step 2105, processor 118 may process a first subset of the input signals associated with a first region of the field of view to detect a first object in the first region, wherein processing the first subset is performed individually on each of the first subset of the input signals. At step 2107, processor 118 may process a second subset of the input signals associated with a second region of the field of view to detect at least one second object in the second region, wherein the at least one second object is located at a greater distance from the light source than the first object and wherein processing of the second subset includes combining input signals of the second subset. At step 2109, processor 118 may output information associated with a distance to the first object and information associated with a distance to the at least one second object.

Distributed LIDAR System

LIDAR systems (such as the LIDAR systems described above) may be deployed on any platform where distance ranging information to objects in a platform environment may be useful. In some cases, for example, the disclosed LIDAR systems may be deployed on a vehicle to provide ranging information relative to objects in an environment of the vehicle. For example, in some cases, it may be desirable to provide one or more optical gateways to the LIDAR system (e.g., deflector elements that may both project laser light to an environment of the vehicle and receive reflected laser light from the environment of the vehicle) at locations around a perimeter of a vehicle envelope that may offer relatively unimpeded field of views to areas of interest within a vehicle environment. Such locations may include, for example, areas in and/or around the front, sides, roof, or rear of a vehicle (e.g., on or within a vehicle front or rear bumper, grill, headlight assembly, taillight assembly, or any other fixture associated with the vehicle).

In many cases, however, such vehicle locations may present certain challenges to LIDAR system deployment. For example, in some situations, there may be insufficient space available for a LIDAR system, including a light source, deflector, processor, etc. at a desired location on a vehicle perimeter. In other cases, sufficient space for a complete LIDAR system may be available in desired locations around a vehicle perimeter, but placing the LIDAR system in such regions may foreclose placement of other potential systems or system components in those locations.

Additionally, certain locations on a vehicle, such as near an engine compartment, exhaust system, etc., may impact heat dissipation capabilities within those regions. With respect to LIDAR system deployment, placing heat-generating components of a LIDAR system (e.g., various processors associated with the LIDAR) within high-heat regions of a vehicle (or other type of platform) may impact an ability of the LIDAR system to effectively dissipate heat generated by these components. Excess heat in these systems can negatively impact the operation of one or more LIDAR system components. For example, as described above, the LIDAR deflector may include one or more scanning mirrors that hinge on tiny bendable hinges in order to control the direction of light projection and/or light collection. The operation of the deflectors may be degraded in situations where excess thermal energy may cause changes in one or more of their operational properties.

Both of these challenges as well as others may be addressed with distributed LIDAR system embodiments described herein and may provide further advantages. For example, as will be discussed in detail below, the disclosed LIDAR system may be distributed such that a front-end unit of the system, while not necessarily related to the front of a vehicle, may provide an optical gateway to an environment of the LIDAR system of the vehicle (e.g., at least a deflector for projecting laser light to an environment of interest), and a separate back-end unit, spaced apart from the front-end unit and not necessarily related to or located near the back of the vehicle, that may include other components of the LIDAR system (e.g., one or more LIDAR processing units). It should be noted that the terms front-end unit and back-end unit, in general, are used to distinguish between distinct portions of a distributed LIDAR system and do not indicate a relationship with a particular location on a vehicle.

Such a distributed LIDAR system may provide various potential benefits. For example, by separating one or more processing units of the LIDAR system from optical front-end components, the distributed system may offer increased flexibility in where the front-end components are placed. For example, in some cases, the optical front-end components may be located in tight spaces at the front, side, roof, or rear of a vehicle that may be too small to accommodate a complete LIDAR system. Additionally, the separation of one or more processing units of the LIDAR system from optical front-end components in the distributed system may offer enhanced heat management capabilities (e.g., by thermally isolating the front-end unit(s) from the back-end unit(s)). For example, processing units associated with a LIDAR back-end unit may be moved away from heat generating locations of the vehicle (e.g., engines, exhaust, etc.) and may be located in other locations where heat dissipation may be less challenging. Additionally, separating heat-generating LIDAR components from one another, such as the separation of processing units and/or light sources from light deflectors, may reduce the sensitivity of the LIDAR system to thermal variations and may enhance performance. Additionally, separating heat-sensitive LIDAR components from heat-generating LIDAR components from may improve the performance of the heat-sensitive LIDAR components. The disclosed systems may also include data conduits and/or light conduits for providing connectivity between the LIDAR front-end and back-end units.

The disclosed systems may have a variety of configurations. In one example, the disclosed systems may include one or more LIDAR front-end units, one or more LIDAR back-end units, and a data conduit. In some cases, the conduit connecting the front-end and back-end units may also include optical components to transfer light from one component to another (e.g., laser light for projection from the back-end to the front-end and/or received reflected light from the front-end to the back-end for sensing). The front-end units may be located remotely from the back-end unit, which may reduce or eliminate heat impact of the back-end components on components housed in the front-end units, for example. In some embodiments, the back-end unit may include a processing unit with a processor and the front-end units may include a projecting unit including a scanning unit with a light deflector and an actuator. One or more light sources may be located in the front-end units or the back-end units.

Figure 22:
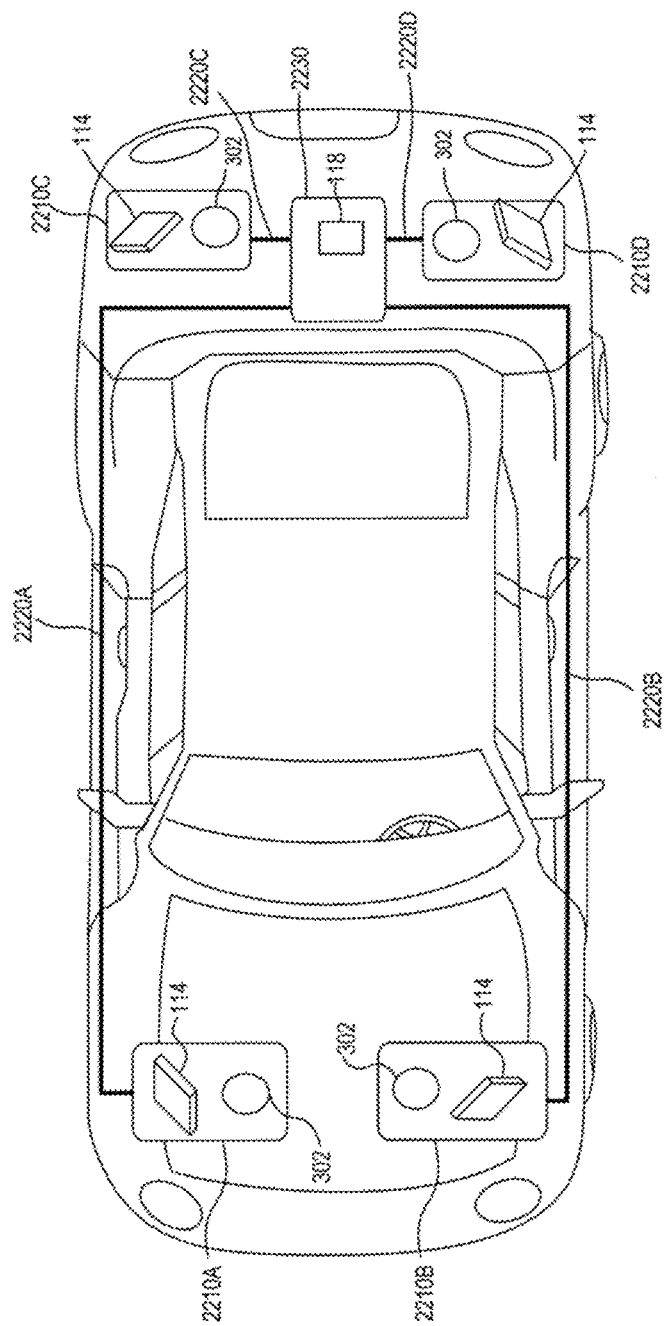
FIG. 22 is a diagram showing an exemplary LIDAR system with distributed LIDAR system components in accordance with some embodiments of the present disclosure.

FIG. 22 is a diagram showing an exemplary LIDAR system with distributed LIDAR system components including first housing 2230, which may also be referred to as a back-end unit, a plurality of second housings 2210, for example 2210A-D, which may also be referred to as a front-end units, data conduits 2220, for example 2220A-D, processor 118, controllable light deflectors 114, light sources 112, and actuators 302.

Back-end unit 2230 may include any structures or components suitable for conducting the main processing of the LIDAR system. Back-end unit 2230 may have a variety of configurations and may include various components. In one example, back-end unit 2230 may include a processing unit and one or more processors, such as processing unit 108 and processor 118 of FIG. 1A. As depicted in FIG. 1A, processing unit 108 may include processor 118. In some embodiments, processor 118 may control components of front-end units 2210. For example, as depicted in FIG. 22, processor 118 may coordinate operation of light source 112 with the movement of light deflector 114 of FIG. 1A (e.g., by actuator 302 of FIG. 3A) in order to scan a field of view and receive light reflected from objects in the field of view. Among other potential benefits, locating processing unit 108 within back-end unit 2230 rather than including separate processing units for each front-end unit 2210 may increase efficiency through centralization, as a single processing unit may receive, process, and control information from multiple front-end units. For example, as shown in FIG. 22, processor 118 may receive information via data conduits 2220 from four different front-end units, e.g., the plurality of four front-end units 2210A-D of FIG. 22. Each data conduit may be configured to interconnect the first housing (back-end unit) and at least one second housing (front-end unit). Each data conduit may be associated with a forward path from the back-end unit to the at least one front-end unit and a return path from the at least one front-end unit to the back-end unit. Each data conduit may be configured to cooperate with the at least one processor and at least one actuator associated with a light deflector, for example, such that the forward path is enabled to convey control signals for controlling the at least one actuator, and the return path is enabled to convey to the at least one processor reflections signals indicative of light reflected from objects in the field of view. In some embodiments, there may be separate back-end units for controlling and for processing.

As noted above, processing units associated with the disclosed LIDAR systems (among other components) may generate heat, and such heat may affect other components, such as the light deflectors responsible for directing laser light to an environment and/or for collecting reflected light from the environment. In some embodiments, as depicted in FIG. 22, processor 118 may be separated from other LIDAR system components. For example, processor 118 may be placed in back-end unit 2230, while other LIDAR components, such as deflectors 114 may be placed in front-end units 2210. Such separation may mitigate potential effects of heat from LIDAR system processors on other LIDAR components. Furthermore, distribution of LIDAR system components may enable selective location and advantageous positioning within a platform (e.g., a vehicle) of certain LIDAR components. In some embodiments, it may be desirable for the LIDAR system to have an optical gateway at the front of a vehicle (e.g., in order to scan an FOV forward of the vehicle). Many vehicles, however, include an engine unit at the front of the vehicle, which can contribute to significant levels of heat in this region. Thus, in some cases, placement of a full LIDAR system near a front region of a vehicle may exacerbate heat effects on the LIDAR system. For example, heat generated by LIDAR processing units may be difficult to dissipate in high-heat regions near a vehicle engine, which can lead to adverse impact on LIDAR components such as the deflectors or other heat-sensitive components. Moreover, some locations may be considered "prime" locations, e.g., interesting for camera, LIDAR, vehicle components, etc., so it may be advantageous to minimize LIDAR footprint in such prime locations. The distributed LIDAR systems of the present embodiments, however, may enable separation of back-end unit 2230, including one or more LIDAR processors, from high-heat areas of a vehicle, such as near an engine. For example, in some embodiments, back-end unit 2230 may be located near a center of the vehicle, in a rear portion of the vehicle, in a passenger compartment of the vehicle, on a roof of the vehicle, etc. Back-end unit 2230 may be located anywhere in the vehicle. As depicted in the exemplary system shown in FIG. 22, back-end unit 2230 can be located in the rear of the vehicle. Alternatively (e.g., where a vehicle has a mid-engine or rear-engine design), back-end unit 2230 may be located in the front of the vehicle, or in another location away from the engine. In some embodiments, processor 118 may be placed in front-end unit 2210.

Figure 23:
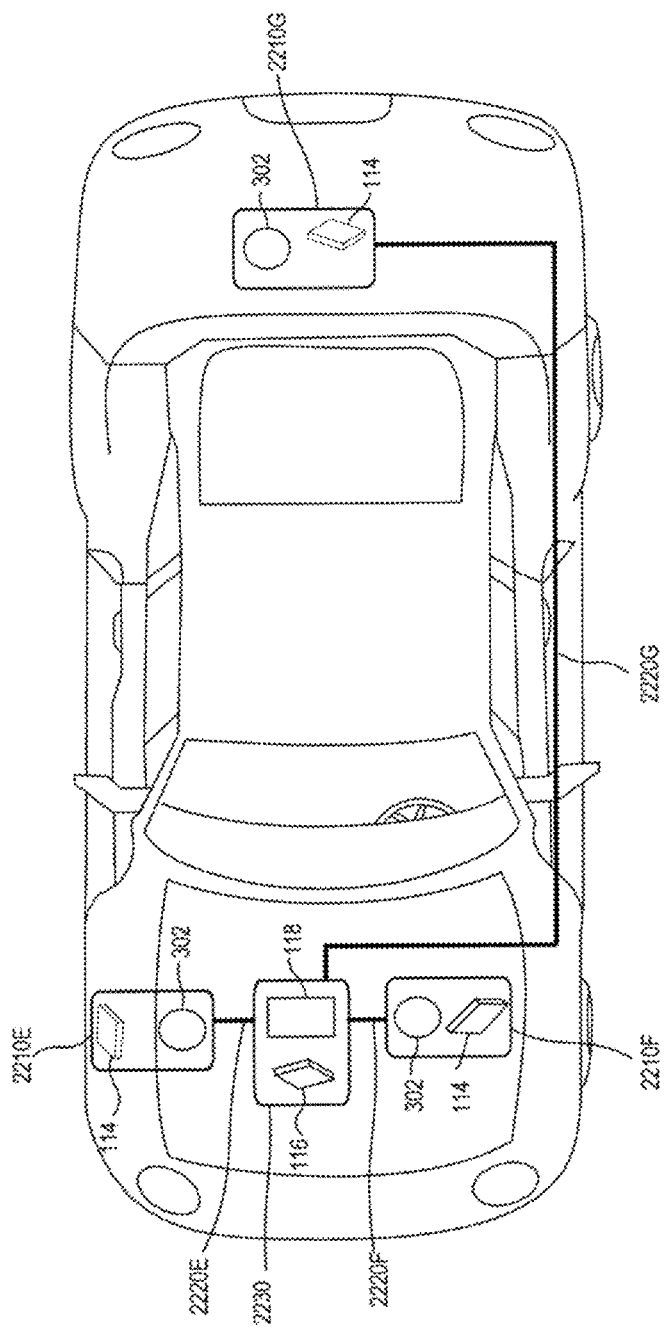
FIG. 23 is a diagram showing an exemplary LIDAR system with distributed LIDAR system components in which a first housing includes at least one sensor in accordance with some embodiments of the present disclosure.
Figure 24:
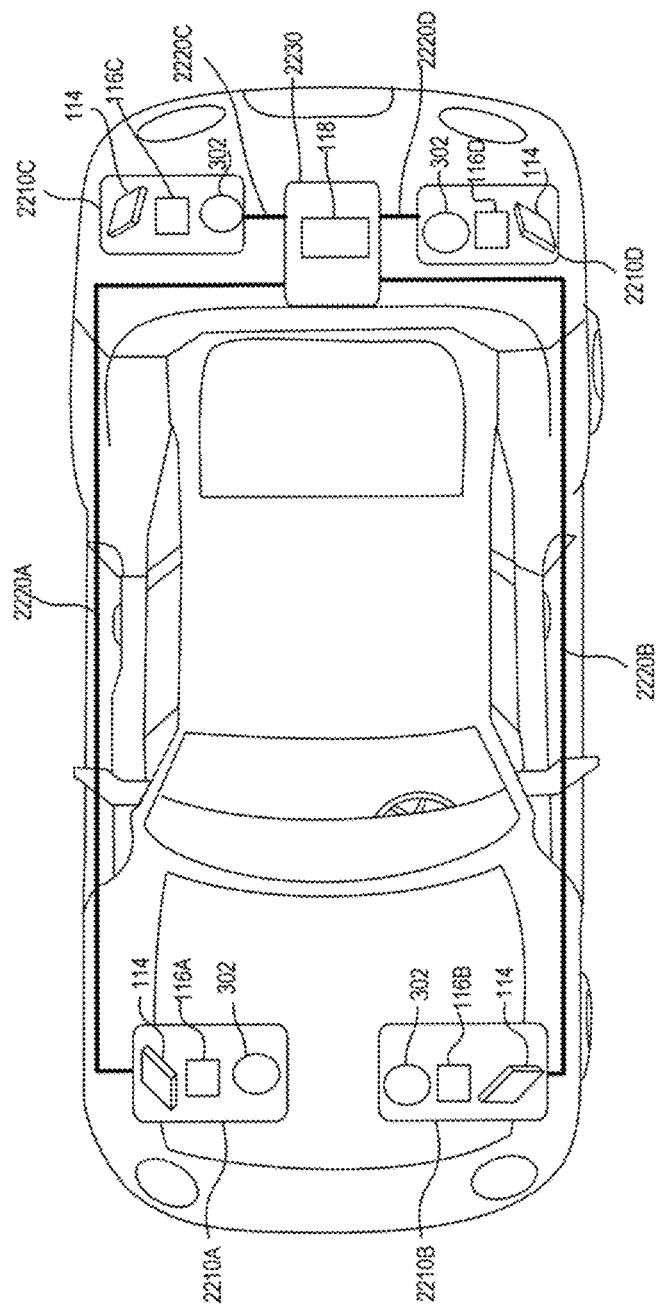
FIG. 24 is a diagram showing an exemplary LIDAR system with distributed LIDAR system components in which at least one second housing includes at least one sensor in accordance with some embodiments of the present disclosure.

In some embodiments, LIDAR system 100 in a vehicle (e.g., vehicle 110 of FIG. 6A) may be configured with one or more processors (e.g., processors 118A, 118B, and 118C, or any other LIDAR processor) located in a back-end unit, e.g., back-end unit 2230. In such embodiments, the plurality of front-end units (e.g., units 2210A-D of FIG. 22) may include projecting units 102 separated from the back-end units. Such a configuration may separate the processing unit components from at least the projecting unit components of the LIDAR system 100 (e.g., any of the deflector, actuator, and/or light source). In some embodiments and as depicted in FIGS. 22 and 24, at least one light source 112 of FIG. 1A may be located in one or more front-end units. In other embodiments and as depicted in FIG. 23, at least one light source 112 of FIG. 1A may be located in the back-end unit.

In some embodiments processor 118, which may be located in back-end unit 2230, may be configured to synchronize an operation of a plurality of light deflectors and a plurality of actuators in the plurality of front-end units. Any combination of the following functions may be implemented by back-end unit 2230: monitoring and controlling the deflector (and other components), processing data, and decision making (in LIDAR/host level). For example, in one embodiment, processor 118 of back-end unit 2230 may send control signals via data conduit 2220A and data conduit 2220B to actuators 302 of front-end units 2210A and 2210B to move light deflectors 114 simultaneously. In some embodiments, processor 118 may simultaneously move light deflectors 114 in all front-end units. In some embodiments, processor 118 may simultaneously move light deflectors 114 in front-end units located in the rear of the vehicle. In other embodiments, processor 118 may simultaneously move light deflectors 114 in front-end units located in the front of the vehicle. In other embodiments, processor 118 may simultaneously move light deflectors 114 in front-end units located on the roof of the vehicle. In yet other embodiments, processor 118 may simultaneously move light deflectors 114 in front-end units located in the side of the vehicle.

In some embodiments, processor 118 may be configured to change the selection of which of the various front-end units 2210 are active (e.g. control deflector by actuator to scan the incident light beam over the field of view). For example, processor 118 may be configured to change the selection of which of the various front-end units 2210 are active based on detection information. For example, a processor associated with the LIDAR system and located in a back-end unit may selectively control operation of one or more front-end components (e.g., deflector, actuator, sensor, and/or light source) based on LIDAR detection relative to the host vehicle environment or based on any other source providing information regarding objects in an environment of the host vehicle (e.g., vehicle radar, vehicle mounted cameras, sensors onboard or located remotely from the host vehicle, etc.). As an illustration, if a pedestrian crosses in front of the vehicle and moves outside the present field of view of front-end unit 2210B, but the pedestrian may be detected by another front-end unit, e.g. front-end unit 2210A, then processor 118 may use front-end unit 2210A to scan the field of view. In another example, if another vehicle changes lanes in front of the host vehicle and moves outside the present field of view of a front-end unit on the side of the vehicle, but the other vehicle may be detected by another front-end unit, e.g. on the front of the vehicle, then processor 118 may use the front-end unit on the front of the host vehicle to scan the field of view. In yet another example, the LIDAR system may include a plurality of forward-looking front-end units (directed towards the front of the vehicle) and a plurality of backward-looking front-end units (directed towards the front of the vehicle). The processor may choose to utilize all of the front-end units directed in the direction of propagation (e.g., driving forward or in reverse gear), and only one of the front-end units directed in the opposite direction.

In another example, a back-end processor may alter one or more performance characteristics associated with at least one front-end component based on information feedback. For example, a back-end processor (e.g., processor 118) may be configured to use information obtained from reflections signals sensed by any of the front-end units to cause a change in light flux projected from the same and/or any one of the other front-end units. For example, in response to receiving information from front-end unit 2210B via data conduit 2220B, for example, identifying a stopped car ahead, processor 118 of back-end unit 2230 may send a control signal via data conduit 2220A to actuator 302 of front-end unit 2210A to cause a change in the light flux projected from front-end unit 2210A in advance of changing lanes.

In some embodiments, processor 118 may be configured to identify a subgroup of the plurality of front-end units 2210 for processing of reflections signals based on an operational condition of the vehicle. For example, when the host vehicle is driving in reverse, processor 118 may identify a subgroup including front-end unit 2210D and front-end unit 2210C which are located in the rear of the vehicle and there access to fields of view behind the host vehicle. In another embodiment, when the vehicle is driving forward, processor 118 may identify a subgroup including front-end unit 2210A and front-end unit 2210B which are located at the front of the host vehicle and their access to fields of view forward of the host vehicle. Based on such determinations, the processor may selectively activate or control various front-end components. Additionally or alternatively, the processor may alter one or more operational characteristics of any of the components of an identified subgroup of front-end units. For example, light flux provided by any of the front-end units may be increased or decreased, scanning rates and/or scanning patterns may be changed, etc.

While light sensitive components for sensing reflected laser light may be located in the front-end units of a LIDAR system, they need not be. For example, such sensors may also be located in LIDAR back-end units. FIG. 23 provides a diagrammatic view of an exemplary LIDAR system with distributed LIDAR system components in which the back-end unit includes at least one sensor 116. As shown in FIG.

23, the LIDAR system may include back-end unit 2230, a plurality of front-end units 2210E-G, and data conduits 2220E-G. Processor 118 may be located in back-end unit 2230 along with one or more sensors 116, which may function as a centralized sensor for detecting laser light reflections collected, for example, by light deflectors 114 located in the front-end units 2210E, 2210F, and 2210G. In such embodiments, collected laser light may be transferred from a front-end unit to a back-end unit via any suitable means. For example, in some cases, one or more fiber optic conduits may be included in or separate from data conduits 2220E, 2220F, and 2220G. Similar arrangements may be used in embodiments that include a centralized laser light source or a plurality of centralized lasers in order to distribute laser light for projection to an environment of the host vehicle via deflectors included in one or more of the available front-end units of the LIDAR system. In some embodiments, in front end unit 2210, the RX channel may be optically combined with the TX channel. In other embodiments, in front end unit 2210, the RX channel may not be optically combined with the TX channel.

In some embodiments, processor 118 may be configured to use information obtained from reflections signals associated with one of the plurality of front-end units 2210E-G to cause a change in sensitivity of a sensor located in back-end unit 2230 (or at any other location within the LIDAR system, e.g., in a front-end unit). For example, in response to receiving information from front-end unit 2210G via data conduit 2220G, processor 118 of back-end unit 2230 may adjust sensitivity of a sensor 116 located in back-end unit 2230.

In some embodiments, back-end unit 2230 may include at least one vibration sensor configured to determine data indicative of vibrations of the vehicle. In other embodiments, back-end unit 2230 may include a location sensor, velocity sensor, acceleration sensor, and direction feedback sensor. In such embodiments, in response to information received from the any one of the sensor, for example, processor 118 may send control signals via data conduits to an actuator, light source, etc. located in one or more front-end units to cause a change in the light flux projected from any of the one or more front-end units. If, for example, there is a vibration based on the conditions of the road (pothole, rough road, etc.), the scanning properties of the deflector may be adjusted. In one example, processor 118 may adjust the light flux projected from any of the front-end units based on detected vibrations.

In some embodiments and as depicted in FIG. 23, back-end unit 2230 may include light source 112 of projecting unit 102 of FIG. 1A. Light source 112 of projecting unit 102 of FIG. 1A, like processor 118 described above, may generate a significant amount of heat. Combining a light source 112 and processor 118 of FIG. 1A into one housing and separating them from the deflectors may improve heat dissipation and may reduce or avoid heat related drift of the light deflectors located in the front-end units.

As previously noted, in some embodiments, data conduits or separate light conduits may be configured to convey the light from a light source located in a LIDAR back-end unit to any of the available LIDAR front-end units in order to project the light to various sections of the environment of the host vehicle. In some embodiments, the data conduit (or separate light conduit) may include fiber optics, one or more optical elements establishing an optical path (e.g., one or more lenses, filters, mirrors, etc.) to convey light from a back-end light source to front-end components.

Front-end units 2210 may have a variety of configurations and may include various components. In one example and in reference to FIG. 22, front-end units 2210 may include projecting unit 102 and light source 112 of FIG. 1A, scanning unit 104 and light deflector 114 of FIG. 1A, and actuator 302 of FIG. 3A. In some embodiments, front-end units 2210 may further include one or more ancillary processors, but not the main LIDAR analysis processor, e.g. processor 118 of back-end unit 2230, which may be used to detect and classify objects in the field of view as described above.

Front-end units 2210 may be located in the host vehicle at any suitable location. As described above, the front-end units may be remotely located relative to a LIDAR back-end unit. In some embodiments, front-end units 2210 may be located on the side of the vehicle for side imaging, e.g., identifying and measuring distances to various locations on objects located on the side of the vehicle and generating an associated point cloud based on the collected distance information. In some embodiments, front-end units 2210 may be located on the front of the vehicle for forward imaging. In some embodiments, front-end units 2210 may be located on the rear of the vehicle for rear imaging. In some embodiments, front-end units 2210 may be located on the roof of the vehicle for higher vantage point imaging and/or 360 degree imaging (or any portion of 360 degrees). In some embodiments, one or more of the plurality of front-end units 2210 may be located on or behind the windshield of the host vehicle. In some embodiments, one or more of the plurality of front-end units 2210 may be located in the head lights or tail lights (or their associated housings) of the vehicle, within a forward or rear bumper, within the vehicle grill, coupled with an antenna, etc. A combination of positions of front-end units 2210 (e.g., in a plurality of the above-identified example locations) may enable a larger aggregated field of view of an environment of the host vehicle. In some embodiments, front-end units 2210 or a component within front-end units 2210 may be rotatable so as to change a FOV of the unit (e.g. rotating/moving the FOV 90° to the left, right, up, or down).

Separation of the LIDAR components into one or more front-end units and at least one back-end unit may provide flexibility in how a LIDAR system is deployed on a particular platform. For example, where LIDAR processing units, light sources, and/or sensors are located in a LIDAR back-end unit, accompanying LIDAR front-end units may need to house fewer LIDAR components, which may enable the front-end units to be located in smaller spaces. In some embodiments, a LIDAR front-end unit may include a LIDAR deflector and actuator. In other embodiments, the LIDAR front-end may include a LIDAR deflector, an actuator, and a sensor. Such front-end units may include accompanying components as well. In such embodiments, the LIDAR front-end units may occupy relatively small volumes, which may enable their placement in such locations as behind a rearview mirror of a vehicle, within a headlight assembly, within a vehicle grill, within or on a vehicle bumper, within or on a vehicle antenna assembly, within or on a vehicle door handle, or any other low volume location. In some cases, e.g., where a front-end unit includes a light deflector, actuator, and optionally a sensor, the LIDAR front-end unit may be incorporated at nearly any location on or in a host vehicle.

By distributing LIDAR system components between front-end and back-end units, in some embodiments, each of the plurality of front-end units (e.g., units 2210) may occupy a smaller volume than a LIDAR back-end unit of the same system (e.g., back-end unit 2230). In some embodiments, back-end unit 2230 may be substantially larger in size than any of the plurality of front-end units. For example, a back-end unit may occupy a greater volume than a front-end unit. In some cases, a LIDAR back-end unit may have volume that is 1.2×, 2×, 5×, 10× 25×, 50×, 100× or more larger than a LIDAR front-end unit deployed as part of a common LIDAR system. While any dimensions for the front-end and back-end units may be used depending on the requirements of a particular application, in one exemplary embodiment, a LIDAR front-end unit may have a total volume in a range of about 80 cm3, and a LIDAR back-end unit may have a total volume in a range of about 500 cm3.

The disclosed LIDAR systems may include any number of front-end and back-end units depending on the requirements of a particular application. In some cases, the disclosed LIDAR systems may include one front-end unit and one back-end unit. In other cases, the disclosed LIDAR system may include multiple front-end units (2, 4, 8, 10, 25 or more) together with a single, central back-end unit. In still other cases, a LIDAR system may include multiple front-end units as well as multiple back-end units. In embodiments that include multiple front-end units, the front-end units may be deployed, for example, at various locations around a host vehicle for an improved or increased field of view.

As described above, a controllable light deflector (e.g., such as deflector 114) of a LIDAR front-end unit may include any structures or components suitable for directing light to a LIDAR field of view. In some embodiments, the light deflector may include a MEMS mirror. In some embodiments, the light deflector may include an optical phased array (OPA), a mechanical mirror, a rotatable polygon prism, a crystal, or any other form of controllable deflector. A scanning unit of a front-end unit may be either bidirectional or one-directional, scanning only the outgoing illumination, scanning only the incoming light reflections, or scanning in both directions (e.g., as depicted in FIG. 2A). A scanning unit of a front-end unit may be either one-dimensional (e.g., scanning only across one axis) or two-dimensional (e.g., scanning across two axes). A single mirror may be deployed in a front-end unit and may be used to deflect light to the field of view and deflect light from the field of view to the sensor. In other cases, two or more different mirrors may be provided in a front-end unit to project and deflect light. In other cases, a front-end unit may include one or more mirrors (or other type of deflector) to project light toward a field of view, and one or more different mirrors (or other type of deflector) to collect reflected light from the field of view. Any of the optical channels available within a particular front-end unit may be selectively enabled by the LIDAR processor, for example, in response to detection feedback or other available information. Each deflector deployed in a front-end unit may include one or more light deflectors. In some embodiments, each light deflector associated with each front-end unit may include an array of light deflectors. For example, light deflector 114 of front-end unit 2210B may include an array of four light deflectors (e.g., light deflectors 114A-D). In some instances, a front-end unit may include an array of 2, 5, or 10 (or more) light deflectors. In some cases, the front-end unit may even include an array of 100 or more light deflectors.

As described above, a plurality of LIDAR front-end units may be deployed at locations around a vehicle envelope such that two or more of the LIDAR front-end units offer overlapping fields of view. In such cases, a LIDAR processor (e.g., processor 118) may be configured to control movement of a plurality of light deflectors within one or more LIDAR front-end units such that an accumulated energy density of projected light in at least one overlapping region is under a maximum permissible exposure. As noted, overlapping regions of a field of view may include regions where light from more than one deflector is provided.

While in the disclosed distributed LIDAR systems, a LIDAR processor (e.g., processor 118) may be disposed within a back-end unit, such a processor may be used to control one or more components located in one or more of the front-end units. For example, in some embodiments a processor in a back-end unit may be used to control the operation of an actuator (e.g., actuator 302) in order to cause an associated deflector to scan light over a LIDAR FOV or at least a portion of a LIDAR FOV. A back-end unit processor may be used to control any number of components included in one or more front-end units. For example, in some embodiments, a single processor included in a central back-end unit may be used to control multiple components across multiple front-end units. In one example, a back-end unit processor may send control signals to multiple front-end unit actuators (e.g., actuators 302 of front-end units 2210A and 2210B) in order to cause multiple light detectors across different front-end units to move simultaneously. In some cases, such movement may be substantially synchronized such that scans of multiple fields of view associated with multiple deflectors are completed within similar time intervals. Such control signals may be conveyed from the back-end processor(s) to one or more actuators (or other components) of one or more front-end units via data conduits (e.g., data conduits 2220A and 2220B).

FIG. 24 provides a diagrammatic representation of another exemplary embodiment consistent with the present disclosure. As depicted in FIG. 24, front-end units 2210 may include a sensing unit 106 including a sensor 116. As in other embodiments of the distributed LIDAR system, the processing unit 108 and processor 118 may be deployed within back-end unit 2230. The plurality of front-end units 2210 include at least one sensor 116, e.g., sensors 116A-116D, for capturing and measuring light reflected from objects in the field of view. In some embodiments, front-end units 2210 may each include multiple sensors. Reflections signals generated by the light sensors may include data that is conveyed to the at least one processor via return paths provided by the data conduits connecting the LIDAR front-end unit(s) with the LIDAR back-end unit(s).

In other embodiments (e.g., where a light sensor is located in a LIDAR back-end unit), the reflection signals transmitted by the data conduit/optical conduit connecting a LIDAR front-end unit with a LIDAR back-end unit may include reflected light collected by one or more deflectors or other optical components associated with a LIDAR front-end unit. In such cases, the reflections signals include the reflected light that is conveyed from the at least one front-end unit to a back-end unit via the return path. In such embodiments, the data conduits may be configured to convey light and may include any structure suitable for light transmission (e.g., optical fiber cables, coaxial cables, waveguides, lenses, light guides, mirrors, etc.) As noted, a return path of a data conduit, e.g., from each of the plurality of front-end units 2210 to back-end unit 2230, data conduits 2220 may convey reflections signals including either the light itself or data from the light.

In some embodiments, processor 118 may be further configured to use information obtained from reflections signals associated with one or more of a plurality of front-end units to cause a change in a sensitivity of a sensor located in another of the plurality of front-end units. For example, in response to receiving information from front-end unit 2210D via data conduit 2220D, processor 118 of back-end unit 2230 may adjust sensitivity of sensor 116C located in front-end unit 2210C. In another embodiment, processor 118 may use information obtained from reflections signals associated with one of the plurality of front-end units to cause a change in a sensitivity of sensors located in all of the plurality of front-end units, e.g., sensors 116A-D of front-end units 2210A-D.

Data conduits 2220 may include any structures or components suitable for transferring information from one location to another. In some embodiments, data conduits 2220 may include connectors that interconnect back-end unit 2230 and the plurality of front-end units 2210. For example, data conduits may include various types of connections. In some examples, data conduits 2220 may include CANDL communications, wired, optical fiber, a coaxial cable, a waveguide, or any cable capable of conveying light, instructions, and information. The type of data conduit may depend on the type of data the data conduit is transferring.

A data conduit may be configured to cooperate with the processor and actuator such that the forward path is enabled to convey control signals for controlling the at least one actuator. According to some embodiments, in a forward path of a data conduit, e.g., from back-end unit 2230 to each of the plurality of front-end units 2210, data conduits 2220 may convey light (e.g., frm a LIDAR light source). Data conduits 2220 may also convey instructions from processor 118 to actuators 302 in the forward path or to any other controllable components of the front-end unit(s). Such control signals, for example, may alter one or more operational parameter values associated with a front-end component (e.g., a scanning rate, scanning pattern, scanning range, etc. associated with a deflector included in a front-end unit). In some cases, control signals may cause a direct response in one or more electrical components associated with the actuator (e.g., a piezo electric device, etc.) or any other component of front end unit 2210. In other cases, the control signals may be more complex. For example, they may include commands or instructions for a processor. Upon receipt, a processor associated with the actuator may interpret the control signals and issue one or more signals to cause a change in the actuator components. In some instances, control may be electronic signal to cause response by actuator. In some embodiments, control signals can be more complex instructions/commands (e.g., for execution by a processor associated with the actuator). In some embodiments, in a return path control signals may be sent to the back-end unit from a front-end unit. In some embodiments, the return path may be enabled to convey to the at least one processor reflections signals indicative of light reflected from objects in the field of view.

In some embodiments, each front-end unit 2210 may be different from another front-end unit 2210. For example, in the same LIDAR system, front-end units 2210 may include different FOVs, different scanning rates, different illumination power, and different illumination range. Additionally, in some embodiments, some front-end units 2210 may include one or more sensors while other front-end units 2210 may not. Moreover, in some embodiments, some front-end units 2210 may include one or more lasers while other front-end units 2210 may not. For example, front-end units 2210A-B of FIG. 24 may have greater FOV, higher scanning rate, higher illumination power, and higher illumination range than that of front-end units 2210C-D due to the position of front-end units 2210A-B in the vehicle.

While a host vehicle has been described as an example of a platform upon which the disclosed LIDAR systems may be deployed, the disclosed LIDAR systems may also be deployed on various other types of platforms. For example, in some embodiments, LIDAR system 100 may be included as part of a security camera system (e.g., a non-scanning system) as shown associated with the scene of FIG. 6D. In this example, the surveillance system may include a single rotatable LIDAR system 100 to obtain 3D data representing field of view 120 and to process the 3D data to detect people 652, vehicles 654, changes in the environment, or any other form of security-significant data. In some embodiments, the security system may include distributed system components, such as any of those described above. For example, the security system may include a back-end unit, as the processing hub, and may be separated from a front-end unit as the sensing and scanning units. The data conduits may connect the first and front-end units in the security system. By implementing the distributed system component scheme in the security camera, the processing of the reflections signals is done in a central location.

Multilayered MEMS Scanning Device

MEMS systems (such as those discussed below, e.g., with respect to the associated drawings) may include MEMS mirrors, scanning units 104, light deflectors 114, and other components. Such MEMS systems may be used in conjunction with a LIDAR system (e.g., any of the LIDAR systems disclosed herein), in other types of optical and/or electro-optical systems, in sound systems, in sensors, cameras, medical devices, or any other types of systems. Many MEMS systems are manufactured as single-wafer devices and, as a result, are limited to a single planar geometry. Such systems are also limited to the mechanical properties derivable from the single-wafer.

In some cases, such as the LIDAR systems described herein, MEMS mirrors having diameters (or other relevant dimension) on the order of about 5 mm or more may be employed. Such systems may also involve significant movement of the MEMS mirror (e.g., displacement amplitudes/angular rotation) in multiple axes in order to scan a FOV. In order to scan an FOV at useful frame rates for use in various applications (e.g., vehicular applications in which an FOV may be scanned multiple times per second), the MEMS mirror may be required to quickly move through a series of instantaneous positions at high operational frequencies.

Traditionally MEMS mirrors fabricated, for example, from a single wafer of silicon may significantly limit the functionality of certain scanning systems, such as LIDAR systems. For example, scanning systems including large MEMS movable structures (e.g., a MEMS mirror with a diameter larger than 5 mm) with significant displacement amplitudes/angles may generate significant stress relative to the mirror structure (e.g., silicon). Additionally, a MEMS mirror having a full thickness of the wafer material from which it was manufactured (or even the full thickness of the one or more relevant layers of the wafer) may have a mass and moment of inertia that can make high frequency scanning difficult or impossible. For example, massive, high-inertia mirrors may require impractically high voltage levels to actuate the mirrors. Such mirrors may also result in significant frequency limitations that may render them inapplicable for certain applications. For example, displacing a mirror having an active area with a diameter of about 5-10 mm to about 10-20° with respect to the reference surface may require linear displacements of over 1000 μm out of the plane. Under such constraints, it may be desirable for a light deflector of a LIDAR system to exhibit the following characteristics:

a. Large area/diameter (e.g., in order to enable collection of a larger amount of light from the scene);
b. Large displacement angles (e.g., in order to cover a wide FOV by a single deflector);
c. High operational frequency (e.g. to effectively scan the wider FOV in short time, or in a greater spatial resolution);
d. Low susceptibility to interference frequency (e.g., having low response to frequencies below 1,000 Hz or so).

Traditional MEMS systems, e.g., two-dimensional MEMS systems having a mirror whose surfaces are coplanar with corresponding surfaces of the mirror support (e.g., frame 2516 of FIG. 25), may require significant trade-offs between these characteristics. Such tradeoffs may be required, for example, as a result of the relatively massive, high inertia mirrors typical of such designs.

The disclosed embodiments may overcome one or more limitations associated with traditional MEMS scanning systems. In some cases, the disclosed MEMS scanning systems may include multilayered structures, i.e., structures constructed from two or more wafers, and fabrication techniques allowing for significant reductions in mirror mass, mirror moment of inertia, deflector assembly mass, deflector assembly moment of inertia, etc. As a result, the disclosed MEMS scanning system may offer the potential for higher operational frequencies, actuation with lower voltage levels, higher responsiveness, decreased scan times, etc. as compared to traditional MEMS scanning systems.

As described in more detail below, multilayered MEMS scanning devices may be efficiently and less expensively mass-produced, as the different wafers may be bonded to one another before the wafers are diced to form the MEMS device. In some embodiments, one or more of the wafers from which the multilayered MEMS scanning device is made may include one or more layers, in which case the bonding may be between one or more layers of a first wafer and one or more layers of a second wafer. The term "layer" as used herein refers to a functional layer of a wafer, which can include a single material layer or may include a plurality of layers of different materials constructed a single wafer and/or substrate). For example, a layer may include separately fabricated layer constituents that are assembled into a unitary structure (e.g., a layer may include a packaged assembly including a plurality of sub-layers). In all of the embodiments and processes below, some of the options in which the systems and methods may be implemented are such in which the term "layer" pertains to a single layer of a wafer made from a single material (e.g., silicon, metal, polysilicon). However, the disclosure is not limited to such implementations.

Unlike single-wafer devices, multilayer MEMS devices, i.e., MEMS devices fabricated from two or more wafers, may be more customizable in that each wafer, or each layer of one of the wafers, may be formed of a different material, different thickness, different geometrical structure, etc., based on the desired mechanical properties for a particular layer. In some cases, each sub-layer in a packaged layer stack in a MEMS scanning assembly may offer different mechanical and/or electrical properties that together contribute to an overall set of properties associated with the final assembly. Additionally, unlike traditional, single-wafer devices, multilayered MEMS devices may be manufactured in a range of geometries and configurations, some of which are impossible or impractical in single wafer devices. For example, a multilayered MEMS device may enable the use of longer actuator arms positioned at least partly behind the mirror and not just to the sides of the mirror. Such longer actuator arms may give the scanner (e.g., a MEMS mirror) a greater range of motion. The systems and methods described below may also be implemented in other types of MEMS devices including, for example, pistons, sensors, and the like.

Figure 25:
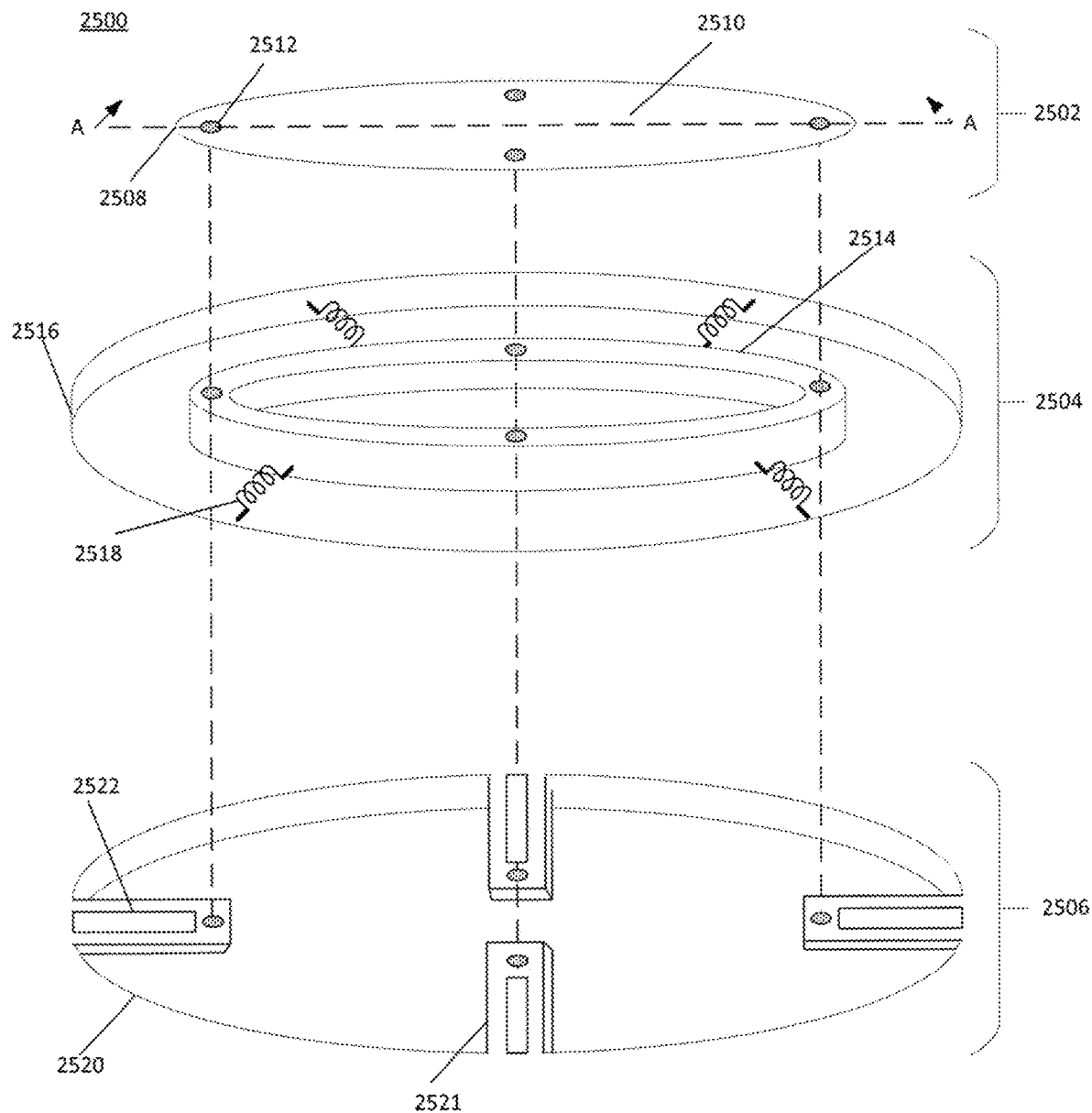
FIG. 25 is an illustration of a MEMS scanning device, consistent with disclosed embodiments.

FIGS. 25, 26, 27A, 27B, 27C, and 28 illustrate different views of several exemplary MEMS scanning devices, consistent with disclosed embodiments. Each of the drawings illustrate some aspects which may be implemented for the making of a MEMS scanning device consistent with disclosed embodiments. It is noted that the drawings are provided by way of non-limiting examples only, and aspects illustrated in different drawings may be combined in some MEMS scanning devices, and that some MEMS scanning devices which are herein disclosed may include aspects not illustrated by the drawings, or in a different manner than the drawn examples. The general description in the following paragraphs is followed by a more specific description of the different drawings. While the following description is not limited to any of the drawn examples, FIGS. 25 and 27 provide two illustrative examples of multilayered MEMS devices; In FIG. 25 each of the following three components of the MEMS scanning device is implemented on a wafer of its own: mirror, actuators, and restraining springs; In FIG. 27 the same components are divided between two wafers, and some of the components are implemented on more than one wafer. For the sake of brevity, the terms "the three components" and "the three components of the MEMS scanning device" would refer to some or all of: one or more mirrors of the MEMS scanning device, one or more actuators of the MEMS scanning device, and one or more restraining springs of the MEMS scanning device. It is noted that this usage is not intended to limit the scope of the invention in any way, and that—as described below—the MEMS scanning device may include more than these three components, and this components may also be implemented so as to share wafer parts with one another (e.g., the same piece of silicon may be used for an actuator and for a restraining spring).

In some embodiments, a MEMS scanning device, for example, for use in a LIDAR or navigational system, may include a movable MEMS mirror (e.g., 2510, 2708) configured to pivot about at least one axis; one or more actuators (e.g., 2522, 2712) configured to cause pivoting of the movable MEMS mirror about the at least one axis in at least one first direction; and one or more restraining springs (e.g., 2518, 2706) configured to facilitate pivoting of the movable MEMS mirror about the at least one axis in at least one second direction different from the at least one first direction. As used herein, "restraining springs" refers to any component or structure configured to provide a restoring force to the MEMS mirror. In some cases, the restraining springs may limit the motion of the mirror in response to actuation and may restore the mirror to an equilibrium position after actuation (e.g., once an actuating voltage signal has been discontinued). In some embodiments, the at least one second direction is opposite the at least one first direction. That is, the restoring force provided by the one or more restraining springs may be in a direction opposite to (or substantially opposite to) an actuating force intended to cause at least one displacement of the MEMS mirror. In some embodiments, the MEMS mirror may be part of a LIDAR system scanning unit. A LIDAR scanning unit may include a deflector, as described throughout the present disclosure, comprising a moveable MEMS mirror configured to pivot about at least one axis. Pivoting along a single axis, for example, may enable scanning of a LIDAR FOV along a single horizontal or vertical line. Pivoting along two axes may enable scanning of a LIDAR FOV in both horizontal and vertical directions.

The manufacturing techniques described above may be used in fabricating one or more of the components, each component being fabricated from at least one wafer, of the disclosed multilayered MEMS scanning system. For example, in some embodiments, any one of the movable MEMS mirror, the one or more actuators, or the one or more restraining springs may be constructed of at least two differing wafers with mechanical properties that differ from each other, where the at least two differing wafers are directly bonded together to form a unified structure. In some cases, two or more of the movable MEMS mirror, the one or more actuators, and the one or more restraining springs may be constructed of at least two differing wafers with mechanical properties that differ from each other, where the at least two differing wafers are directly bonded together to form a unified structure. That is, the two or more wafers in such cases together include components of at least two of the following components types: mirror, actuator, restraining spring. Optionally, the two or more wafers collectively include components of all of the following components types: mirror, actuator, restraining spring (that is: at least one mirror and at least one actuator and at least one restraining spring).

As mentioned above, the different components-which are in charge of the operational aspects of mirroring, actuation, and restraining—may be implemented in many different ways across the two or more wafers of the MEMS scanning device. Referring by way of example to the exemplary MEMS scanning device of FIG. 25, different components of the MEMS scanning device (referenced 2500 in this drawings) may be implemented in different tiers (each including one or more wafers, or one or more wafer-layers), such that each layer of wafer is used at most for one of these components (mirror, actuators, restraining springs). In some cases, the disclosed MEMS scanning devices may include three tiers: a mirror tier 2502 (interchangeably "active layer" and "mirror layer"), a restraining tier 2504 (interchangeably "restraining layer"), and an actuation tier 2506 (interchangeably "actuation layer"). Each tier may be formed of a separate wafer (or wafers) having unique mechanical properties. As an example, the mirror tier may be formed from a rigid, lightweight, and relatively thin wafer with a reflective surface or coating. The restraining tier and the actuation tier may be formed from thicker, but more flexible wafers. Unlike single-wafer scanning devices, which are restricted to a single wafer thickness, the multilayer construction including two or more wafers may allow for selection of properties relative to each layer of a wafer (whether that layer is used for one of the aforementioned three components or to more than one of them). For example, a thin layer used for the mirror of the MEMS scanning device may enable reduced mass of the mirror, allowing the MEMS scanning device to function with higher efficiency, responsiveness, frequency, and a greater range of motion. As discussed further below, other tiers (e.g., the restraining tiers)—and the wafer layers from which those tiers are made—may be fabricated to include structures that, while being formed from a single wafer, may have geometries that further contribute to the performance of the scanning system (e.g., restraining tier structures having hollow shapes, voids, etc.). In such multilayered MEMS scanning systems, the performance tradeoffs associated with single-wafer designs may be mitigated or avoided altogether.

Any or all of the components of the disclosed MEMS scanning device (also referred to as "scanning system" and "scanning device") may be constructed from a single wafer or, alternatively, may be fabricated with a multilayered structure in which structures may be formed separately from different wafers or materials and may be bonded together during the fabrication process. For example, in some of the disclosed MEMS scanning systems, at least one of the movable MEMS mirror, the actuators, and/or the restraining springs may be constructed of two differing wafers bonded together. For example, the restraining springs may include a first silicon layer constructed from a first wafer directly bonded to a second silicon layer constructed from a second wafer. In the example of FIG. 27 this is demonstrated directly by actuators 2706*a* and 2706*c*. In the example of FIG. 25 this may be achieved, by way of example, by duplicating wafer 2520, so that tier 2506 would include two copies of wafer 2520 which are bonded to each other. Any other of the other wafers in the example of FIG. 25 may also be duplicated.

The multilayered structures of the disclosed embodiments may include varying degrees of overlap with respect to one another. That is, when the MEMS scanning device is assembled, overlap parts of adjacent layers or wafers actually touch each other, while non-overlapping parts of one wafer are positioned next to an opening of a neighboring wafer of the scanning device. In some cases, such overlap may provide regions in which one layers may be bonded or joined to the adjacent layer, which is implemented on a different wafer. The overlap may also offer interfaces through which tiers of the structure may interact and/or interfaces through which the three components may interact with one another. It is noted that overlapping parts of different wafers do not have to be bonded to one another, and that overlapping parts of non-neighboring wafers may be separated from one another by an opening, or by an intermediate part of an intermediate wafer. In some embodiments, each of at least two different wafers may be used to form one or more components of the scanning system, and the at least two different wafers may include at least a first overlapping portion and at least a second non-overlapping portion. For example, the one or more actuators (possibly a part of an actuation tier 2506) may be made to overlap with the mirror (possibly a part of a mirror tier 2502) by a certain amount. In some cases, 30% of the one or more actuators may overlap with the mirror (e.g., the overlapped portions of the one or more actuators may be positioned below the mirror and may provide a bonding interface for connecting the actuators and the mirror, either directly or indirectly; an indirect connection is demonstrated in FIG. 25). In some embodiments, a wafer (or wafers) in which the mirror is implemented may include other functionalities (e.g., restraining springs) or support (e.g., frame). In another example, at least some of the actuators may be constructed of a first wafer, and at least some of the restraining springs may be constructed of a second wafer different from the first. In some embodiments, at least 25% of the first wafer may overlap with the second wafer.

In some embodiments, at least one of the wafers used to fabricate a portion of the disclosed MEMS scanning system may be formed of a plurality of layers. For example, a particular wafer may include one or more of a silicon layer, oxide layer, polycrystalline silicon layer, porous silicon layer, aluminum layer, metal layer, piezoelectric layer, and the like—in any order or configuration. As an example, the mirror may include a silicon layer (or a layer formed of another material) and a reflective coating on the silicon. In another example, the one or more actuators may have silicon regions upon which a piezoelectric material (e.g., lead zirconate titanate, hereinafter PZT) has been deposited. In another example, the MEMS mirror may be implemented on a first silicon layer of a silicon-on-insulator wafer, and a reinforcement structure of the mirror may be implemented on a second silicon layer of the same wafer, separated from the first silicon layer by an insulator layer. In some embodiments, differing wafers or different layers within the differing wafers may differ in at least one of: thickness, stiffness, material, crystal direction (e.g., 001, 010, etc.), uniformity (e.g. hole, indentations, surface deformations, etc.), and mechanical strength. As previously described, the ability to customize the properties of each wafer or layer used in the multilayered scanning device may provide greater control over the behavior and performance of the scanning system.

In some embodiments (e.g., in the example of FIG. 27), the one or more of the restraining springs may be constructed from multiple wafers and arranged such that at least one restraining spring in the system may exhibit a multilayered structure. In some cases, a first restraining spring may be stacked upon at least one other restraining spring. As an example, a single restraining "spring," which may refer to a portion of structure configured to provide a restoring force to the mirror, may be constructed from two wafers in a stacked configuration to increase the spring's resistance to movement (e.g., increase a spring constant associated with the restraining spring/member/structure). In some arrangements, a first restraining spring and a second restraining spring (from among a plurality of restraining springs, for example) may completely overlay one another. In another arrangement, the first restraining spring and the second restraining spring may only partially overlay one another. In other embodiments, the first restraining spring and the second restraining spring may share no overlapping regions.

In some examples, at least one first restraining spring and at least one second restraining spring may be bonded together to form a unitary multilayered spring structure configured to facilitate pivoting of the movable MEMS mirror (e.g., in a direction toward an equilibrium position of the mirror, in a direction opposite to an actuation direction of the mirror, etc.) In some embodiments, the wafers used to form system components such as the restraining springs may be formed of different materials. These different materials may exhibit different mechanical properties, and those mechanical properties may influence the performance of the system components, such as the restraining springs. For example, strategically arranging restraining springs having different stiffnesses relative to the mirror may cause the mirror to have a more restrictive range of motion in one direction (e.g., along an x-axis) than in another direction (e.g., along ay-axis).

In the disclosed MEMS scanning system, certain regions of adjacent wafers may be bonded to one another while other regions may remain unbonded, even if overlapping. Those areas where there is no bonding may enable movement of a first wafer relative to second wafer. On the other hand, bonded regions may directly join together two adjacent wafers without intervening layers such that at least portions of the adjacent wafers physically touch or interact with one another.

In some cases, adjacent wafers may be bonded using adhesives. For example, an adhesive may be used to bond adjacent wafers or layers together. Any other type of adhesive bonding (interchangeably "glue bonding") which is used for wafer bonding may also be used. In other cases, adjacent wafers may be bonded without using adhesives. As used herein, "adhesiveless bonding" may refer to a process in which wafers or layers are joined together without the use of an adhesive. For example, such adhesiveless bonding may include pressing adjacent wafers together under high pressure. In the disclosed embodiments, wafers or layers may be bonded together using, for example, direct bonding, surface activated bonding, plasma activated bonding, anionic bonding, eutectic bonding, etc. By using such bonding processes, wafers may be directly bonded together without the use of adhesive. Any of the disclosed bonding processes may be automated for efficient mass production of devices.

In some embodiments, the movable MEMS mirror may constitute a either a hinged or hingeless MEMS mirror. The MEMS mirror may be moved or pivoted by a number of actuators. The scanning system may include a number of movable MEMS mirrors, each movable MEMS mirror being associated with a different group of actuators and/or a different group of restraining springs. In some embodiments, the plurality of actuators are configured to cause pivoting of the movable MEMS mirror in two first directions, and the plurality of restraining springs are configured to facilitate pivoting of the movable MEMS mirror in two second directions, thereby the enabling the movable MEMS mirror to pivot about two distinct axes. For example, in one example a first actuator may enable rotation of a mirror in a positive direction about an X axis, and a second actuator may enable rotation of the mirror in a positive direction about a Y axis. In this example, a first restraining spring may produce a restoring force that may cause rotation of the mirror in a negative direction about the X axis. A second restraining spring may produce a restoring force that may cause rotation of the mirror in a negative direction about the Y axis.

As noted, the movable MEMS mirror may be constructed of a first wafer and a plurality of actuators that interact with the mirror may be constructed (partly or wholly) of one or more second wafers with mechanical properties or characteristics that differ from the mechanical properties or characteristics of the first wafer. For example, the thickness of the second wafer may be greater than the thickness of the first wafer (or at least, greater than the thickness of a device layer on which the mirror surface is manufactured). For example, the thickness of the actuators may be greater than the thickness of the mirror. Such arrangements may enable a significant range of motion produced by the actuators while reducing the mass of the mirror. In another example, the stiffness of the first wafer may be greater than the stiffness of the second wafer. In another embodiment, the movable MEMS mirror may be constructed of a first wafer and one or more of the restraining springs may be constructed of at least one second wafer with mechanical properties that differ from mechanical properties of the first wafer. In another embodiment, one or more of the actuators may be constructed of a first wafer and one or more of a plurality of restraining springs may be constructed of a second wafer with mechanical properties that differ from mechanical properties of the first wafer. It will be clear to a person who is of skill in the art that the examples provided in this paragraph are not intended to form an exhaustive list, and that other ways of implementing different functions in different wafers may be implemented in other embodiments of the disclosed scanning MEMS device.

In some embodiments, one or more of the scanning system actuators may include a layer of PZT, or any other piezoelectric material. For example, one or more of the actuators may be constructed from a wafer onto which a piezoelectric layer is formed. In contrast, the movable MEMS mirror may be constructed of a different wafer, and the piezoelectric layer may be deposited on yet another separate wafer. Such a configuration may enable pivoting of the movable MEMS mirror by activating the piezoelectric material of the one or more actuators. For example, the piezoelectric layer on one or more of the actuator structures may be activated by applying a voltage to the piezoelectric material, resulting in a mechanical strain on the piezoelectric material changing a dimension of the material. As a result, depending on the orientation of the piezoelectric material relative to an actuator arm, an applied voltage to the piezoelectric material can cause movement of a mirror actuator in a MEMS scanning system. The actuators of the present scanning systems, however, may be activated using any other suitable techniques. For example, other activation methods may include electrostatic actuation, electromagnetic actuation, electromechanical actuation.

In the presently disclosed scanning systems, the actuators may interact with the scanning mirror through any suitable interaction structure. In some cases, the material from which one or more actuators are formed may be bonded or otherwise connected directly to the mirror, and motion of the actuators may impart desired motion to the scanning mirror. In some cases, the actuators may be physically connected to a moveable MEMS mirror by interconnects (e.g., flexible interconnects whose flexibility is much higher than that of the actuators, such as by a factor of at least ×2, ×5, ×10, etc.). Motion of the actuators may be translated to the mirror through the interconnects. In some cases, the interconnects may form a continuous connection between the actuators and the mirror and may be formed of a relatively flexible material (e.g., a material that may flex in response to movement of the actuators or that may exhibit a restoring force in the absence of actuation to assist in returning the mirror to an equilibrium position).

FIG. 25 illustrates an exploded view of an exemplary MEMS scanning device 2500, consistent with disclosed embodiments. MEMS device 2500 may include three distinct tiers: a mirror tier 2502, a restraining tier 2504, and an actuation tier 2506. In other embodiments, MEMS device 2500 may include any number of tiers of various geometries configured in any order. For example, the mirror may be implemented on a first wafer, and both the actuation and restraining of the mirror may be achieved by a second wafer other than the first wafer. It is noted that any of the variations, functionalities, structures and so forth discussed below with respect to the MEMS scanning device of FIG. 25 may also be implemented if applicable to any other MEMS scanning device discussed in the present application, mutatis mutandis, even if not explicitly stated (e.g., for reasons of brevity), and even if the relevant MEMS scanning device includes components which are not neatly dividable into separate functional tiers. Furthermore, any of the variations, functionalities, structures and so forth discussed below with respect to the MEMS scanning device of any of the following figures may also be implemented if applicable to any other MEMS scanning device discussed in the present application, mutatis mutandis, even if not explicitly stated (e.g., for reasons of brevity).

Mirror tier 2502 may be formed of a wafer 2508 having an active area 2510. In some embodiments, a reflective coating may be deposited on the surface of wafer 2508 to form a flat and continuous surface (e.g., a specular surface reflective to light). In other embodiments, wafer 2508 and mirror surface 2510 may have various degrees of curvature to form a concave or convex mirror surface. Wafer 2508 and/or active area 2510 may include one or more bonding sites 2512. Bonding sites 2512 may be positioned on both the top and bottom of the mirror tier 2502, or on either one of the top or bottom of mirror tier 2502. In some embodiments, mirror tier 2502 may further include one or more reinforcement ribs formed of a rigid material. In some embodiments, the reinforcement ribs may be formed on another wafer bonded to the wafer of the mirror, e.g. within optional backing structure 2514 of FIG. 25. In some embodiments, and as shown in FIG. 25, mirror tier 2502 may be formed of a relatively thin wafer, such that it has a thickness less than other wafers used in the fabrication of the scanning device. In some embodiments, the mirror tier 2502 may be fabricated from a layered wafer 2508 (e.g., a silicon-on-insulator wafer, SOI) in which the active area 2510 of mirror tier 2502 is implemented on a thin layer (e.g., silicon) of the wafer, and a supporting substructure (e.g., reinforcement ribs such as ribs 2722 of FIG. 27B) are implemented on a thicker layer of the same wafer. The thin layer may have thickness less than other wafers used in the fabrication of the scanning device. Such a thin mirror structure may significantly reduce the mass and inertia of mirror tier 2502 as compared, for example, to two-dimensional scanning devices made primarily from a single wafer (where the mirror typically has a thickness the same as or similar to the actuators and/or restraining springs). Manufacturing the mirror tier separate from the other tiers of the scanning device may also enable fabrication of the mirror from a material having a lower density than materials used in other tiers, which may also reduce the mass of the mirror relative to traditional designs. Active area 2510 may include a reflective coating deposited on the surface of wafer 2508 or a reflective layer bonded to wafer 2508.

Restraining tier 2504 may include a backing structure 2514 disposed within a frame 2516 and held in place with one or more springs 2518. In some embodiments, backing structure 2514, frame 2516, and springs 2518 may be formed by etching a single wafer and, thus, form a unitary structure. In some embodiments, backing structure 2514 may be formed of the same material and have the same mechanical properties as wafer 2508. In other cases, however, backing structure 2514 may be formed of a different material with different mechanical properties as compared to the material of wafer 2508. In some embodiments, and as described below, frame 2516 may be formed in any geometry such that support 2514 fits within the cavity. Backing structure 2514 may be held in the frame 2516 by the one or more springs 2518. Springs 2518 may be, for example, metallic springs, wire filaments, an elastomeric material, and/or may be etched from a wafer used to form backing structure 2514 and frame 2516. In some embodiments, all of the springs may exhibit the same or similar spring constants such that they provide the same or similar restoring forces under similar displacements. In other embodiments, one or more of the springs may have a different spring constant relative to other springs in the restraining tier 2504, such that different restoring forces may be provided to the support 2514 (and, therefore, to mirror tier 2502) in response to the same or similar displacement levels. Optionally, the restraining springs and/or actuators may be connected directly to the active area 2510 and not via a support 2514 (which may or may not be implemented). The restraining springs in such an implementation may be, for example, implemented by the silicon substrate of actuators 2521, since such silicon tends to be restored to its original unstressed position. In such a case, the relative strength of springs 2518 may be significantly lower, possibly serving mostly as a flexible interconnect to the support of the mirror. An example in which the restraining springs are implemented together with the actuators is provided with respect to FIG. 27A.

As noted, in some embodiments, springs 2518 may be relatively thin and may be etched from the wafer used to provide frame 2516 and form support 2514. In other cases, springs 2518 may be thicker than the mirror and/or from the actuators. In some cases, controlling the etched thickness of springs 2518 may enable selection of a desired spring constant. In other cases, higher spring coefficients may be achieved, for example, by stacking more than one restraining wafer on top of one another, e.g., as described below with reference to FIG. 27A. Restraining elements of different restraining tiers (if implemented) may be co-located in vertical planes (i.e., may partly overlap each other). The number of restraining elements (e.g., springs 2518) in each restraining tier may be the same or different than the number of actuators of the actuation tier. Additionally, the number of restraining elements (e.g., springs) in different restraining tiers may be the same or different from one another. Distributing springs (or other restraining elements) among different tiers may enable the use of thinner restraining tiers (e.g. 5-10 μm). The structure and the number of restraining tiers included in a particular scanning system, and the number and structure of associated springs may be determined based on operational frequency requirements (e.g. scanning frequency) of the scanning system. In some cases, it may be desirable to have a certain frequency response profile provided by the restraining elements. For example, it may be desirable to have a low response to frequencies below 2,000 Hz, 1,000 Hz, 700 Hz or 250 Hz, etc., where vibrations associated with vehicle operation may occur.

Springs 2518 may be configured to provide a restoring force to the mirror 2510 (e.g., via support 2514) in response to displacement of the mirror 2510 and/or backing structure 2514 caused by forced applied by actuators 2521. For example, springs 2518 may resist the motion imparted to the mirror 2510 by actuators 2521, such that subsequent to an actuation event in which the mirror 2510 is displaced, the restoring force provided by springs 2518 may pull the displaced mirror into its original position (e.g., an equilibrium position when no actuators are activated). In some embodiments, springs 2518 may also mitigate the effects of low-frequency vibrations on the mirror. For example, in a LIDAR system, springs 2518 may lessen the effects of vibrations caused by vehicle movements, engine operation, road surface irregularities, etc.

Actuation tier 2506 may be formed of a wafer 2520 into which is etched or otherwise formed one or more controllable actuators 2522 disposed on arms 2521 extending from the frame formed by an opening in wafer 2520. The actuators 2521 may optionally be formed within an opening etched or otherwise formed in wafer 2520. Actuators 2521 may provide force to move and/or pivot the mirror 2510. In one embodiment, actuator 2521 may be made wholly or partially of semiconductor (e.g., silicon). On each arm 2521 of the actuators may be formed a piezoelectric layer (e.g. PZT, aluminum nitride, etc.), which changes in dimension in response to electric signals applied by an actuation controller, for example.

In some embodiments, one or more actuators 2521 may be formed wholly or partially from a piezoelectric material, e.g., PZT, that deforms when a voltage is applied. In some embodiments, wafers 2516 and 2520 may overlap in the scanning system assembly by any suitable amount or degree such that certain portions of the structures in the restraining tier at least partially overlap structures in the actuation tier. For example, the wafer 2520 used to form actuation tier 2506 may overlap the wafer 2516 of the restraining tier such that at least 25% of the area on a surface of the restraining tier wafer overlaps with an adjacent surface of the actuation tier. In other embodiments, any combination of wafer 2508, backing structure 2514, frame 2516, and springs 2518, and wafer 2520 may partially or completely overlap. In some embodiments, more or fewer actuators than shown in FIG. 25 may be used. Different configurations of actuators, for example, may provide symmetric or antisymmetric actuation. Other actuation techniques known in the art may also be used, in addition to or instead of piezoelectric actuation.

As shown in FIG. 25, a PZT layer 2522 may be included on each actuator arm. In some embodiments the PZT layer 2522 may be disposed on only one side of the actuator arm. Such a configuration may enable motion of the actuator primarily in one direction (e.g., an upward bending of each actuator arm). In other cases, a PZT layer may be disposed on both sides of the actuator arm. Such a configuration may enable movement of each actuator arm in more than one direction (e.g., an upward bending and a downward bending of each actuator arm).

In some embodiments, the arms 2521 of the actuation tier 2506 may provide the restoring force directly to the mirror 2510 (e.g., where the retaining springs 2518 are omitted in favor of using arms 2521 as retaining springs). In such cases, the PZT structures on arms 2521 may function as the actuating elements responsible for pivoting the MEMS mirror in a first direction, and the arms 2521 may be responsible for providing a restoring force to the MEMS mirror in order to pivot the mirror in a direction opposite to the first direction (e.g., after an actuation applied to a PZT structure is discontinued). Referring to the mechanical couplings of different elements of MEMS scanning system 2500 to one another (e.g., actuators, springs, mirror, frame, support, arms), it is noted that some or all of these couplings may be rigid (e.g., direct bonding), while some or all of these couplings may be flexible (e.g., connected via flexible interconnects or via flexible parts of the respective components of MEMS scanning system 2500).

In some embodiments, MEMS scanning device 2500 may include additional tiers and/or components, some or all of which may optionally be implemented on wafers other than these used for the actuation, restraining and actuation tiers. For example, a transparent wafer may be positioned in front of the mirror tier for transmission of light to and from the mirror. In some embodiments, an additional tier (not shown) may hold the mirror's controller and/or driving circuitry.

The tiers included in scanning device 2500 may be bonded to one another at any suitable location. In some cases, the interlayer bonding may be accomplished through designated coupling surfaces 2512, for connecting one tier to another tier—either below or above it. While the different tiers of device 2500 in FIG. 25 are shown as being bonded through certain coupling surfaces 2512 (through which the vertical dashed lines extend), any number of coupling surfaces or bonding locations may be used to join adjacent wafers to one another. As previously noted, adjacent wafers may be bonded to one another via any suitable bonding technique, such as, for example: direct bonding, surface activated bonding, plasma activated bonding, anodic bonding, eutectic bonding, pressure sensitive adhesives, bonds formed through intermediate or intervening buffer layers, etc. In some embodiments, bonding techniques that may be implemented at relatively low temperatures (e.g., below 150°, 200° Celsius) may be used to bond wafers without disrupting the actuation material, e.g., the deposited PZT. With respect to any of the tiers discussed below, each tier (or tier type) may include more components than illustrated and/or discussed, and possibly also to omit some.

Figure 26A:
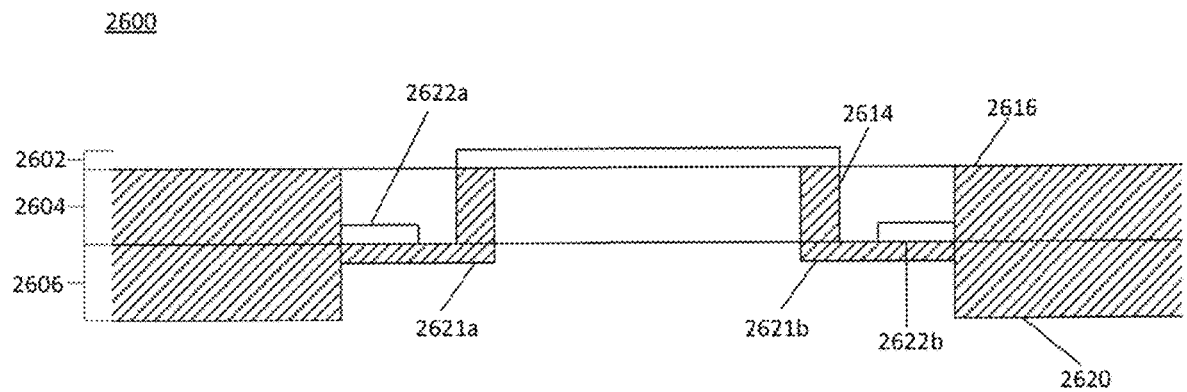
FIGS. 26A-26C are illustrations of a cross-sectional area of a MEMS scanning device, consistent with disclosed embodiments.
Figure 26B:
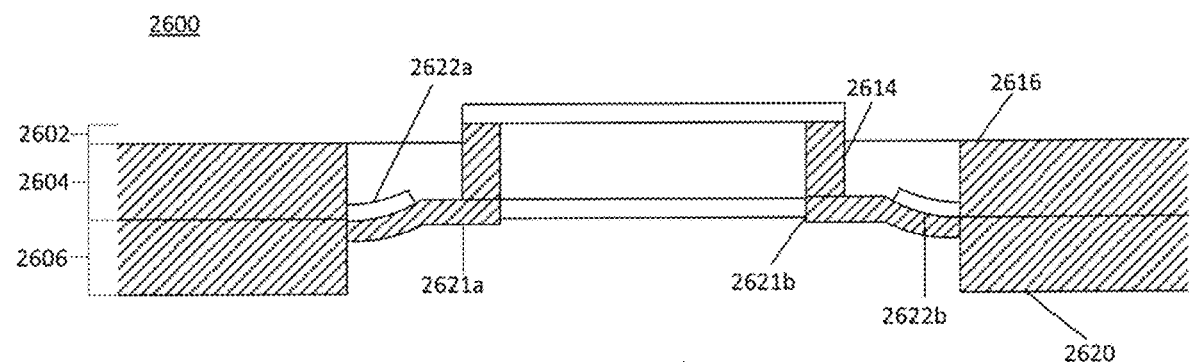
Figure 26C:
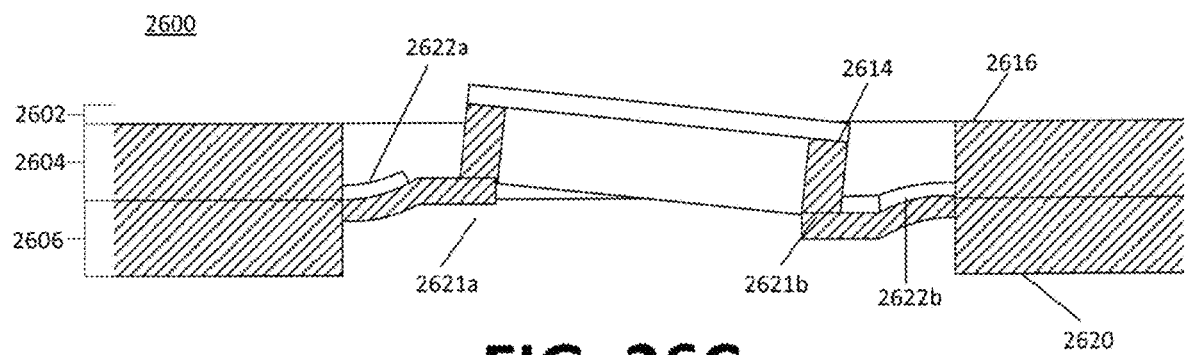

FIGS. 26A-26C are illustrations of a cross-sectional view of an exemplary MEMS scanning device 2600 having a mirror tier 2602, a restraining tier 2604, and an actuation tier 2606. In a nonlimiting example, the cross-sectional views of FIGS. 26A-26C may be cross section of MEMS scanning device 2500 along line A-A shown in FIG. 25. Mirror tier 2602 may be the same as mirror tier 2502 and may include a thin wafer with a reflective coating (or, as mentioned above, a thin device layer with a reflective coating). Restraining tier 2604 may be the same as restraining tier 2504 and may be formed of a single wafer. Restraining tier 2604 may include frame 2616 and backing structure 2614. Actuation tier 2606 may be the same as tier 2506 and may include a wafer 2620 with arms 2621*a* and 2621*b* supporting actuators 2622*a* and 2622*b*, respectively. tiers 2602, 2604, 2605 may be bonded together at a high pressure to form a single structure 2600. Tiers 2602, 2604, and 2606 may be implemented on two wafers, on three wafers, or more. In each of these cases, two or more tiers may be formed on one wafer, as long as two or more differing wafers are used.

FIGS. 26A-26C show the MEMS scanning device in different actuation states. For example, FIG. 26A illustrates an equilibrium position of device 2600 where no voltage is applied to any actuators of the actuating layer 2606. As a result, backing structure 2614 and its associated mirror tier are in an equilibrium position. FIG. 26B illustrates the state of scanning device 2600 when both actuators 2622*a* and 2622*b* have a voltage applied. When a voltage is applied to actuators 2622*a* and 2622*b* located at 180 degrees relative to one another, the subsequent upward bending of these opposite side actuators results in displacement of the entire support and mirror upward thereby raising backing component 2614 and mirror tier 2602. FIG. 26C, on the other hand, shows tilting of the backing component and mirror assembly by actuation of actuator 2622*a* differently relative to an opposite side actuator 2622*b*. For example, in some cases, actuator 2622*a* may be actuated while actuator 2622*b* is left inactive. In such a case, the upward bending of actuator 2622*a* and lack of bending of actuator 2622*b* will cause the mirror to tilt. Such tilting of the mirror may also be achieved (where available) by causing one actuator to bend in a direction opposite to another actuator. For example, as shown in FIG. 26C, actuator 2622*a* has received an applied voltage causing an upward bend while actuator 2622*b* has received an applied voltage causing a downward bend. As a result, the mirror is tilted about an axis normal to and extending through the center of the cross-sectional view of FIG. 26C. In another example, the mirror may reach the position shown in FIG. 26C from its position shown in FIG. 26B by removing the voltage applied to actuator 2622*b*, thereby allowing the tension of arm 2621*b* to pull the mirror into a tilted position. From the actuation states shown in both FIGS. 26B and 26C, once the applied voltages are removed, the actuators 2622*a* and 2622*b* can relax, and the springs of the restraining tier (whether implemented in a separate wafer, as the same arms 2622, or in any other ways) can assist in returning the support/mirror to its equilibrium state.

Figure 27A:
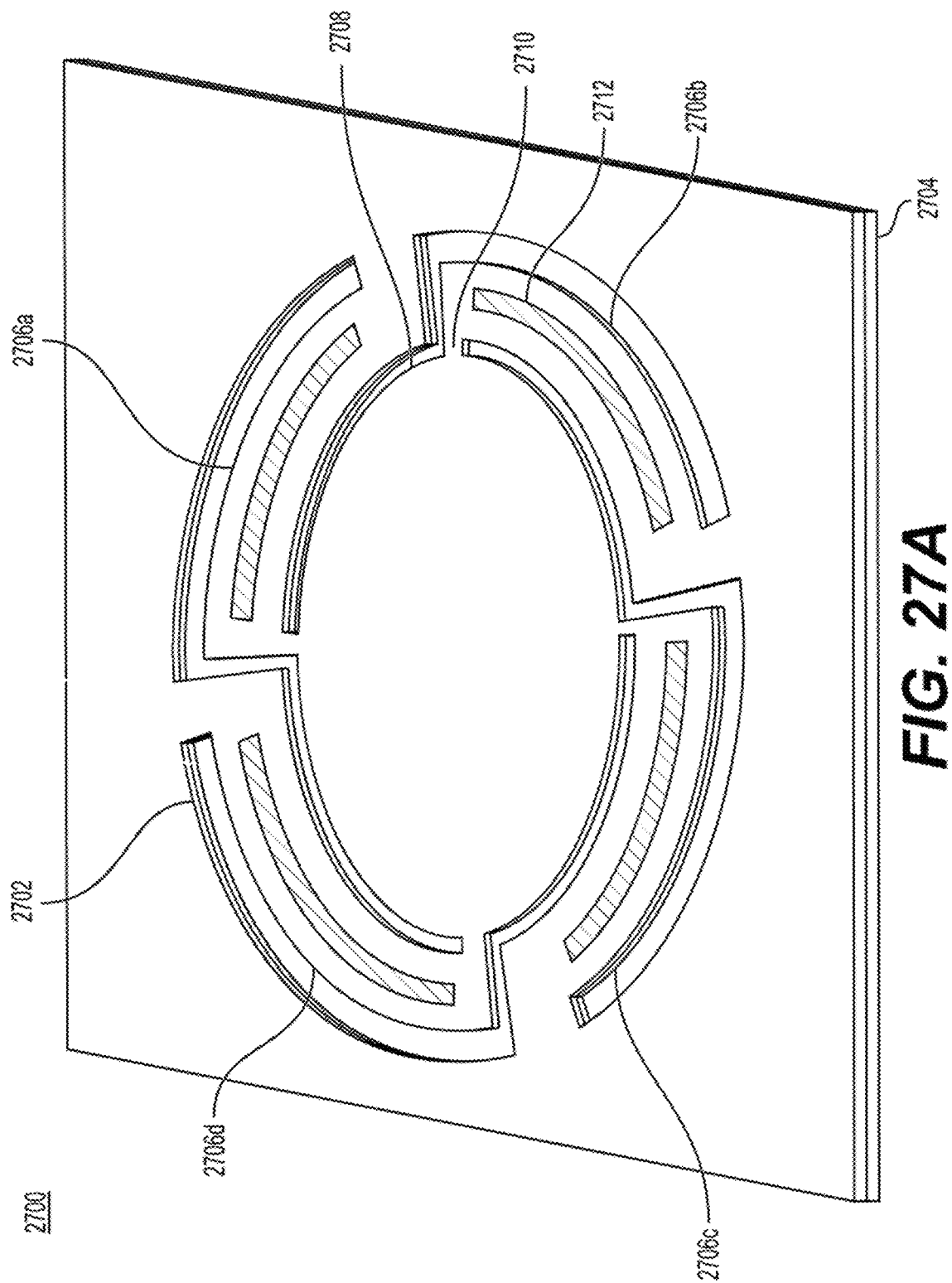
FIG. 27A-27C are illustrations of exemplary configurations of a MEMS scanning device, consistent with disclosed embodiments.

FIG. 27A is an illustration of another exemplary embodiment of a multilayered two-dimensional MEMS scanning device. MEMS device 2700 may include two wafers 2702 and 2704 (including corresponding structures fabricated from the wafers) bonded together (e.g., using one of the previously described direct bonding methods). Wafer 2702 may be formed of a different material than wafer 2704, or be otherwise different therefrom. In some cases, wafer 2702 may have at least one mechanical property (e.g., rigidity, flexibility, toughness, tensile strength, etc.) that is different from that of wafer 2704. Wafer 2702 may form a frame and four arms 2706*a*, 2706*b*, 2706*c*, and 2706*d*. Each arm may be joined to the active area/mirror 2708 by a flexible connector 2710. In some embodiments, the arms and flexible connectors may be formed by etching away portions of a wafer.

In some embodiments, piezoelectric actuators 2712 may be disposed on each of the four arms. When a voltage is applied to one or more of the actuators 2712, the actuator may contract, causing its respective arm to lift the active area 2708 upward via its respective connector 2710. Vertical translation of the active area/mirror without tilting may be accomplished by activating all of the actuators such that all displace equally upward. On the other hand, tilting of the active area/mirror may be accomplished, for example, through differently actuating opposing arms.

Arms 2706*a*, 2706*b*, 2706*c*, and 2706*d* may act as restraining springs by providing a restoring force to active area 2708 via flexible connectors 2710. For example, each arm may exhibit a particular stiffness to provide a restoring force to the mirror in the absence of an actuation signal applied to a corresponding PZT structure/actuator located on the arm.

In some embodiments, arms 2706*a*, 2706*b*, 2706*c*, and 2706*d* may be formed of a single wafer or even a single wafer-layer, e.g., wafer 2702. In such an embodiment, each arm may have the same mechanical properties, e.g., the properties of wafer 2702, and may have the same mechanical properties of each other.

In another embodiment, one, some or all of arms 2706*a*, 2706*b*, 2706*c*, and 2706*d* may be formed of two or more different numbers of wafers. For example, as shown in FIG. 27A, two arms, arms 2706*a* and 2706*c*, may be formed of two wafers 2702 and 2704, while the other arms, 2706*b* and 2706*d*, may be formed of a single wafer, e.g., wafer 2702. Etched wafer 2704 may form two arms (arms 2706*a* and 2706*c*) and may be bonded to wafer 2702 using a previously described method, e.g., contact bonding, plasma bonding, and the like.

In embodiments in which the arms have differing numbers of wafers and/or differing number of wafer layers, different arms may have different properties based on the number of wafers and/or layers and/or mechanical properties of the wafers and/or layers forming each of the arms. For example, arms 2706*b* and 2706*d* may have a different range of motion than arms 2706*a* and 2706*c*. As an example, if each actuator 2712 exerts the same amount of force upon activation, arms 2706*a* and 2706*c* may experience less displacement as a result of the additional resistance provided by wafer 2704.

The degree of motion of each respective arm may be at least partially dependent on the materials used to form that arm and also based on the structure of the arm. For example, arms 2706*a* and 2706*c* may offer a greater range of motion than arms 2706*b* and 2706*d* if arms 2706*a* and 2706*c* are made from a more flexible material than arms 2706*b* and 2706*d*. In such embodiments, similar actuation voltages applied to the actuators of arms 2706*a* and 2706*b* may result in different degrees of motion.

In some embodiments, the one or more actuators (whether or not implemented as an actuation tier) may be constructed of wafer 2702 so as to include arms 2706*a*, 2706*b*, 2706*b*, and 2706*d* and actuators 2712. It is noted that the term "actuator" may pertain to only the active parts of the scanning device (e.g., to the PZT layer), but may also be used to refer to a larger structure which further include a passive part of the MEMS scanning device that moves together with the active part or which carries it (e.g., to both the PZT part and the silicon part of the respective arm). Furthermore, in some implementation the active PZT part may be implemented not as part of a wafer but rather as a stand alone PZT component which is bonded to a wafer (e.g., to a silicon arm of that wafer).

The one or more restraining springs (whether or not implemented as a restraining tier) may be formed of wafer 2704 and include arms 2706a and 2706c. In some embodiments, the one or more restraining springs may be formed of all the arms. Thus, the wafers forming the one or more actuators and the one or more restraining springs may include overlapping portions and non-overlapping portions. For example, overlapping portions 2706a and 2706c and non-overlapping portions 2706b and 2706d. In some embodiments, at least 25% of the wafer 2702 overlaps with wafer 2704. In other embodiments, e.g., device 2500 shown in FIG. 25, the surface area of support 2514 or the surface area of arms 2521 may be varied such that the actuation tier 2506 and restraining tier 2504 overlap to varying degrees.

Figure 27B:
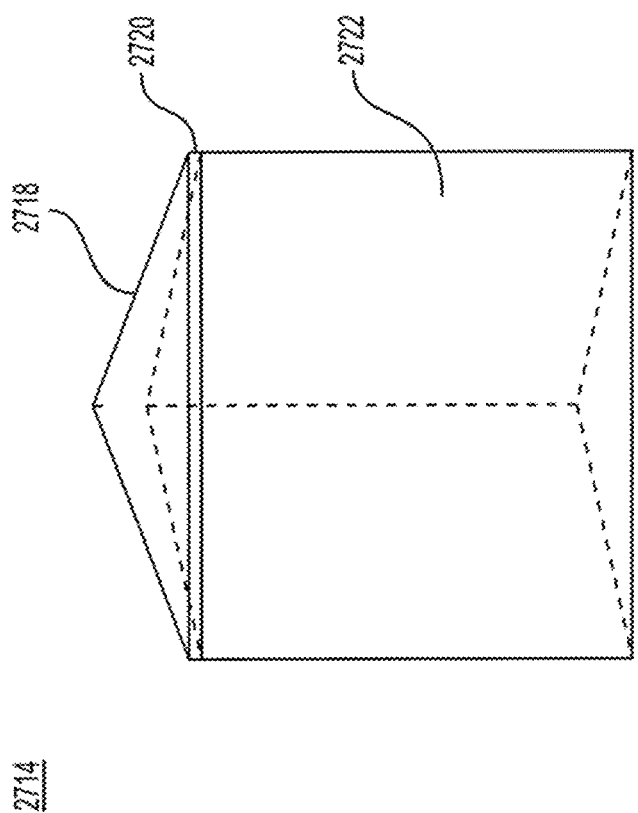

FIG. 27B illustrates an embodiment of a mirror tier 2714. Mirror tier 2714 may include an active layer 2718, e.g., a reflective coating, deposited on a wafer 2720. Wafer 2720 may be etched to include one or more voids defined by ribs 2722. The voids may be etched into wafer 2720 (e.g., at a handle layer of a SOI multilayered wafer) or may be formed as a result of bonding one or more components together to form a three-dimensional structure. Ribs 2722 may provide mechanical strength, stability, and/or durability to mirror tier 2714 without adding excess mass to the tier. Thus, ribs 2722 may reinforce mirror tier 2714 while adding less mass than a solid reinforcement layer. The number of voids and/or ribs 2722 may vary depending on the desired mechanical properties and/or desired mass of mirror tier 2714. It is noted that the mirror components of FIG. 27B may also optionally be implemented in a wafer which includes at least a part of one or more actuator and/or of one or more restraining springs, and not necessarily as a standalone tier.

Figure 27C:
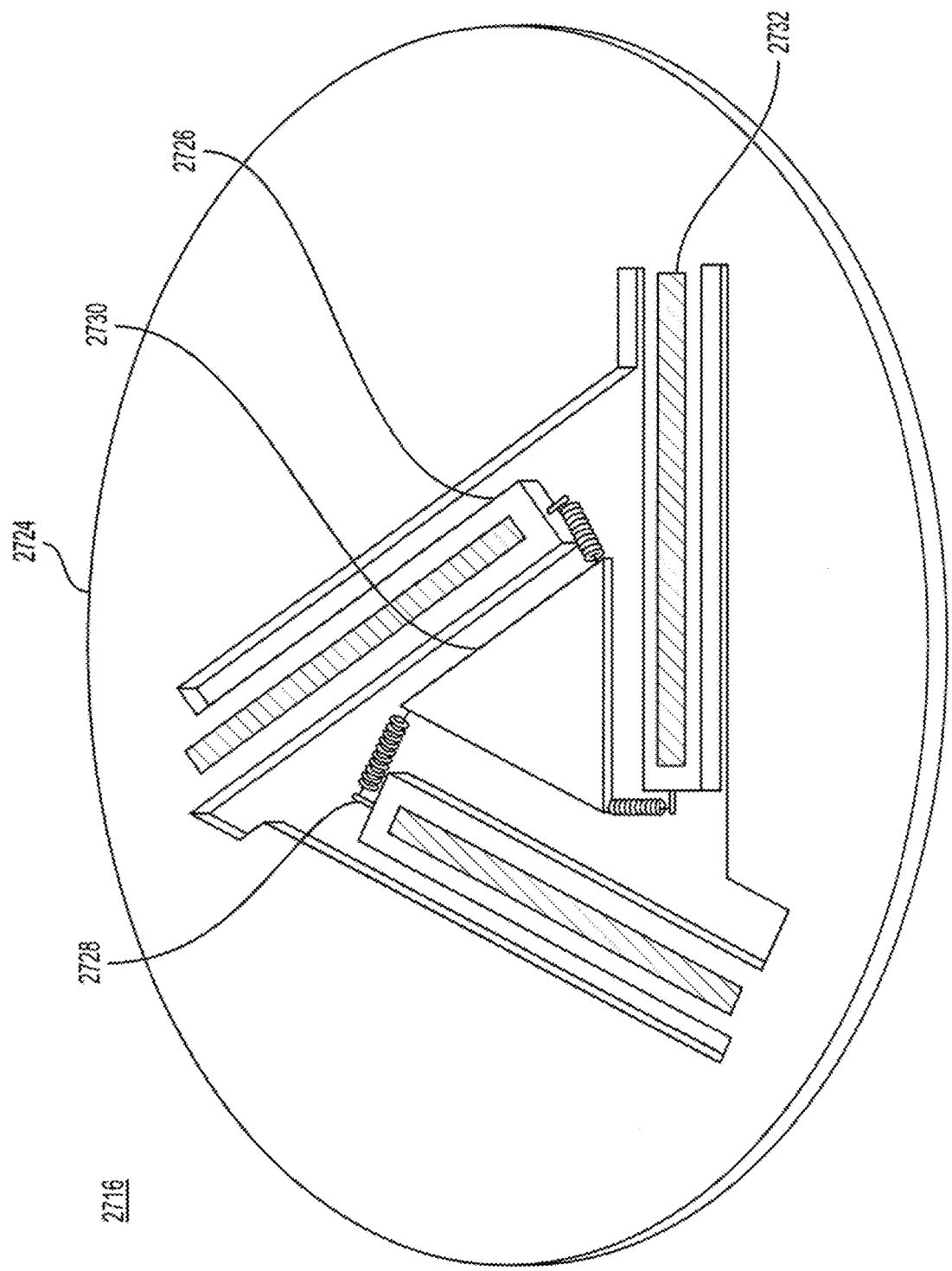

FIG. 27C illustrates a wafer which includes the actuation and restraining components of a MEMS scanning device (i.e., at least one actuator and at least one restraining spring), collectively referred to as tier 2716. The actuators and restraining springs of FIG. 27C can be connected, for example, to the mirror tier of FIG. 27B. Tier 2716 may include a wafer 2724, e.g., a silicon wafer, into which a plurality of arms 2726, flexible connectors 2728, and support area 2730 are etched. The illustrated example includes three arms, which enable two-dimensional scanning of the mirror. The lower surface of mirror tier 2714 may be bonded to the support area 2730 using one of the previously described bonding methods. Each arm 2726 may include an actuator 2732, e.g., PZT layer. Each arm 2726 may function as a restraining spring that provides a force to return the device to an equilibrium position after activation of one or more of the actuators 2732. In addition, each arm 2726 may restrict the motion of the mirror tier 2714 by limiting the motion of an activated actuator, e.g., by resisting deformation caused by the contraction of an actuator. Tier 2716 may further include flexible connectors 2728, which are etched from the wafer 2724 such that the mirror tier 2714 is indirectly acted upon by each actuator 2732.

Figure 28:
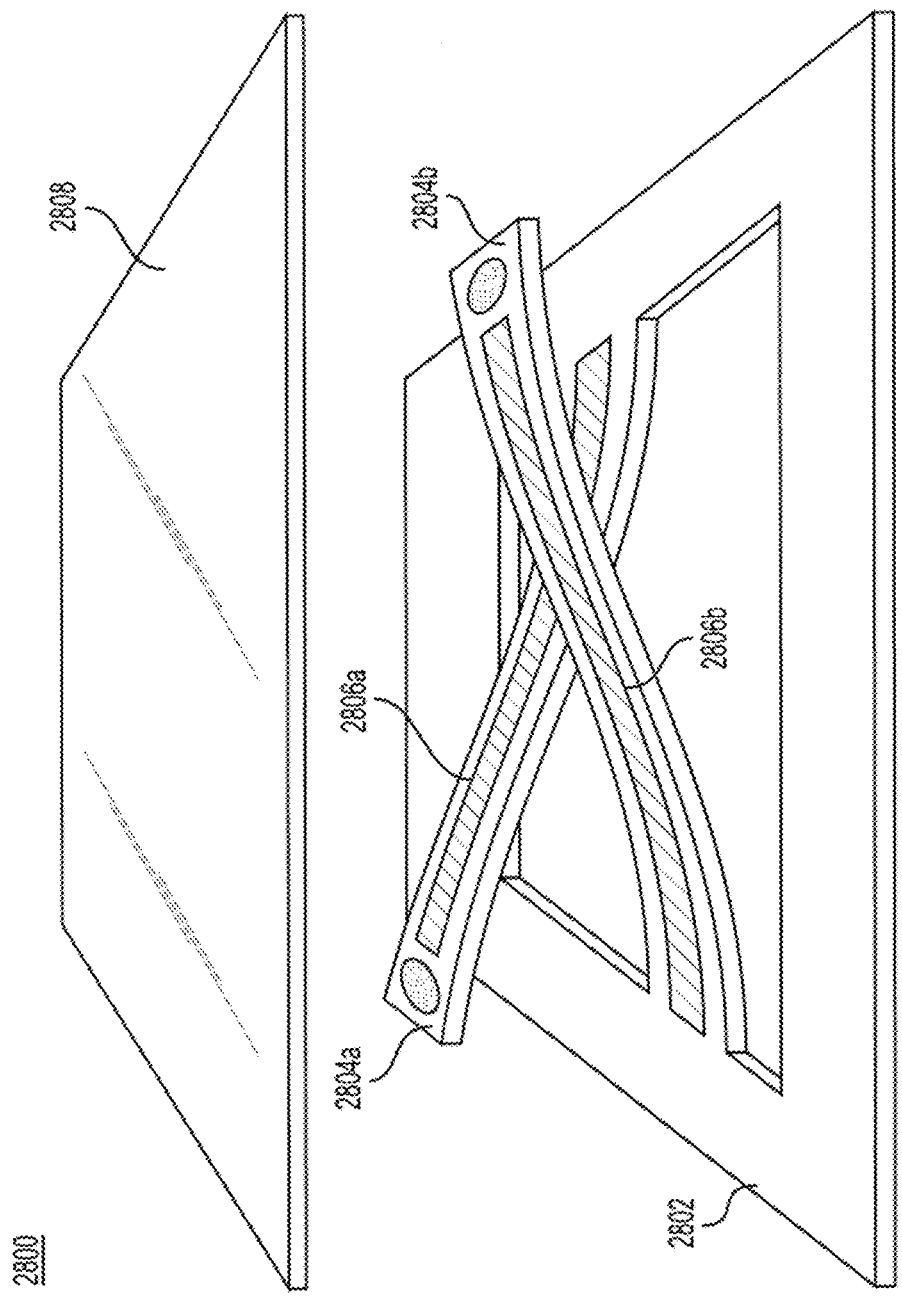
FIG. 28 is an illustration of an exemplary configuration of a MEMS scanning device, consistent with disclosed embodiments.

FIG. 28 is an illustration of another embodiment of a one-dimensional MEMS scanning device, consistent with disclosed embodiments. MEMS device 2800 is formed of a mirror 2808 implemented on one wafer, and a second single wafer 2802 which includes both actuators and restraining springs (and therefore may be considered as acting as both the actuation tier and the restraining tier). Mirror 2808 may be formed of a wafer having a reflective coating, as previously described. Flexible wafer 2802 may be formed into a frame having one or more arms 2804a and 2804b. Each arm may be bonded to piezoelectric actuators 2806a and 2806b, respectively, configured to contract when a voltage is applied, thereby deforming the arm on which the actuator is deposited and raising the respective side of mirror 2808. Each arm 2804a and 2804b may additionally act as a restraining spring by resisting deformation and pulling the mirror 2808 back into its equilibrium position.

In some embodiments, the mirror 2808 may be pivoted to varying degrees along a central axis by activating each actuator 2806a and 2806b in combination or individually, simultaneously or in tandem. In other embodiments, the movement of the mirror may be modified by, for example, changing the geometry of one or both arms, depositing the piezoelectric material in a different geometry on one or both arms, and/or bonding the mirror tier 2808 to a different area of one or both arms. Thus, the mirror may pivot to scan a FOV without the use of a hinge. Alternatively, a hinge may be implemented (e.g., as part of the mirror tier 2808, connected between the mirror and its frame (not shown), in order to restrict the pivoting movement to pivot about the mechanical hinge.

A MEMS Scanning Device with a Bent Interconnect

Figure 29:
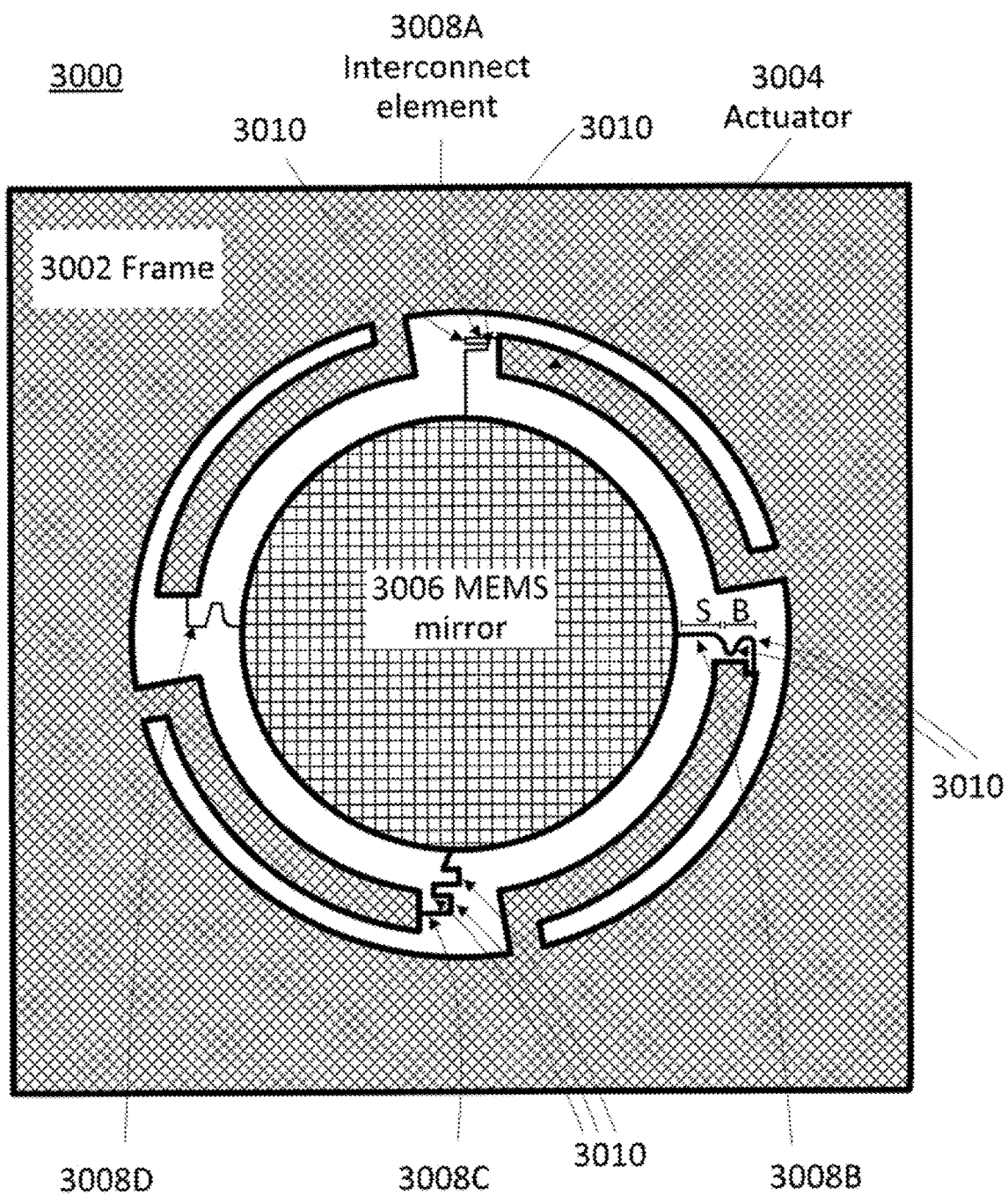
FIG. 29 provides a diagrammatic representation of a MEMS scanning device in accordance with examples of the presently disclosed subject matter.

FIG. 29 illustrates MEMS scanning device 3000 in accordance with examples of the presently disclosed subject matter. MEMS scanning device 3000 may be used in a LIDAR system (e.g., LIDAR system 100 or any other scanning LIDAR system), in another electrooptical system (e.g., a camera, a scanning electronic microscope, video projector), or in any other system.

MEMS scanning device 3000 (hereinafter also MEMS device 3000) may include a movable MEMS mirror 3006 which configured to pivot about at least one axis (i.e., 1D scanning mirror, 2D scanning mirror). For example, MEMS mirror 3006 may rotate with respect to a plane of frame 3002 which provides structural stability to MEMS device 3000. In other implementations, other types of pivotable surfaces or structures which are actuated by one or more actuators 3004 to rotate about at least one axis may also be implemented instead of a scanning MEMS mirror, mutatis mutandis.

MEMS scanning device 3000 include one or more actuators 3004 which are operable to rotate MEMS mirror 3006 about the at least one axis. In the illustrated example there are four actuators 3004, but any other number of actuators may also be implemented. The actuators may be piezoelectric actuators, electromechanical actuators, or any other type of actuation known in the art (e.g., as exemplified above). Each actuator 3004 out of the at least one actuator is operable to bend upon actuation to move the MEMS mirror 3006. The actuators 3004 may bend in a direction perpendicular to a plane of the MEMS mirror (if flat) and may also bend in other directions.

The at least one actuator 3004 is connected to the MEMS mirror 3006 by one or more flexible interconnect element 3008 which are connected between the at least one actuator 3004 and the MEMS mirror 3006 and which are used for transferring the pulling force generated by the bending of the at least one actuator 3004 to MEMS mirror 3006. It is noted that in some instances, other mechanical forces (e.g., push, twist) may also be transmitted from the one or more actuators 3004 to the MEMS mirror 3006 via the one or more flexible interconnects elements 3008. Each actuator 3004 may be connected to the mirror by a single flexible interconnect element 3008 or by one than one flexible interconnect elements.

The flexible interconnect elements 3008 may be made from the same material and wafer layer (or layers) as the actuators 3004 (or part thereof). For example, the actuators may include a silicon layer body, a piezoelectric element (of a piezoelectric layer of the wafer) that is configured to bend the body and move the MEMS mirror when subjected to an electrical field, and metal electrodes for applying the electrical field to the piezoelectric element. The flexible interconnect in such an example may be made from the same silicon layer, having the same thickness. Regardless of the exact shape of the flexible interconnect element 3008, it is significantly narrower (in the plane of the mirror/frame) than a width of the actuator 3004 to which it is connected. For example, the flexible interconnect element 3008 may be more than 10× thinner than the respective actuator 3004, more than 20×, 50×, 75×, 100×, and so on thinner. It is noted that the flexible interconnect element 3008 may be connected to the respective actuator at different parts—towards an outer side of the actuator 3004 (e.g., as illustrated for interconnect elements 3008A and 3008B), towards an inner side of the actuator 3004 (closer to MEMS mirror 3006, e.g., as illustrated for interconnect element 3008D), or in an intermediate position between the inner side and the outer side (e.g., as illustrated for interconnect element 3008C and an opposing inner side closer to the movable MEMS mirror than the outer side, wherein the first torsion spring is connected to the opposing inner side of the first actuating arm and the second torsion spring is connected to the outer side of the second actuating arm. The way the stresses spread across scanning MEMS device 3000 in the different options are obviously different and may be selected for improving the performance of MEMS device 3000 (e.g., improving frequency of scanning, angle of scanning, and so on).

As exemplified in FIG. 29, each of the one or more flexible interconnect elements 3008 of MEMS device 3000 is an elongated structure which includes at least two turns 3010 at opposing directions, each turn greater than 120°. Turns 3010 of a flexible interconnect element 3008 are at opposing direction if one of the turns 3010 is at a clockwise direction and the other turn 3010 is at a counterclockwise direction.

In the illustrated examples, different turns 3010 are at different angles. For example, some or all of the turns of an interconnect may be at angles greater than 150°, of about 180°, or even at reflex angles which are greater than 180°. The turns 3010 may be continuously curved turns (e.g., as exemplified with respect to the example of interconnect element 3008B), but may also include one or more angled corners (e.g., as exampled by interconnect elements 3008A and 3008C). Flexible interconnect element 3008D illustrates that different types of turns 3010 may be implemented in a single interconnect element 3008. It is noted that the illustrated MEMS device 3000 includes four different types of flexible interconnect elements 3008 for the sake of example only. In other cases, some or all of the interconnects 3008 of MEMS scanning device 3000 may be identical to each other. Also—while all of the actuators 3004 are illustrated as identical and similar to each other, this is not necessarily the case. It is noted that in addition to the two or more turns 3010 which are greater than 120°, a flexible interconnect element 3008 may also include additional turns. For example, a flexible interconnect element 3008 may include one or more additional opposing turns of at least 75°.

As exemplified by flexible interconnect elements 3008A and 3008B, a flexible interconnect element 3008 may include a substantially straight portion which is substantially perpendicular to an edge of the MEMS mirror 3006. The straight portion of the interconnect elements 3008 may be connected directly (as illustrated) or indirectly to the MEMS mirror 3006. While not necessarily so, the straight portion may be longer than a bent part of the flexible interconnect element 3008 that includes the at least two turns 3010 (e.g., as illustrated for element 3008A). Optionally, the bent part of the flexible interconnect 3008 has an accumulated width (e.g., in the radial direction of the illustrated circular MEMS mirror 3006) that is shorter than that of the elongated part (exemplified for interconnect element 3008B by the widths "S" and "B" in the diagram).

The plurality of turns 3010 of the interconnect element 3008 allow it to elongate in the radial direction, and thus a flexibility in the distance between the connected actuator 3004 and MEMS mirror 3006 (both absolutely, and in the projection on the plane of MEMS mirror 3006). The plurality of turns 3010 may also allow for dissipation of stresses which may be generated if a single 900 turn was implemented instead, for example. The two or more turns 3010 allow the flexible interconnect element to "open up" the turns 3010, either in the plane of the MEMS mirror 3006 and/or perpendicular thereto.

Having the bent part of the flexible interconnect 3008 designed with a relatively narrow accumulated width (e.g., shorter than the widths of the respective actuator 3004 and/or shower than the width of the elongated part of the same interconnect element 3008) can be used for various reasons. For example, such a configuration may enable to have the bent part (also referred to as "twisted part") move (e.g., spread its curls or "open") primarily in the vertical direction, perpendicular to the plane of MEMS mirror 3006. Thus, instead of creating twisting forces and movement applied to the flexible interconnect element (e.g., if a single 900 angle is implemented), the bending of the actuator is translated to a movement which is mostly happening in the vertical direction. Thus, it uses the energy of the actuator 3004 more efficiently for the lifting of the part of the MEMS mirror 3006 connected to the actuator 3004 by the respective interconnect element 3008. A similar configuration may also be used to share the stress more evenly across different parts of the interconnect elements 3008 and/or across different parts of the respective actuator 3004, and even to apply the greater stresses during the bending of the actuator 3004 and expansion/elongation of the interconnect element 3008 towards the MEMS mirror 3006 and the part of the flexible interconnect element 3008 closer to the MEMS mirror 3008.

Polygon Deflector

As mentioned above, different types of scanning/movable deflectors may be used in LIDAR systems (e.g., in LIDAR system 100). One type of scanning deflectors is scanning polygons which spin (usually in very high angular velocities), whose facets act as mirror and/or prisms which deflect light projected onto the facet(s) of the polygon. The polygon is a 3D structure made from a reflective and/or transparent material, having a polygonal intersect. The 3D structure may be a polygonal prism, but this is not necessarily so, and a wide variety of polygonal scanners of non-prism shapes are known in the art. The spinning polygon scanner may be surrounded by a thin medium such as air, nitrogen or vacuum in order to decrease drag forces on the spinning polygonal scanner. However, in some systems it is useful to immerse the polygon scanner in a fluid, e.g. in order to reduce the effect of mechanical impacts on the deflector (e.g., resulting from the movement of a moving vehicle). The refractive index of the liquid 3106 may be selected to resemble (or be equal to) the refractive index of the tank 3104, in order to reduce the optical effects on light passing between these two media.

Figure 30A:
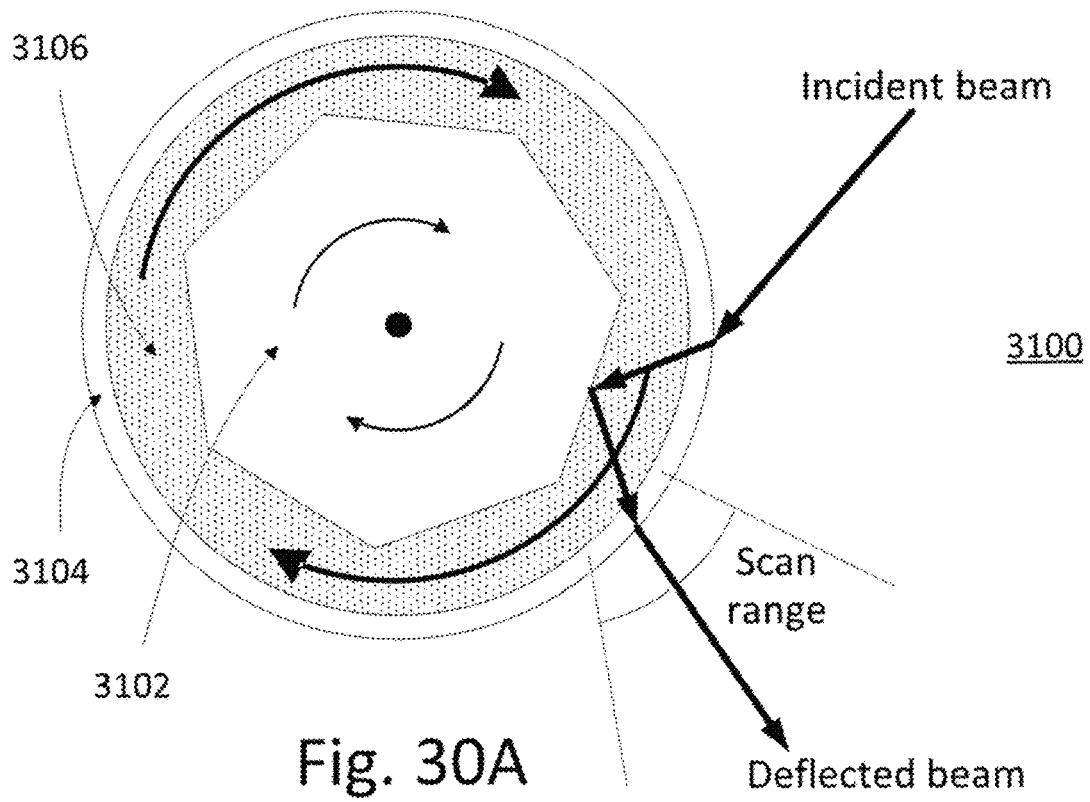
FIGS. 30A-30F provide diagrammatic representations of examples of reflective scanning polygons in accordance with examples of the presently disclosed subject matter.

FIG. 30A illustrates a reflective scanning polygon 3102 immersed in a tank 3104 of liquid 3106. Each facet of the polygon 3102 (or at least some of them) reflects light that hit it similarly to a mirror. Since the polygon 3102 is rotating, a fixed laser beam impinging upon the polygon 3102 is scanned over a field of view for each facet. Scanning in the vertical dimension (if implemented) may be achieved in different ways, such as including an additional scanner for the second axis, implementing non-vertical facets in differing angles, or implemented facets in different angles one above the other (using one or more light sources). Some examples of such polygonal scanners are provided with respect to FIGS. 31A, 31B and 31C. It is noted that beams coming from different directions (e.g., in the field of view of the LIDAR system) may also be scanned in a similar manner toward a sensor (or another target, whether part of an electrooptical system or not). The reflection of the light-source beam and that of the returning beam may be implemented on the same one (or more) of the facets. Examples of some such polygons 3102, which may be used in any of the deflectors of FIGS. 30A through 30F, are provided in FIGS. 31A, 31B and 31C. FIGS. 30A-30F illustrate top views illustration of the polygon scanners 3100, and FIGS. 8A-8C include diagonal views of only the polygons 3102, without the tank 3104 in which it is included.

It is noted that different types of liquid (or, more generally, fluids) may be used for immersing the polygon 3102 in the tank. For example, the liquid 3106 may have differing volumetric mass densities, specific weights, viscosity, transparency, refractive indexes, and so on. Likewise, the polygon 3102 may have differing volumetric mass densities, specific weights, viscosity, transparency, reflectivity, and so on. Similarly, the tank 3104 may have differing volumetric mass densities, specific weights, viscosity, transparency, refractive indexes, and so on. The volumetric mass density of the polygon 3102 may be similar to that of the liquid 3104, e.g. for reducing mechanical forces applied on the polygon 3102 during rotation, bus this is not necessarily so. The refractive index of the liquid 3106 may be similar to that of the tank 3104, for reducing the number and/or degree of refractions, but this is not necessarily so.

As demonstrated in FIG. 30A, the incident beam is refracted twice—once when it enters the tank 3104, and the second time when it leaves the tank 3104. The refraction of the beam by the liquid depends on the shape of the tank 3104. In addition to changing the propagation direction of the incident beams, the refractions in the transitions between the outside air (or other ambient medium, e.g., nitrogen) and the enclosed liquid 3106 may also result in other optical effect such as increase in divergence, aberrations, etc. Furthermore, since the face of the tank 3104 is curved and the facets of the polygon 3102 are flat, the liquid 3106 (or other fluid) between the components of the embodiment of FIG. 30A acts as a lens, which means that the increase in divergence and other optical modifications of the incident beams are not constant in different angles (positions) of the polygon 3102.

FIGS. 30B, 30C, 30D, 30E and 30F include several illustrative examples of polygon scanners 3102 immersed in fluids according to different aspects of the present invention. The polygon scanners 3102 may be used in LIDAR system, electrooptical systems (e.g., as exemplified above), or any other optical systems. The fluid may be liquid. The fluid may be gaseous. Any one of the polygon 3102 scanners represented by the illustrative examples of FIGS. 30B, 30C, 30D, 30E and 30F may be implemented in system 100 or in any other types of scanning LIDAR system. The polygon scanners systems 3100 represented by the illustrative examples of FIGS. 30B, 30C, 30D, 30E and 30F may also be implemented in any other optical or electro-optical system with an optical scanning mechanism such as a barcode reader. Any system which includes such a polygon 3102 scanner may optionally include one or more additional scanning mechanism (e.g. a mirror).

Figure 30B:
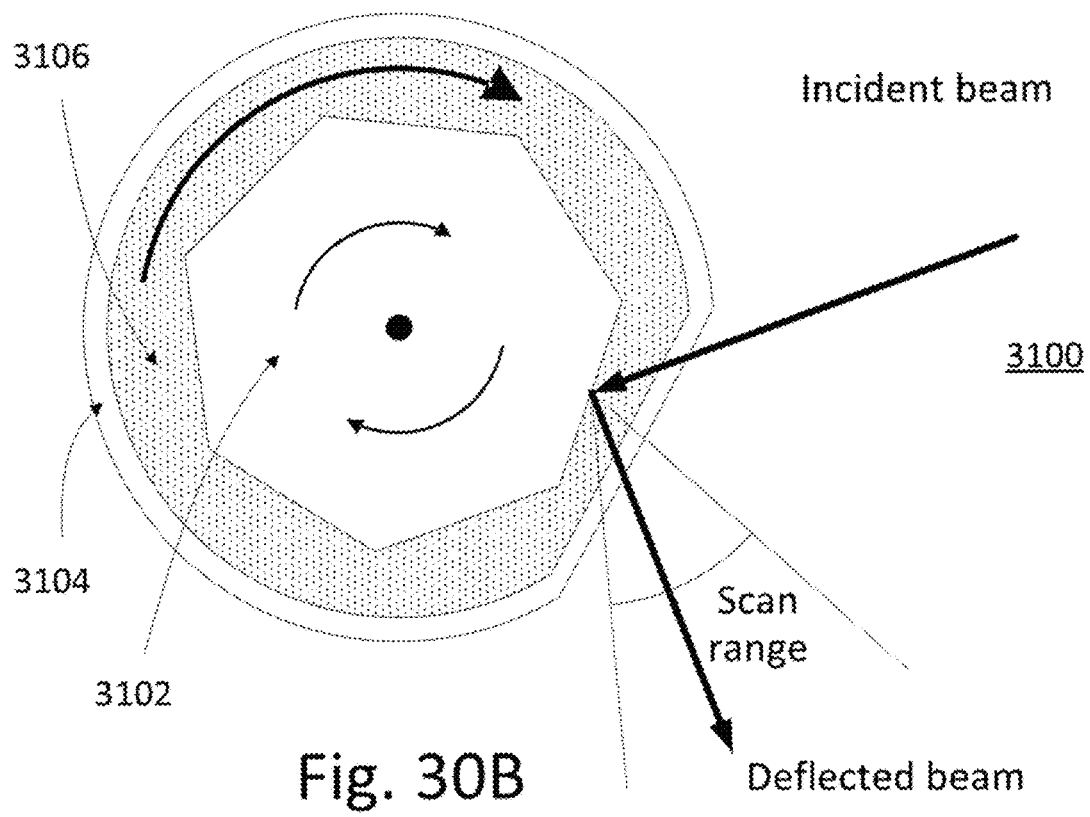

FIG. 30B illustrates a polygon 3102 scanner in accordance with examples of the presently disclosed subject matter. In the example of FIG. 30B, part of the tank 3104 through which light beams are transferred is substantially flat, thereby reducing the divergence in the transitions between air and fluid. However, the non-uniformity of the inner part of the casing (tank 3104) may interfere with the movement of the rotating fluid (e.g. resulting in reduced performance, in turbulences, etc.). Non-uniform movement of the rotating fluid may also apply undesired mechanical forces on the rotating polygon 3102.

Figure 30C:
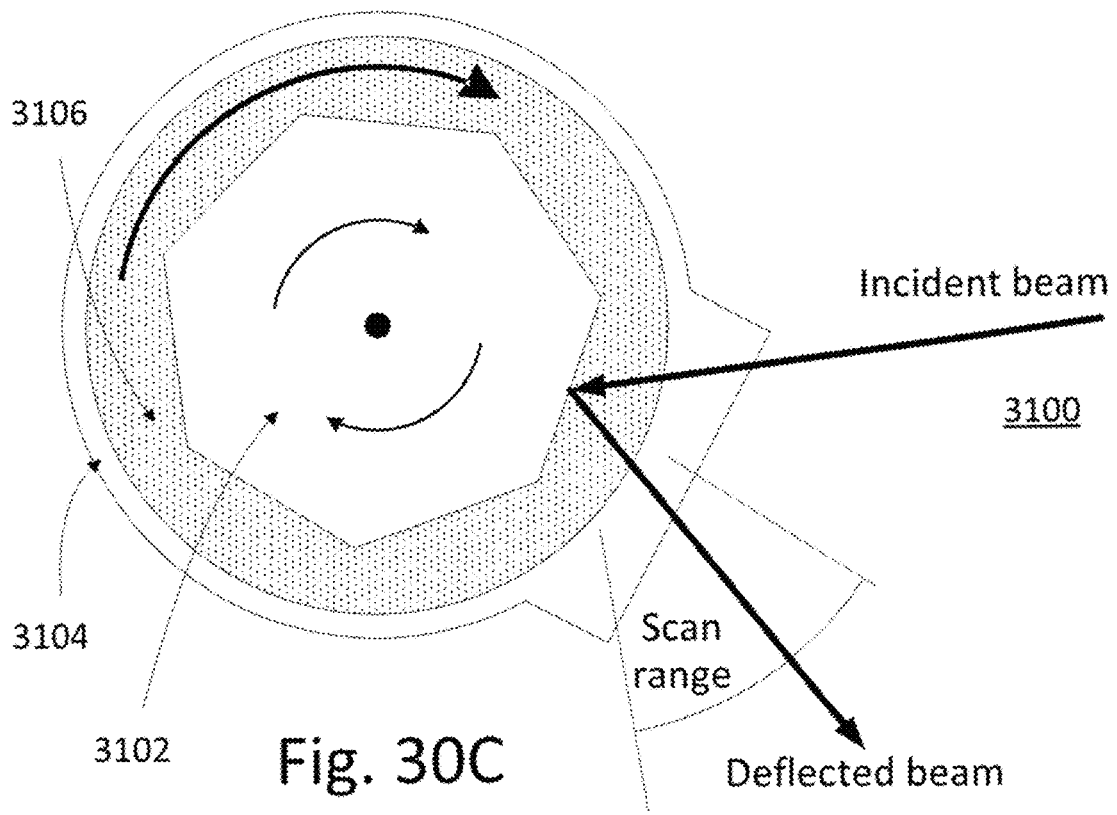
Figure 30D:
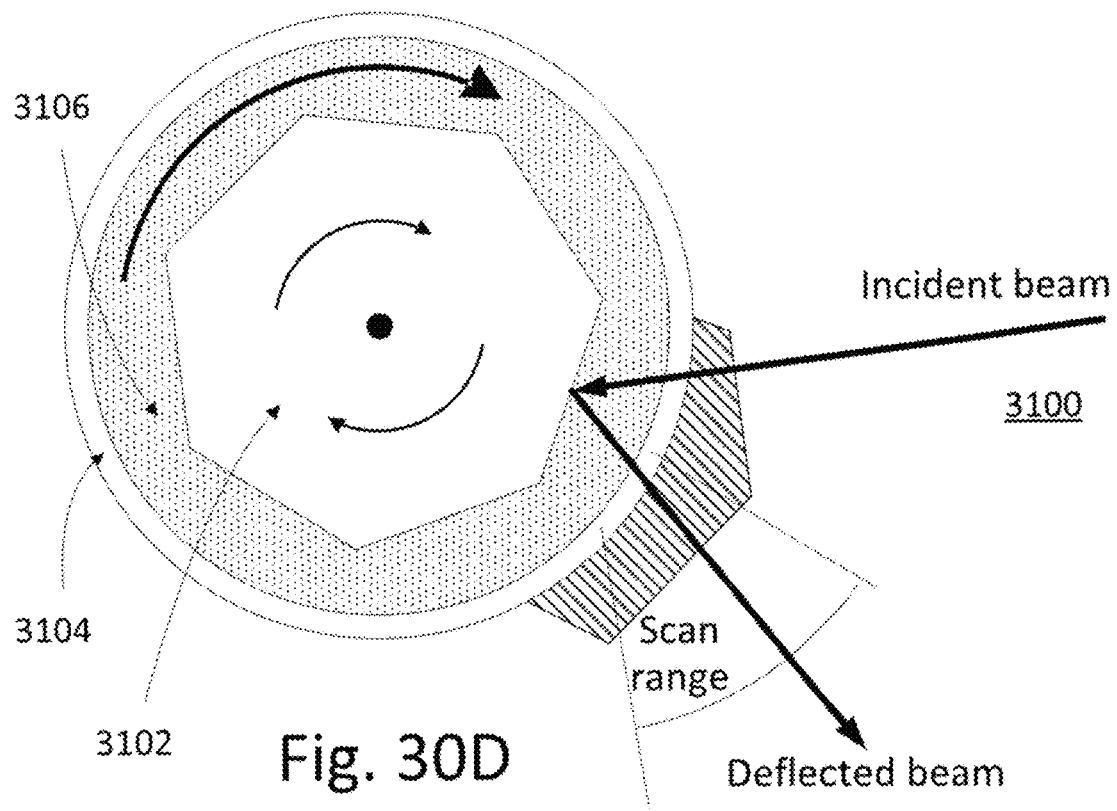

FIG. 30C illustrates a polygon 3102 scanner in accordance with examples of the presently disclosed subject matter. As exemplified in the example of FIG. 30C, the polygon 3102 scanner may include a tank 3104 of non-uniform width, in which a shape of the exterior part of the tank 3104 walls is in different than—and at least partly non-parallel to—a shape of the interior face of the tank 3104 walls. For example, the exterior face of the wall may be substantially flat in at least a part of the circumference of the tank 3104, while the corresponding part of the interior face of the walls is curved (e.g., circular, arced or elliptical; possibly in direct continuity of the rest of the interior, as exemplified in the illustration). The part of the exterior of the tank 3104 through which light is transferred to and from the tank 3104 may optionally include one or more flat faces (e.g. as exemplified in FIGS. 30C and 30E), but curved faces may also be used (e.g. as exemplified in FIG. 30F). The curving (or flatness) of the exterior face may be selected based on the refractive indexes of the liquid 3106 and of the tank 3104, and possibly also on the refractive index (is) of one or more corrective lenses positioned outside the tank 3104 (e.g. as exemplified in FIG. 30D). Such correction lens (or lenses)—if implemented—may be directly attached to the tank 3104 (e.g., as illustrated in FIG. 30D), or somewhat remote therefrom. The orientation of the one or more faces of the parts of the tank 3104—exterior and/or corrective lenses may be determined based on the direction(s) of incident beam(s) and/or on the direction(s) of beam(s) outbound from the polygon 3102 (e.g. as exemplified in FIG. 30D).

While the examples of FIGS. 30B, 30C and 30D demonstrate an exterior which is substantially parallel to the interior of the tank 3104 in large parts of the tank 3104, this is not necessarily so, and the exterior and interior may have substantially different shapes. For example, the interior may be a continuous smooth curve (e.g. circle, ellipse), and the exterior may be an angled shaped (e.g. a polygon 3102, as exemplified in FIG. 30E).

The polygon 3102 scanner may further include other components, such as (but not limited to): a motor, reinforcement structures, location feedback mechanism, controller, etc. Any type of motor, reinforcement structures, location feedback mechanism, controller and/or other components which are known in the art may be used.

Referring to the above examples of polygon scanners systems 3100, it is noted that the polygon 3102, the tank 3104 (interior and/or exterior face thereof) and/or the corrective lenses (if any) may be coated in antireflective coatings or other form of optical coatings, many of which are known in the art.

Optionally, the tank 3104 and/or the corrective lens (if any) may include liquid 3106 (or other fluid) encased in a different casing than the liquid 3106 in which the polygon 3102 is at least partly immersed, e.g., in order for having practically the same refractive index.

It is noted that different nuances of the invention where discussed in greater detail in relation to different drawings. It is noted that any combination of two or more of the nuances, aspects and features of the invention discussed above may be implemented in a single polygon scanner assembly 3100.

In view of the non-limiting examples provided above, polygon scanner assembly 3100 may include:
a. An at least-partly transparent tank 3104;
b. An at least-partly transparent fluid 3106 (e.g., liquid), confined within the tank 3104; and
c. A reflective polygon 3102, at least partly immersed in the fluid 3106, the reflective polygon 3102 operable to reflect an incidence beam of light arriving from outside the tank 3104 to provide a deflected beam of light exiting from the tank 3104 outward A shape of an exterior wall of the tank 3104 is optionally not parallel to a shape of an interior wall of the wall in at least a transference part of the wall of the tank 3104 through which at least one of the incidence beam and the deflected beam propagates.

Figure 30E:
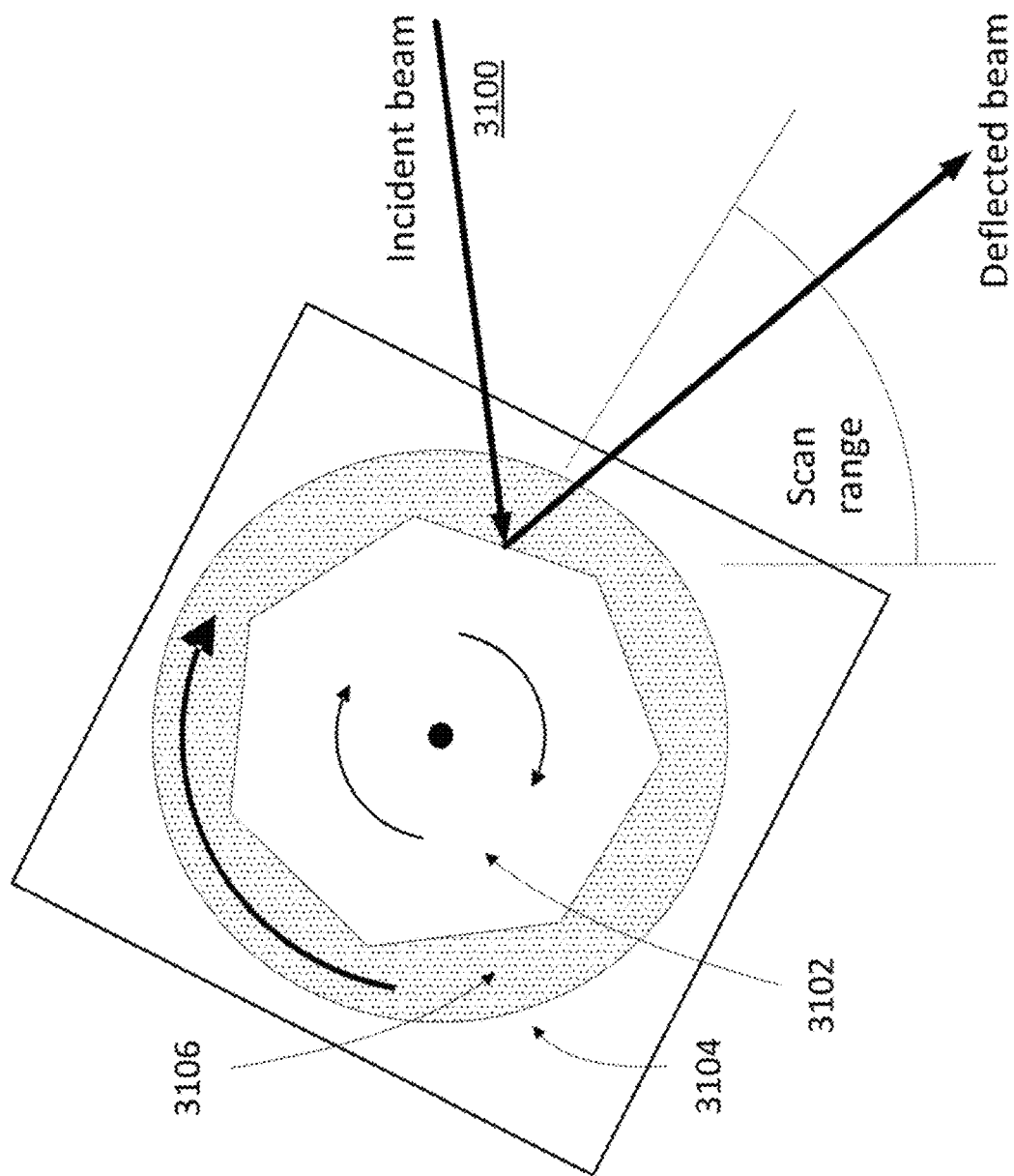
Figure 30F:
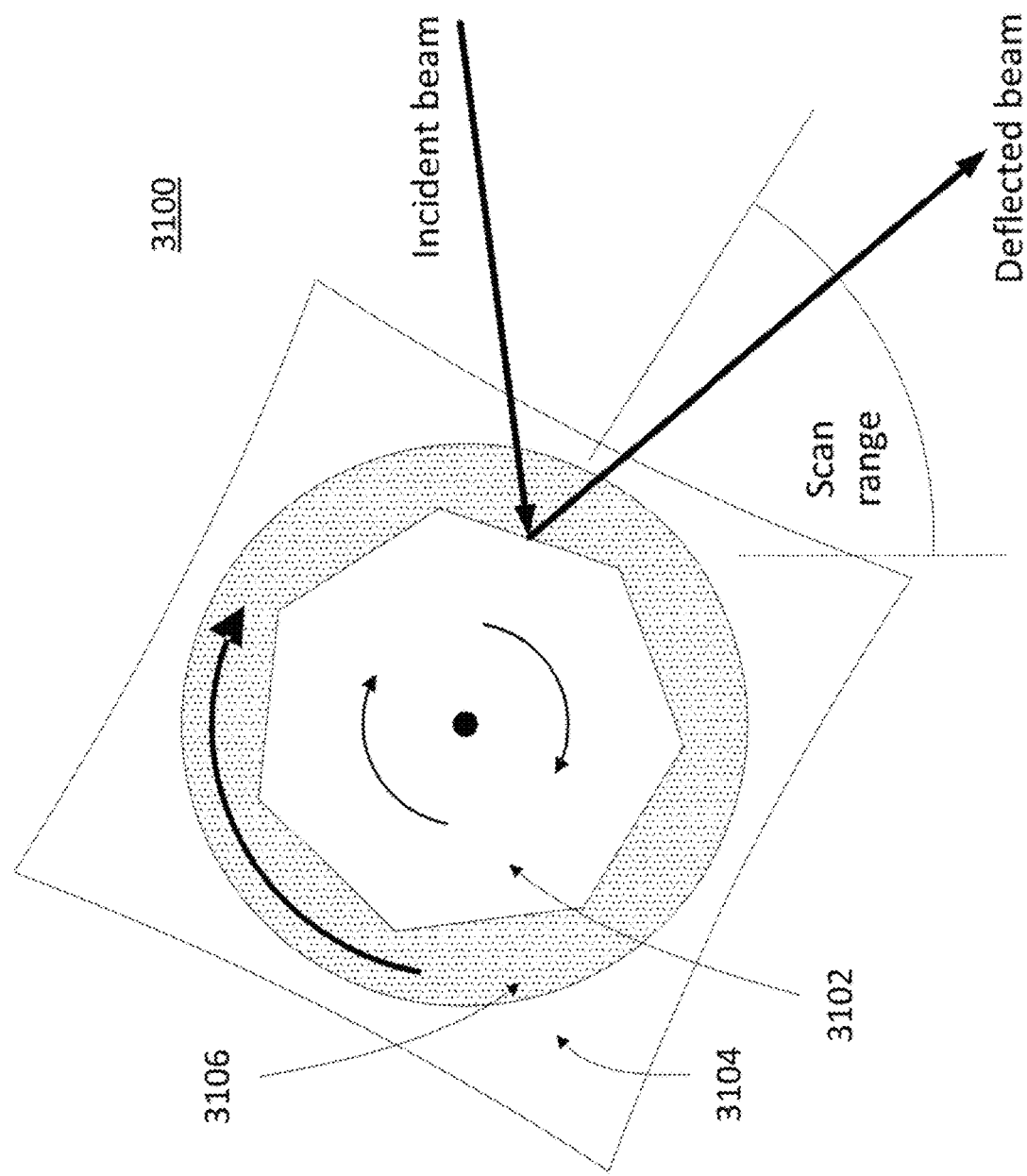
Figure 31A:
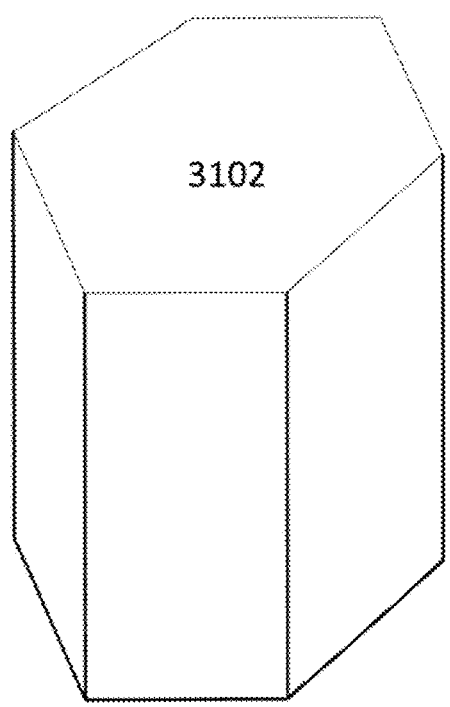
FIGS. 31A-31C provide diagrammatic representations of examples of polygon scanners in accordance with examples of the presently disclosed subject matter.
Figure 31B:
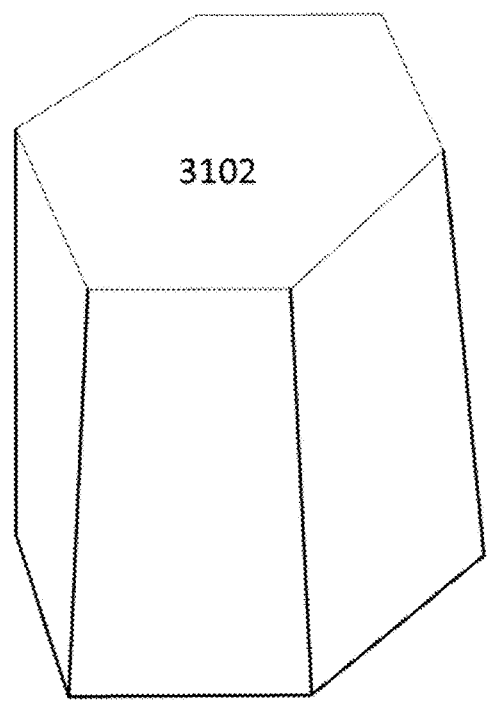
Figure 31C:
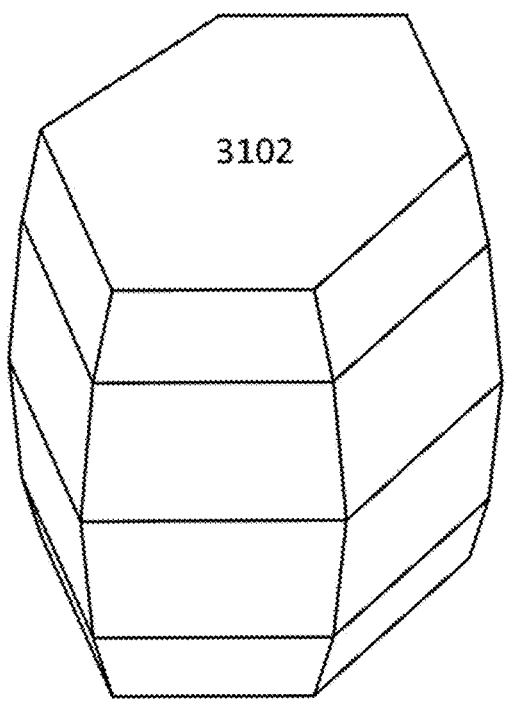

Optionally, the exterior of the transference part includes at least one flat facet, while the interior of the transference part is a smoothly curved plane (e.g., as exemplified in FIGS. 30C, 30D, and 30E). It is noted that the polygon scanner assembly 3100 may include a first transference part of the wall for transferring incident beams and a second transference part of the wall for transferring outbound beams, wherein the first transference part and the second transference part include non-parallel faces (e.g., as exemplified in FIG. 30E).

Optionally, a divergence of a light beam scanned by the polygon scanner 3102 is substantially unchanged in a plurality of instantaneous positions of the reflective polygon. Optionally, a divergence of a light beam scanned by the polygon scanner 3102 is substantially identical in a plurality of instantaneous positions of the reflective polygon.

In view of the non-limiting examples provided above, polygon scanner assembly 3100 may include:
a. An at least-partly transparent tank 3104;
b. An at least-partly transparent fluid 3106 (e.g., liquid), confined within the tank 3104;
c. A reflective polygon, at least partly immersed in the fluid 3106, the reflective polygon operable to reflect an incidence beam of light arriving from outside the tank 3104 to provide a deflected beam of light exiting from the tank 3104 outward; and
d. At least one corrective lens for converging or diverging at least one of the incidence beam and the deflected beam. The at least one corrective lens may be mechanically coupled to the tank 3104, such that an outward-facing face of the corrective lens facing away from the tank 3104 is not parallel to a shape of an interior wall of the wall in at least a transference part of the wall of the tank 3104 through which at least one of the incidence beam and the deflected beam propagates. While not necessarily so, the at least one corrective lens may be attached to the exterior of the tank 3104.

Optionally, the fluid 3106 and the tank 3104 have substantially the same refractive index. Optionally, the fluid 3106 and the corrective lens have substantially the same refractive index. Optionally, the tank 3104 and the corrective lens have substantially the same refractive index. Optionally, the outward-facing face of the at least one corrective lens includes at least one flat facet, while the interior of the transference part is a smoothly curved plane. Optionally, such a polygonal scanning system 3100 may include one or more first corrective lens for transferring incident beams and one or more second corrective lens for transferring outbound beams, such that the one or more first corrective lens and the one or more second corrective lens include non-parallel faces. Optionally, a divergence of a light beam scanned by the polygon scanner is substantially unchanged in a plurality of instantaneous positions of the reflective polygon. Optionally, a divergence of a light beam scanned by the polygon scanner is substantially identical in a plurality of instantaneous positions of the reflective polygon.

As aforementioned, a polygonal scanner system 3100 as disclosed above may be incorporated into a LIDAR system or any other optical and/or electrooptical system. such a system may further include other components of a LIDAR system, e.g., as discussed above with respect to LIDAR system 100. For example, such an electrooptical system may include: a light source, operable to emit at least one light beam; polygon scanner assembly 3100 operable to deflect the at least one light beam toward a FOV of the electrooptical system, such that the polygon scanner deflects the at least one light beam in different directions while being positioned in different instantaneous positions of the polygon scanner; and a controller for controlling rotation of the polygon scanner. Such a LIDAR system may also include a sensor for detecting reflected light of the at least one light beam reflected back from one or more objects in the field of view, and a processor operable to process detection information of the sensor, to provide distance information for the one or more objects.

What is claimed is:
1. A LIDAR system, comprising:
at least one processor configured to:
control at least one LIDAR light source in a manner enabling light projected from the at least one light source to vary over a plurality of scans of a field of view, the field of view including a foreground area and a background area;
receive from a group of detectors a plurality of input signals indicative of reflections of the projected light from the field of view, wherein a representation of a portion of the field of view associated with a plurality of pixels is constructible from the plurality of input signals;
detect a possible existence of an object in the background area based on first input signals associated with a first scanning cycle, wherein an object-existence-certainty level in the first scanning cycle is below a threshold;
detect a possible existence of the object based on second input signals associated with a second scanning cycle, wherein an object-existence-certainty level in the second scanning cycle is below the threshold; and
aggregate the first input signals associated with the first scanning cycle and the second input signals associated with the second scanning cycle to detect an existence of the object at an object-existence-certainty level higher than the threshold.

2. The LIDAR system of claim 1, wherein when the object-existence-certainty level in the first scanning cycle is below the threshold, the at least one processor is configured to cause more light to be projected towards the object during the second scanning cycle compared to light was projected towards the object in the first scanning cycle.

3. The LIDAR system of claim 1, wherein when the object-existence-certainty level in the first scanning cycle is below the threshold, the at least one processor is configured to increase a sensitivity level of at least some of the group of detectors in the second scanning cycle compared to the sensitivity level of the at least some of the group of detectors in the first scanning cycle.

4. The LIDAR system of claim 1, wherein the at least one processor is further configured to take into account an angular orientation of a surface identified in the first input signal and second input signal to increase the object-existence-certainty level.

5. The LIDAR system of claim 1, wherein the at least one processor is further configured to take into account a reflectivity level identified in the first and second input signals to increase the object-existence-certainty level.

6. The LIDAR system of claim 1, wherein the at least one processor is further configured to detect a change of at least one of a presence indication, a surface angle, and a reflectivity level in the second input signals compared to the first input signals, and take into account the detected change to increase the object-existence-certainty level.

7. The LIDAR system of claim 1, wherein the at least one processor is further configured to initially process individually input signals associated with the first and second scanning cycles, and when the object-existence-certainty level in both the first and second scanning cycles is below the threshold but higher than a second threshold, combine input signals associated with the first and second scanning cycles.

8. The LIDAR system of claim 7, wherein the at least one processor is further configured to aggregate input signals from a third scanning cycle when the object-existence-certainty level associated with the combined the first and second input signals is lower than the threshold to detect the existence of the object at the object-existence-certainty level higher than the threshold.

9. The LIDAR system of claim 1, wherein the at least one processor is further configured to take into account input signals from a third scanning cycle when the object-existence-certainty level associated with the first and second input signals is above the threshold, in order to obtain a point resolution for the object greater than a point resolution achievable with the first and second input signals alone.

10. The LIDAR system of claim 1, wherein the at least one processor is further configured to access stored classification information, and based on the classification information and the first and second input signals, classify the object.

11. The LIDAR system of claim 1, wherein the at least one processor is further configured to select the second input signals based on a direction associated with the first input signals and at least one kinetic parameter of an object in the field of view.

12. The LIDAR system of claim 1, wherein:
the plurality of input signals are associated with a first pixel that covers a portion of the foreground area, a second pixel that covers a portion of the foreground area and a portion of the background area, and a third pixel that covers a portion of the background area; and
the at least one processor is further configured to:
use input signals associated with the first pixel to determine a distance to the object located in the foreground area; and
use input signals associated with the second pixel and input signals associated with the third pixel to determine a distance to an additional object located in the background area.

13. A vehicle, comprising:
a body;
at least one processor configured to:
control at least one LIDAR light source in a manner enabling light projected from of the at least one LIDAR light source to vary over a plurality of scans of a field of view, the field of view including a foreground area and a background area;
receive from a group of detectors a plurality of input signals indicative of reflections of the projected light from the field of view, wherein a representation of a portion of the field of view associated with a plurality of pixels is constructible from the plurality of input signals;
detect a possible existence of an object in the background area based on first input signals associated with a first scanning cycle, wherein an object-existence-certainty level in the first scanning cycle is below a threshold;
detect a possible existence of the object based on second input signals associated with a second scanning cycle, wherein an object-existence-certainty level in the second scanning cycle is below the threshold; and
use the first input signals associated with the first scanning cycle and the second input signals associated with the second scanning cycle to detect an existence of the object at an object-existence-certainty level higher than the threshold.

14. The vehicle of claim 13, wherein a value of the threshold is dynamic and depends on a type of the detected object.

15. The vehicle of claim 13, wherein a value of the threshold is dynamic and depends on a distance of the detected object from the at least one light source.

16. The vehicle of claim 13, wherein when the object-existence-certainty level in the first scanning cycle is below the threshold, the at least one processor is configured to cause more light to be projected towards the object during the second scanning cycle compared to light that was projected towards the object in the first scanning cycle.

17. The vehicle of claim 13, wherein when the object-existence-certainty level in the first scanning cycle is below the threshold, the at least one processor is configured to increase a sensitivity level of at least some of the group of detectors compared to the sensitivity level of the at least some of the group of detectors associated with the first scanning cycle.

18. The vehicle of claim 13, wherein the first and second input signals are associated with a same portion of the field of view.

19. The vehicle of claim 13, wherein the first and second input signals are associated with differing but overlapping portions of the field of view.

20. The vehicle of claim 13, wherein the second scanning cycle is consecutive with the first scanning cycle.

21. The vehicle of claim 13, wherein the second scanning cycle is non-consecutive with the first scanning cycle.

22. The vehicle of claim 13, wherein the at least one processor is further configured to take into account a velocity of the vehicle when combining the first input signals and the second input signals.

23. The vehicle of claim 13, wherein:
the plurality of input signals are associated with a first pixel that covers a portion of the foreground area, a second pixel that covers a portion of the foreground area and a portion of the background area, and a third pixel that covers a portion of the background area; and
the at least one processor is further configured to:
use input signals associated with the first pixel to determine a distance to the object located in the foreground area; and
use input signals associated with the second pixel and input signals associated with the third pixel to determine a distance to an additional object located in the background area.

24. A method for using a LIDAR system to detect objects in a field of view, the method comprising:
controlling at least one LIDAR light source in a manner enabling light flux of the at least one LIDAR light source to vary over a plurality of scans of a field of view, the field of view including a foreground area and a background area;
receiving from a group of detectors a plurality of input signals indicative of reflections of light projected from the field of view, wherein a representation of a portion of the field of view associated with a plurality of pixels is constructible from the plurality of input signals;
detecting a possible existence of an object in the background area based on first input signals associated with a first scanning cycle, wherein an object-existence-certainty level in the first scanning cycle is below a threshold;
detecting a possible existence of the object based on second input signals associated with a second scanning cycle, wherein an object-existence-certainty level in the second scanning cycle is below the threshold; and
aggregating the first input signals associated with the first scanning cycle and the second input signals associated with the second scanning cycle to detect an existence of the object at an object-existence-certainty level higher than the threshold.

25. The method of claim 24, wherein:
the plurality of input signals are associated with a first pixel that covers a portion of the foreground area, a second pixel that covers a portion of the foreground area and a portion of the background area, and a third pixel that covers a portion of the background area; and
the method further comprises:
using input signals associated with the first pixel to determine a distance to the object located in the foreground area; and
using input signals associated with the second pixel and input signals associated with the third pixel to determine a distance to an additional object located in the background area.

\* \* \* \* \*